US012581949B2

(12) United States Patent
Carpenter et al.

(10) Patent No.: US 12,581,949 B2
(45) Date of Patent: *Mar. 17, 2026

(54) THERMAL INTERFACE LAYER

(71) Applicant: 3M INNOVATIVE PROPERTIES COMPANY, St. Paul, MN (US)

(72) Inventors: Samuel J. Carpenter, Maplewood, MN (US); Aaron K. Nienaber, Lake Elmo, MN (US); Joseph B. Eckel, Vadnais Heights, MN (US); Ronald D. Jesme, Plymouth, MN (US); Jacob P. Podkaminer, St. Paul, MN (US); Victor Ho, St. Paul, MN (US); Sebastian Goris, Inver Grove Heights, MN (US); Matthew T. Johnson, Woodbury, MN (US); Michael S. Graff, Woodbury, MN (US); Steven H. Kong, Woodbury, MN (US)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 478 days.

This patent is subject to a terminal disclaimer.

(21) Appl. No.: 17/792,815

(22) PCT Filed: Jan. 14, 2021

(86) PCT No.: PCT/IB2021/050268

§ 371 (c)(1), (2) Date: Jul. 14, 2022

(87) PCT Pub. No.: WO2021/148910

PCT Pub. Date: Jul. 29, 2021

(65) Prior Publication Data

US 2023/0055151 A1 Feb. 23, 2023

Related U.S. Application Data

(60) Provisional application No. 62/964,444, filed on Jan. 22, 2020.

(51) Int. Cl.

*H01L 23/373* (2006.01)
*H01L 23/42* (2006.01)

(52) U.S. Cl.

CPC ...... *H01L 23/3733* (2013.01); *H01L 23/3736* (2013.01); *H01L 23/3737* (2013.01); *H01L 23/42* (2013.01)

(58) Field of Classification Search

CPC .... H01L 23/3733; H01L 23/3737; C09K 5/14

See application file for complete search history.

(56) References Cited

U.S. PATENT DOCUMENTS

| | | | |
|---|---|---|---|
| 2,370,636 | A | 3/1945 | Carlton |
| 2,857,879 | A | 10/1958 | Johnson |

(Continued)

FOREIGN PATENT DOCUMENTS

| | | | | |
|---|---|---|---|---|
| CN | 106700957 | A | | 5/2017 |
| CN | 109825010 | A | * | 5/2019 |

(Continued)

OTHER PUBLICATIONS

Martin, Field-structured composites for efficient, directed heat transfer, 2009, Journal of Applied Physics 106, 084301, pp. 1-7. (Year: 2009).*

(Continued)

*Primary Examiner* — Monique R Jackson
(74) *Attorney, Agent, or Firm* — Clifton F. Richardson

(57) ABSTRACT

A thermal interface layer includes pluralities of first and second particles dispersed in a polymeric binder at a total loading V in a range of about 40 volume percent to about 70 volume percent. The first and second particles have different compositions. The first particles include one or more of iron or nickel. The second particles include one or more of aluminum, magnesium, silicon, copper, or zinc. The thermal interface layer has a thermal conductivity in a thickness (Continued)

direction of the thermal interface layer in units of W/mK of at least $K=5.1-0.17V+0.002V^2$.

8 Claims, 84 Drawing Sheets

(56) References Cited

U.S. PATENT DOCUMENTS

| | | | |
|---|---|---|---|
| 3,625,666 A | 12/1971 | James | |
| 4,008,055 A | 2/1977 | Phaal | |
| 4,612,242 A | 9/1986 | Vesley et al. | |
| 5,181,939 A | 1/1993 | Neff | |
| 6,391,393 B1 | 5/2002 | Martin et al. | |
| 6,433,055 B1 * | 8/2002 | Kleyer | C08K 3/08 524/588 |
| 7,439,475 B2 | 10/2008 | Ohta | |
| 7,494,704 B2 | 2/2009 | Massa et al. | |
| 7,718,256 B1 * | 5/2010 | Frank | C09J 163/00 428/354 |
| 7,727,931 B2 | 6/2010 | Brey et al. | |
| 9,831,022 B2 | 11/2017 | Kim et al. | |
| 2002/0090501 A1 | 7/2002 | Tobita | |
| 2005/0256241 A1 * | 11/2005 | Sachdev | H01L 23/433 257/E23.09 |
| 2006/0280873 A1 | 12/2006 | Smith et al. | |
| 2007/0131912 A1 * | 6/2007 | Simone | C09J 9/02 252/500 |
| 2008/0289262 A1 | 11/2008 | Gao | |
| 2011/0038124 A1 | 2/2011 | Burnham et al. | |
| 2012/0106111 A1 | 5/2012 | Mazzochette et al. | |
| 2016/0333232 A1 | 11/2016 | Choi et al. | |
| 2018/0249593 A1 | 8/2018 | Zhang et al. | |
| 2019/0359862 A1 | 11/2019 | Fang et al. | |
| 2021/0294002 A1 | 9/2021 | O'Neill et al. | |
| 2021/0388175 A1 * | 12/2021 | Iwazaki | C08L 83/04 |

FOREIGN PATENT DOCUMENTS

| | | | |
|---|---|---|---|
| CN | 106810719 B | | 7/2019 |
| CN | 106047242 B | | 8/2019 |
| GB | 1477767 A | | 6/1977 |
| JP | 09115707 A | | 5/1997 |
| JP | 11302613 A | | 11/1999 |
| JP | 2001261722 A | * | 9/2001 |
| JP | 2002299530 A | | 10/2002 |
| JP | 2004134604 A | | 4/2004 |
| JP | 2009010296 A | | 1/2009 |
| JP | 2009076513 A | | 4/2009 |
| JP | 2012052059 A | | 3/2012 |
| KR | 20120129556 A | | 11/2012 |
| WO | 1995020820 A1 | | 8/1995 |
| WO | 2012111837 A1 | | 8/2012 |
| WO | 2018080703 A1 | | 5/2018 |
| WO | 2018080704 A1 | | 5/2018 |
| WO | 2018080705 A1 | | 5/2018 |
| WO | 2018080755 A1 | | 5/2018 |
| WO | 2018080756 A1 | | 5/2018 |
| WO | 2018080765 A1 | | 5/2018 |
| WO | 2018080784 A1 | | 5/2018 |
| WO | 2018080799 A1 | | 5/2018 |
| WO | 2018136269 A1 | | 7/2018 |
| WO | 2018160348 A1 | | 9/2018 |
| WO | 2021148911 A1 | | 7/2021 |
| WO | 2021148916 A1 | | 7/2021 |

OTHER PUBLICATIONS

Machine translation of CN109825010A, published May 2019, Powered by EPO and Google. (Year: 2019).*

Machine translation of JP2001261722A, published Sep. 2001, Powered by EPO and Google. (Year: 2001).*

Engineering ToolBox, (2003). Thermal Conductivity of selected Materials and Gases. [online] Available at: https://www.engineeringtoolbox.com/thermal-conductivity-d_429.html [Accessed May 5, 2020]. (Year: 2003).*

Engineering ToolBox (2005). Thermal Conductivity of Metals. [online] Available at: https://www.engineeringtoolbox.com/thermal-conductivity-metals-d_858.html [Accessed Jul. 19, 2018]. (Year: 2005).*

Al Masud, "On The Electric and Magnetic Alignment of Magnetoactive Barium Hexaferrite—PDMS Composites", Proceedings of SPIE, 2017, vol. 10165, pp. 1016513-1-1016513-14.

Al-Busoul, "Hydrodynamics and Heat Transfer Characteristics of G-S Magnetically Stabilized Beds Consisting of Admixtures of Shale Oil and Magnetic Particles", Heat Mass Transfer, 2008, vol. 44, pp. 1099-1106.

Chen, "Transparent and Through Thickness Conductive Polystyrene Films using External Magnetic Fields for "Z" Alignment of Nickel Nanoparticles", Nanoscale, 2015, vol. 7, Article No. 14636. pp. 14636-14642.

Ferroxcube, "Sendust Material Specification—Datasheet", Sep. 1, 2008, pp. 66-68.

Haydon Kerk Pittman, "Haydon Kerk Pittman at a Glance", URL: <https://www.haydonkerkpittman.com/>, 2017, 2 pages.

International Search Report for PCT Application No. PCT/IB2021/050268, mailed on Apr. 13, 2021, 3 pages.

International Search Report for PCT Application No. PCT/IB2021/050272, mailed on Mar. 23, 2021, 4 pages.

International Search Report for PCT Application No. PCT/IB2021/050308, mailed on Apr. 20, 2021, 5 pages.

Martin, "Anisotropic Magnetism in Field-Structured Composites", Physical Review E, Mar. 2000, vol. 61, No. 3, pp. 2818-2830.

Song, "Planar Alignment of Magnetic Microdisks in Composites Using Rotating Fields", IEEE Transactions on Magnetics, Nov. 2015, vol. 51, No. 11, 5 pages.

Tan, "Theoretical Study of Alignment Dynamics of Magnetic Oblate Spheroids in Rotating Magnetic Fields", Physics of Fluids, 2016, vol. 28, pp. 062004-1-062004-16.

* cited by examiner

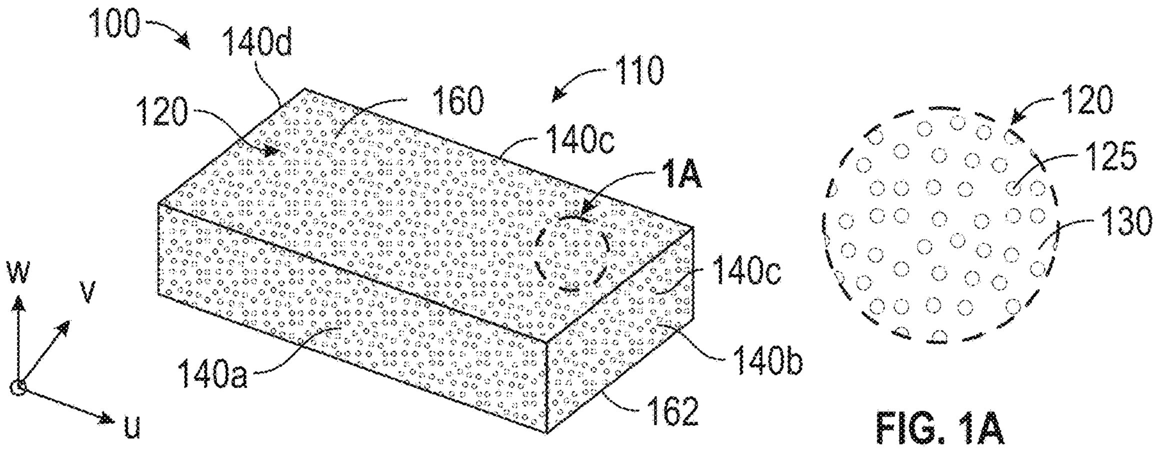
FIG. 1A
FIG. 1
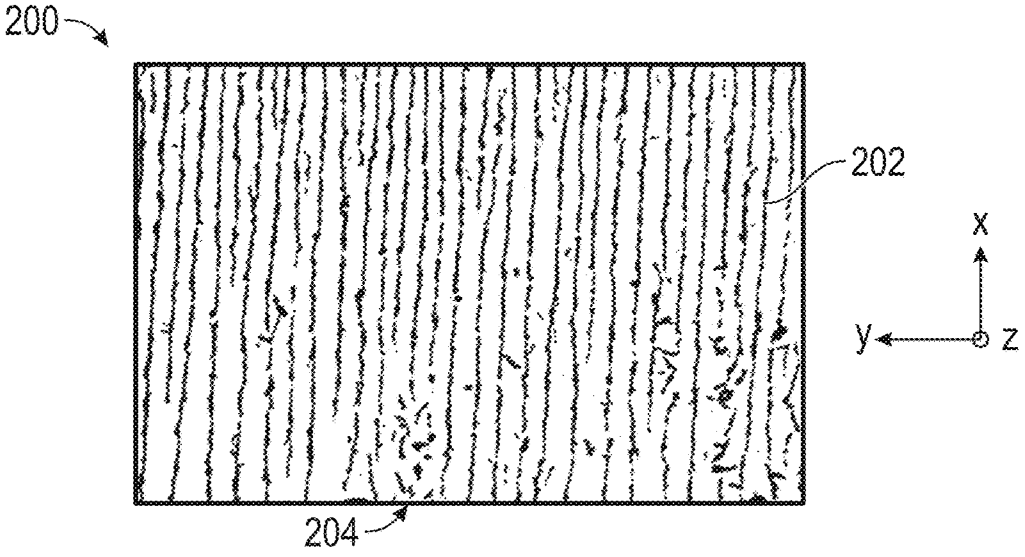
FIG. 2
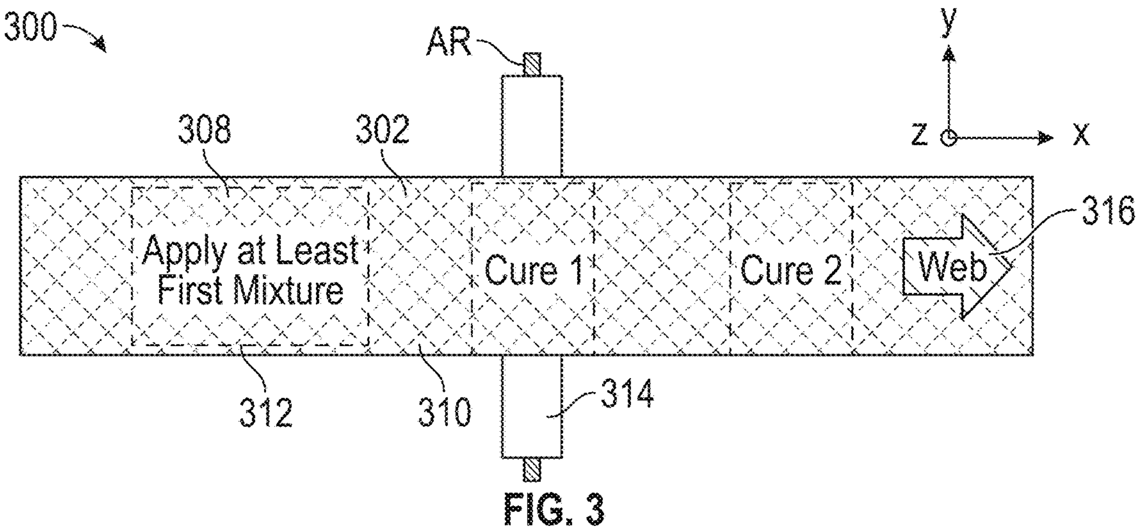
FIG. 3

THERMAL INTERFACE LAYER

CROSS REFERENCE TO RELATED APPLICATIONS

This application is a national stage filing under 35 U.S.C. 371 of PCT/IB2021/050268, filed Jan. 14, 2021, which claims the benefit of Provisional Application No. 62/964,444, filed Jan. 22, 2020, the disclosures of which are incorporated by reference in their entirety herein.

BACKGROUND

Magnetic fields can be used to alter a distribution of magnetic particles in a resin.

A thermal interface material can be used to provide improved thermal contact between two objects.

SUMMARY

The present disclosure relates generally to films and layers including particles. The particles can be oriented and/or aligned and/or positioned by the methods described herein to provide one or more improved properties relative to the case where the particles are randomly oriented and distributed, according to some embodiments. At least some of the particles can be magnetically responsive; at least some of the particles can be electrically conductive; and/or at least some of the particles can be thermally conductive.

In some aspects of the present disclosure, a thermal interface layer including pluralities of first and second particles dispersed in a polymeric binder at a total loading V in a range of about 40 volume percent to about 70 volume percent is provided. The first and second particles have different compositions. The first particles include one or more of iron or nickel. The second particles include one or more of aluminum, magnesium, silicon, copper, or zinc. The thermal interface layer has a thermal conductivity in a thickness direction of the thermal interface layer in units of W/mK of at least $K=5.1-0.17\ V+0.002\ V^2$.

In some aspects of the present disclosure, a thermal interface layer including pluralities of first and second particles at a total volume loading in a range of about 40 percent to about 70 percent is provided. A ratio of a total volume of the first particles to a total volume of the first and second particles is in a range of about 0.04 to about 0.1. The first and second particles have respective real parts of relative magnetic permeability $\mu'_1$ and $\mu'_2$ such that for at least one frequency less than about 1 GHz, $\mu_1/\mu'_2 \geq 5$. Alternatively, or in addition, the first and second particles can have different compositions. The second particles are at least partially aligned so as to increase a thermal conductivity of the thermal interface layer in a thickness direction of the thermal interface layer by at least 10 percent.

In some aspects of the present disclosure, a thermal interface layer including pluralities of first and second particles at a total volume loading of less than about 55 percent is provided. A total volume loading of the first particles in the thermal interface layer is in a range of about 2.5 percent to about 10 percent. A total volume loading of the second particles in the thermal interface layer being from about 2.5 to about 15 times the total volume loading of the first particles. The first and second particles having respective real parts of relative magnetic permeability $\mu'_1$ and $\mu'_2$ such that for at least one frequency less than about 1 GHz, $\mu'_1/\mu'_2 \geq 5$. Alternatively, or in addition, the first and second particles can have different compositions. The second particles have a thermal conductivity of at least 10 W/mK. The plurality of first particles include a plurality of first flakes. Each first flake extends generally along orthogonal first and second directions defining a plane of the first flake. Each first flake in at least a majority of the first flakes is oriented such that the plane of the first flake makes an angle of less than 40 degrees with the thickness direction of the thermal interface layer. The first particles cause the second particles to at least partially align.

In some aspects of the present disclosure, a thermal interface layer including pluralities of first and second particles having respective real parts of relative magnetic permeability $\mu'_1$ and $\mu'_2$, where for at least one frequency less than about 1 GHz, $\mu'_1/\mu'_2 \geq 5$. Alternatively, or in addition, the first and second particles can have different compositions. For at least one cross-section of the thermal interface layer and for each of the first and second particles, the particle has alternating higher and lower densities. The higher density includes a plurality of the particle. The second particles have a thermal conductivity of at least 10 W/mK.

In some aspects of the present disclosure, a thermal interface layer including a plurality of alternating substantially continuous layers of magnetically responsive first and thermally conductive second particles, the alternating layers generally extending along orthogonal first and second directions and arranged along a third direction, the first and second particles having different compositions. The second particles have a thermal conductivity of at least 10 W/mK.

In some aspects of the present disclosure, a thermal interface layer including a plurality of particles dispersed between opposing first and second major surfaces of the thermal interface layer is provided. The first and second layers are spaced apart a distance D. The particles are agglomerated so as to form a plurality of spaced apart substantially continuous layers of particles generally extending along orthogonal first and second directions and arranged along a third direction. Each substantially continuous layer of particles has a length L along the first direction from a first to an opposing second edge of the thermal interface layer and a width W along the second direction extending from the first to the second major surface. $L/D \geq 100$. At least some of the particles have a thermal conductivity of at least 10 W/mK.

In some aspects of the present disclosure, a thermal interface layer including a plurality of particles dispersed between opposing first and second major surfaces of the thermal interface layer is provided. The particles are sufficiently densely packed so as to form a plurality of spaced apart substantially continuous layers of particles generally extending along orthogonal first and second directions. At least one of the first and second directions forms an oblique angle with respect to a thickness direction of the thermal interface layer. At least some of the particles have a thermal conductivity of at least 10 W/mK.

In some aspects of the present disclosure, a thermal interface layer rolled along a length of the thermal interface layer to form a roll is provided. The thermal interface layer includes a plurality of substantially continuous layers of particles extending along the length and a thickness of the thermal interface layer and arranged along a width of the thermal interface layer. The thermal interface layer has a substantially higher thermal conductivity along each of the thickness and the length of the thermal interface layer than the width of the thermal interface layer.

In some aspects of the present disclosure, a thermal interface layer is provided. The layer has first and second major surfaces spaced apart a distance D in a thickness direction of the thermal interface layer and a lateral length L along a length direction of the layer orthogonal to the thickness direction, where L/D≥100. The layer includes a plurality of particles dispersed and asymmetrically distributed between the first and second major surfaces so that in each of at least a first layer cross-section of the layer orthogonal to the length direction and a second layer cross-section of the layer orthogonal to the thickness direction, an ellipse fitted to a cross-section of a two dimensional autocovariance of an image of the layer cross-section at 10% of a central peak of the autocovariance has a major axis length L1 and a minor axis length L2, where L1/L2≥1.2. At least some of the particles have a thermal conductivity of at least 10 W/mK.

In some aspects of the present disclosure, a thermal interface layer is provided. The layer has first and second major surfaces spaced apart a distance D in a thickness direction of the thermal interface layer and a lateral length L along a length direction of the layer orthogonal to the thickness direction, where L/D≥100. The layer includes a plurality of particles dispersed between the first and second major surfaces and regularly arranged so that in each of at least a first layer cross-section of the layer orthogonal to the length direction and a second layer cross-section of the layer orthogonal to the thickness direction, a power spectral density of a positive portion of a two dimensional autocovariance of an image of the layer cross-section has a peak corresponding to a pitch of less than about 100 micrometers and corresponding to the regular arrangement of the particles. At least some of the particles have a thermal conductivity of at least 10 W/mK.

These and other aspects will be apparent from the following detailed description. In no event, however, should this brief summary be construed to limit the claimable subject matter.

BRIEF DESCRIPTION OF THE DRAWINGS

FIG. 1 is a schematic perspective view of a magnetizable particle according to some embodiments of the present disclosure.

FIG. 1A is an enlarged view of region 1A in FIG. 1.

FIG. 2 is an image of a plurality of magnetic particles arranged with a desired structure due to the application of a magnetic field on a substrate according to an example of the present disclosure.

FIG. 3 is schematic view of a method of making a film, the method varies a magnetic field by rotating modulation and applies a cure, where under the influence of the magnetic field, the particles assume a desired structure according to some embodiments of the present disclosure.

DETAILED DESCRIPTION

Figure 3A:
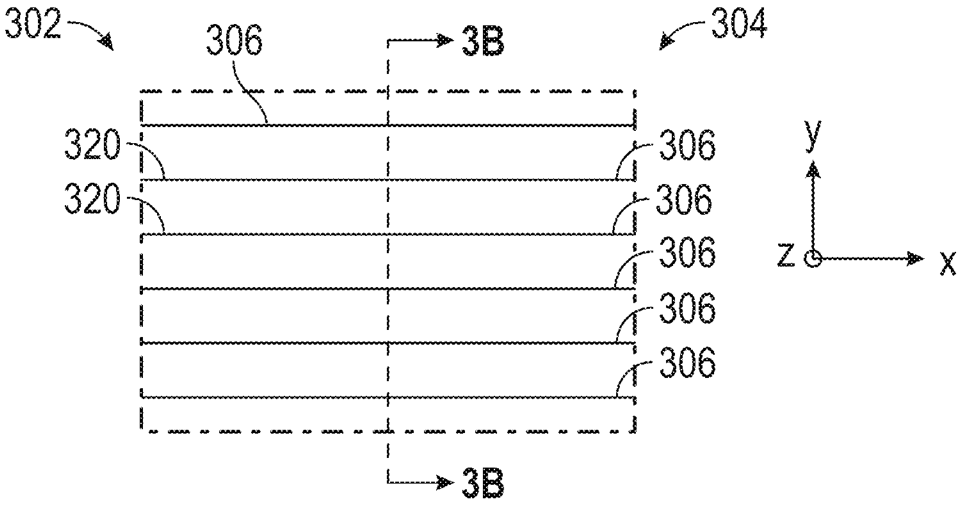
FIG. 3A is a schematic illustration of a desired structure of a plurality of particles that results from the method of FIG. 3 according to some embodiments of the present disclosure.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

Films and layers including magnetic particles (particles that are at least one of magnetizable, magnetically permeable, or magnetically responsive) are described. The magnetic particles can be oriented and/or aligned and/or positioned by the methods described herein to provide one or more improved properties relative to the case where the particles are randomly oriented and distributed, according to some embodiments. The magnetic particles may directly or indirectly provide desired properties of the film or layer. In some embodiments, a magnetic film includes magnetic particles which provide a desired magnetic shielding and/or magnetic absorption, for example. The magnetic film can also include dielectric filler particles to provide a desired response to electric fields. In some embodiments, a film or layer includes magnetic first particles and different second particles, where the second particles provide, at least in part, desired properties while the first particles are used, at least in part, to orient and/or align and/or position the second particles to enhance the properties provided by the second particles. For example, an electrically conductive layer (e.g., an electrically conductive adhesive layer of an electrically conductive tape) can include magnetic first particles and electrically conductive second particles, where the second particles are included to increase the electrical conductivity in the thickness direction and the first particles are used, as least in part, for aligning and/or orienting and/or positioning the second particles which further increases the electrical conductivity in the thickness direction. As another example, a thermal interface layer (e.g., a layer used to provide or enhance thermal conduction between a hotter object, such as a battery system, and a cooler object, such as a cooling system) can include magnetic first particles and thermally conductive second particles, where the second particles are include to increase the thermal conductance in the thickness direction and the first particles are used, at least in part, for aligning and/or orienting and/or positioning the second particles which further increases the thermal conductivity in the thickness direction.

A layer of film can be one or more of a magnetic film, a thermal interface layer, or an electrically conductive adhesive layer. For example, a magnetic film can include magnetic particles in an adhesive layer where the magnetic particles can be electrically conductive and/or where additional particles which are electrically conductive are included in the adhesive layer, so that the magnetic film is also an electrically conductive adhesive layer. The magnetic particles and/or the additional particles can also be thermally conductive so that the magnetic film is also a thermal interface layer. As another example, a magnetic film can include magnetic particles in a layer where the magnetic particles can be thermally conductive and/or where additional particles which are thermally conductive are included in the layer so that the layer is a thermal interface layer. The magnetic particles and the additional particles, if included, can be electrically insulative so that the layer is an electrically insulative thermal interface layer.

The methods described herein for orienting and/or aligning and/or positioning (e.g., magnetic) particles include, in some embodiments, providing the particles in a layer of uncured resin, aligning and/or orienting and/or positioning the particles by applying a magnetic field, and then at least partially curing the resin. It is typically preferred that there is relative motion between the applied magnetic field and the layer. For example, moving a sample back and forth in a static magnetic field has been found to provide improved alignment and/or orientation and/or positioning compared to holding the sample fixed in the static magnetic field. A similar effect can be achieved by moving the sample by an array of suitably oriented, spaced apart, static magnets. In some embodiments, the layer is passed near a rotating cylinder magnet, for example, to align and/or orient and/or position the magnetic particles and optionally other particles included in the layer. Utilizing a rotating magnetic field has been found to provide improved alignment and/or orientation and/or positioning compared to cases where there is no relative motion between the applied magnetic field and the layer. The methods described herein allow the improved alignment and/or orientation and/or positioning to be achieved throughout the layer in a continuous roll-to-roll process, for example.

As used herein:

A "magnetized" item (e.g., particle) is an item having a magnetic moment, in the absence of an applied magnetic field, of at least 0.001 electromagnetic units (emu), in some cases at least 0.005 emu, and yet other cases 0.01 emu, up to an including 0.1 emu, although this is not a requirement. A "magnetizable" item (e.g., particle) is an item capable of being magnetized using an applied magnetic field or an item that is already magnetized. Useful magnetizable materials include ferromagnetic materials and ferrimagnetic materials, for example. Typically, applied magnetic fields used in practice of the present disclosure have a field strength in the region of the magnetic particles being oriented of at least about 10 gauss (1 mT), in some cases at least about 100 gauss (10 mT), and in yet other cases at least about 1000 gauss (0.1 T), and in yet other cases at least about 10,000 gauss (1.0 T).

A "magnetically permeable" item (e.g., particle) is an item having a real part of relative magnetic permeability μ' where μ'−1 is substantially higher than that of typical weakly paramagnetic materials (typical weakly paramagnetic materials include, for example, air, wood, aluminum and platinum having relative permeabilities of 1.00000037, 1.00000043, 1.000022, and 1.000265, respectively). In some cases, a magnetically permeable item has a real part of magnetic permeability μ' that is at least 1.01 for at least one frequency less than about 1 GHz. In some cases, μ' is at least 1.02, or at least 1.05, or at least 1.1, or at least 2, or at least 5, or at least 10 for at least one frequency less than about 1 GHz. Useful magnetically permeable materials include ferromagnetic materials (e.g., iron, nickel, cobalt, or alloys including at least one of iron, nickel, or cobalt) and ferrimagnetic materials (e.g., ferrite), for example. Useful magnetically permeable particles also include superparamagnetic particles (e.g., sufficiently small nanoparticles made from ferromagnetic or ferrimagnetic materials are known to exhibit superparamagnetism), for example.

A "magnetically responsive" particle is a particle that responds (e.g., moves and/or changes orientation when the particle is free to move, or generates a force and/or torque when the particle is held in place) to an applied magnetic field to a substantially greater extent than that of typical weakly paramagnetic particles and typical weakly diamagnetic particles (typical weakly diamagnetic materials include, for example, water, copper, and sapphire having relative of 0.999992, 0.999994, and 0.99999976, respectively). In some cases, a magnetically responsive particle has a real part of magnetic permeability μ' such that |μ'-1| is at least 0.01 for at least one frequency less than about 1 GHz. In some cases, |μ'-1| is at least 0.02, or at least 0.05, or at least 0.1, or at least 1, or at least 2, or at least 5, or at least 10 for at least one frequency less than about 1 GHz. Useful magnetically responsive particles include particles containing ferromagnetic materials or ferrimagnetic materials, and superparamagnetic particles.

A "magnetic particle" is a particle that is at least one of magnetizable, magnetically permeable, or magnetically responsive.

A "thermally conductive" item is an item having a thermal conductivity of greater than 0.5 W/mK along at least one direction. In some cases, a thermally conductive item (e.g., a particle) has a thermal conductivity of at least 1 W/mK, or at least 5 W/mK, or at least 10 W/mK, or at least 20 W/mK, or at least 30 W/mK (e.g., along at least one direction). In some cases, the thermal conductivity is at least 1 W/mK, or at least 5 W/mK, or at least 10 W/mK, or at least 20 W/mK, or at least 30 W/mK along at least two orthogonal directions (e.g., in the plane of a thermally conductive plate or along each of three mutually orthogonal direction in a particle extending in each of the three directions (e.g., a substantially spherical particle)).

An "electrically conductive" item is an item having an electrical resistivity of no more than 200 μΩ cm (evaluated at low frequencies (e.g., about 1 kHz or less) or evaluated statically (direct current)) along at least one direction. An electrically conductive particle can have an electrical resistivity of no more than 20 μΩ cm, or no more than 10 μΩ cm, or no more than 5 μΩ cm, for example. Magnetic and electric properties are determined at 20° C., unless indicated differently.

An "electrically insulative" item is an item having an electrical resistivity of at least 100Ω m (evaluated at low frequencies (e.g., about 1 kHz or less) or evaluated statically (direct current)) along each direction. An electrically conductive particle can have an electrical resistivity of at least 1 kΩ m, or at least 1 MΩ m, or at least 1 GΩ m, for example.

A "dielectric particle" is a particle having a real part of dielectric constant greater than 1.8 for at least one frequency less than about 1 GHz. In some cases, the dielectric constant is greater than 2, 3, 5, or 10 for at least one frequency less than about 1 GHz. A dielectric particle is typically an electrically insulative particle. The dielectric constant may also be referred to as the relative permittivity.

The term "orientation", "orient", "orienting", or "oriented" as it refers to the particles of the present disclosure can refer to a non-random disposition of at least a majority of the particles relative to a substrate, which is sometimes referred to as a backing herein, or relative to a major surface of the layer including the particles, or relative to a thickness direction of the layer. For example, a majority of the particles can have a major planar surface disposed at an angle of at least 70 degrees relative to a first major surface of the substrate after application of the magnetic field (or of no more than 30 degrees relative to a thickness direction of the substrate or a layer including the particles). These terms can also refer to major axes and dimensions of the particles themselves. For example, the particle maximum length, width and thickness are a function of a shape of the particle, and the shape may or may not be uniform. The present disclosure is in no way limited to any particular particle shape, dimensions, type, etc., and many exemplary magnetic particles useful with the present disclosure are described in greater detail below. However, with some shapes, the "length", "width" and "thickness" give rise to major faces and minor side faces. Regardless of an exact shape, any particle can have local Cartesian axes (e.g., principle axes) as shown in FIG. 1 u (length which can be the longest dimension along a principle axes), v (width), and w (thickness which can be the smallest dimension along a principle axes) defined. With these conventions, the particle w-axis is parallel with the maximum thickness, the particle u-axis is parallel with the maximum length, and the particle v-axis is parallel with the maximum width of the particle. As a point of reference, the particle axes can identified for each particle as a standalone object independent of the backing construction; each magnetic particle (along with the particle's local (uvw) coordinate system) can be manipulated by a magnetic field to cause the particle to achieve a desired orientation relative to a global (xyz) coordinate system, where the x-axis is down-web (length), the y-axis is cross-web (width), and the z-axis is normal to the xy-plane (thickness) Refer to FIG. 3 and additional FIGS. 2-23B. A "z-axis rotation orientation" of the particle can be defined by the particle's angular rotation about a z-axis passing through the particle and normal to the backing or parallel to the thickness direction. The orientation effected by the magnetic field(s) of the present disclosure can entail application of the magnetic field to alter or otherwise change a spatial arrangement of at least a majority of the plurality of the magnetic particles relative to the substrate and/or on a particle level to a desired range of rotational orientations about the particle in one or more of the z-axis, the y-axis and/or the x-axis to a range of rotational orientations about the particle axes.

The term "position", "positioning", "position", or "position" as it refers to particles of the present disclosure can refer to a non-random disposition of at least a majority of the particles relative to one another. For example, a majority of the particles may be spaced a desired distance apart in at least one axis after application of the magnetic field.

The term "alignment", "aligning", "aligned", or "align" as it refers to the particles of the present disclosure can refer to a non-random positioning of at least a majority of the particles. Specifically, having "alignment" can position a majority of the particles such that a majority of the particles have major surfaces that are substantially parallel with one another substantially orthogonal to one another, and/or are oriented at a desired angle with respect to one another.

The term "desired structure" means a structure formed from a plurality of particles where at least a majority of the plurality of particles have one or more of an orientation, position, and/or alignment relative to one another and/or the substrate that has been affected by application of the magnetic field(s).

The term "vitrification", "vitrified", "vitrifying", or "vitrify" as it refers to the resin mixture containing the magnetic particles and/or other particles means increasing the viscosity of the resin mixture so as to enable at least a majority of the particles maintain their desired structure after application of the magnetic field(s). Vitrification may be only partially accomplished to a sufficient amount so as to enable at least a majority of the magnetic particles maintain their desired structure after application of the magnetic field(s). Vitrification may occur via polymerization (e.g. radiation curable or thermally curable resin systems), solidification through removal of thermal energy (e.g. solidification of a polymer melt), or evaporation of a solvent from the resin mixture. The terms "Cure", "Cure 1" and "Cure 2" as used in this document are all vitrification processes.

Magnetic particles are described herein by way of example and can have various configurations. For example, the magnetic particles can be constructed of various materials including but not limited to ceramics, metal alloy powder, metal alloys, glass particles coated to be magnetizable, or composites, for example. Similarly, the magnetic particles can be substantially entirely constructed of magnetizable material, can have magnetizable portions disposed therein (e.g., ferrous traces), or can have magnetizable portions disposed as layers on one or more surfaces thereof (e.g., one or more surfaces can be coated with a magnetizable material) according to some examples. The magnetic particles, or other particles, can be shaped according to some examples, such as shown in the example of FIG. 1. According to some examples, the particles can include flakes, crush grains, agglomerates, substantially spherical particles (e.g., particles that are nominally spherical or particles that can reasonably be considered to be approximately spherical), substantially ellipsoidal particles (e.g., particles that are nominally ellipsoidal or particles that can reasonably be considered to be approximately ellipsoidal), and/or substantially spheroidal particles (e.g., particles that are nominally spheroidal or particles that can reasonably be considered approximately spheroidal), for example. The particles can be used in loose form (e.g., free-flowing or in a slurry) prior to cure and can be incorporated into various articles including the films or layers discussed herein.

Referring now to FIGS. 1 and 1A, an exemplary magnetic particle 100 is disclosed. The magnetic particle 100 can have a shaped body 110 that has been coated with a magnetizable and/or magnetically permeable and/or magnetically responsive material 120. According to some examples, the body 110 need not be shaped but can be random. Furthermore, the body 110 can be formed of a magnetic material (magnetizable and/or magnetically permeable material) and need not be coated. The magnetic material 120 can include magnetic particles 125 (e.g., iron) retained in a binder matrix 130 (also referred to simply as "binder") as further shown in FIG. 1A. If shaped, as it need not be in many embodiments, but as shown in the embodiment of FIG. 1, the body 110 can have two opposed major surfaces 160, 162 connected to each other by four minor side surfaces 140*a*, 140*b*, 140*c* and 140*d*. Magnetic particles of the type shown can be moveable to align with magnetic field lines of force as will be discussed subsequently to form desired structures.

The magnetic material 120 can be a unitary magnetic material, or it can include magnetic particles in a binder matrix. Suitable binders can be vitreous or organic, for example, as described for the binder matrix 130 hereinbelow. The binder matrix can be, for example selected from those vitreous and organic binders. The body 110 can include ferrous materials or non-ferrous material(s), for example.

If the magnetic material includes a layer coated on the particle 100 as shown in the embodiment of FIG. 1, this can be accomplished by any suitable method such as, for example, dip coating, spraying, painting, physical vapor deposition, and powder coating. Individual magnetic particles can have magnetic layers (layers that include magnetic materials) with different degrees of coverage and/or locations of coverage. The magnetic material can be essentially free of (i.e., containing less than 5 weight percent of, in yet other cases containing less than 1 weight percent of) materials used in the shaped body 110. The magnetic layer can consist essentially of magnetic materials (e.g., >99 to 100 percent by weight of vapor coated metals and alloys thereof), or it can contain magnetic particles retained in a binder matrix. The binder matrix of the magnetic layer, if present, can be inorganic (e.g., vitreous) or organic resin based, and is typically formed from a respective binder precursor.

Magnetic particles according to the present disclosure can be prepared, for example, by applying a magnetic layer or precursor thereof to the body 110. Magnetic layers can be provided by physical vapor deposition as discussed hereinbelow. Magnetic layer precursors can be provided as a dispersion or slurry in a liquid vehicle. The dispersion or slurry vehicle and can be made by simple mixing of its components (e.g., magnetic particles, optional binder precursor, and liquid vehicle), for example. Exemplary liquid vehicles include water, alcohols (e.g., methanol, ethanol, propanol, butanol, ethylene glycol monomethyl ether), ethers (e.g., glyme, diglyme), and combinations thereof. The dispersion or slurry can contain additional components such as, for example, dispersant, surfactant, mold release agent, colorant, defoamer, and rheology modifier. Typically, after coating onto the ceramic bodies the magnetic layer precursor is dried to remove most or all of the liquid vehicle, although this is not a requirement. If a curable binder precursor is used, then a curing step (e.g., heating and/or exposure to actinic radiation) generally follows to provide the magnetic layer.

Vitreous binder can be produced from a precursor composition including a mixture or combination of one or more raw materials that when heated to a high temperature melt and/or fuse to form a vitreous binder matrix. Further disclosure of appropriate vitreous binders that can be used with the article can be found in PCT Publication Nos. WO 2018/080703, WO 2018/080756, WO 2018/080704, WO 2018/080705, WO 2018/080765, WO 2018/080784, WO 2018/080755, and WO 2018/080799, for example.

In some embodiments, the magnetic layer can be deposited using a vapor deposition technique such as, for example, physical vapor deposition (PVD) including magnetron sputtering. PVD metallization of various metals, metal oxides and metallic alloys is disclosed in, for example, U.S. Pat. No. 4,612,242 (Vesley) and U.S. Pat. No. 7,727,931 (Brey et al.). Magnetic layers can typically be prepared in this general manner.

As discussed previously, the body of the magnetic particle can be shaped (e.g., precisely-shaped) or random (e.g., flake, crushed). Exemplary shapes include squares, spheres, rectangles, pyramids (e.g., 3-, 4-, 5-, or 6-sided pyramids), truncated pyramids (e.g., 3-, 4-, 5-, or 6-sided truncated pyramids), cones, truncated cones, rods (e.g., cylindrical, vermiform), prisms (e.g., 3-, 4-, 5-, or 6-sided prisms), spheres, spheroids, and ellipsoids. A flake can have a thickness small (e.g., smaller by a factor of at least 4, or at least 8) compared to a largest lateral dimension of the flake and may have an irregular edge shape, for example.

Exemplary magnetic materials that can be suitable for use in magnetic particles can include: iron; cobalt; nickel; various alloys of nickel and iron marketed as Permalloy in various grades; various alloys of iron, nickel and cobalt marketed as Fernico, Kovar, FerNiCo I, or FerNiCo II; various alloys of iron, aluminum, nickel, cobalt, and sometimes also copper and/or titanium marketed as Alnico in various grades; alloys of iron, silicon, and aluminum (typically about 85:9:6 by weight) marketed as Sendust alloy; Heusler alloys (e.g., $Cu_2MnSn$); manganese bismuthide (also known as Bismanol); rare earth magnetizable materials such as gadolinium, dysprosium, holmium, europium oxide, alloys of neodymium, iron and boron (e.g., $Nd_2Fe_{14}B$), and alloys of samarium and cobalt (e.g., $SmCo_5$); MnSb; $MnOFe_2O_3$; $Y_3Fe_5O_{12}$; $CrO_2$; MnAs; and ferrites such as magnetite; zinc ferrite; nickel ferrite; cobalt ferrite, magnesium ferrite, manganese zinc ferrite, barium ferrite, and strontium ferrite; yttrium iron garnet; and combinations of the foregoing such as nickel zinc ferrite, cobalt nickel zinc ferrite, and magnesium manganese zinc ferrite. In some embodiments, the magnetic material includes at least one metal selected from iron, nickel, and cobalt, an alloy of two or more such metals, or an alloy of at one such metal with at least one element selected from phosphorus and manganese. In some embodiments, the magnetic material is an alloy (e.g., Alnico alloy) containing 8 to 12 weight percent (wt. %) aluminum, 15 to 26 wt. % nickel, 5 to 24 wt. % cobalt, up to 6 wt. % copper, up to 1 wt. % titanium, where the balance of material to add up to 100 wt. % is iron. In some embodiments, the magnetic particles are carbonyl iron particles. Carbonyl iron can be prepared by the chemical decomposition of purified iron pentacarbonyl. In some embodiments, the magnetic particles include iron. In some embodiments, the magnetic particles include carbon and iron. In some embodiments, the magnetic particles include nickel.

The magnetic particles can have a major dimension of any size relative to a thickness of the layer they are a part of but can be much smaller than the thickness of the layer in some instances. For example, they can be 1 to 2000 times smaller in some embodiments, in yet other embodiments 100 to 2000 times smaller, and in yet other embodiments 500 to 2000 times smaller, although other sizes can also be used.

Suitable magnetic particles include particles formed from any of the magnetic materials described elsewhere, optionally coated with another material, and particles formed from a nonmagnetic material and coated with a magnetic material. For example, suitable magnetic particles include nickel coated graphite, nickel coated glass, nickel coated polymer (e.g., nickel coated polymethylmethacrylate (PMMA) particles), and silver coated nickel.

In some embodiments, a film or layer includes first and second particles. The first particles can be magnetic particles. The second particles can be one or more of dielectric particles, electrically conductive particles, or thermally conductive particles. Suitable electrically conductive particles include silver coated nickel, silver coated glass, and metallic particles such as copper or silver particles. Suitable dielectric particles include one or more of copper oxide (e.g., heat treated Cu(II) oxide), carbon, or $BaTiO_3$. Suitable thermally conductive particles include alumina particles (e.g., alpha alumina powder, substantially spherical alumina particles, or polyhedral alumina), boron nitride particles (e.g., boron nitride flakes or substantially spherical boron nitride particles), metallic particles, and metal oxides, carbides, hydrates or nitrides.

In some embodiments, a film or layer includes first and second particles. In some embodiments, the first particles include carbon and iron. In some embodiments, the first particles include at least one of iron or nickel. In some embodiments, the second particles include copper oxide. In some embodiments, the second particles include at least one of alumina or boron nitride. In some embodiments, the second particles include at least one of silver and copper. In some embodiments, the first particles include one or more of iron or nickel, and the second particles include one or more of aluminum, magnesium, silicon, copper, or zinc. An advantage of such embodiments is that a high thermal conductivity for a given filler loading, or a low filler loading for a given thermal conductivity, can be achieved with cost effective fillers. The aluminum, magnesium, silicon, copper, or zinc may or may not be in their elemental form. For example, an aluminum particle contains aluminum in its elemental form, while an alumina particle contains aluminum not in its elemental form. The second particles can be or include aluminum, alumina (aluminum oxide), aluminum trihdrate (ATH), silica (silicon oxide), magnesium oxide, silicon carbide, copper, zinc oxide, aluminum nitride, or silver, for example. In some embodiments, the second particles have an isotropic thermal conductivity. In other embodiments, the second particles have an anisotropic thermal conductivity (e.g., boron nitride flakes or graphite flakes typically have a substantially higher in-plane conductivity than out of plane thermal conductivity).

FIG. 2 is a photograph of a film 200 with a plurality of magnetic particles 202 that have been organized into a desired structure with a majority of the magnetic particles exhibiting a non-random positioning along lines of force due to the application of a magnetic field. As shown in FIG. 2, at least a majority of the magnetic particles 202 are aligned and spaced into a desired structure 204 having distinctive rows. In FIG. 2, the plurality of magnetic particles 202 are Sendust particles. Other magnetic particles described herein could be used in place of the Sendust particles. The Sendust particles account for substantially 20% of the film by weight percentage and are applied as a slurry onto a substrate. The Sendust particles are initially dispersed in a resin in a random manner.

The type of resin chosen can depend on the desired application. For example, it may be desired for the cured resin to be a pressure-sensitive adhesive (PSA) in some applications (e.g., electrically conductive tape), while in other applications, it is desired that the cured resin be free of tackiness, and in still other applications some degree of tack is desired but less tack than that of a typical PSA. Suitable resins include acrylics, silicones, urethanes, and epoxies, for example. The resin can include suitable curing agents (e.g., amines such as tetraethylenepentamine in epoxy systems), and/or rheology modifiers such as diluents, for example.

Types of resin families that can be used include but are not limited to: a combination of a first and a second polymerizable component selected from (meth)acrylate monomers and (meth)acrylate oligomers, and mixtures thereof. As used herein, "monomer" or "oligomer" is any substance that can be converted into a polymer. The term "(meth)acrylate" refers to both acrylate and methacrylate compounds. In some cases, the polymerizable composition can include a (meth) acrylated urethane oligomer, (meth)acrylated epoxy oligomer, (meth)acrylated polyester oligomer, a (meth)acrylated phenolic oligomer, a (meth)acrylated acrylic oligomer, and mixtures thereof. The polymerizable resin optionally further includes at least one crosslinker having three or more (meth)acrylate groups. The polymerizable composition may optionally include a (e.g. monofunctional) reactive diluent. The polymerizable resin can be a radiation curable polymeric resin, such as a UV curable resin. Radiation (e.g. UV) curable compositions generally include at least one photoinitiator. The photoinitiator or combination of photinitiators can be used at a concentration of about 0.1 to about 10 weight percent. More preferably, the photoinitiator or combination thereof is used at a concentration of about 0.2 to about 3 weight percent. In general, the photoinitiator(s) are at least partially soluble (e.g. at the processing temperature of the resin) and substantially colorless after being polymerized. The photoinitiator may be (e.g. yellow) colored, provided that the photoinitiator is rendered substantially colorless after exposure to the UV light source. Types of resin families can also include but are not limited to: a polymerizable resin including of high molecular weight polymers, epoxides and/or siloxanes.

The resin can be at least partially cured after the Sendust particles are organized into the desired structure by the applied magnetic field. Due to the high aspect ratio of the Sendust flakes, there can be initially little to no transmission through the slurry prior to organization by the magnetic field. Once the magnetic field is applied, the Sendust particles are organized into the desired structure, with the field lines orienting the Sendust particles (flakes) upward and aligning them relative to one another.

FIG. 3 shows a method 300 for making a layer or film 302 according to some embodiments of the present disclosure. FIG. 3A shows a desired structure 304 of the plurality of particles 306 that results from the magnetic field of the method of FIG. 3. Particles 306 can be magnetic particles, or particles 306 can be particles that are ordered and/or aligned and/or positioned due to the presence of other particles which are magnetic particles. It should be noted that in FIG. 3A, and in the subsequently shown and described methods and the desired structures of FIGS. 4-23A, that the desired structures, methods and films are shown on a larger scale (high level) such that individual particles of the plurality of particles are not specifically shown. Thus, each row or layer (shown as a line) of the desired structures will include some of the plurality of the particles. It should be recognized that the desired structures include the plurality of particles, which may be spaced from one another even when grouped in rows or layers as shown in FIG. 2. It should be further recognized that for the disclosed methods a majority (or more) of the plurality of particles may exhibit the desired structure and the desired structures shown herein are often shown in a highly schematic manner that does not show some degree of randomness that can occur in the orientation, alignment and/or positioning of at least some (e.g., less than a majority) of the particles. This randomness is shown in some areas of the film of FIG. 2.

Figure 3B:
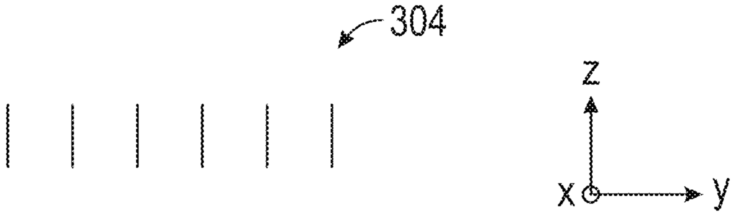
FIG. 3B is a schematic cross-sectional view of FIG. 3A along the line at 3B-3B in FIG. 3A.

The method 300 is operable to provide the plurality of particles 306 with the desired structure 304 within the layer or film 302 as shown in FIG. 3A. FIG. 3B shows a cross-section of FIG. 3A showing the desired structure 304 from another perspective.

In some embodiments, a layer or film includes pluralities of first and second particles. In some embodiments, the first particles are magnetic particles and the second particles are electrically conductive and/or thermally conductive. The first particles may be magnetic while the second particles may be magnetic or nonmagnetic.

Figure 3C:
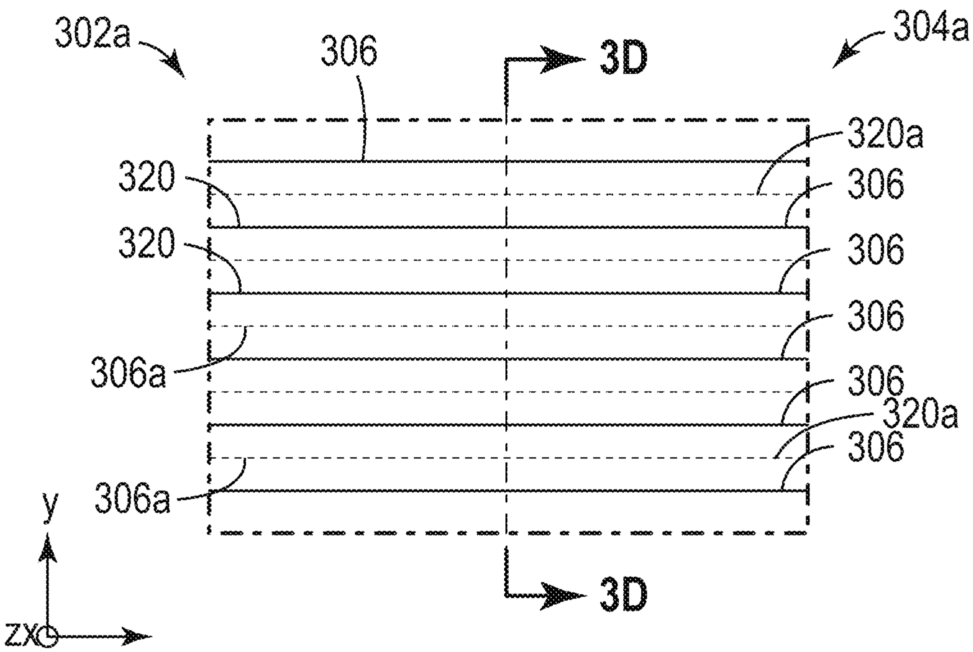
FIG. 3C is a schematic illustration of a desired structure of pluralities of particles that results from the method of FIG. 3 according to some embodiments of the present disclosure.

FIG. 3C shows a structure 304*a* of the plurality of first particles 306 and a plurality of second particles 306*a* in a layer or film 302*a* that can result from the magnetic field of the method of FIG. 3. FIG. 3D shows a cross-section of FIG. 3C showing the desired structure 304*a* from another perspective. The first particles 306 are arranged in layers 320 and the second particles 306*a* are arranged in layers 320*a*.

Figure 3D:
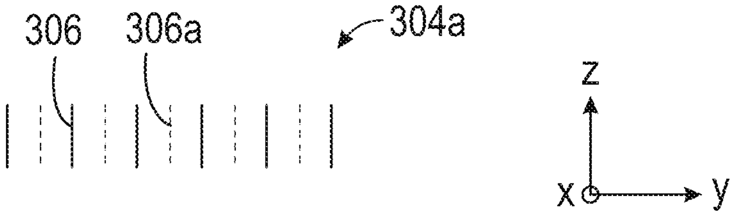
FIG. 3D is a schematic cross-sectional view of FIG. 3C along the line at 3D-3D in FIG. 3C.
Figure 3E:
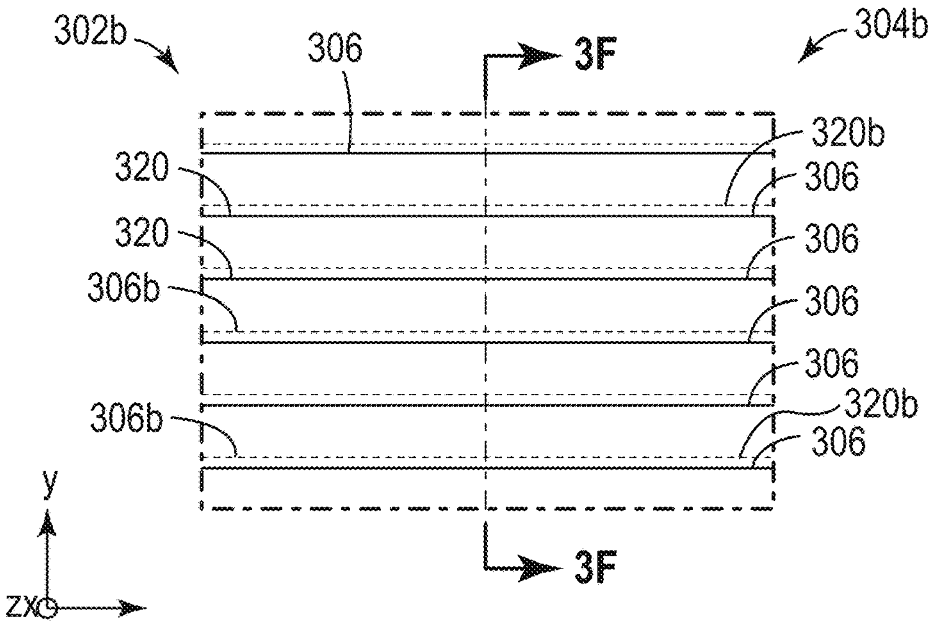
FIG. 3E is a schematic illustration of another desired structure of pluralities of particles that results from the method of FIG. 3 according to some embodiments of the present disclosure.

FIG. 3E shows a structure 304*b* of the plurality of first particles 306 and a plurality of second particles 306*b* in a layer or film 302*b* that can result from the magnetic field of the method of FIG. 3. FIG. 3F shows a cross-section of FIG. 3E showing the structure 304*b* from another perspective. The first particles 306 are arranged in layers 320 and the second particles 306*b* are arranged in layers 320*b* which may be substantially coincident with layers 320 (e.g., the first and second particles can be mixed in a same layer).

Figure 3F:
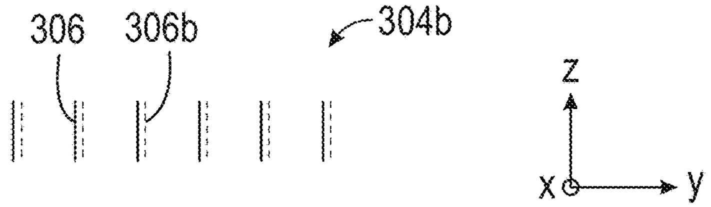
FIG. 3F is a schematic cross-sectional view of FIG. 3EC along the line at 3F-3F in FIG. 3E.

Whether the first and second particles form coincident or alternating layers typically depend of the magnetic properties of the particles and in some cases on the size of the particles. In the embodiment of FIGS. 3C-3D, first particles 306 can be magnetic particles and the second particles 306*a* can be nonmagnetic or substantially less magnetic than the first particles 306. For example, the first and second particles can have respective first and second respective real parts of relative magnetic permeability $\mu'_1$ and $\mu'_2$ where for at least one frequency less than about 1 GHz, $\mu'_1/\mu'_2 \geq 5$. The relative magnetic permeability of a particle may be taken to be the relative magnetic permeability of the bulk material making up the particle, or in the case of a composite particle, the relative magnetic permeability may be taken to be the effective relative permeability as determined by effective medium theories such as the magnetic Clausius-Mossotti or Maxwell-Garnett models. The second particles 306*a* can have a size comparable to or larger than the first particles 306, for example. If the second particles 306*a* were much smaller than the first particles 306, the second particles 306*a* could be substantially randomly distributed between layers of the first particles 306. In some embodiments, an average spacing between substantially continuous layers of the first particles 306 is less than an average longest dimension of the second particles 306*a* (see, e.g., FIG. 52A). In the embodiment of FIGS. 3E-3F, the first and second particles 306 and 306*b* can both be magnetic particles (e.g., each having a relative magnetic permeability of at least 2 for at least one frequency less than about 1 GHz). Particles having similar magnetic properties tend to be arranged in the same layers.

In some embodiments, for at least one cross-section of the layer or film and for each of the first and second particles, the particle has alternating higher and lower densities, the higher density including a plurality of the particle. A particle has alternating higher and lower densities when a density of the particle alternates along at least one direction defining higher and lower density regions of the particle. The higher density of the particle includes a plurality of the particle when each higher density region includes a plurality of the particle. In other words, in some embodiments, for at least one cross-section of the layer or film, the first particles are distributed in alternating higher and lower density regions where each higher density region of the first particles includes a plurality of the first particles, and the second particles are distributed in alternating higher and lower density regions where each higher density region of the second particles includes a plurality of the second particles. In some embodiments, in the at least one cross-section of the layer or film, the higher densities of the first particle alternate with the higher densities of the second particle (see FIG. 3C-3D). In some embodiments, in the at least one cross-section of the layer or film, the first and second particles have substantially coincident alternating higher and lower densities (see FIG. 3E-3F). For example, the higher and lower densities may occur within a same layer and may be coincident to within the thickness of the layer.

The plurality of particles 306 can have a construction similar to the magnetic particles illustrated or described elsewhere herein. According to some embodiments and now referencing FIG. 3, the particles can be dispersed in a resin to form a first mixture 308. The resin can have a composition the same as the examples provided in reference to FIG. 2, for example. The first mixture 308 can be positioned on a web 310 (including a substrate 312). The plurality of particles 306, or total of the first particles 306 and second particles 306*a* or 306*b*, can be anywhere from 0.010% to 90% percent by weight of the first mixture 308. The particular chemical composition and thickness of the substrate 312 can depend on the desired attributes of the particular product that is being constructed. That is, balancing the needs for strength, temperature resistance, surface energy, adherence to the coated layer, among others. The thickness of the substrate 312 is typically at least about 0.025 millimeters (mm) and more typically at least about 0.125 mm. Further, the substrate 312 generally has a thickness of no more than about 0.5 mm.

Useful substrate materials include, for example, styrene-acrylonitrile, cellulose acetate butyrate, cellulose acetate propionate, cellulose triacetate, polyether sulfone, polymethyl methacrylate, polyurethane, polyester, polycarbonate, polyvinyl chloride, polystyrene, polyethylene naphthalate, copolymers or blends based on naphthalene dicarboxylic acids, polyolefin-based material such as cast or orientated films of polyethylene, polypropylene, and polycyclo-olefins, polyimides, and glass. Optionally, the substrate material can contain mixtures or combinations of these materials. In an embodiment, the substrate may be multilayered or may contain a dispersed component suspended or dispersed in a continuous phase. In some embodiments, after the resin is cured, the substrate is removed. For example, the substrate can be a release liner or a carrier layer that is removed from the layer before the layer is used in an application.

Further examples of substrates include polyethylene terephthalate (PET) and polycarbonate. Examples of useful PET films include photograde polyethylene terephthalate and available from DuPont Films of Wilmington, Del. under the trade designation "Melinex 618".

Optionally, a second substrate (which can be similar or dissimilar in composition and thickness as the first substrate 312) may be laminated (e.g., bonded (permanently or releasably) using an adhesive) to the film 302 to protect the coated layer or to provide a desired physical property to the resulting film, for example.

The first mixture 308 can be applied up-web of a magnet 314 (permanent or electromagnet). A magnet, such as magnet 314, can be an individual magnet or an assembly of magnets that can act like a single magnet, for example. The magnet 314 can be placed in close proximity (within a few feet) of the web 310 containing the first mixture 308 of the plurality of particles 306 (and optionally particles 306*a* and/or 306*b*) and resin. A Cartesian coordinate system is provided in FIGS. 3 and 3B to aid in understanding the positioning of the web 310 relative to the magnet 314 and in understanding the desired structure 304 of FIG. 3A. According to the embodiment shown, the Cartesian coordinate system provided can have an axis (x-axis) oriented in the down-web/up-web direction. The (y-axis) substantially aligns with a cross-web direction of the web 310 and with an axis of rotation AR of the magnet 314. The (z-axis) substantially aligns normal to both of the x-axis and y-axis.

Figure 4:
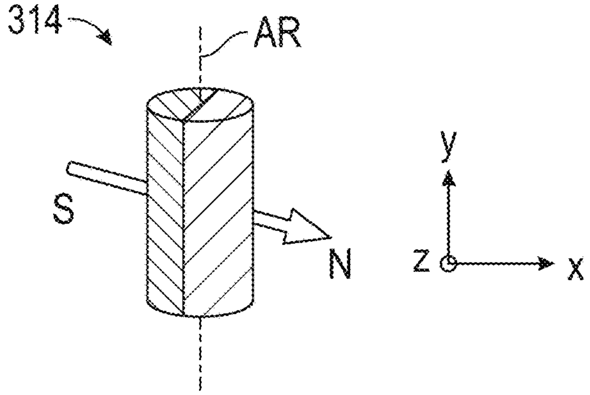
FIG. 4 is a schematic view of an example of a magnet according to some embodiments of the present disclosure.
Figure 4A:
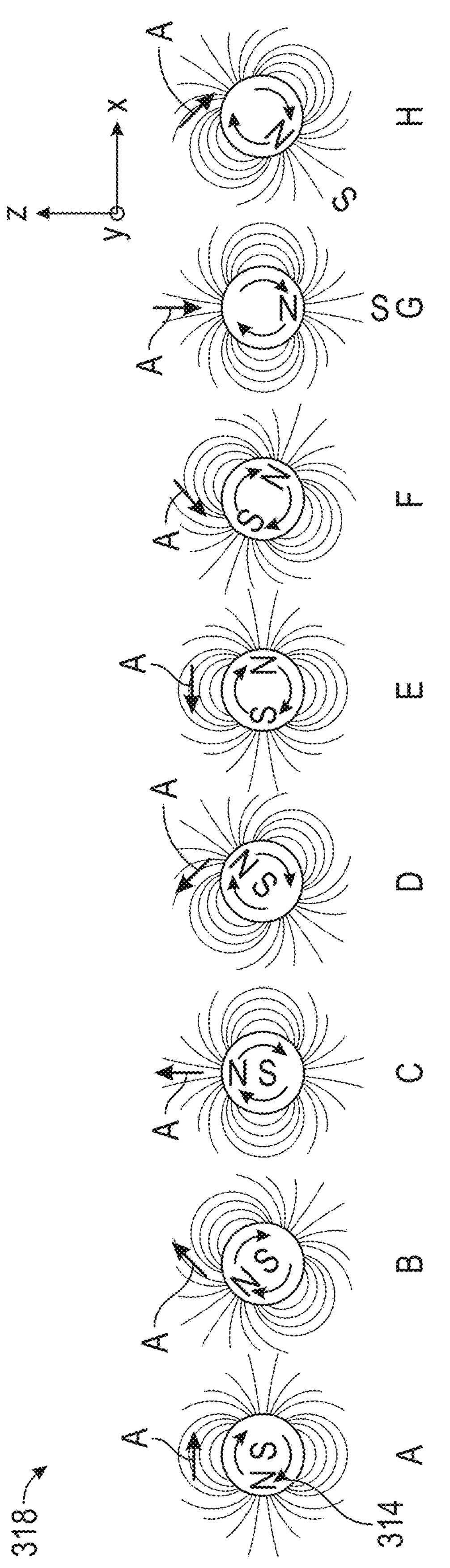
FIG. 4A is a schematic view showing the magnet of FIG. 4 with the magnetic field having rotating modulating as a result of rotation of the magnet according to some embodiments of the present disclosure.

As shown in the example of FIG. 3, the magnet 314 is rotated about the axis of rotation AR relative to the web 310. The rotational speed of the magnet can be between 100 to 10,000 rpm or more. The web 310 can translate relative to the magnet 314 as indicated by arrow 316. FIGS. 4 and 4A show construction of the magnet 314 in further detail. FIG. 4 shows the magnet 314 can include two poles N and S that are each shaped as hemispheres and are disposed to either side of the axis of rotation AR. FIG. 4A shows a magnetic field 318 that is generated by the magnet 314 and rotating modulation of the magnetic field 318 that results from rotation of the magnet 314 about the axis of rotation AR (FIGS. 3 and 4). The film 302 and other details of the method 300 of FIG. 3 are not shown in FIG. 4A. The resolved line of force that would be exerted on the magnetic particles in the coated layer is indicated by arrows A in FIG. 4A.

Further examples of magnetic field configurations and apparatuses for generating them are described in U.S. Patent Appl. Pub. Nos. 2008/0289262 A1 (Gao) and U.S. Pat. No. 2,370,636 (Carlton), U.S. Pat. No. 2,857,879 (Johnson), U.S. Pat. No. 3,625,666 (James), U.S. Pat. No. 4,008,055 (Phaal), U.S. Pat. No. 5,181,939 (Neff), and British Pat. No. GB 1 477 767 (Edenville Engineering Works Limited), which are each hereby incorporated herein by reference to the extent that it does not contradict the present disclosure.

Returning now to FIG. 3, according to the example embodiment, the magnet 314 is positioned to extend across a full cross-web extend of the web 310 in the y-axis direction of the Cartesian coordinate system provided. However, in some embodiments the magnet 314 may not extend the full cross-web width as shown in FIG. 3. FIG. 3 additionally shows the method 300 applies at least one cure to the layer or film 302, indicated as Cure 1 in FIG. 3. The Cure 1 is applied in close proximity (within a few inches up-web or down-web) of the magnet 314. The Cure 1 can be applied by any known technique such as, but not limited to, application of ultraviolet light, application of electron beam, application or removal of thermal energy (e.g., applying heating or cooling), for example. As shown in FIG. 4A, as the magnetic field 318 is undergoing rotating modulation, the application of Cure 1 should be applied to the layer or film 302 at a particular time and location where the lines of force and resolved force is oriented in a desired manner in order that the plurality of particles are in the desired structure 304, 304*a*, or 304*b* (FIGS. 3A-3F). The Cure 1 can be a full cure (i.e. full polymerization of the resin can occur) or can be a partial cure with sufficient polymerization such that a majority of the particles are in the desired structure. With a full cure no second cure (indicated as Cure 2) would be needed in the method of FIG. 3. FIG. 3 shows the method 300 having a partial cure (Cure 1) and a second cure (Cure 2) at a down-web location to complete full polymerization.

Thus, the method 300 of FIG. 3 can include positioning the first mixture 308 on the substrate 312. The first mixture 308 can include the plurality of particles 306 and optionally particles 306*a* and/or 306*b* dispersed in the first resin. The method 300 can include assembling the plurality of particles into the desired structure by rotating modulation of at least the magnetic field 318 relative to the plurality of particles. The method 300 can further include vitrifying (such as by the Cure 1 and/or the Cure 2 discussed above) to increase a viscosity of the first resin while the particles are in the desired structure.

FIGS. 3A-3F shows the desired structure 304, 304*a*, and 304*b* at a high level and in a highly schematic manner. As shown in FIG. 3A, for example, the substrate 312 (FIG. 3) can be removed. However, in other embodiments the substrate 312 can be retained. As discussed previously, individual ones of the plurality of particles are not shown in FIGS. 3A-3F. FIG. 3A shows a configuration for the layer or film 302 with the desired structure 304 similar to that of the magnetic film 200 of FIG. 2. The desired structures 304, 304*a*, and 304*b* are structures where the particles are arranged in spaced rows or layers 320, 320*a* or 320*b* extending generally in the down-web direction.

The embodiments of FIGS. 3 and 3A-3F are described with application of the first mixture 308 as a single layer on the substrate. However, applications of multiple layers using the same mixture or different mixture compositions are also contemplated, and indeed, are further described and illustrated in this disclosure. As one illustrative example, a magnetic film can include two layers where one of the layers provides a high magnetic permeability in the thickness direction and in a first in-plane direction and where the other of the two layers provides a high magnetic permeability in the thickness direction and in a second in-plane direction not parallel to the first in-plane direction. In other embodiments, a single layer is preferred. In any embodiment describing desired structures in different layers, a single layer can be provided having the desired structure shown in any of the different layers.

Figure 5A:
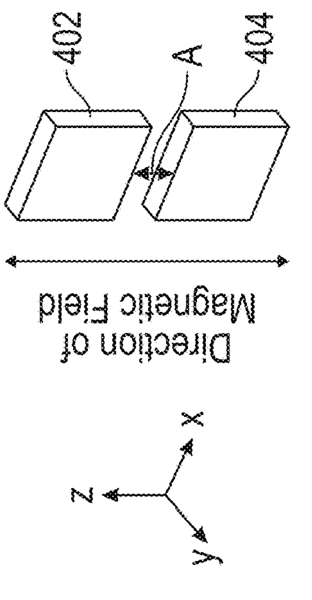
FIGS. 5A-5C are schematic illustrations of arrangements of a plurality of particles relative to one another cross-web, down-web and thickness direction according to some embodiments of the present disclosure.
Figure 5B:
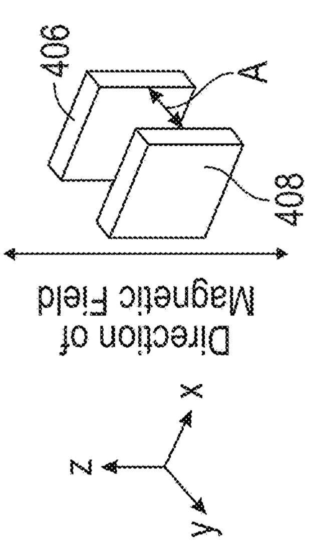
Figure 5C:
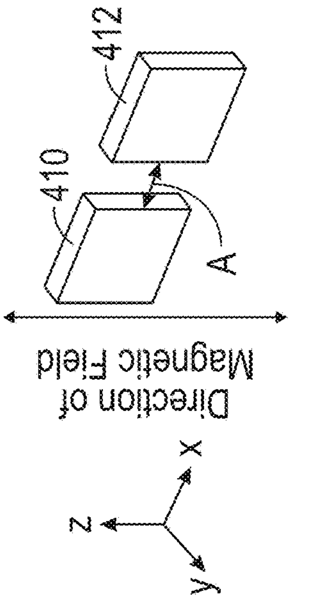

FIGS. 5A-5C show further potential orientations, positions and alignments of exemplary ones of the plurality of particles described herein. FIG. 5A shows a particular orientation for particles 402 and 404 with minor surfaces arranged in the z and x directions of the Cartesian coordinate system (same orientation system as utilized in FIGS. 3-4A) and the major surfaces oriented in the y-direction. Such orientation is purely exemplary in nature and is used for ease of reference and description. In the multilayer orientation of FIG. 5A the particles 402 and 404 are stacked and spaced from one another. In some embodiments, the particles 402 and 404 can be configured to be attracted or repelled from one another as indicated by arrow A.

FIG. 5B shows particles 406 and 408 that are spaced from one another in a cross-web direction. In some embodiments, the particles 406 and 408 can be configured to be attracted or repelled from one another as indicated by arrow A. FIG. 5C shows particles 410 and 412 that are spaced from one another in a cross-web direction. In some embodiments, the particles 410 and 412 can be configured to be attracted or repelled from one another as indicated by arrow A. Multiple arrangements of the plurality of particles (e.g., arrangements of FIG. 5A, FIG. 5B and/or FIG. 5B) are contemplated, and indeed, are disclosed herein.

Figure 6:
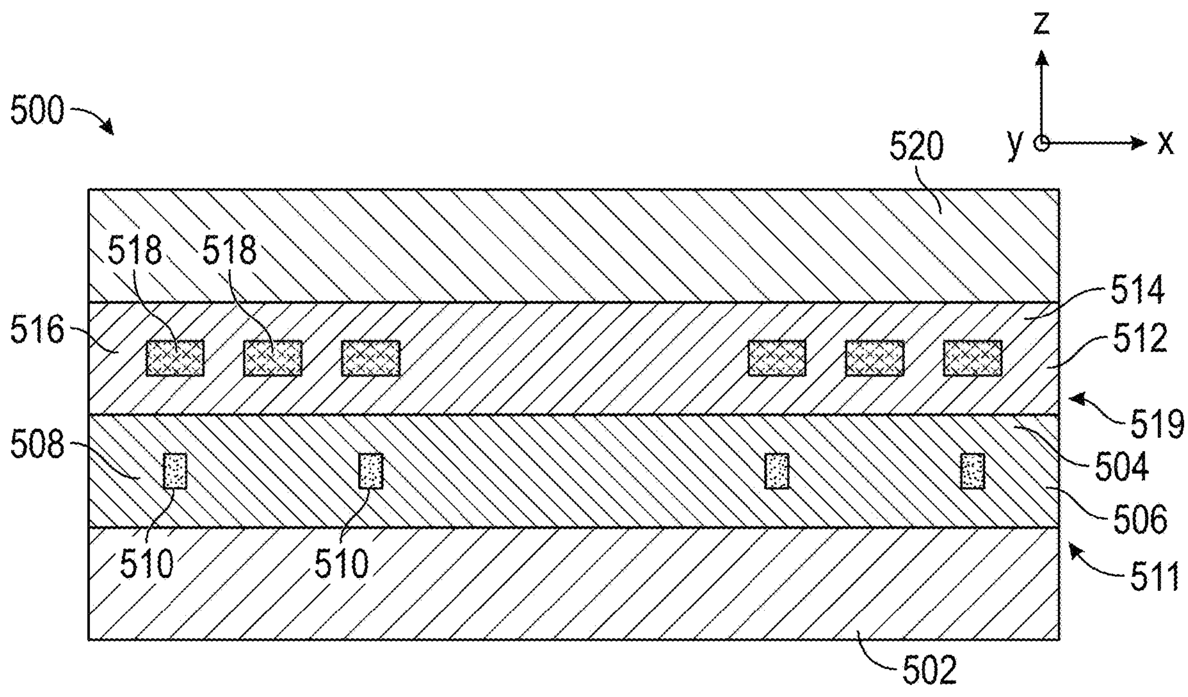
FIG. 6 is a schematic cross-section of an exemplary film produced by one of the methods discussed herein and having multiple layers, where some of the multiple layers contain a plurality of particles according to some embodiments of the present disclosure.

FIG. 6 shows one possible configuration for a film 500 having multiple layers. The film 500 can have a substrate 502 as previously described and a first layer 504. The first layer 504 can include a first mixture 506 of a first resin 508 and a first plurality of particles 510. The first layer 504 can be coupled to the substrate 502 either directly or indirectly. The relative size and spacing of the first plurality of particles 510 has been exaggerated for illustration purposes and viewer understanding in FIG. 6. As shown in FIG. 6, the first plurality of particles 510 have a first desired structure 511.

In FIG. 6, a second layer 512 can be coupled either directly or indirectly (via a second substrate for example) to the first layer 504. The second layer 512 can include a second mixture 514 of a second resin 516 and a second plurality of particles 518. The relative size and spacing of the second plurality of particles 518 has been exaggerated for illustration purposes and viewer understanding in FIG. 6. As shown in FIG. 6, the second plurality of particles 518 have a second desired structure 519. The second desired structure 519 can differ from or be substantially similar to the first desired structure 511.

The particles 510 and/or 518 may be magnetic particles, or other types of particles (e.g., electrically and/or thermally conductive) that are ordered by the presence of other particles (not shown in FIG. 6) which are magnetic as generally described for FIGS. 3C-3F, for example.

As shown in FIG. 6, the first plurality of particles 510 can have at least one of a shared first orientation or first common alignment direction relative to the substrate 502 and the second plurality of particles 518 can have at least one of a shared second orientation or second common alignment direction relative to the substrate 502. In FIG. 6, the shared first orientation or first common alignment direction differs from the shared second orientation or second common alignment direction.

Optionally, further layers can be added to the film 500 including layers having particles with further desired structures. The embodiment of FIG. 6 shows a further layer 520 that can be configured to provide a smooth surface to the film 500 along an opposing side of the film from the substrate 502. In other cases, the further layer 520 can provide a desired texturing or other physical attributes if desired.

Figure 7:
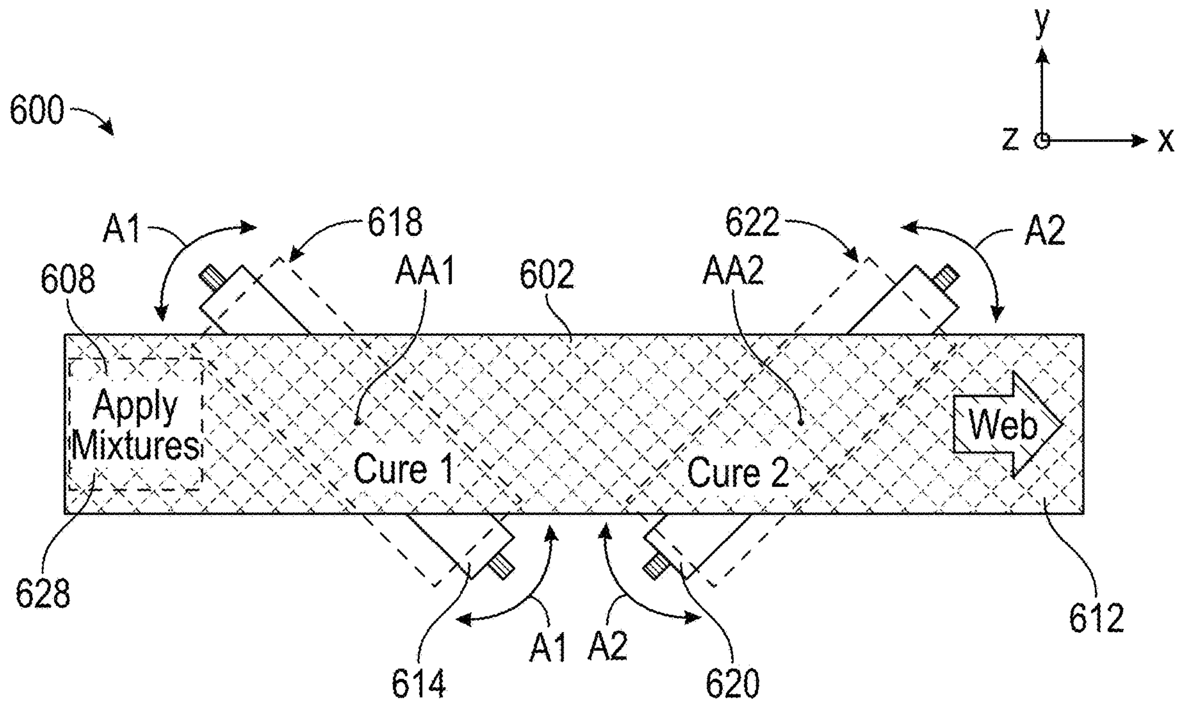
FIG. 7 is schematic view of a method of forming a film using two magnetic fields and two cures where a second plurality of particles assume a second desired structure according to some embodiments of the present disclosure.

FIG. 7 shows another method 600 of forming a film 602 with at least two layers. Unless otherwise further indicated for the remainder of this disclosure, the construct and arrangement of the magnet(s), resin(s), particles, substrate(s), etc. can be substantially similar to or the same as those previously described herein. Thus, for example, each magnet(s), unless otherwise indicated, undergoes rotation similar to that of the magnet 314 of FIGS. 3-4A. Thus, the magnetic field(s) generated by such magnet(s) are subject to rotating oscillation.

Figure 7A:
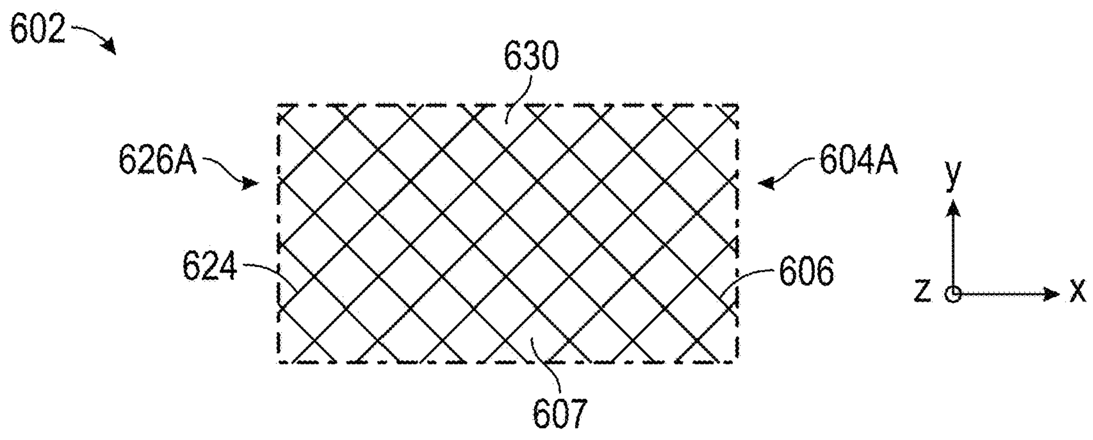
FIG. 7A is a schematic illustration of a desired structure for the pluralities of particles that results from the two magnetic fields of the embodiment method of FIG. 7.
Figure 7B:
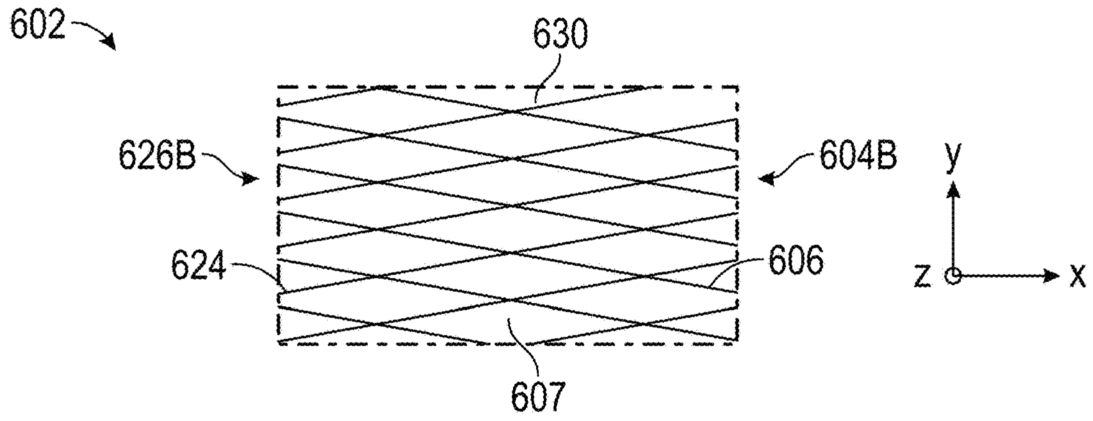
FIG. 7B is a schematic illustration of a desired structure for the of particles that results from the two magnetic fields being pivoted in a cross-web and down-web directions as indicated by arrows in FIG. 7.

The method 600 can include positioning the first mixture 608 (indicated in "Apply Mixtures") on a substrate 612. The first mixture 608 can include the plurality of (e.g., magnetic) particles 606 (see FIGS. 7A and 7B) dispersed in a first resin 607 (FIGS. 7A and 7B). The method 600 can include assembling the first plurality of particles 606 into the desired structure 604A or 604B (again reference FIGS. 7A and 7B) by rotating modulation of a first magnetic field 618 relative to the plurality of particles 606. The method 300 can further include vitrifying to increase a viscosity of the first resin (indicated as "Cure 1") while the plurality of particles 606 are in the desired structure 604A or 604B.

FIGS. 7A and 7B shows the desired structures 604A and 604B that can result from the method 600. These desired structures result from orienting the first magnet 614 and a second magnet 620 both cross-web and down-web relative to the film 602. This orientation of the first and second magnets 614 and 620 changes the magnetic fields 618 and 622 as applied to the first plurality of particles 606 and a second plurality of particles 624.

The orientation of the first magnet 614 can be changed relative to the film 602 as indicated by arrows A1 about axis AA1 in FIG. 7. Similarly, the orientation of the second magnet 620 can be changed relative to the film 602 as indicated by arrow A2 about axis AA2. By orienting the first magnet 614 and/or the second magnet 620 as desired relative to one another and to the film, different overall desired structures can be obtained including the first desired structures 604A and 604B (via orientation/re-orientation of the first magnet 614). FIGS. 7A and 7B further show second desired structures 626A and 626B for the second plurality of particles 624 that result from orientation/re-orientation of the second magnet 620. The second desired structures 626A combined with the first desired structures 604A provide the overall desired structures shown in FIG. 7A. The second desired structure 626B combined with the first desired structures 604B provide the overall desired structure shown in FIG. 7B. To reiterate, the overall desired structures of FIGS. 7A and 7B can differ due to the different orientation of the first magnet 614 and the second magnet 620.

It should be noted that FIGS. 7A and 7B provide just two examples of possible desired structures and further desired structures having different shapes due to the orientation of the first and second magnets relative to the film are also contemplated although not specifically shown. It should also be further noted that although FIGS. 7A and 7B appear to show the first desired structures 604A or 604B in a same layer as the second desired structures 626A or 626B, this is a result of the viewing orientation of FIGS. 7A and 7B, and that the first desired structures 604A or 604B would actually be positioned in a different layer of the film 602 than the second desired structures 626A or 626B.

Because the method 600 of FIG. 7 forms the film 602 with multiple layers, the method 600 can include forming a second mixture 628 (indicated in "Apply Mixtures") that includes the second plurality of particles 624 (FIGS. 7A and 7B) dispersed in a second resin 630. The method 600 can position the second mixture 628 on one or more of the substrate, a second substrate or the first mixture. The method 600 can assemble the second plurality of particles 624 into the second desired structure 626A or 626B further by rotating modulation of the second magnetic field 622 relative to the second plurality of particles 624. The method can increase a viscosity of the second resin 630 (indicated as Cure 2) while the second plurality of particles 624 are rows in the second desired structure 626A or 626B.

In some embodiments, the second mixture 628 and the first mixture 608 have one of a different composition or substantially a same composition. If the composition of the first mixture 608 and the second mixture 628 are substantially the same composition, the second mixture 628 can be positioned according to the method 700 of FIG. 8, after increasing the viscosity of the first resin 607 while the first plurality of particles is in the first desired structure 604A or 604B.

Figure 8:
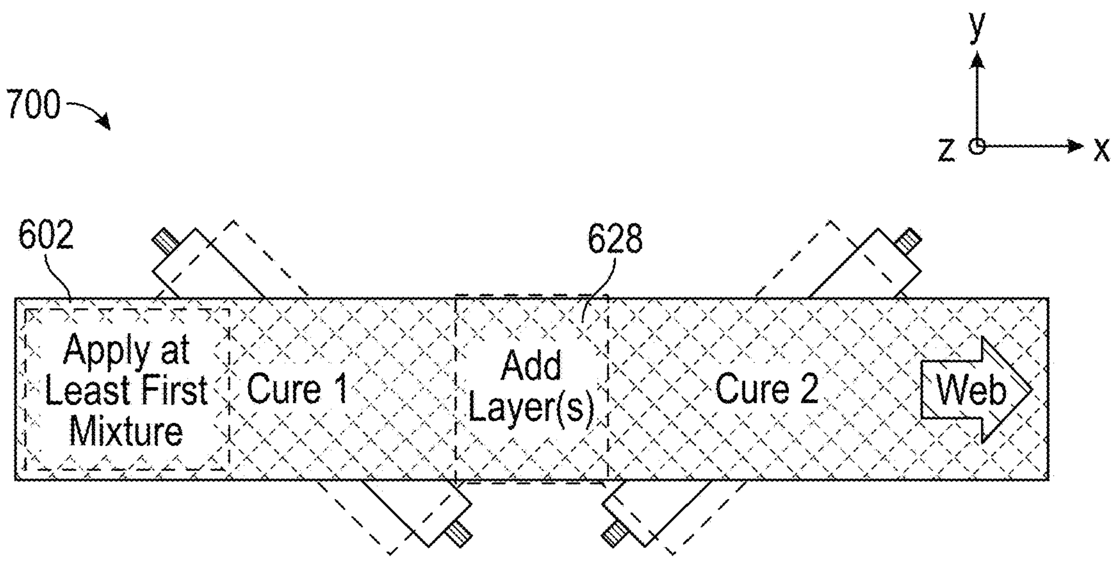
FIG. 8 is schematic view of a method of forming a film using two magnetic fields and two cures where some of the plurality of particles and a second resin are added after the first cure according to some embodiments of the present disclosure.

FIG. 8 shows a further method 700 of forming the film 602 with at least two layers. The method 700 differs from the method 600 of FIG. 7 in that the second mixture 628 can be applied to the web at the labeled ("Add Layer(s)") after the Cure 1 such that the second resin 630 (FIGS. 7A and 7B) is not cured with the first resin 607 (FIGS. 7A and 7B).

Figure 9:
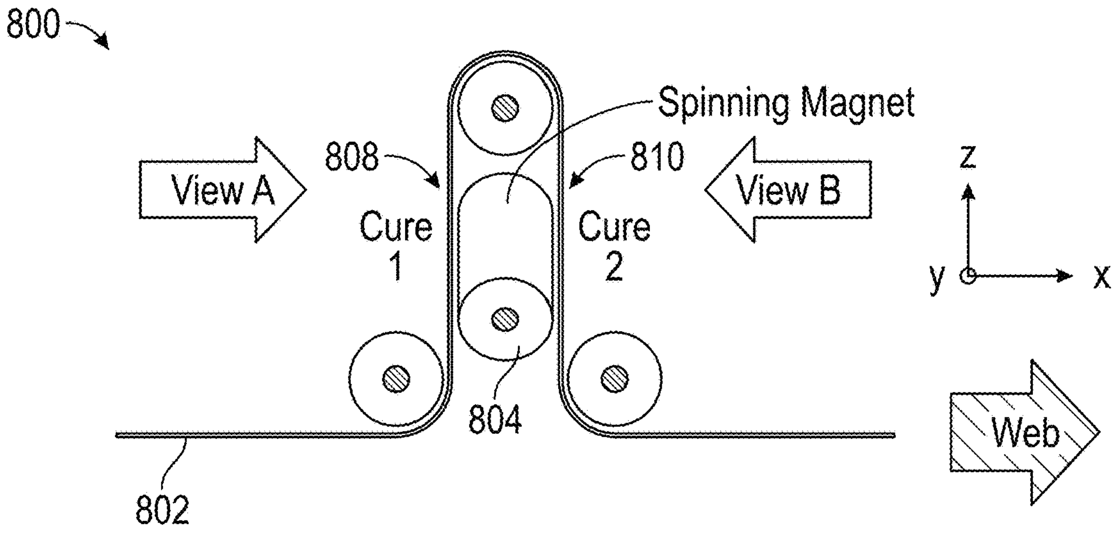
FIG. 9 is a schematic view of a method of forming a film with a web path around a single magnet where the single magnet applies a magnetic field with two different orientations relative to the plurality of particles and the web.
Figure 9A:
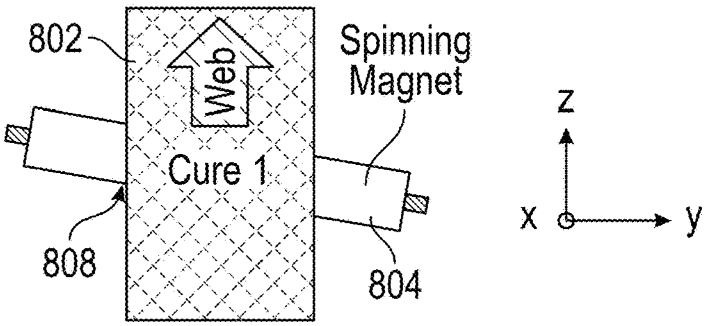
FIG. 9A is a schematic view taken from a first perspective in FIG. 9.
Figure 9B:
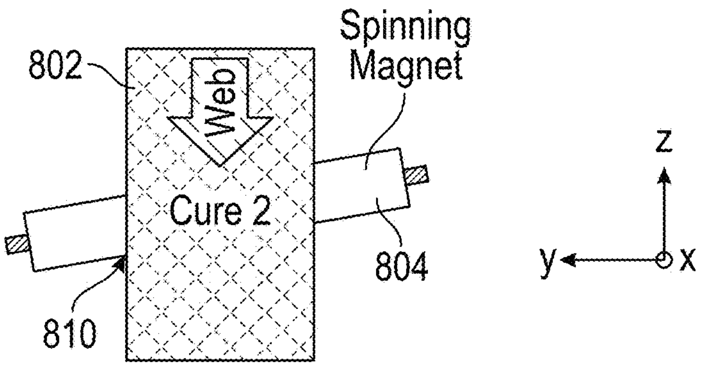
FIG. 9B is a schematic view taken from a second perspective in FIG. 9.
Figure 9C:
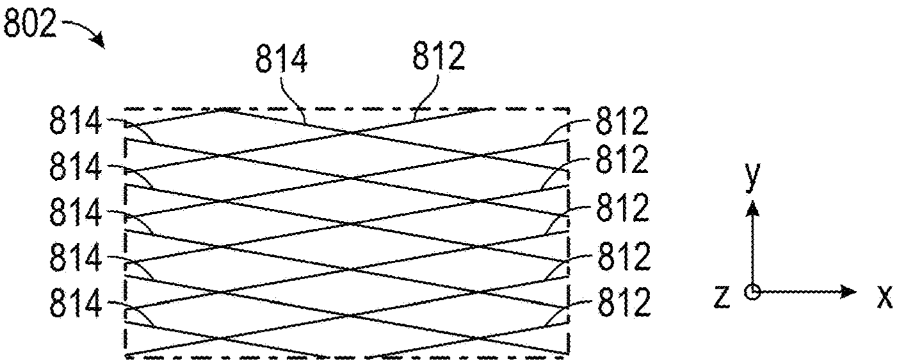
FIG. 9C is a schematic illustration of a desired structure for the particles that results from the two magnetic fields with only the single magnet using the arrangement shown in FIG. 9.

FIGS. 9, 9A and 9B show a method 800 of forming a film 802 having multiple layers that can be applied before Cure 1 or before Cure 1 and then again before Cure 2. The method 800 can provide for the first desired structures 604A or 604B and the second desired structures 626A or 626B, for example, as previously described due to the orientation of the magnet 804 relative to the film 802. The method 800 of FIGS. 9, 9A and 9B differs from FIGS. 7-8 in that a single magnet 804 can be utilized. The distance between the magnet axis of rotation and the web at Cure 1 may be different than that between the axis of rotation and the web at Cure 2. The single magnet 804 generates a first applied magnetic field 808 having rotating modulation on the film 802 in the region of Cure 1 as seen by view A of FIGS. 9 and 9A and produces a second applied magnetic field 810 having rotating modulation (that differs from the first applied magnetic field 808 due at least to orientation) in the region of Cure 2 as seen by view B of FIG. 9B. In this manner, the method 800 can use a single magnet to produce desired structures 812 and 814 such as those of FIG. 9C in multiple layers of the film 802.

Figure 10:
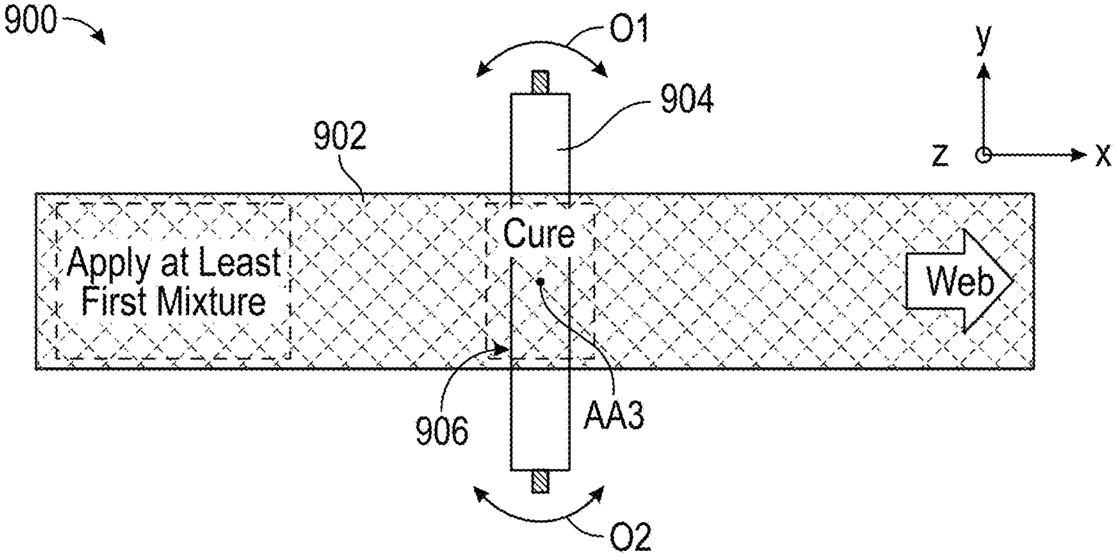
FIG. 10 is a schematic view of a method of forming a film using one magnetic field that is dithered back and forth about a second axis while also undergoing rotating modulation according to some embodiments of the present disclosure.

FIG. 10 show a method 900 of forming a film 902 that can be the same as the method 300 save that the magnet 904 can be moved in a dithering manner as indicated by arrows O1 and O2 back-and-forth about axis AA3. This dithering movement would be in addition to the rotation of the magnet 904 about the axis of rotation AR as previously described. Thus, a magnetic field 906 generated by the magnet 904 would have both rotating modulation and dithering relative to the film 902.

Figure 10A:
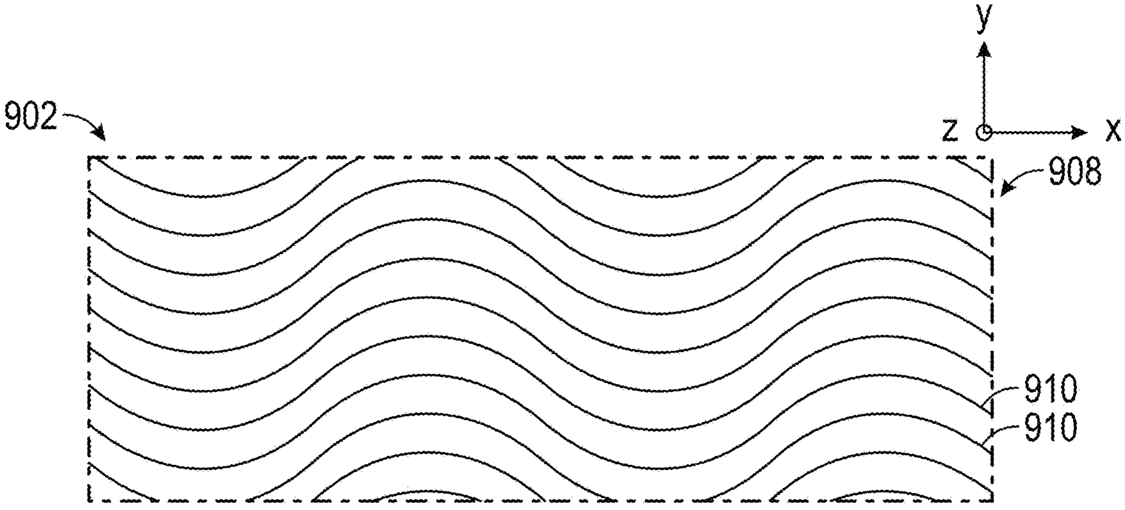
FIG. 10A is a schematic illustration of a desired structure for the particles that result from the dithering about the second axis and rotating modulation of the magnetic field of the embodiment of FIG. 10.

FIG. 10A shows a desired structure 908 for the plurality of particles 910, which can be magnetic particles or particles ordered due to the presence of magnetic particles) in the film 902 that results from application of the magnetic field 906. The desired structure 908 has a sinusoidal pattern in a down-web direction due to the dithering movement of the magnetic field 906.

Figure 10B:
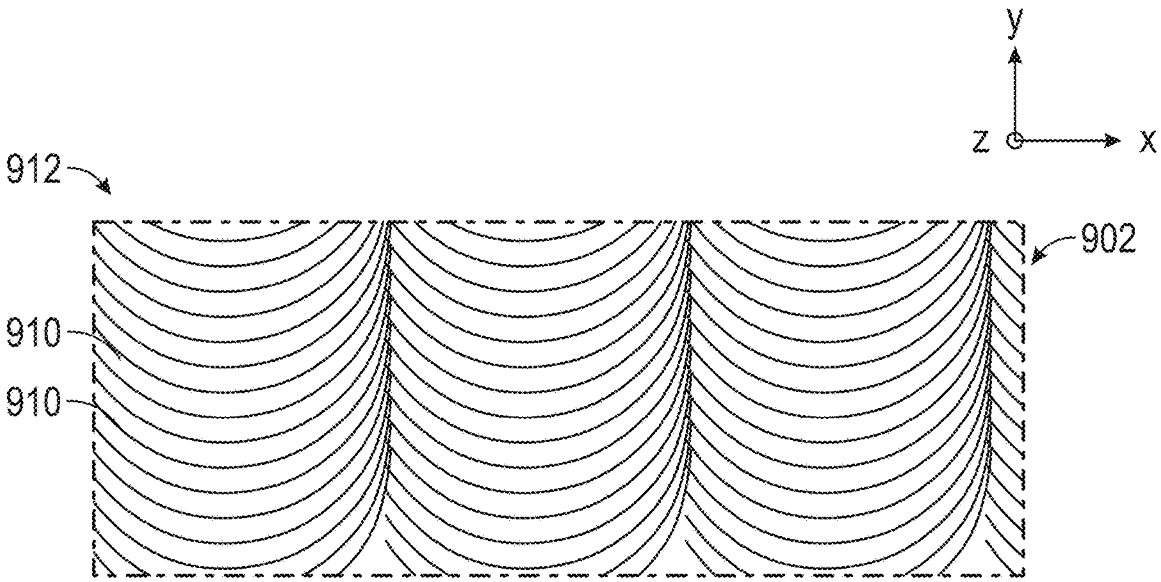
FIG. 10B is a schematic illustration of a desired structure for the particles that result from the full rotation about the second axis and rotating modulation of the magnetic field of the embodiment of FIG. 10.

FIG. 10B shows another desired structure 912 for the plurality of particles 910 in the film 902 according to another embodiment, where rather than dithering back-and-forth in an arc of less than 360 degrees as shown in FIG. 10, the magnet 904 would be fully rotated 360 degrees continuously around the axis AA3 to produce the repeating ring like structures shown in FIG. 10B.

Figure 11:
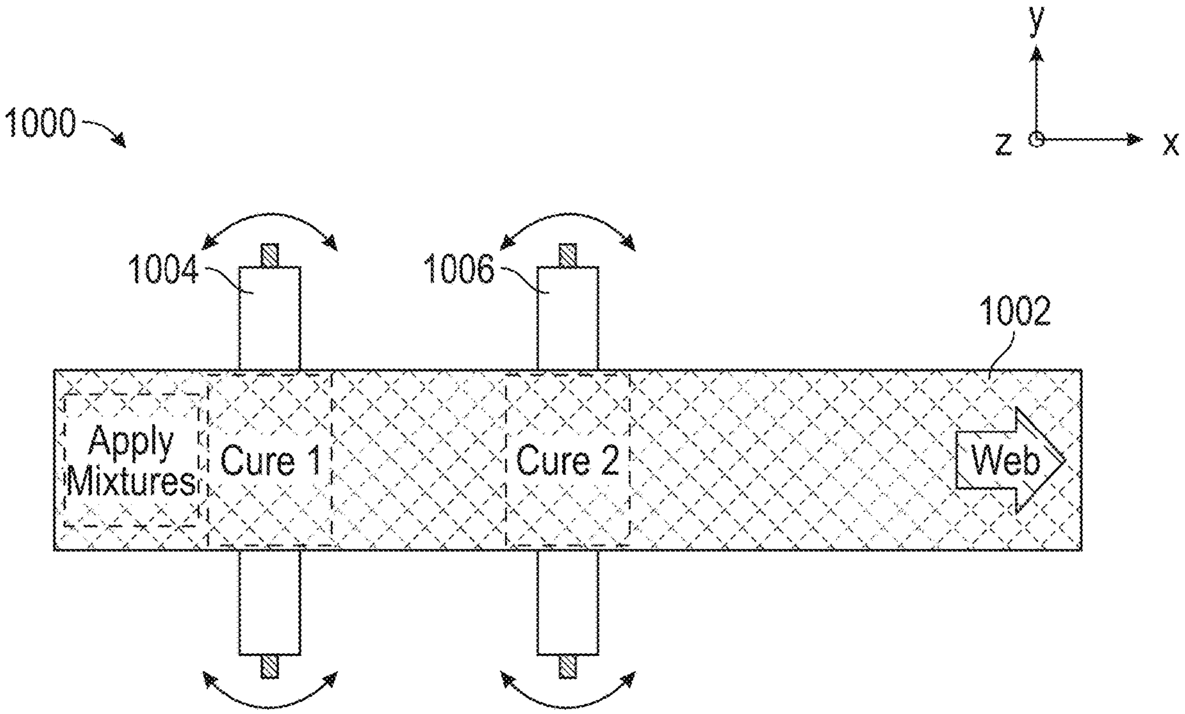
FIG. 11 is a schematic view of a method of forming a film using at least two magnetic fields that are each dithering back and forth while each of the magnetic fields also undergoing rotating modulation according to some embodiments of the present disclosure.
Figure 11A:
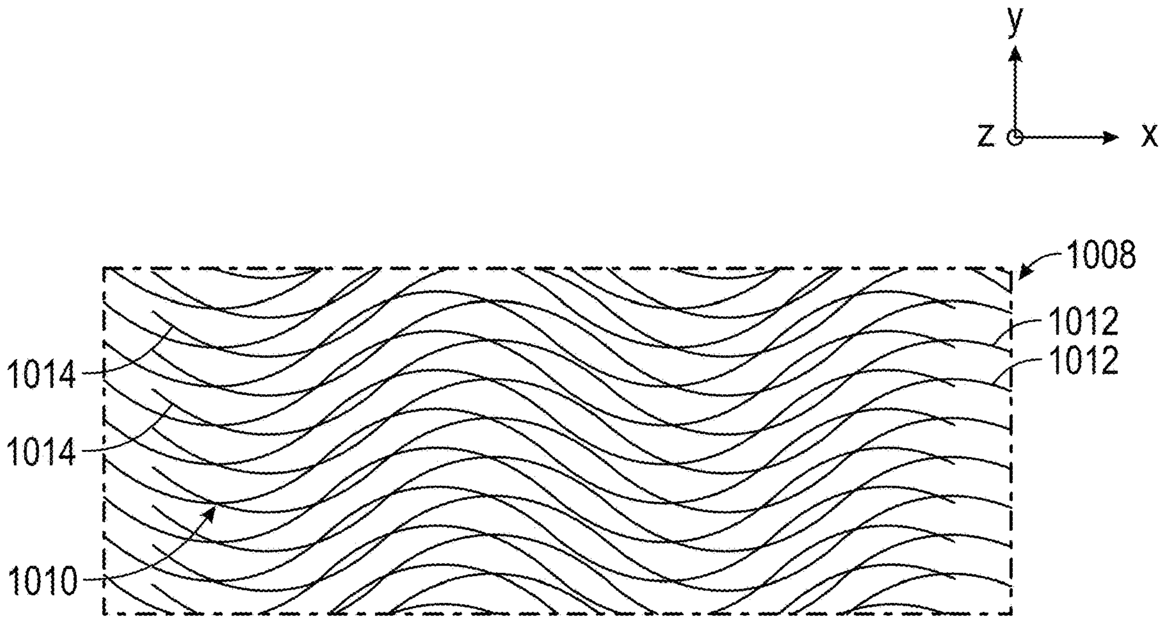
FIG. 11A is a schematic illustration of a desired structure for the plurality of particles that results from the dithering about the second axis and rotating modulation of the at least two magnetic fields of the embodiment of FIG. 11.

FIG. 11 show a method 1000 of forming a film 1002 that is identical to the method 900 of FIG. 10 save that the method utilizes a plurality of magnets 1004 and 1006 and the film 1002 has a plurality of layers. FIG. 11A shows the film 1002 with the desired structures 1008 and 1010 for two of the layers. The desired structure 1008 has a first plurality of (e.g., magnetic) particles 1012. The desired structure 1010 has a second plurality of (e.g., magnetic) particles 1014. The first plurality of particles 1012 have an orientation that differs from that of the second plurality of particles 1014.

Figure 12:
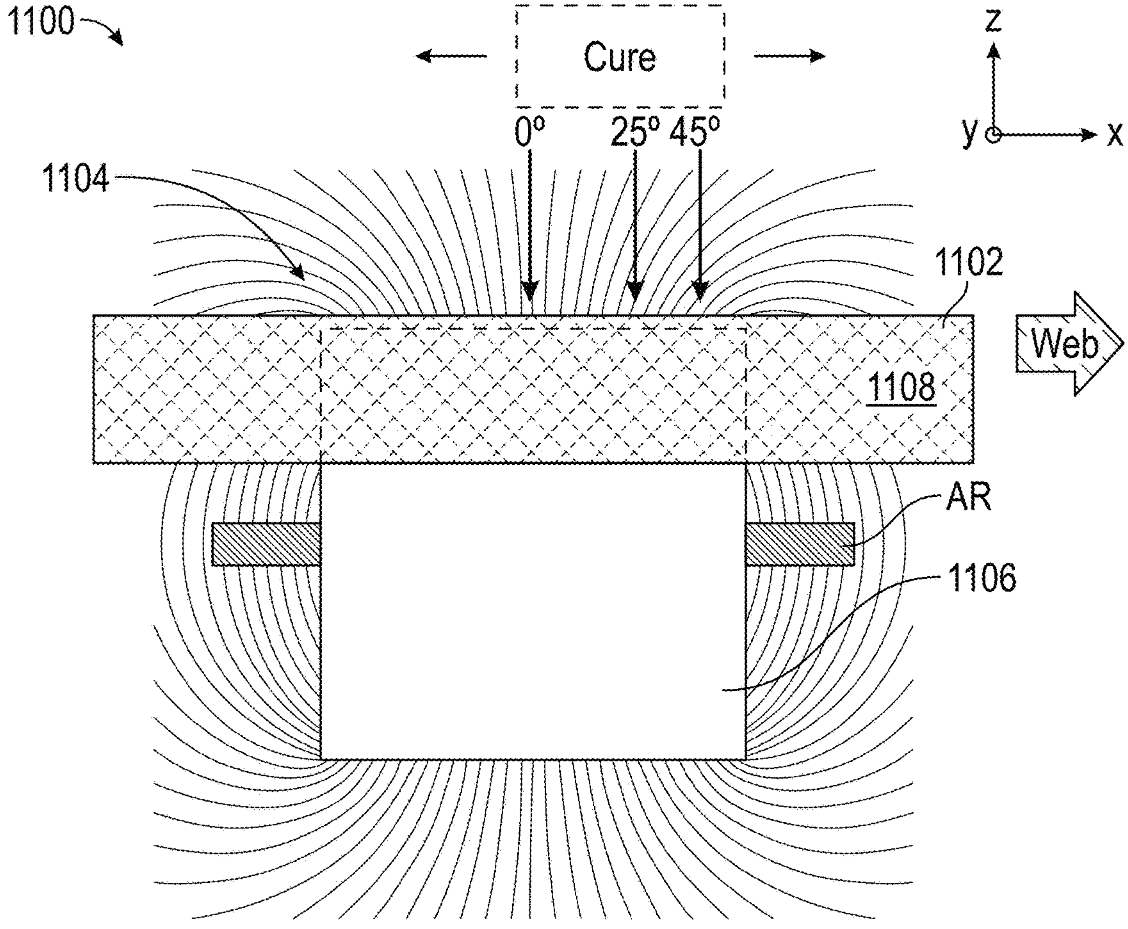
FIG. 12 is a schematic view of a method of forming a film where a down-web position that the cure is applied can be changed relative to the magnetic field showing that different down-web distances experience a different orientation of the magnetic field according to some embodiments of the present disclosure.

FIG. 12 shows a method 1100 of forming a film 1102 where the location of the at least partial cure can be shifted up-web or down-web due to a magnet 1106. This shift in the cure can be to a location where the lines of force from a magnetic field 1104 undergoing rotating modulation due to rotating of the magnet 1106 are at different angles relative to a major surface 1108 of the film 1102. It should be noted that in the embodiment of FIG. 12, the magnet 1106 has been reoriented relative to previously shown and described magnets. The magnet 1106 has an axis of rotation AR that generally extends up-web and down-web and is aligned with the x-direction of the Cartesian coordinate system (this system has been maintained throughout the FIGS.). Angles of the lines of force experienced by the film 1102 are indicated as measured from an angle substantially orthogonal to the major surface 1108 such that an angle of 0 degrees is substantially orthogonal to the major surface, an angle of 25 degrees is substantially 25 degrees from orthogonal and an angle of 45 degrees is substantially 45 degrees from orthogonal, etc.

Figure 12A:
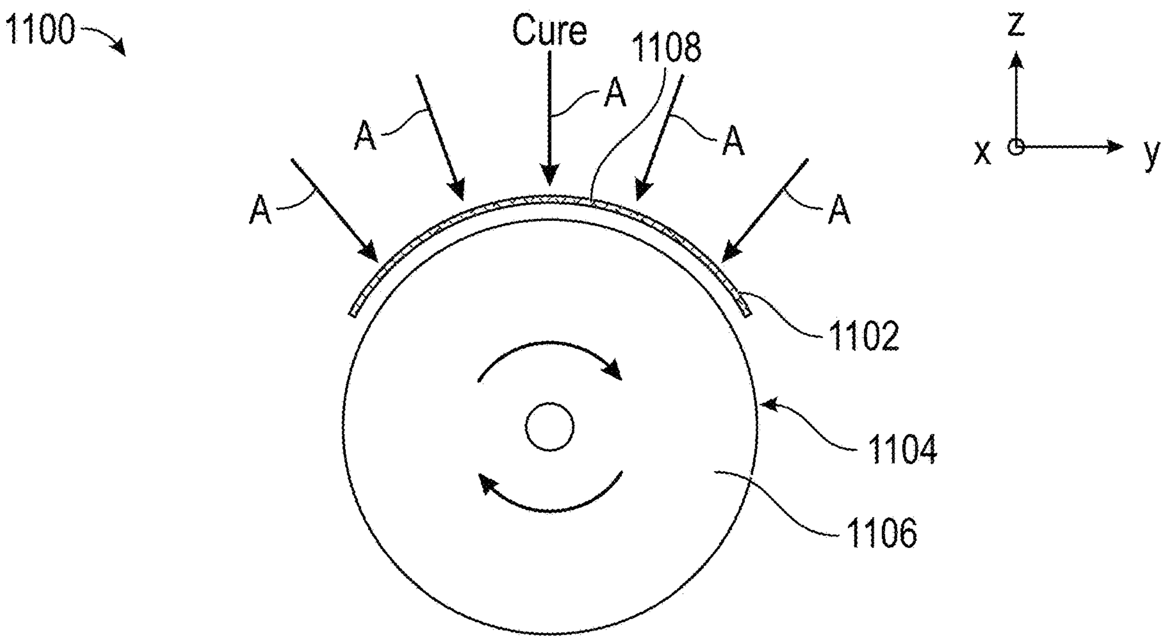
FIG. 12A is a schematic view of the method of FIG. 12 from another perspective showing the web can be curved about the magnet such that all cross-web locations of the same down-web location experience substantially the same orientation of the magnetic field according to some embodiments of the present disclosure.

FIG. 12A shows the method 1100 of FIG. 12 but at an angle orthogonal to the view of FIG. 12. FIG. 12A further shows that the film 1102 can be curved or otherwise shaped in the cross-web direction by a roller, air currents, tenting, web tensioning or another technique. This shaping of the magnetic film 1102 in the cross-web direction can cause the major surface 1108 of the magnetic film 1102 to have a curvature that generally corresponds with and matches a curvature of the magnet 1106. This shaping of the film 1102 allows the major surface 1108 to experience substantially a same relative angle for the lines of force of the magnetic field 1104 in the cross-web direction as indicated by arrows A. Put another way, because of the curvature of the film 1102 substantially matching that of the curvature of the outer surface of the magnet 1106, each of the arrows A has substantially a same angle relative to the major surface 1108. Thus, the magnetic particles experience substantially a same relative angle for the magnetic field 1104 even if they are located in different cross-web locations.

Figure 13:
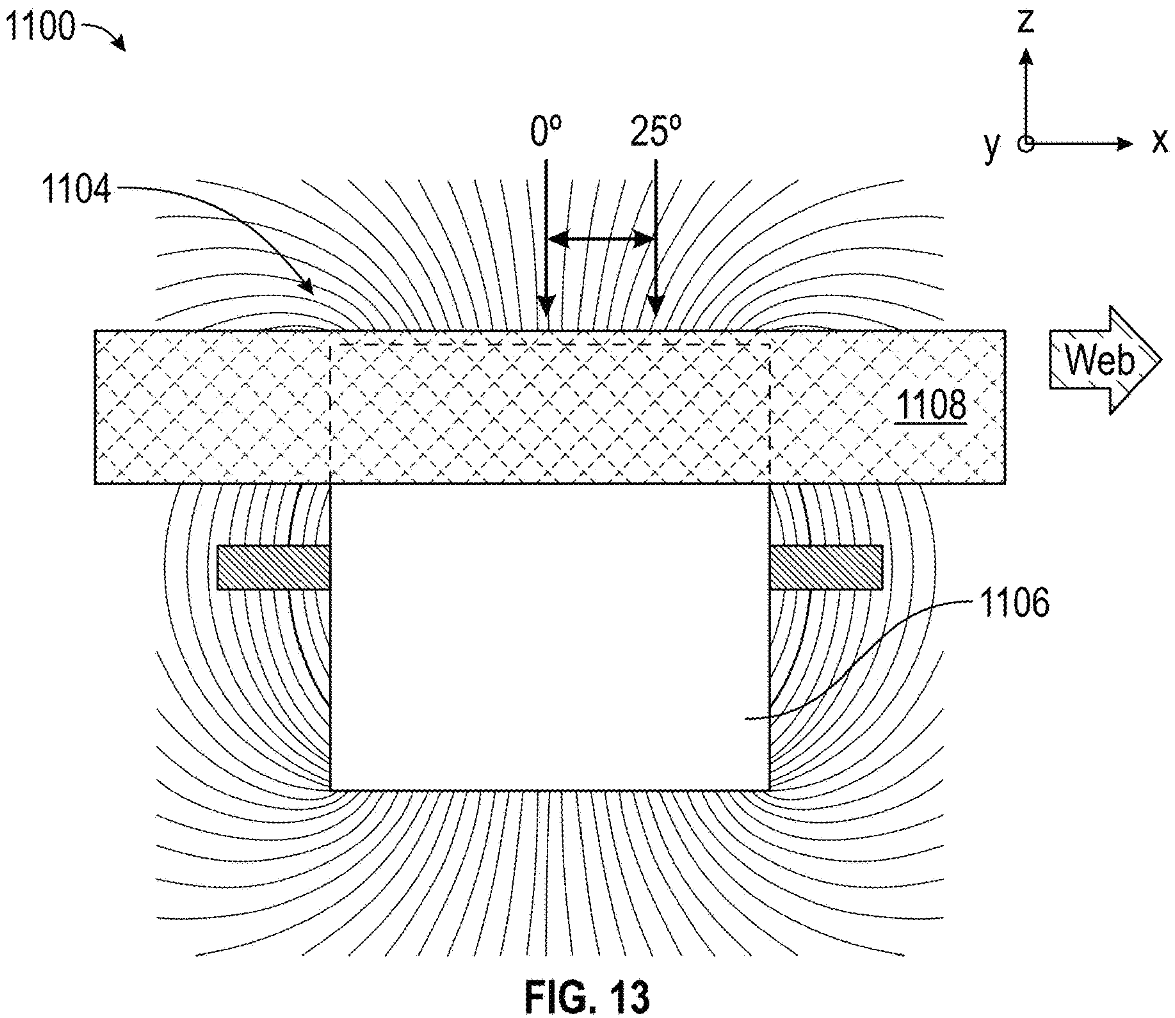
FIG. 13 is a schematic view of a method of forming a film where a down-web position that the cure is applied is alternated between two locations (indicated as 0 degrees and 25 degrees) relative to the magnetic field according to some embodiments of the present disclosure.

FIG. 13 shows an example utilizing the method 1100 previously described in FIG. 12 where the location of the cure in the down-web direction is altered relative to the magnet 1106 such that the lines of force from the magnetic field 1104 undergoing rotating modulation due to rotating of the magnet 1106 are at angles of substantially 0 degrees measured from orthogonal to the major surface 1108 and substantially 25 degrees measured from orthogonal to the major surface 1108.

Figure 13A:
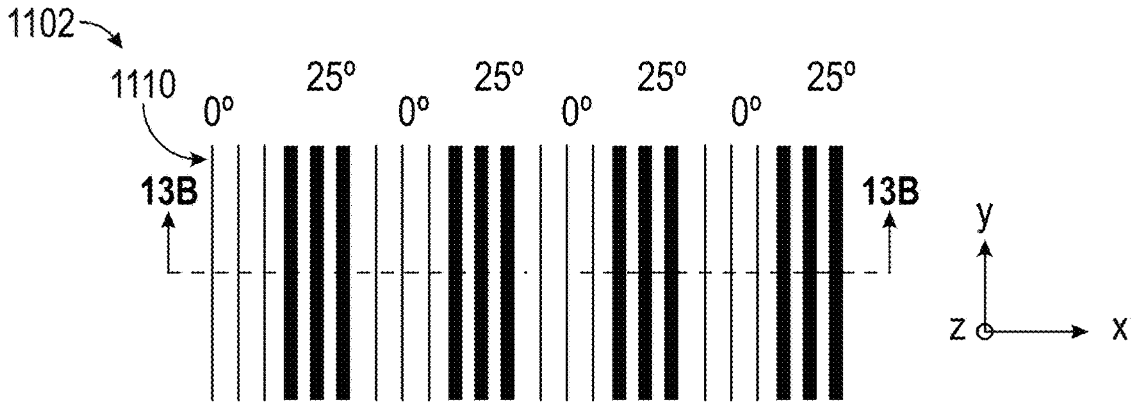
FIG. 13A is a schematic illustration of a desired structure for the plurality of particles that results from the two alternating cure locations of the method of FIG. 13.
Figure 13B:
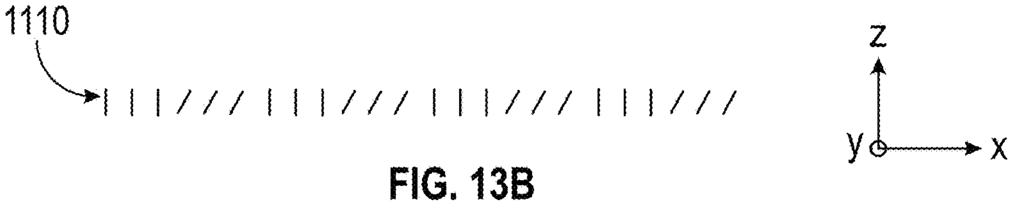
FIG. 13B is a schematic cross-sectional view of FIG. 13A along line at 13B-13B of FIG. 13A.

FIG. 13A shows a desired structure 1110 that results for the film 1102 from the method of FIG. 13. FIG. 13B shows the desired structure 1110 in cross-section along line 13B-13B of FIG. 13A. In some embodiments, as generally described for FIGS. 3A-3F, first and second particles are included where the first particles are disposed in layers as indicated in FIG. 13B and the second particles are in the same layers, or in different layers between the layers shown in FIG. 13B.

Figure 14:
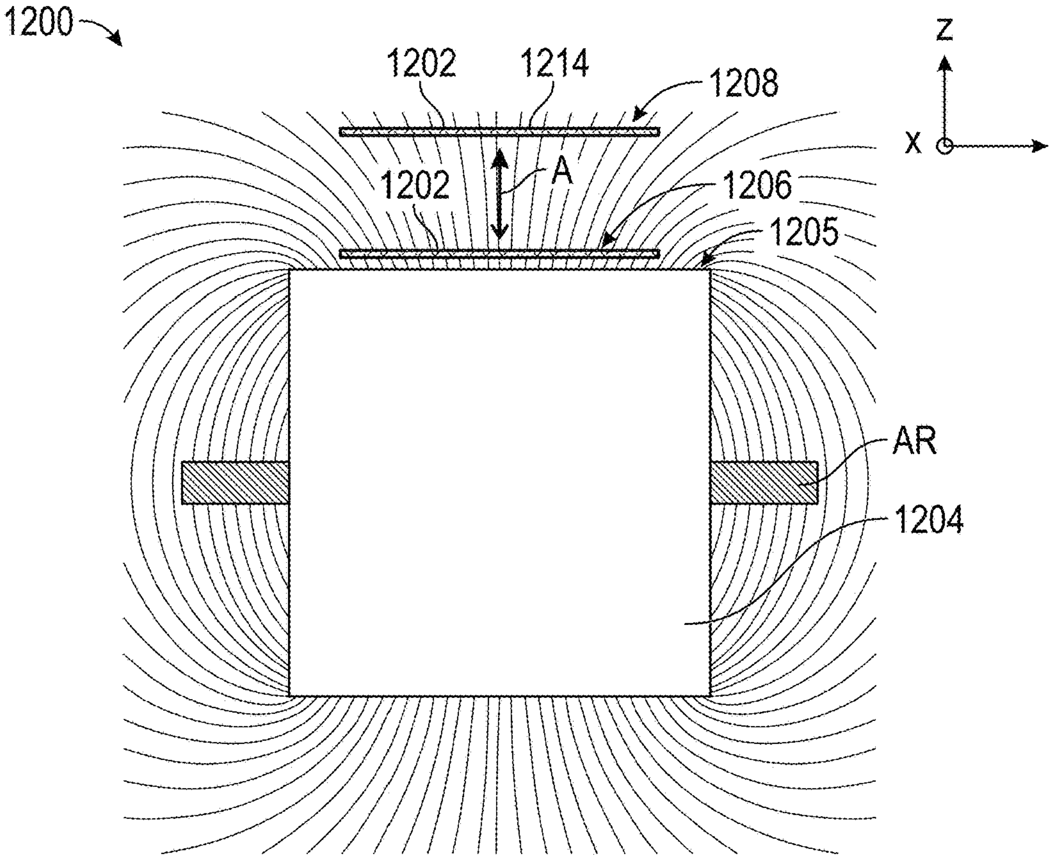
FIG. 14 is a schematic view of a method of forming a film where a position of the entire web relative to the surface of the magnet is changed such that the relative orientation of the magnetic field is changed relative to the plurality of particles according to some embodiments of the present disclosure.

FIG. 14 shows a method 1200 where the relative position of a layer or film 1202 is changed (as indicated by arrow A) relative to a magnet 1204 having a magnetic field 1205. More specifically, the film 1202 can be moved between a relatively closer position 1206 and a relatively further position 1208 from the magnet 1204 and the magnetic field 1205 such that a distance between a major surface 1214 of the layer or film 1202 and the axis of rotation AR of the magnet 1204 is changed. The tracks of the particles tend to be more closely spaced when the layer or film 1202 is in the relatively closer position 1206 and the tracks of the plurality of magnetic particles tend to be more widely spaced when the layer or film 1202 is in the relatively further position 1208. It should be noted with FIGS. 14 and 15 (discussed subsequently) that the magnet 1204, 1304 is oriented substantially cross-web such as previously shown in FIG. 3, and therefore, is not oriented in the manner of FIGS. 12-13. However, it should be noted that in other embodiments, the magnet 1204, 1304 could be oriented relative to the film 1202, 1302 as shown in FIGS. 12-13 and the method 1200, 1300 utilized to obtain different desired structures than are shown in FIGS. 14A, 14B and 15A.

Figure 14A:
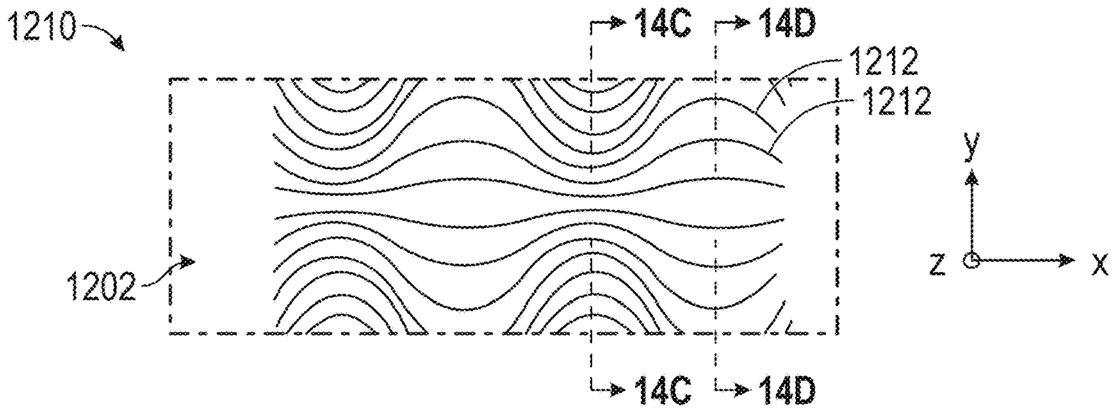
FIGS. 14A and 14B are schematic illustrations of desired structures for the plurality of particles that result from combining the method of FIG. 14 with the method of FIG. 3 and combining the method of FIG. 14 with the method of FIG. 12.
Figure 14B:
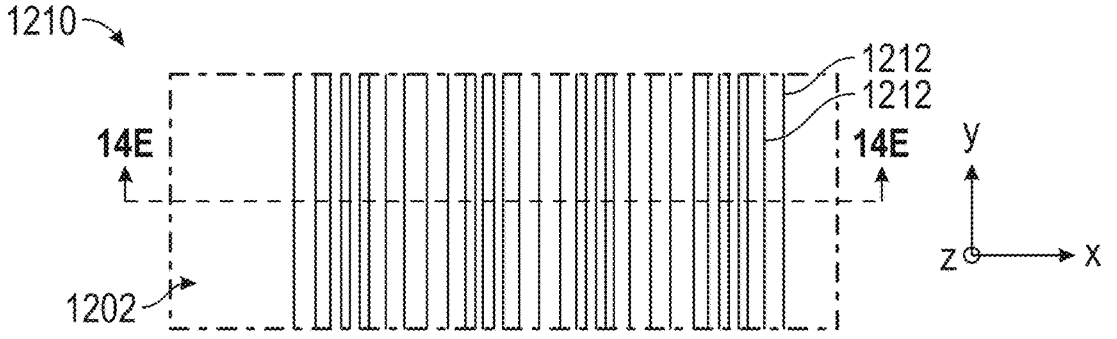
Figure 14C:
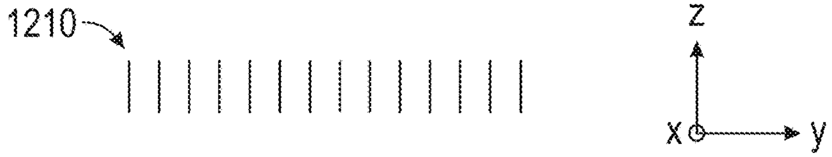
FIG. 14C is a schematic cross-sectional view of FIG. 14A along line 14C-14C of FIG. 14A.
Figure 14D:
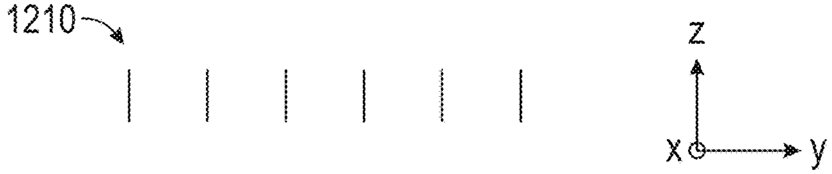
FIG. 14D is a schematic cross-sectional view of FIG. 14A along line 14D-14D of FIG. 14A.
Figure 14E:
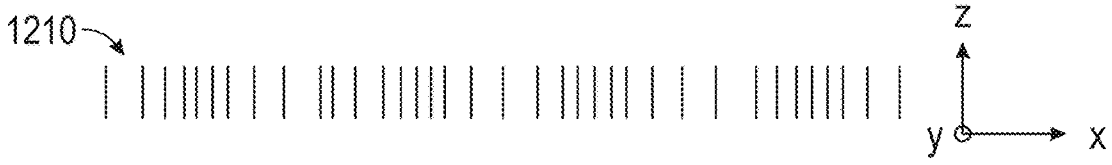
FIG. 14E is a schematic cross-sectional view of FIG. 14B along line 14E-14E of FIG. 14B.

FIGS. 14A and 14B show a desired structure 1210 for the plurality of particles 1212. FIGS. 14C-14E show the desired structure 1210 from various cross-sections of FIGS. 14A and 14B. FIG. 14A an undulating track of the plurality of particles 1212 in the down-web (x-direction) formed by combining the method of FIG. 14 and the method of FIG. 3, where the method of FIG. 3 tends to from down-web tracks and the method of FIG. 14 tends to vary the spacing of these tracks. FIG. 14B is formed by combining the method of FIG. 14 and the method of FIG. 12, where the method of FIG. 12 tends to from cross-web tracks and the method of FIG. 14 tends to vary the spacing of these tracks. In some embodiments, as generally described for FIGS. 3A-3F, first and second particles are included where the first particles are disposed in layers as indicated in any one of FIGS. 14B-14E and the second particles are in the same layers, or in different layers between the layers shown in these figures.

Figure 15:
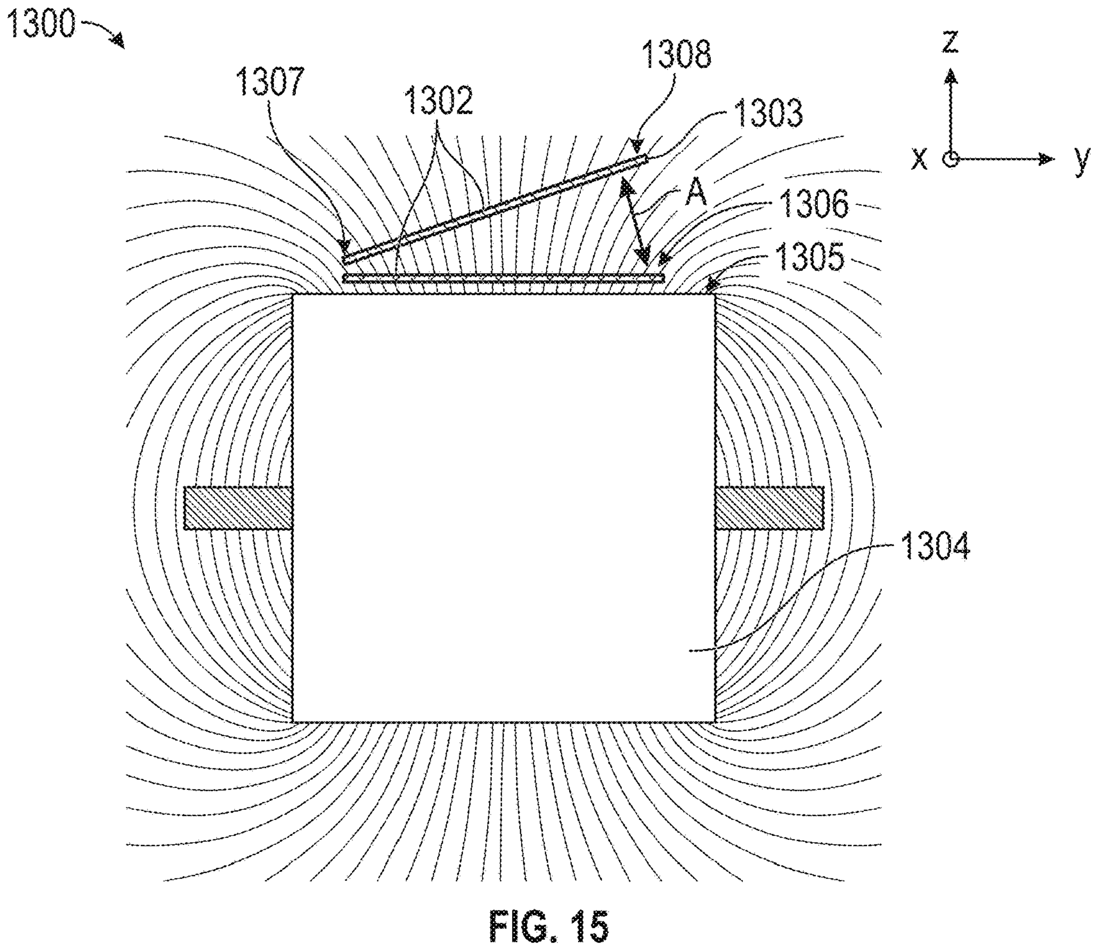
FIG. 15 is a schematic view of a method of forming a film where the angle of the web relative to the magnetic field is changed according to some embodiments of the present disclosure.

FIG. 15 shows a method 1300 where the relative position of only a first portion 1303 of a layer or film 1302 is changed (as indicated by arrow A) relative to a magnet 1304 having a magnetic field 1305. More specifically, the first portion 1303 of the film 1302 can be moved (e.g., tilted) between a relatively closer position 1306 and a relatively further position 1308 from the magnet 1304 and the magnetic field 1305. A second end 1307 of the film 1302 can remain in substantially a same position or only a slightly altered position relative to the magnet 1304 and the magnetic field 1305.

Figure 15A:
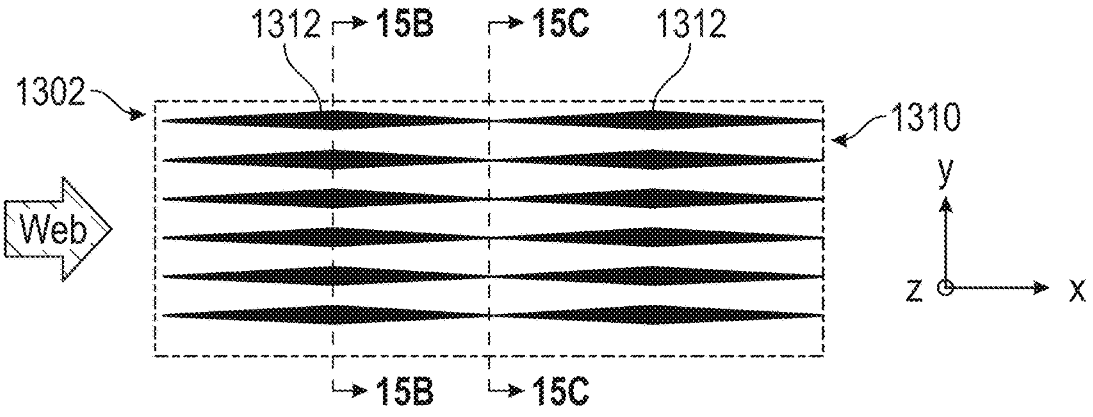
FIG. 15A is a schematic illustration of a desired structure for the plurality of particles that results from the change of the portion of the web relative to the magnetic field of the method of FIG. 15.
Figure 15B:
FIG. 15B is a schematic cross-sectional view of FIG. 15A along line 15B-15B.
Figure 15C:
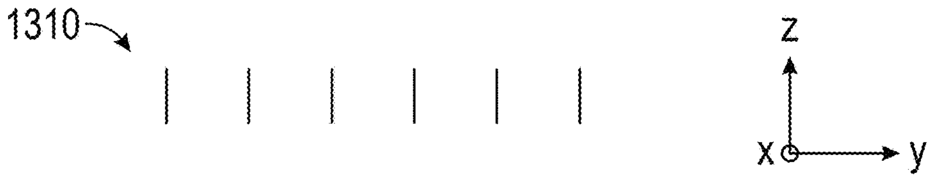
FIG. 15C is a schematic cross-sectional view of FIG. 15A through line 15C-15C.

FIG. 15A shows a desired structure 1310 that results from the back and forth change in position of the first portion 1303 of the film 1302 from the position of 1306 and the position of 1308. FIGS. 15B and 15C are cross-sections of the desired structure 1310 from FIG. 15A. As shown in FIG. 15A, the change to position 1308 and back to position 1306 results in the regions 1312 where the particles are tilted cross-web. In some embodiments, as generally described for FIGS. 3A-3F, first and second particles are included where the first particles are disposed in layers as indicated in FIG. 15B or 15C and the second particles are in the same layers, or in different layers between the layers shown in FIG. 15B or 15C.

Figure 16:
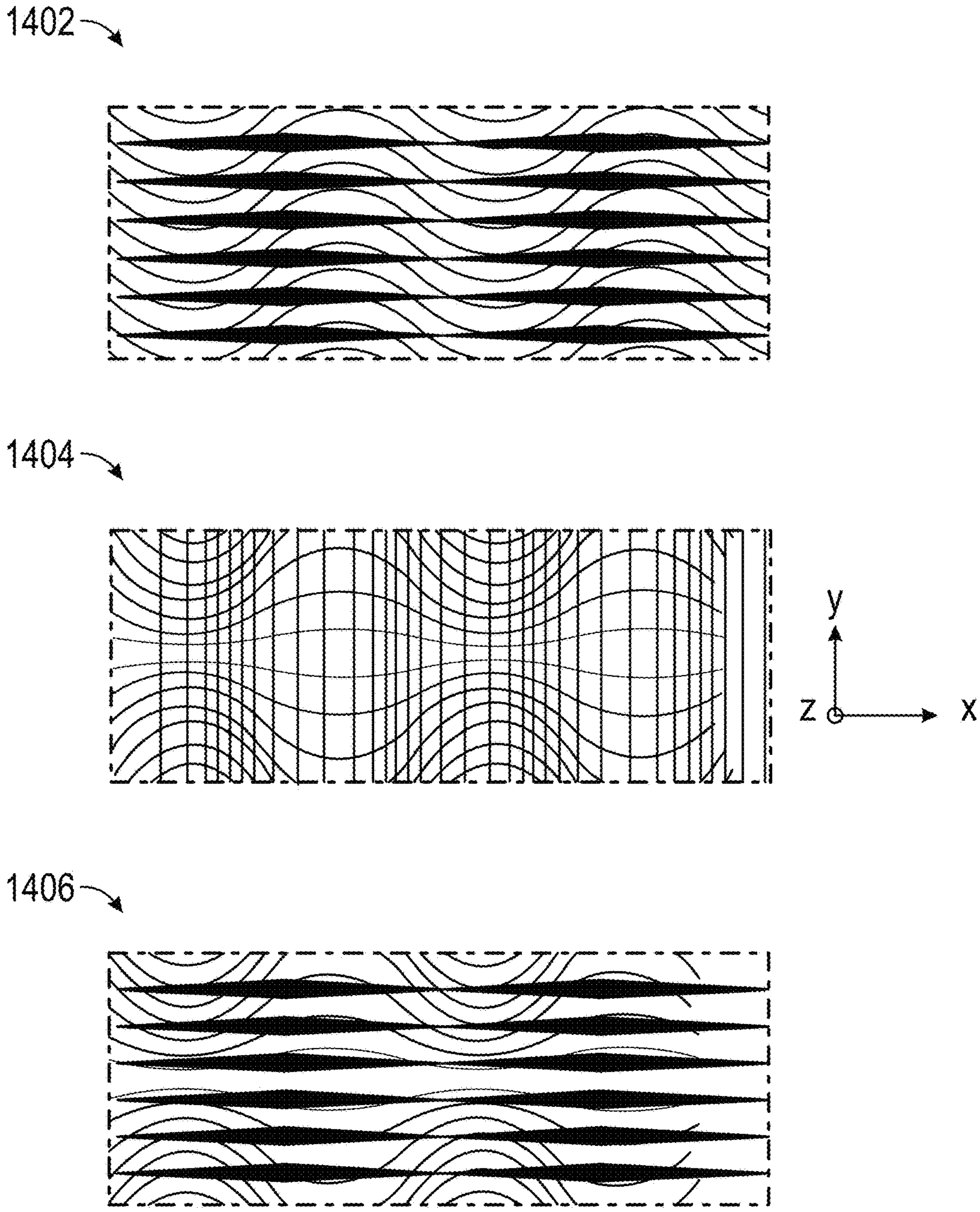
FIG. 16 schematically shows further desired structures for the plurality of particles in films having multiple layers that can be obtained by using multiple magnetic fields by combining at least the methods of FIGS. 10-15, for example.

FIG. 16 shows examples where various of the methods 900-1300 are combined to form multilayer films 1402, 1404 and 1406. Indeed, it should be noted that any of the methods disclosed herein can be combined or modified such as to form multilayer films having a plurality of particles organized in various desired structures.

Figure 17:
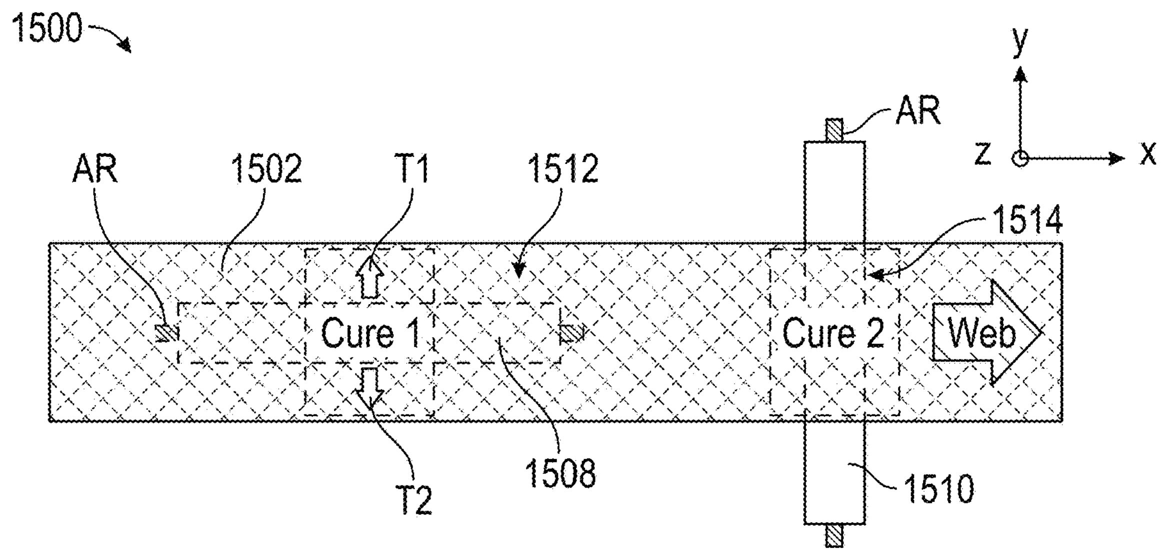
FIG. 17 is a schematic view of a method of forming a film where a first magnetic field is translated in a cross-web direction relative to the web while undergoing rotating modulation and a second magnetic field is oriented substantially transverse to the first magnetic fields and undergoes rotating modulation according to some embodiments of the present disclosure.
Figure 17A:
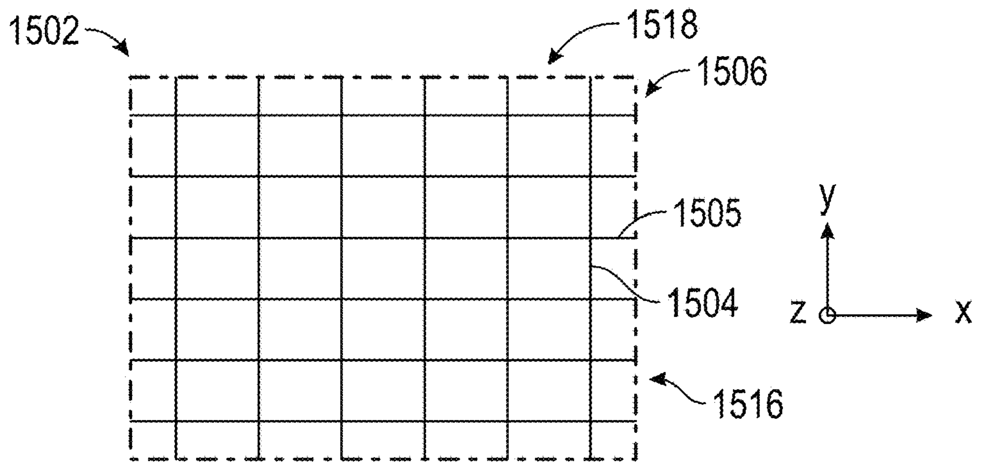
FIG. 17A is schematic illustration of a desired structure for the plurality of particles as a result of the two magnetic fields according to the method of FIG. 17.

FIG. 17 is a method 1500 according to another embodiment for making a film 1502 that has a first and a second plurality of (e.g., magnetic) particles 1504, 1505 organized in an overall desired structure 1506 as shown in FIG. 17A. The method 1500 can utilized at least two magnets 1508 and 1510. The first magnet 1508 can rotate about an axis of rotation AR and can have a first magnetic field 1512 with rotating modulation. The second magnet 1510 can rotate about an axis of rotation AR and can have a second magnetic field 1514 with rotating modulation. Additionally, the first magnet 1508 can translate back-and-forth in the cross-web (y-axis) direction as indicated by arrows T1 and T2.

FIG. 17A shows the overall desired structure 1506 for the multilayer film 1502 that results from the method 1500 with the first plurality of particles 1504 positioned, oriented and/or aligned by the first magnetic field 1512 into a first desired structure 1516 and the second plurality of particles 1505 positioned, oriented and/or aligned by the second magnetic field 1514 into a second desired structure 1518. As shown in FIG. 17A, the rows of the first plurality of particles 1504 of the first desired structure 1516 are oriented transverse to the rows of the second plurality of particles 1505 of the second desired structure 1518.

Figure 18:
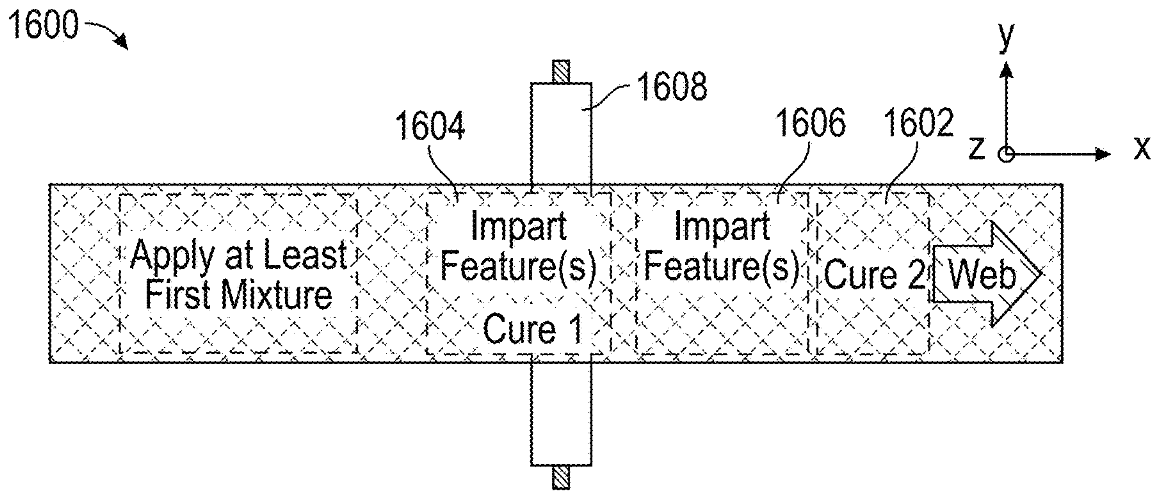
FIG. 18 is a schematic view of a method of forming a film where one or more features are imparted in the film prior to, during or after application of the magnetic field and/or cure according to some embodiments of the present disclosure.

FIG. 18 shows a method 1600 where features 1604 and/or 1606 can be imparted to a layer or film 1602 before, during or after at least a partial cure of the at least a first mixture containing an optically clear resin and a plurality of magnetic particles. FIG. 18 shows the method 1600 performing a first partial cure ("Cure 1") adjacent a first magnet 1608 and applying a second full cure ("Cure 2") down-web from the first magnet 1608. The features that can be imparted to the film 1602 or can be fabricated prior so as to be inherent in the initial web of the layer or film 1602 prior to application of the method 1600. The features can include, but are not limited to, temporarily curving the layer or film 1602 in a cross-web direction (previously shown in FIGS. 12 and 12A), curving/distorting the layer or film 1602 in the up-web/down-web direction, imparting further, particles, substrates, and/or layers to the film (previously described), adding texture to the substrate (shown in FIG. 19), adding a texture to the layer containing the plurality of magnetic particles (shown in FIG. 20), using a profiled die or another tool to impart thickness variation into the mixture/layer, providing for a discontinuous layer containing the plurality of particles, providing for localized irregularities in the magnetic field, providing for flux concentrations in the magnetic field, increasing or decreasing the field strength (the magnetic force) applied by the magnet, and/or providing the substrate with a variable thickness.

Figure 19:
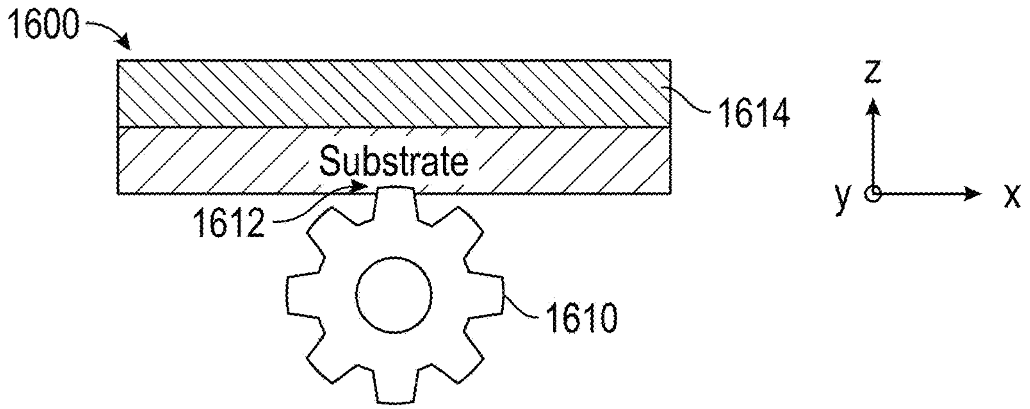
FIGS. 19 and 20 schematically show examples of the one or more features being imparted to the film.
Figure 20:
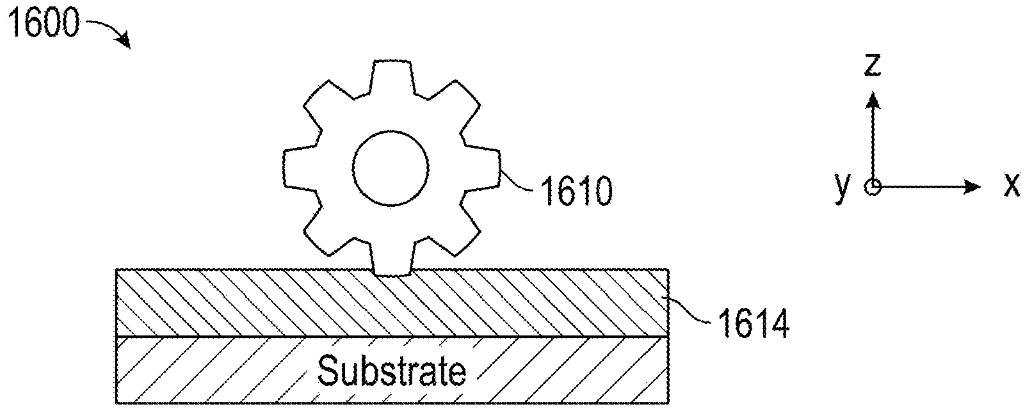

FIG. 19 shows the method 1600 where features are imparted to the substrate by an apparatus 1610 prior to, during, or after the at least partial cure ("Cure 1" of FIG. 18). These features can include texturing of the substrate either cross-web, down-web or both such that the position and angle of the substrate of the substrate relative to the axis of rotation of the magnet can vary from one region (region 1612) to another region. This texturing of the substrate can alter the layer 1614 containing the plurality of particles such that the plurality of particles in one region can have a different positioning, orientation or alignment relative to those in other regions. FIG. 20 shows the method 1600 where features are imparted directly to the layer 1614 by the apparatus 1610 rather than the substrate. Texturing the layer 1614 can vary the thickness of the layer 1614 containing the plurality of particles either cross-web, down-web or both such that the plurality of particles in one region can have a different positioning, orientation or alignment relative to those in other regions.

Figure 21:
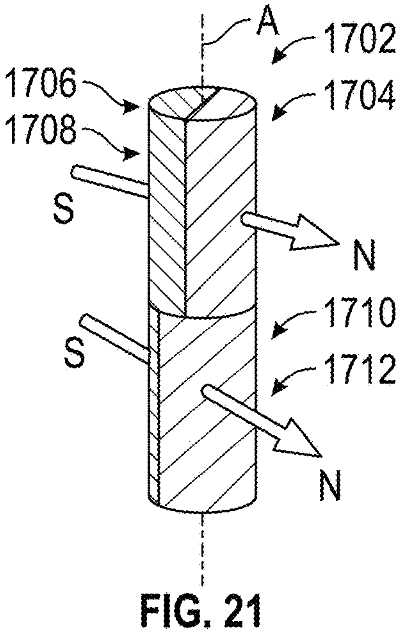
FIG. 21 schematically shows a magnet assembly according to some embodiments where a first portion of the magnet assembly has been rotated relative to a second portion of the magnetic field such that the poles of the first and second portions do not align perfectly, this arrangement for the magnet assembly provides for localized irregularities in the magnetic field according to some embodiments of the present disclosure.

FIG. 21 shows a magnet 1702 that is a composite assembly to form localized irregularities in its magnetic field 1704. More particularly, the magnet 1702 has a first portion 1706 with a first magnetic field 1708 and a second portion 1710 with a second magnetic field 1712. The first portion 1706 is rotated about axis A slightly such that the pole N of the first portion 1706 does not align directly with the pole N of the second portion 1710. Thus, the first magnetic field 1708 differs in orientation from the second magnetic field 1712, such shift in orientation is called a localized irregularity in the present disclosure.

Figure 22:
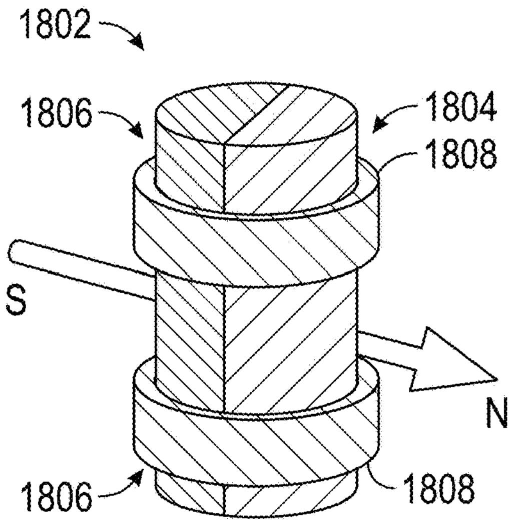
FIG. 22 schematically shows a magnet assembly according to some embodiments that has an irregular diameter with sections having a larger diameter providing for flux concentrations according to some embodiments of the present disclosure.

FIG. 22 shows a magnet 1802 with a magnetic field 1804 having flux concentrations 1806 due to projections 1808 along the surface of the magnet 1802. Such projections can be part of the magnet 1802 or can be ferrous pieces that are separate from the magnet 1802. Further information regarding flux concentrations can be found in PCT Publication No. WO 2018/136269.

Figure 23:
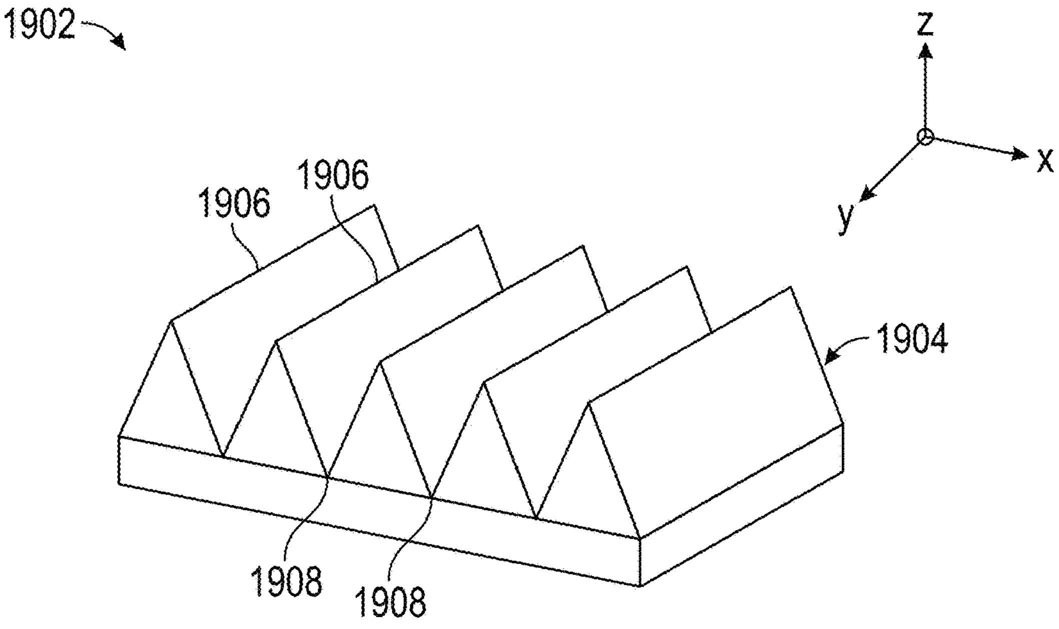
FIGS. 23 and 23A schematically show an embodiment where the substrate of the film is varied in thickness in a predetermined manner, the variable thickness is designed to capture and orient the articles as shown in FIG. 23A according to some embodiments of the present disclosure.
Figure 23A:
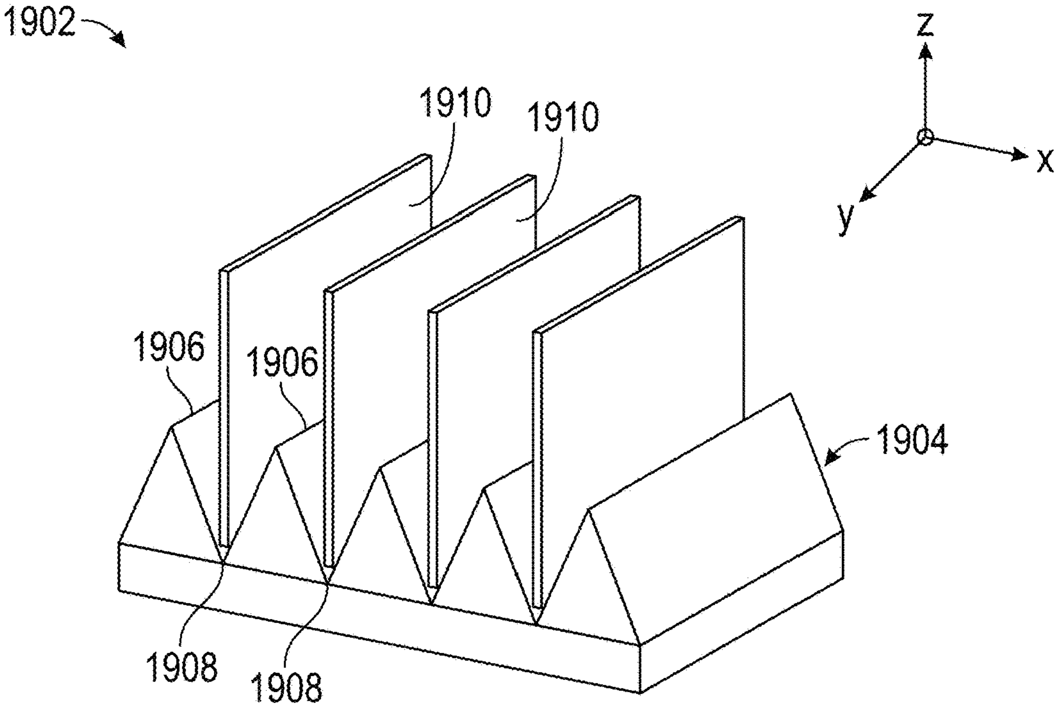

FIGS. 23 and 23A show a film 1902 with a substrate 1904 fabricated with a variable thickness. The substrate 1904 can have alternating peaks 1906 and valleys 1908. The valleys 1908 can be configured to receive a plurality of (e.g., magnetic) particles 1910 therein as shown in FIG. 23A. The optically clear resin is not shown in FIG. 23A. The peaks 1906 can be configured to assist the plurality of particles 1910 to achieve a desired orientation by guiding the plurality of particles 1910 into the orientation shown in FIG. 23A and by supporting the plurality of particles 1910 along the sides thereof. The valleys 1908 can be configured to assist the plurality of particles 1910 to be positioned with the desired orientation as well as relative spacing as shown in FIG. 23A.

Figure 24:
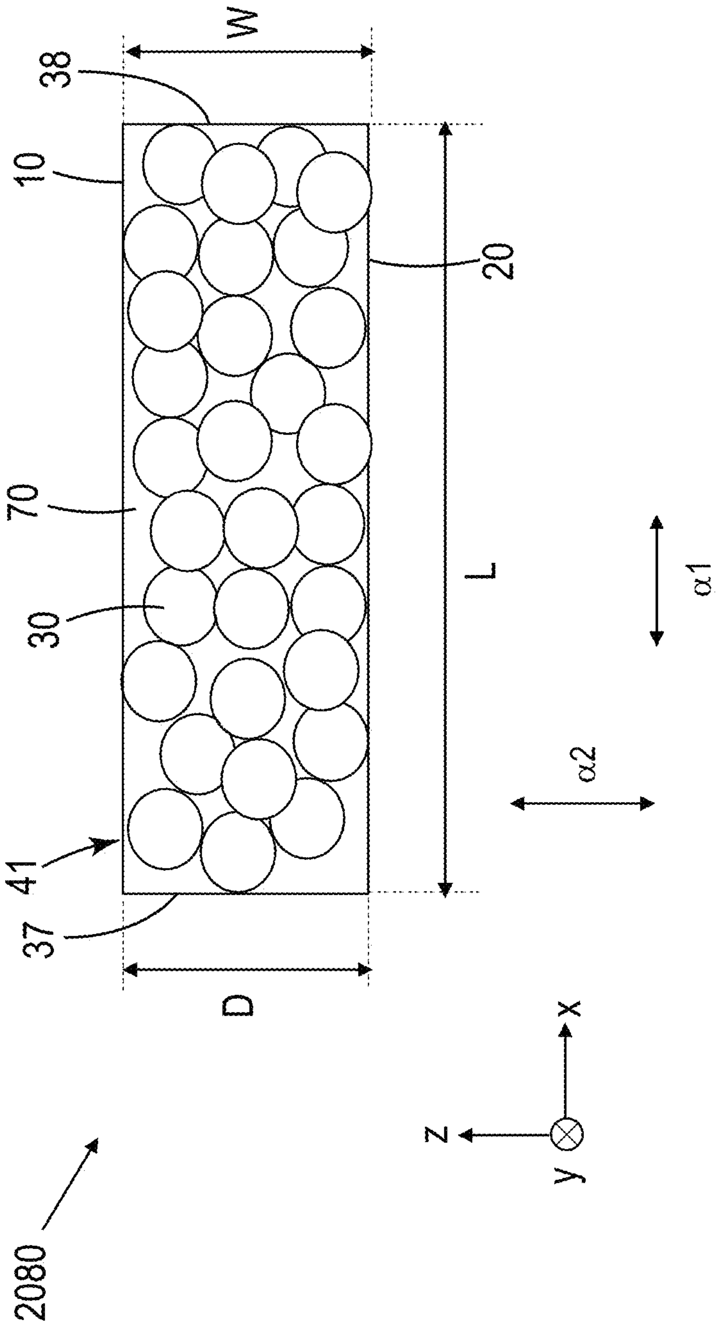
FIG. 24 is a schematic side view of a layer or film including a plurality particles according to some embodiments of the present disclosure.
Figure 24A:
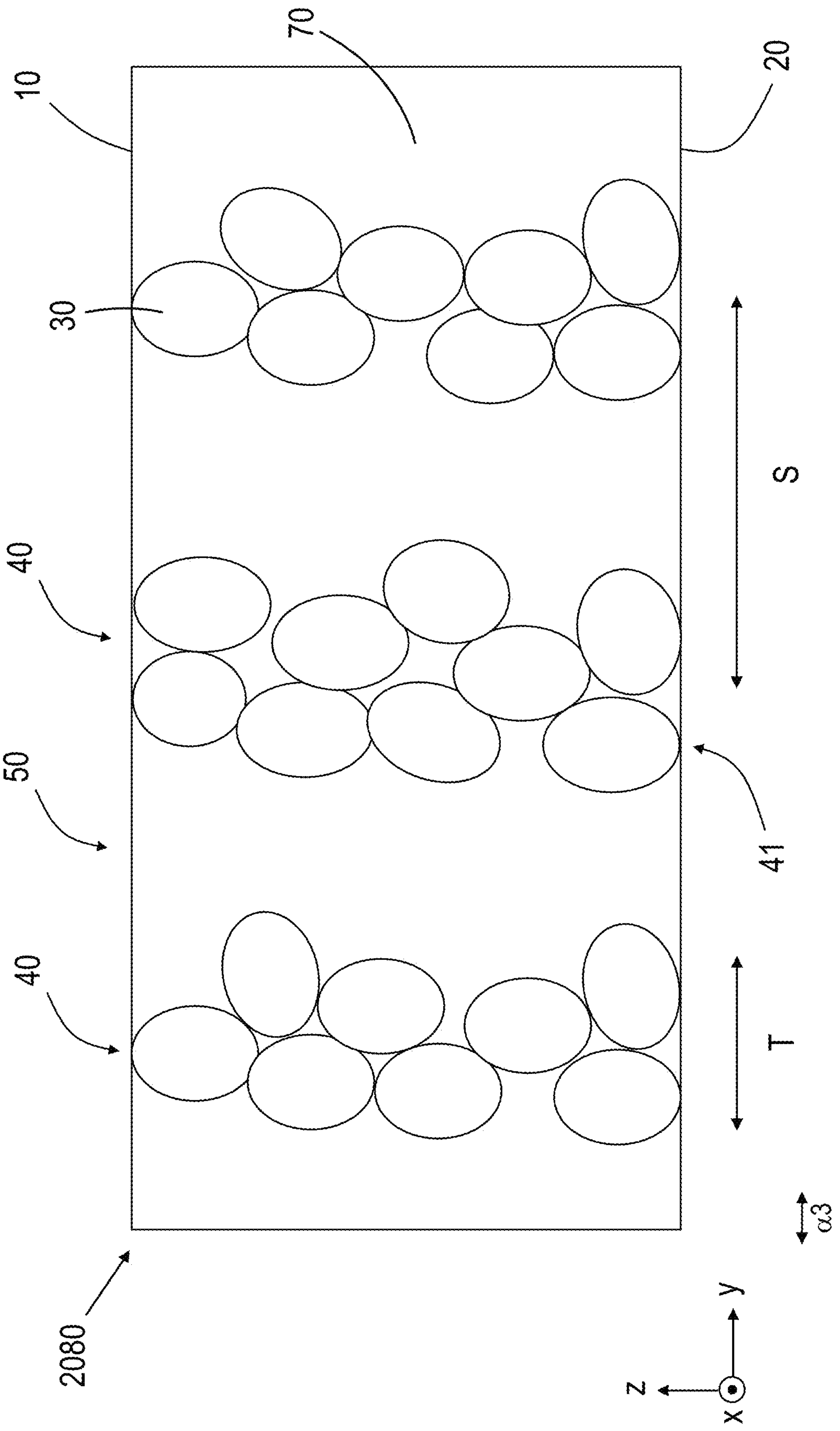
FIG. 24A is a schematic cross-sectional view of the layer or film of FIG. 23 in an orthogonal cross-section.
Figure 25:
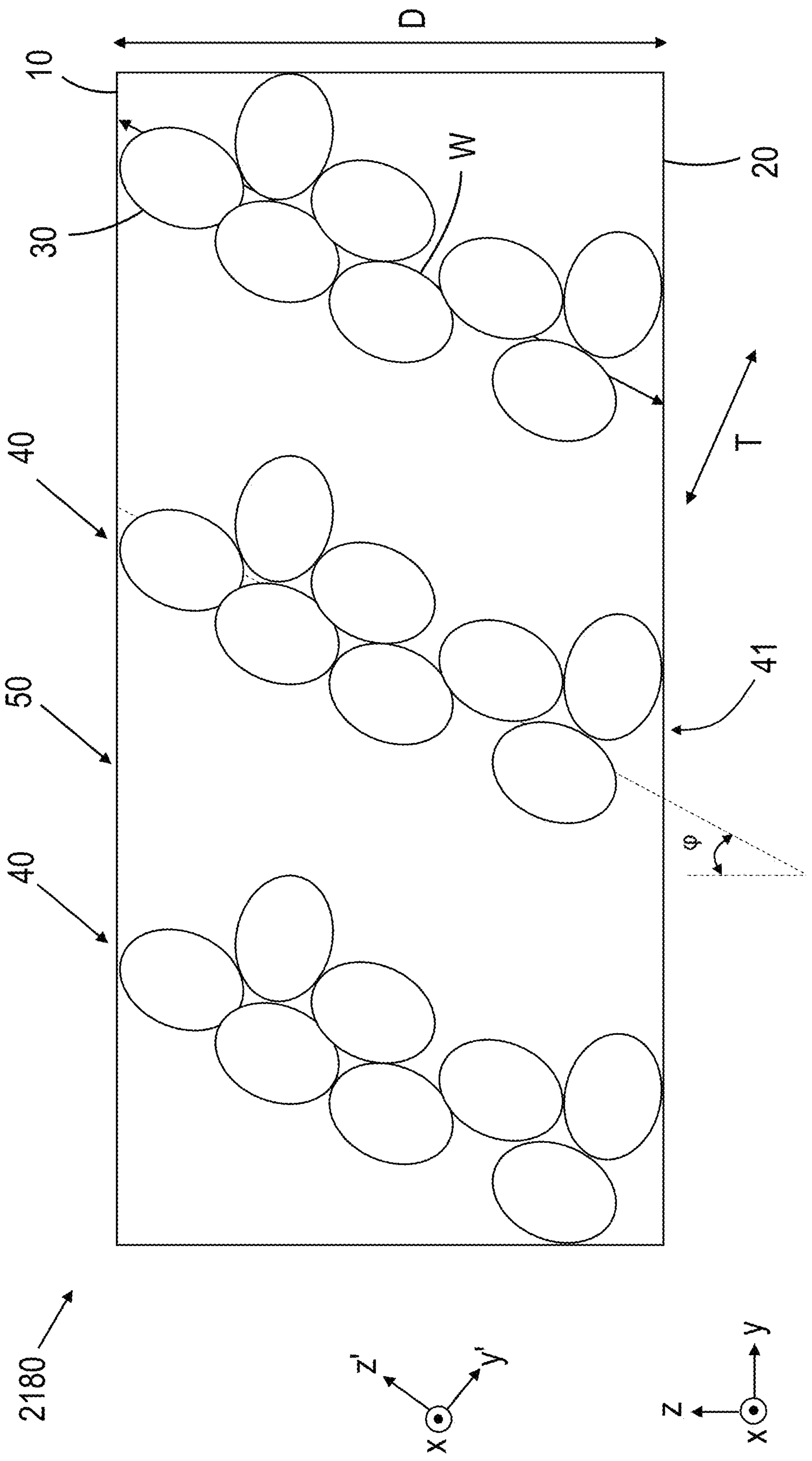
FIG. 25 is a schematic cross-sectional view of a layer or film including layers of particles according to some embodiments of the present disclosure.

FIG. 24 is a schematic side view of a layer or film 2080 including a plurality particles 30, according to some embodiments. FIG. 24A is a schematic cross-sectional view of the layer or film 2080 in an orthogonal cross-section. The layer or film 2080 includes the particles 30 dispersed between opposing first (10) and second (20) major surfaces of the layer or film 2080 which are spaced apart by a distance D. The particles 30 are agglomerated so as to form a plurality of substantially continuous layers 41 of particles generally extending along orthogonal first (e.g., x) and second (e.g., z or z' indicated in FIG. 25) directions and arranged along a third direction (e.g., y-direction). A layer of particles can be described as substantially continuous when, in a plan view facing a major surface of the layer, the particles cover greater than 50 percent of an area of the layer (in some cases, the particles cover at least 60% or at least 70% of the area) and are distributed throughout the layer such that there are no large (compared to the D50 particle size, where the D50 particle size is the median size for a volume distribution and is sometimes denoted Dv50) open regions that do not contain particles (e.g., no open regions having orthogonal length and width directions each larger than 4 D50, or 2 D50, or D50). Each substantially continuous layer 41 of particles 30 has a length L along the first direction (x-direction) from a first (37) to an opposing second (38) edge of the layer or film 2080 and a width W along the second direction (z-direction or z'-direction) extending from the first (10) to the second (20) major surface. In some embodiments, L/D≥100, or L/D≥300, or L/D≥1000. In some embodiments, W/D is at least 0.5, or 0.6, or 0.7, or 0.9. In some such embodiments, W/D is no more than 1.5 (W/D can be greater than 1 as schematically illustrated in FIG. 25), or no more than 1.2, or no more than 1. In some embodiments, W/D is about 1 (e.g., the layer of particles can extend between the opposing major surfaces). In some embodiments, D is less than about 1 mm, or less than about 500 micrometers, or less than about 200 micrometers. In some embodiments, D is in a range of about 30 micrometers to about 500 micrometers, or about 50 micrometers to about 200 micrometers. In some embodiments, the particles 30 are magnetic particles. In some embodiments, the particles 30 are nonmagnetic particles and other particles (not shown in FIGS. 24 and 24A) are magnetic particles. The particles 30 can be thermally conductive and/or electrically conductive, for example.

In some embodiments, each substantially continuous layer of particles has a thickness T along a fourth direction (e.g., y-direction or y'-direction (see FIG. 25)) orthogonal to the first and second directions. The thickness T can be an average thickness of the layer. In some embodiments, D/T≥100. In some embodiments, the third (e.g., y-direction) and fourth directions are substantially parallel (e.g., within 30 degrees, or 20 degrees, or 10 degrees, or 5 degrees of parallel). In some embodiments, the substantially continuous layers 41 of particles 30 have an average thickness T and an average separation S, where S≥T. In some embodiments, at least some of the substantially continuous layers 41 of particles 30 are substantially parallel to one another.

In some embodiments, the layers 41 of particles are tilted relative to a thickness direction of the layer or film. FIG. 25 is a schematic cross-sectional view of a layer or film 2180 generally corresponding to layer or film 2080 except that the layers 41 of particles 30 extend generally along the x- and z'-directions. In some embodiments, a layer or film 2180 includes a plurality of particles 30 dispersed between opposing first and second major surfaces of the layer or film 2180. The particles 30 are sufficiently densely packed so as to form a plurality of substantially continuous layers 41 of particles generally extending along orthogonal first (e.g., x) and second (e.g., z') directions, at least one of the first and second directions forming an oblique angle with respect to a thickness direction (z-direction) of the layer or film 2180. For example, the second direction z' forms an oblique angle φ with the thickness direction z in the illustrated embodiment. In some embodiments, at least some of the particles are thermally conductive. In some embodiments, at least some of the particles are electrically conductive.

In some embodiments, the layer or film (e.g., 2080 or 2180) is a magnetic film and the plurality of particles 30 is a plurality of magnetically permeable particles. In some embodiments, the layer or film (e.g., 2080 or 2180) is an electrically conductive adhesive layer and the plurality of particles 30 is a plurality of electrically conductive particles. In some embodiments, the layer or film (e.g., 2080 or 2180) is a thermal interface layer and the plurality of particles 30 is a plurality of thermally conductive particles.

Figure 26:
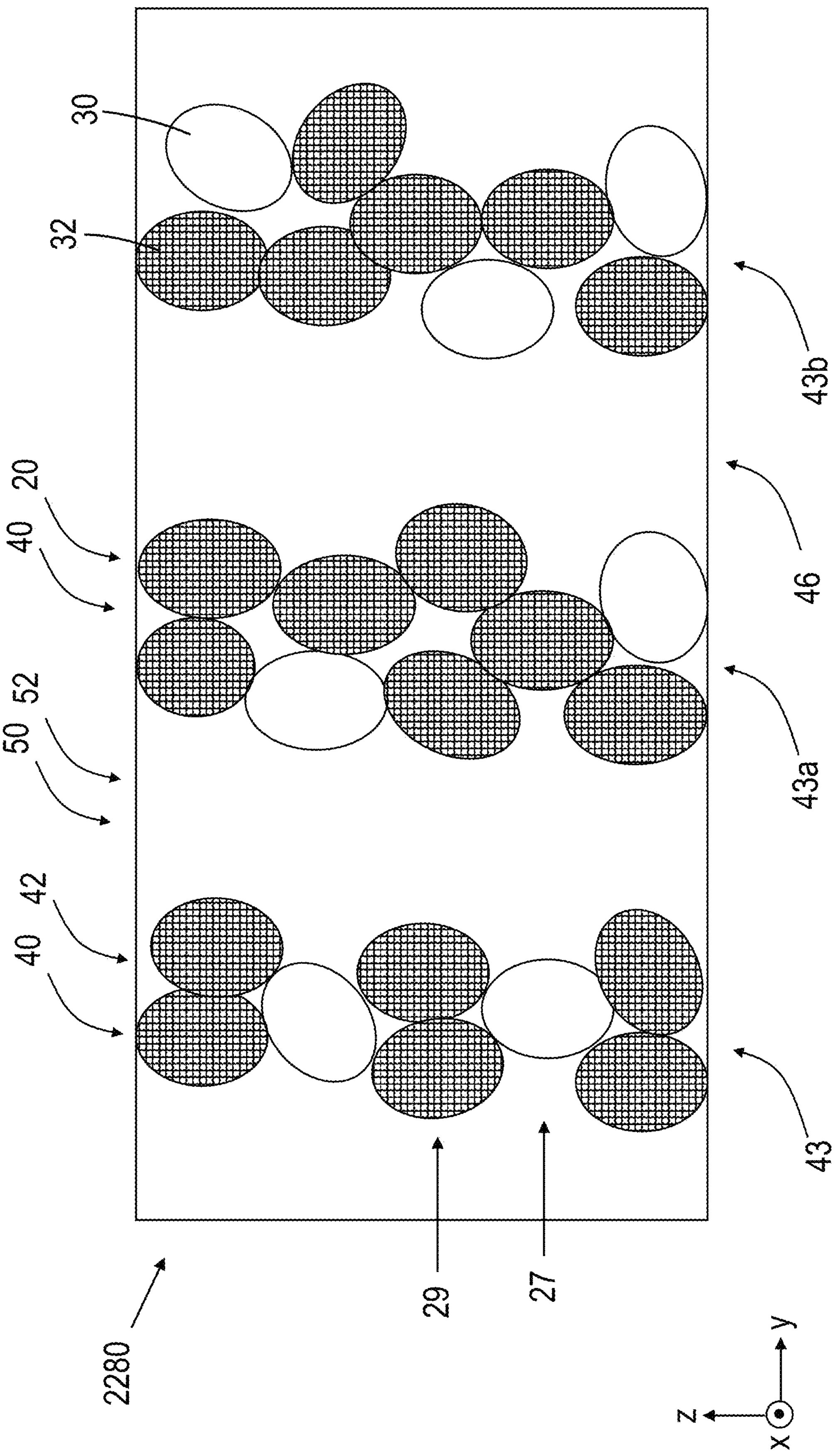
FIG. 26 is a schematic cross-sectional view of a layer or film including first and second pluralities of particles according to some embodiments of the present disclosure.
Figure 27:
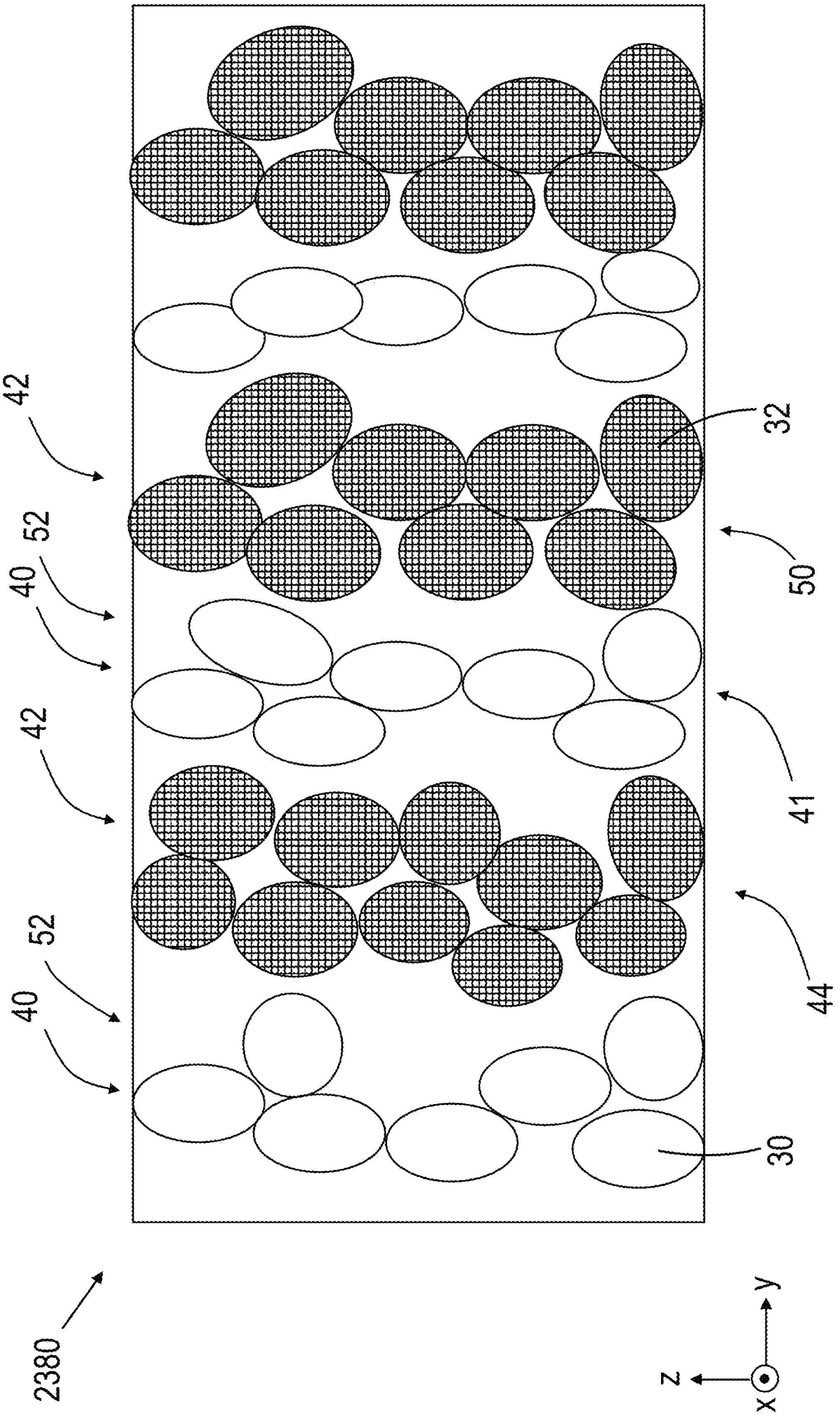
FIG. 27 is a schematic cross-sectional view of a layer or film including first and second pluralities of particles according to some embodiments of the present disclosure.

In some embodiments, the layer or film includes different first and second particles. FIGS. 26-27 are schematic cross-sectional views of layers or films 2280 and 2380, respectively, that includes first and second particles 30 and 32. Layers or films 2280 and 2380 correspond to layer or film 2080, for example, except for including both first and second particles.

In some embodiments, a layer or film 2180 or 2280 includes pluralities of first (30) and second (32) particles having respective real parts of relative magnetic permeability $\mu'_1$ and $\mu'_2$, where for at least one frequency less than about 1 GHz, $\mu'_1/\mu'_2 \geq 5$. Alternatively, or additionally, the first and second particles can have different compositions. In some embodiments, for at least one cross-section of the film or layer and for each of the first and second particles, the particle has alternating higher and lower densities, where the higher density includes a plurality of the particle. The first particle 30 has alternating higher (40) and lower (50) densities, and the second particle 32 has alternating higher (42) and lower (52) densities. In some embodiments, in the at least one cross-section of the layer or film 2280, the first and second particles have substantially coincident (e.g., coincident or coincident to within a thickness of the layer of particles or to within half a thickness of the layer) alternating higher and lower densities (e.g., in FIG. 26, higher densities 40 and 42 are substantially coincident, and lower densities 50 and 52 are substantially coincident). In some embodiments, in the at least one cross-section (e.g., y-z cross-section) of the layer or film 2380, the higher densities 40 of the first particle 30 alternate with the higher densities 42 of the second particle 32. Similarly, in some embodiments, in the at least one cross-section of the layer or film 2380, the lower densities 50 of the first particle 30 alternate with the lower densities 52 of the second particle 32. In some embodiments, the at least one cross-section includes a cross-section (e.g., y-z cross-section) parallel to a thickness direction of the layer or film. In some embodiments, the at least one cross-section includes a cross-section (e.g., x-y cross-section) orthogonal to a thickness direction of the layer or film (see, e.g., FIGS. 3C and 3E).

In some embodiments, the layer or film (e.g., 2280 or 2380) is a magnetic film, the plurality of particles 30 is a plurality of first magnetically responsive particles, and the plurality of particles 32 is a plurality of second magnetically responsive particles. In some embodiments, the layer or film (e.g., 2280 or 2380) is an electrically conductive adhesive layer, the plurality of particles 30 is a plurality of magnetically responsive particles, and the plurality of particles 32 is a plurality of electrically conductive particles. In some embodiments, the layer or film 2080 is a thermal interface layer, the plurality of particles 30 is a plurality of magnetically responsive particles, and the plurality of particles 32 is a plurality of thermally conductive particles.

In some embodiments, the first particles 30 and/or the second particles 32 include at least one of substantially spherical particles, substantially spheroidal particles, or substantially ellipsoidal particles. In some embodiments, the first particles are or include flakes, as described further elsewhere herein, and the second particles are or include at least one of substantially spherical particles, substantially spheroidal particles, or substantially ellipsoidal particles.

In some embodiments, the layer or film (e.g., 2080, 2180, 2280, 2380, or layers or films described elsewhere herein) has at least one property that has different values in different directions. For example, property $\alpha$ schematically illustrated in FIGS. 24 and 24A has values $\alpha_1$, $\alpha_2$, and $\alpha_3$ along the x-, z- and y-directions, respectively. In some embodiments, the property $\alpha$ is the real part of the relative magnetic permeability of the layer or film (e.g., when the layer or film is a magnetic film). In some embodiments, the property $\alpha$ is the thermal conductivity of the layer or film (e.g., when the layer or film is a thermal interface layer). In some embodiments, the property $\alpha$ is the electrical conductivity of the layer or film (e.g., when the layer or film is an electrically conductive adhesive layer). In some embodiments, $\alpha_2>\alpha_3$. In some embodiments, $\alpha_1>\alpha_3$. In some embodiments, $\alpha_2>\alpha_1$.

In some embodiments, a layer or film (e.g., 2080, 2180, 2280, 2380, or layers or films described elsewhere herein) has first and second thermal conductivities (e.g., corresponding to $\alpha_2$ and $\alpha_3$ of FIGS. 24 and 24A) along substantially mutually orthogonal respective first (e.g., z) and second (e.g., y) directions, where the first and second directions are substantially parallel to at least one cross-section (e.g., y-z cross-section and/or a cross-section where the particles have alternating higher and lower densities). In some embodiments, the first thermal conductivity is greater than the second thermal conductivity by at least a factor of 2. In some embodiments, a thermal interface layer, or other layer or film described herein, has a thermal conductivity in the thickness direction of the layer of at least 2 W/mK. In some embodiments, the thermal conductivity in the thickness direction is at least 2.5 W/mK, or at least 3 W/mK, or at least 3.5 W/mK.

In some embodiments, a layer or film (e.g., 2080, 2180, 2280, 2380, or layers or films described elsewhere herein) has first and second electrical conductivities (e.g., corresponding to $\alpha_2$ and $\alpha_3$ of FIGS. 24 and 24A) along substantially mutually orthogonal respective first (e.g., z) and second (e.g., y) directions, where the first and second directions are substantially parallel to at least one cross-section (e.g., y-z cross-section and/or a cross-section where the particles have alternating higher and lower densities). In some embodiments, the first electrical conductivity is greater than the second electrical conductivity by at least a factor of 2. In some embodiments, the layer has an electrical resistance in the thickness direction of less than about 1 ohm, or less than about 0.3 ohms, or less than about 0.1 ohm. The electrical resistance in the thickness direction can be in a range of about 0.005 ohms to about 0.5 ohms, or about 0.01 ohms to about 0.1 ohms, for example. Electrical resistance can be measured as described in U.S. Pat. Appl. Pub. No. 2009/0359862 (Fang et al.).

In some embodiments, a layer or film (e.g., 2080, 2180, 2280, 2380, or layers or films described elsewhere herein) has first and second real parts of relative permeabilities $\mu'_a$ and $\mu'_b$ (e.g., corresponding to $\alpha_2$ and $\alpha_3$ of FIGS. 24 and 24A) along substantially mutually orthogonal respective first (e.g., z) and second (e.g., y) directions, where the first and second directions are substantially parallel to at least one cross-section (e.g., y-z cross-section and/or a cross-section where the particles have alternating higher and lower densities). In some embodiments, for at least one frequency, $\mu'_a$ is greater than $\mu'_b$ by at least 5 percent or at least 8 percent. The at least one frequency can be less than 100 GHz, in a range of 1 MHz to 100 GHz, or in a range of 10 GHz to 50 GHz, for example. The at least one frequency can be an operating frequency (e.g., 33.25 GHz) of a system including the layer, for example. In some embodiments, a layer or film (e.g., 2080, 2180, 2280, 2380, or layers or films described elsewhere herein) has first and second real parts of relative permeabilities $\mu'_c$ and $\mu'_d$ (e.g., corresponding to $\alpha_1$ and $\alpha_3$ of FIGS. 24 and 24A) along substantially mutually orthogonal respective first (e.g., x) and second (e.g., y) in-plane directions. In some embodiments, for the at least one frequency, $\mu'_c$ is greater than $\mu'_d$ by at least 5 percent or at least 8 percent. In some embodiments, the layer or film has first and second imaginary parts of relative permeabilities $\mu''_c$ and $\mu''_d$ (e.g., corresponding to $\alpha_1$ and $\alpha_3$ of FIGS. 24 and 24A) along substantially mutually orthogonal respective first and second in-plane directions, where for the at least one frequency, $\mu''_c$ is greater than $\mu''_d$ by at least 5 percent or at least 8 percent. In some embodiments, the layer or film has first and second real parts of relative permittivities $\varepsilon'_c$ and $\varepsilon'_d$ (e.g., corresponding to $\alpha_1$ and $\alpha_3$ of FIGS. 24 and 24A) along substantially mutually orthogonal respective first and second in-plane directions, where for the at least one frequency, $\varepsilon'_c$ is greater than $\varepsilon'_d$ by at least 15 percent or at least 20 percent. In some embodiments, the layer or film has first and second imaginary parts of relative permittivities $\varepsilon''_c$ and $\varepsilon''_d$ (e.g., corresponding to $\alpha_1$ and $\alpha_3$ of FIGS. 24 and 24A) along substantially mutually orthogonal respective first and second in-plane directions, where for the at least one frequency, $\varepsilon''_c$ is greater than $\varepsilon''_d$ by at least 15 percent or at least 30 percent.

Figure 45:
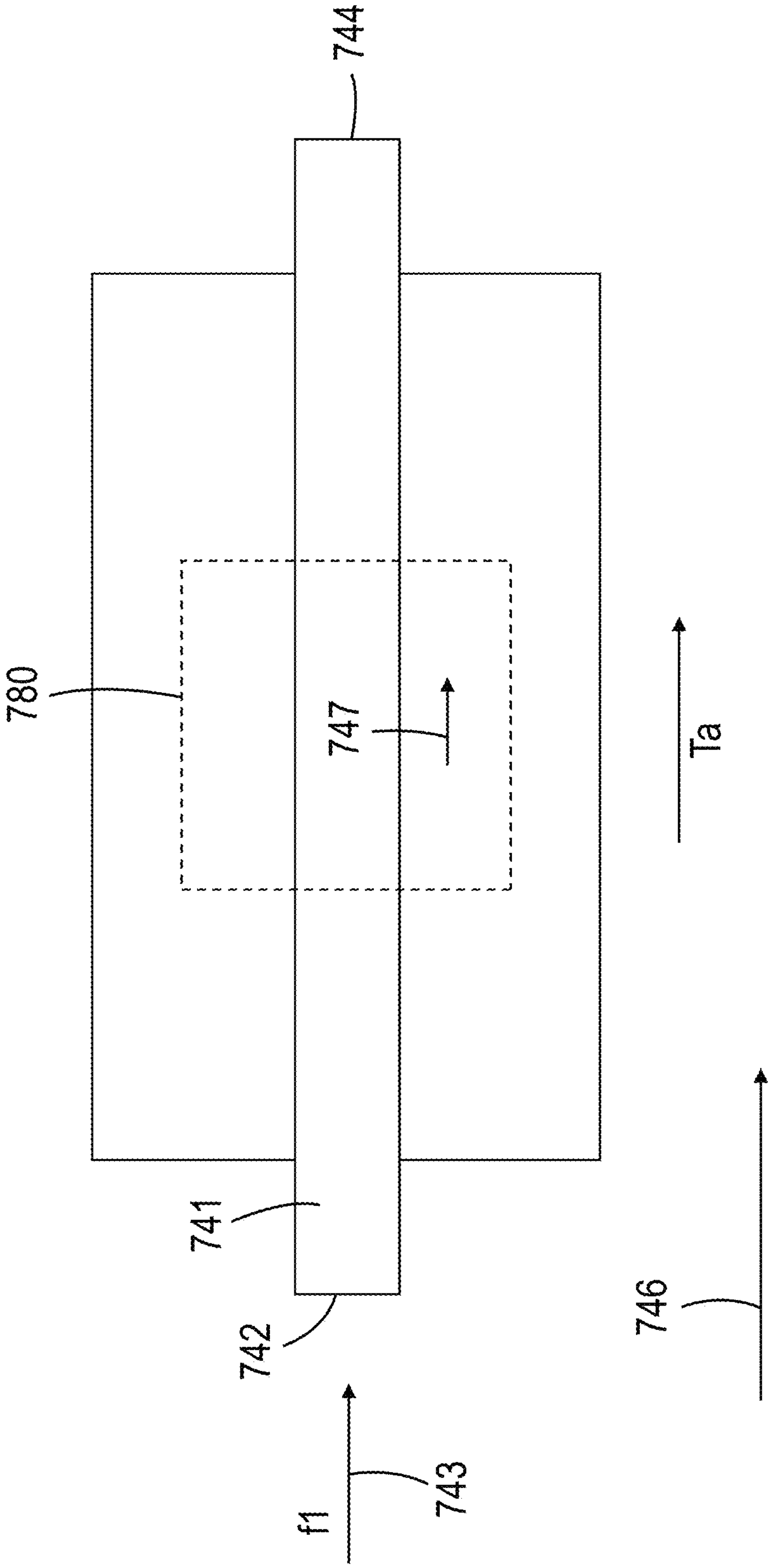
FIGS. 45 and 45A are schematic top views of a transmission line.
Figure 45A:
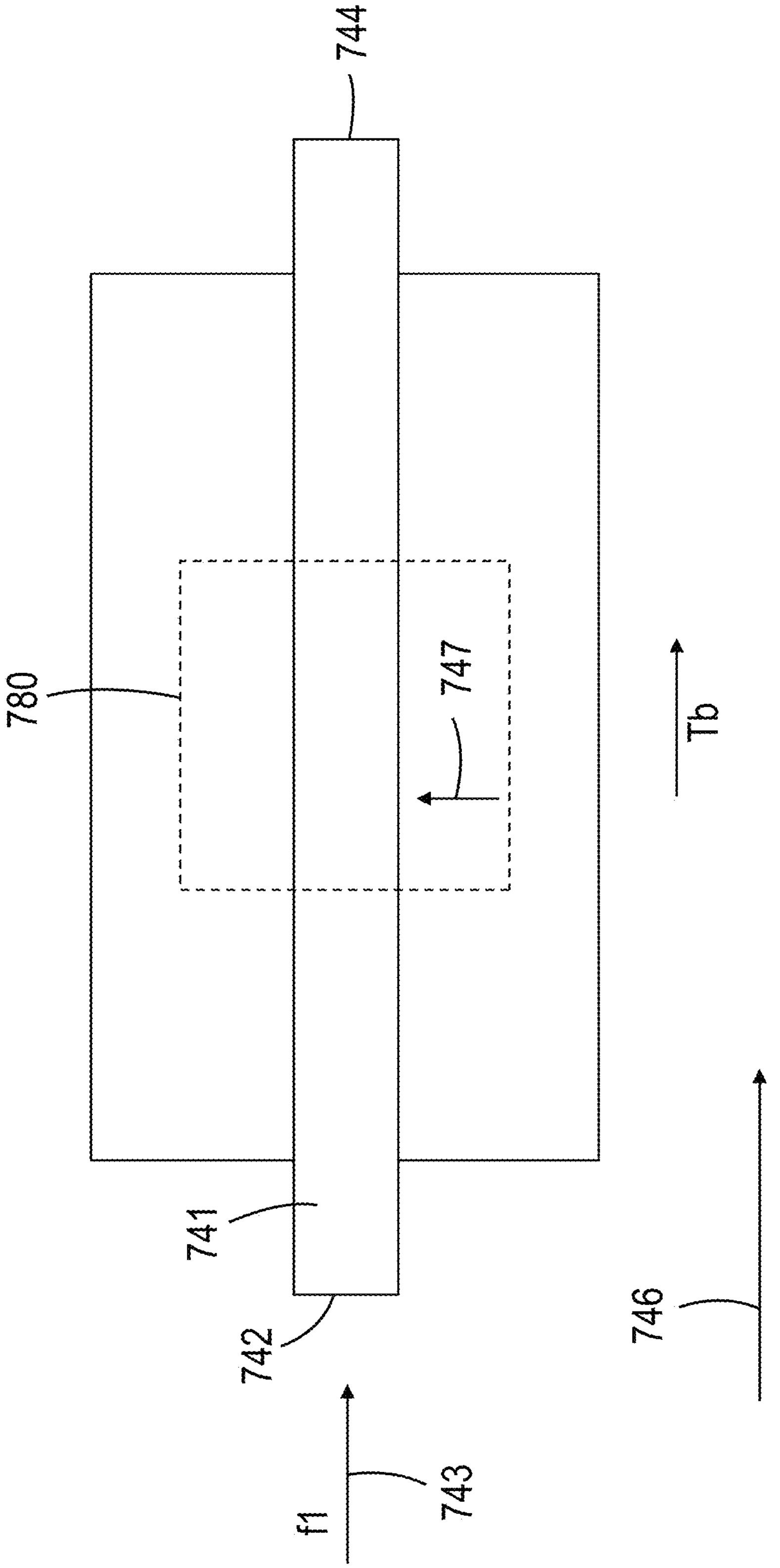

In some embodiments, a magnetic film (e.g., corresponding to layers or films 2080, 2180, 2280, 2380, or layers or films described elsewhere herein)) has opposing first (10) and second (20) major surfaces and a plurality of magnetically permeable particles (e.g., particles 30) dispersed therebetween. The particles are so arranged to define mutually orthogonal in-plane first (e.g., x-direction, or direction along layers of particles) and second (e.g., y-direction, or direction orthogonal to layers of particles) directions of the film. FIGS. 45 and 45A are schematic top views of a transmission line 741 that can be used for testing a layer or film 780 where the first direction 747 of the layer or film 780 is indicated. In some embodiments, when the first major surface of the magnetic film is disposed on, and substantially parallel to, a transmission line 741 elongated along a length direction 746 and including opposing first (742) and second (744) ports, and a signal 743 at a first frequency f1 greater than about 10 GHz, or in a range of about 10 GHz to about 30 GHz or to about 20 GHz, is applied to the first port 742, a transmission coefficient (e.g., the S12 parameter of FIG. 45D) of the transmission line 741 is Ta (in dB) when the first direction 747 is substantially parallel to the length direction and Tb (in dB) when the first direction is substantially orthogonal to the length direction. In some embodiments, Ta/T2≥1.3.

In some embodiments, the alternating higher and lower densities of the particles results in the layer or film having an improved flexibility compared to a layer having a uniform distribution of the particles when bent around an axis parallel to the x-axis, for example. This can be useful for applying the layer or film on a curved surface, for example.

Figure 54:
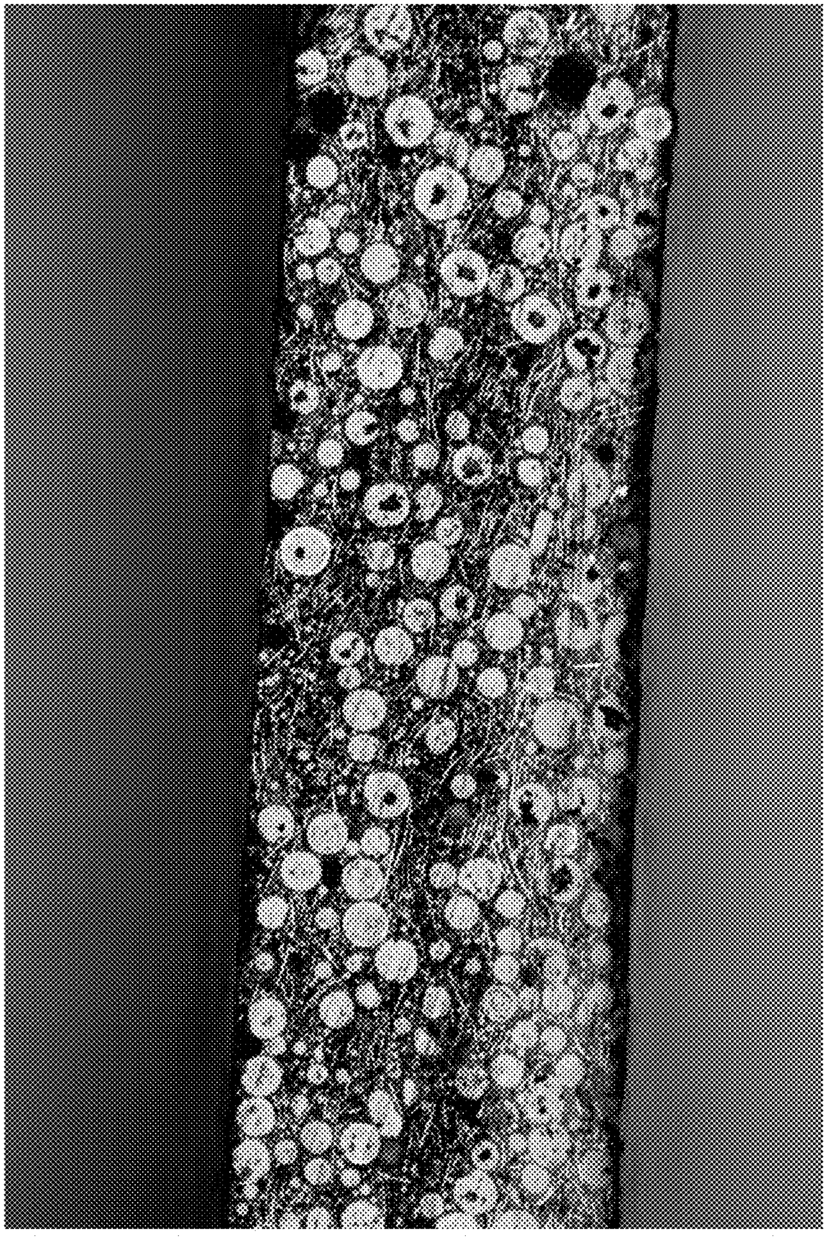
FIG. 54 is an image of a cross-section of another thermal interface layer that was not subjected to an applied rotating magnetic field.
Figure 54A:
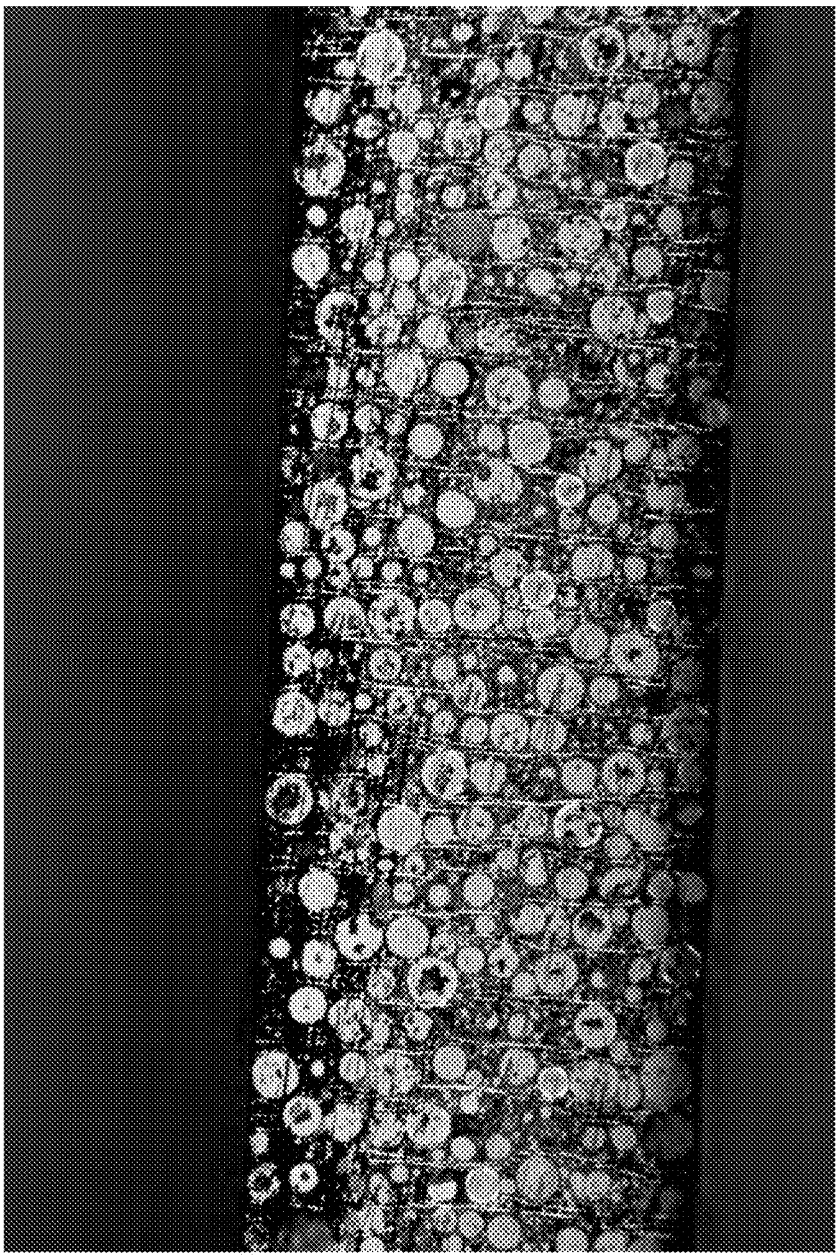
FIG. 54A is an image of a cross-section of another thermal interface layer that was subjected to an applied rotating magnetic field.

In some embodiments, a layer or film 2280 includes a plurality of substantially continuous layers 43 of particles generally extending along orthogonal first (e.g., x) and second (e.g., z) directions and arranged along a third (e.g., y) direction, where each substantially continuous layer 43 of particles includes a plurality of first particles 30 having a first composition and a plurality of second particles 32 having a different second composition. Each pair 43*a*, 43*b* of adjacent substantially continuous layers 43 of particles defines a space 46 therebetween. Each of the first and second particles have a lower density in the space 46 between, than in each of, the layers 43 of particles. In some embodiments, one or more (e.g., a majority) of the substantially continuous layers 43 of particles includes first (27) and second (29) regions interspersed with one another where the first regions 27 have a higher density of the first particle 30 and a lower density of the second particles 32, and the second regions have a higher density of the second particle 32 and a lower density of the first particle 30. In some embodiments, at least some of the first regions 27 include only a single particle. In some embodiments, at least a majority of the second regions 29 include a plurality of the second particles 32. In some embodiments, at least a majority of the second regions 29 are free from first particles 30. FIG. 54A shows a first region containing a single first particle and disposed between adjacent second regions each containing a plurality of second particles.

In some embodiments, a layer or film 2380 includes a plurality of alternating layers 41, 44, of first (30) and second (32) particles, respectively, where the alternating layers 41, 44 generally extend along orthogonal first (e.g., x) and second (e.g., z or z') directions and are arranged along a third (e.g., y) direction. The first (30) and second (32) particles have different compositions.

In some embodiments, a layer or film includes pluralities of first and second particles having respective real parts of relative magnetic permeability $\mu'_1$ and $\mu'_2$. In some embodiments for at least one frequency less than about 1 GHz, $\mu'_1/\mu'_2 \geq 5$. In some embodiments, the at least one frequency includes 1000 Hz. In some embodiments, the at least one frequency includes a frequency less than 10 Hz (e.g., 1 Hz). In any embodiment where a magnetic or electrical property is specified for at least one frequency less than about 1 GHz, the at least one frequency can be or include 1000 Hz, 100 Hz, 10 Hz, and/or 1 Hz.

In some embodiments, the layer or film (e.g., 2080, 2180, 2280, 2380, or layers or films described elsewhere herein) has a total volume loading of particles less than about 70 percent, or less than about 60 percent, or less than about 55 percent, or less than about 50 percent, or less than about 45 percent, or less than about 40 percent, or less than about 35 percent, or less than about 30 percent. In some embodiments, the total volume loading is greater than about 25 percent, or greater than about 30 percent, or greater than about 35 percent, or greater than about 40 percent, or greater than about 45 percent. The desired volume loading typically depends on the size and/or shape of the particles, on how many types of particles are included, and on desired properties of the layer or film. For example, in some embodiments, a total volume loading of less than about 35 percent is used when roughly spherical or irregular shaped magnetic particles are utilized since a higher volume loading can result in reduced ordering of the particles when a magnetic field is applied. In some embodiments, first and second particles are included, where the first particles are magnetically responsive flakes. It has been found that for some such embodiments, or for other embodiments, a total volume loading of the first particles in the range of about 1 percent to about 20 percent, or about 2 percent to about 12 percent, or about 2.5 percent to about 10 percent is a suitable loading to provide a desired ordering and/or alignment and/or positioning of the second particles (e.g., the first particles can cause the second particles to at least partially align). In some such embodiments, or in other embodiments, a total volume loading of the first and second particles is less than about 55 percent. In some embodiments, the second particles are also flakes (e.g., electrically and/or thermally conductive flakes). In some such embodiments, or in other embodiments, a total volume loading of the first and second particles is in a range of about 20 percent or about 25 percent to about 55 percent or to about 50 percent. In some embodiments, the second particles are substantially spherical, substantially spheroidal, or substantially spheroidal (e.g., electrically and/or thermally conductive spheres). In some such embodiments, or in other embodiments, a total volume loading of the first and second particles is in a range of about 40 percent to about 70 percent, or about 45 percent to about 60 percent. In some embodiments, the first and second particles are dispersed in a polymeric matrix (e.g., binder 70), where the polymeric matrix includes at least 50 percent by volume of the thermal interface layer.

Figure 55:
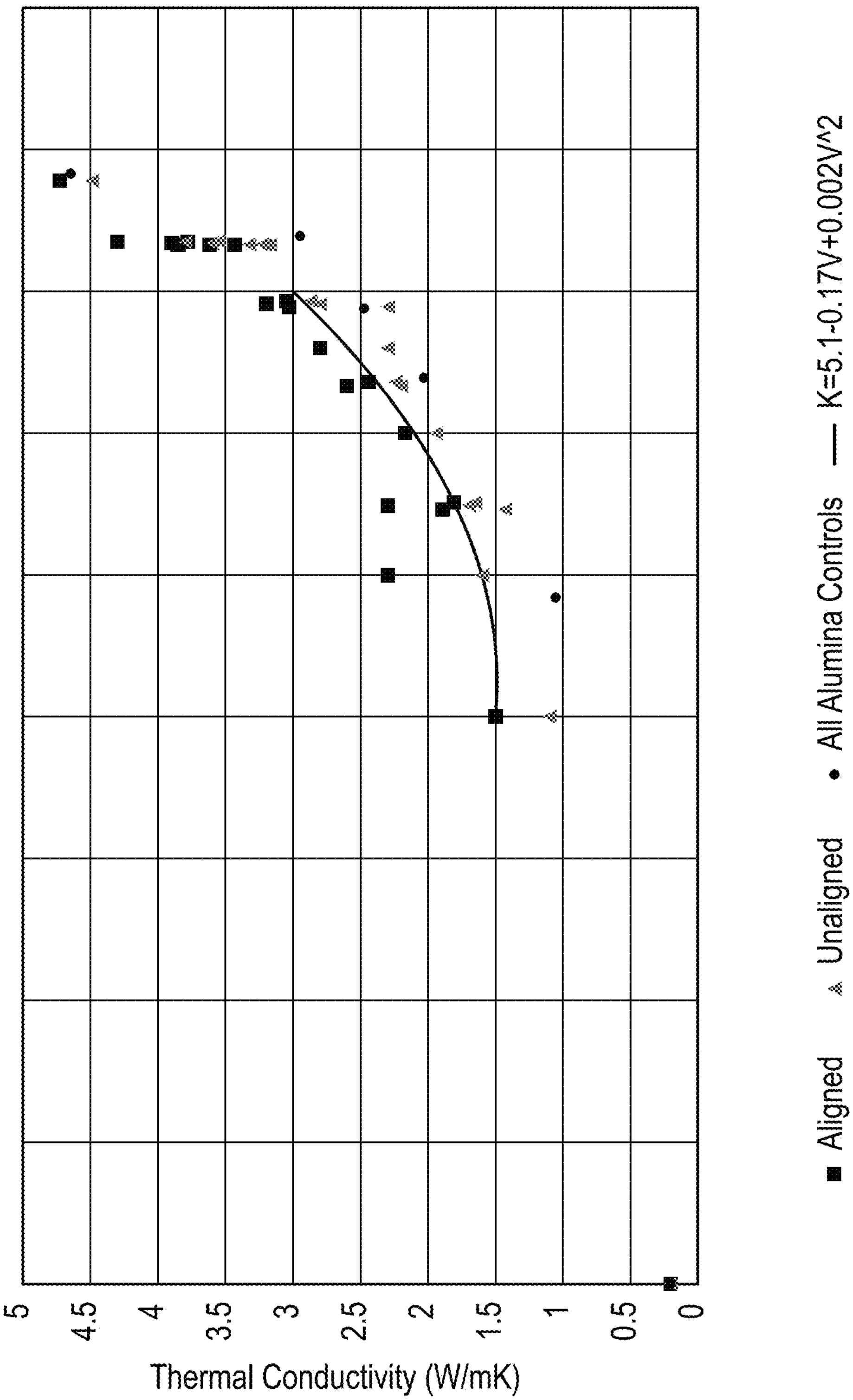
FIG. 55 is a plot of thermal conductivity versus total filer volume loading.

In some embodiments, a thermal interface layer includes pluralities of first and second particles dispersed in a polymeric binder at a total loading V in a range of about 40 volume percent to about 70 volume percent, and the thermal interface layer has a thermal conductivity in a thickness direction of the thermal interface layer in units of W/mK of at least $K=5.1-0.17\ V+0.002\ V^2$ (see, e.g., FIG. 55). For example, at a volume loading of V=60 volume percent, $K=5.1-0.17*60+0.002*60^2=2.1$ W/mK. A ratio of a total volume of the first particles to a total volume of the first and second particles can be in a range of about 0.04 to about 0.1 (see, e.g., FIG. 56). In some embodiments, the second particles are at least partially aligned so as to increase a thermal conductivity of the thermal interface layer by at least 10 percent (e.g., as compared to unaligned or randomly distributed second particles). In some embodiments, the second particles are at least partially aligned so as to increase a thermal conductivity of the thermal interface layer by at least 20 percent, or at least 25 percent, or at least 30 percent (see, e.g., FIG. 56).

Figure 28:
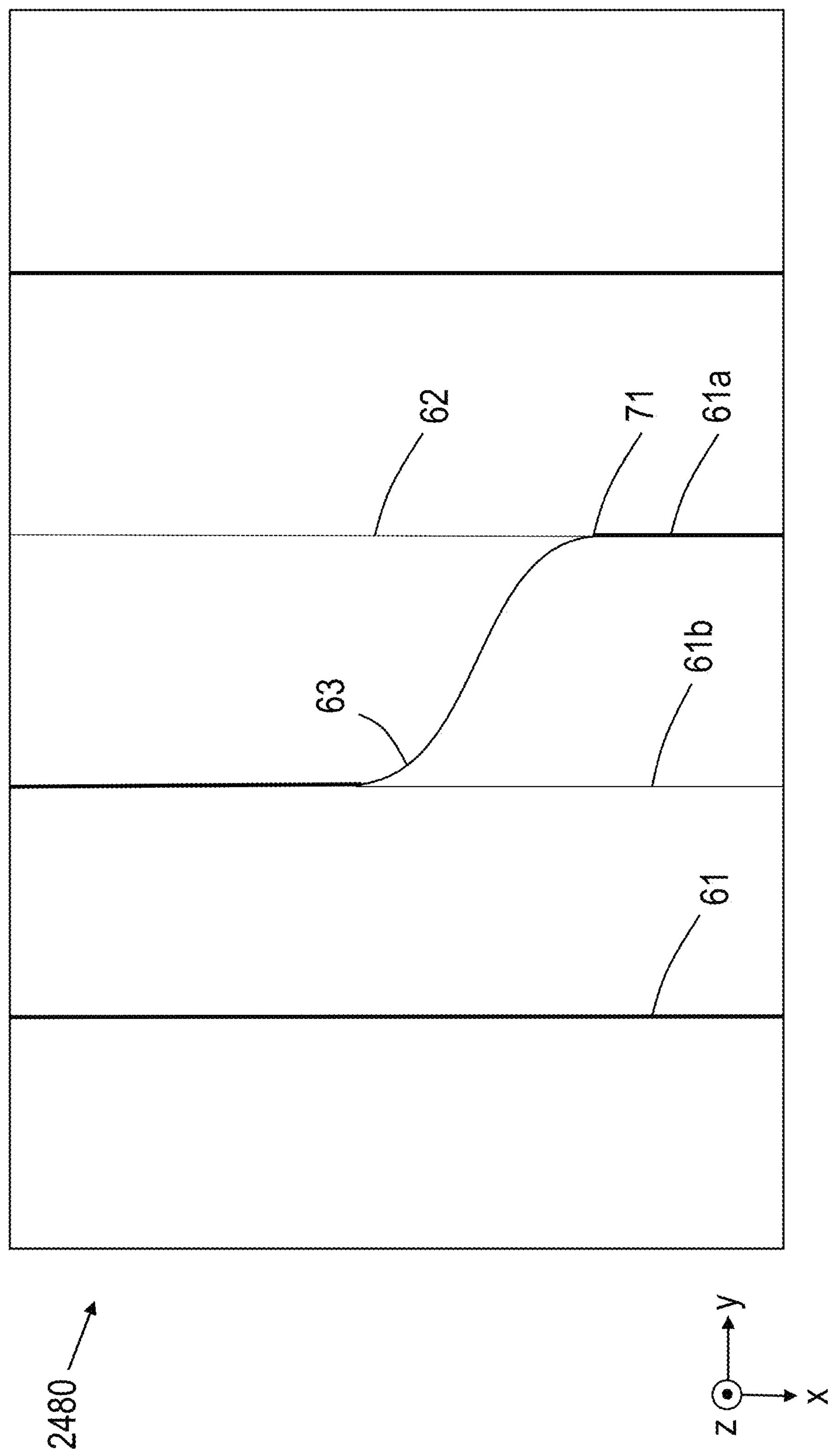
FIG. 28 is a schematic top view of a layer or film according to some embodiments of the present disclosure.

FIG. 28 is a schematic top view of a layer or film 2480. In some embodiments, a layer of film 2480 includes particles agglomerated so as to form a plurality of substantially continuous layers 61 of particles generally extending along orthogonal first (e.g., x) and second (e.g., z or z') directions and arranged along a third direction (e.g., y-direction). In some such embodiments, at least one (61*a*) of the substantially continuous layers 61 of particles splits at a fork 71 into first (62) and second (63) sublayers. Each sublayer 62, 63 generally extends along the first and second directions. The second sublayer 63 can merge with an adjacent substantially continuous layer 61*b*, for example. In some embodiments, the plurality of substantially continuous layers 61 of particles are spaced apart except for discrete regions where a sublayer of particles from one layer merges with another layer.

Figure 29:
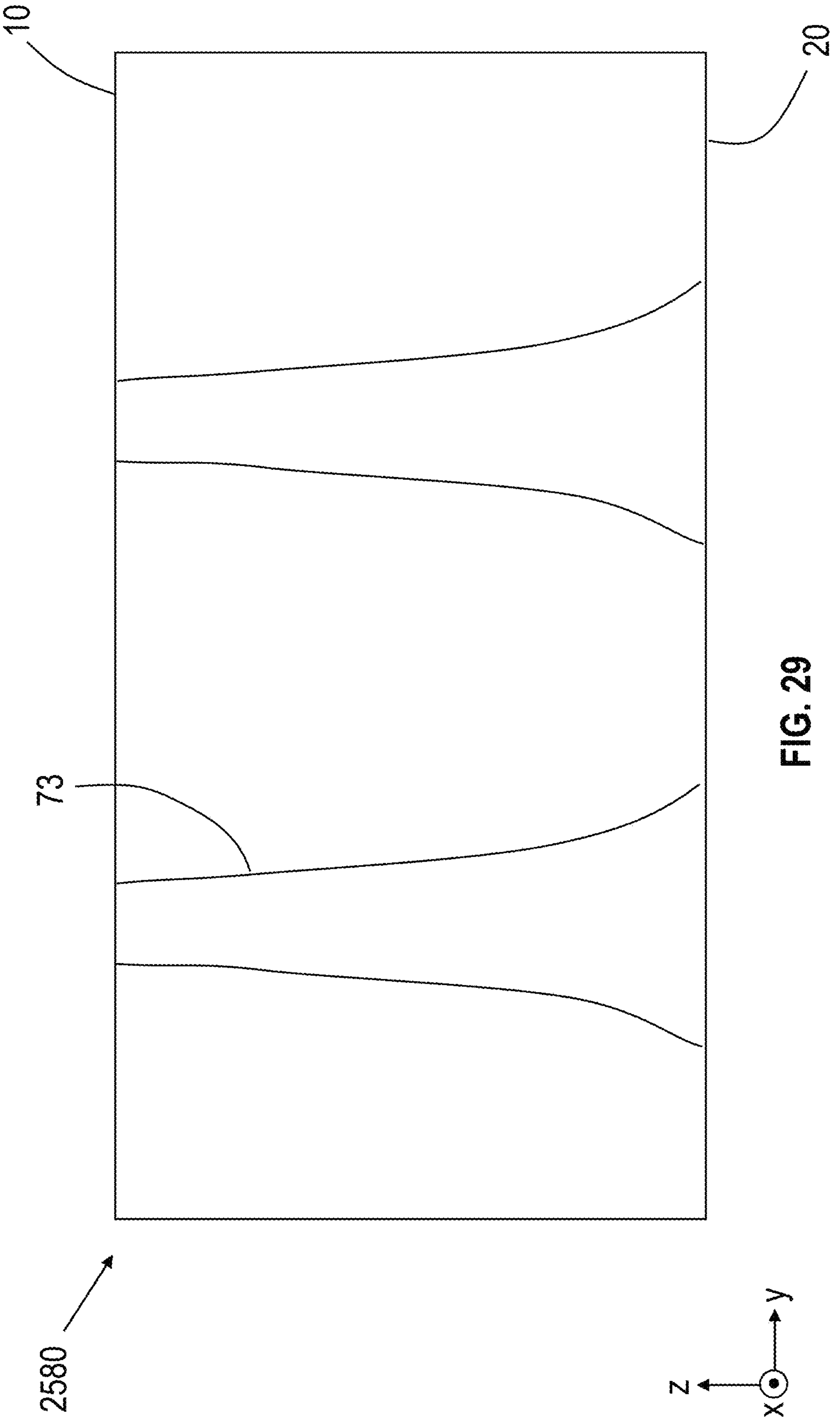
FIGS. 29-30 are schematic cross-sectional views of layers or films according to some embodiments of the present disclosure.
Figure 30:
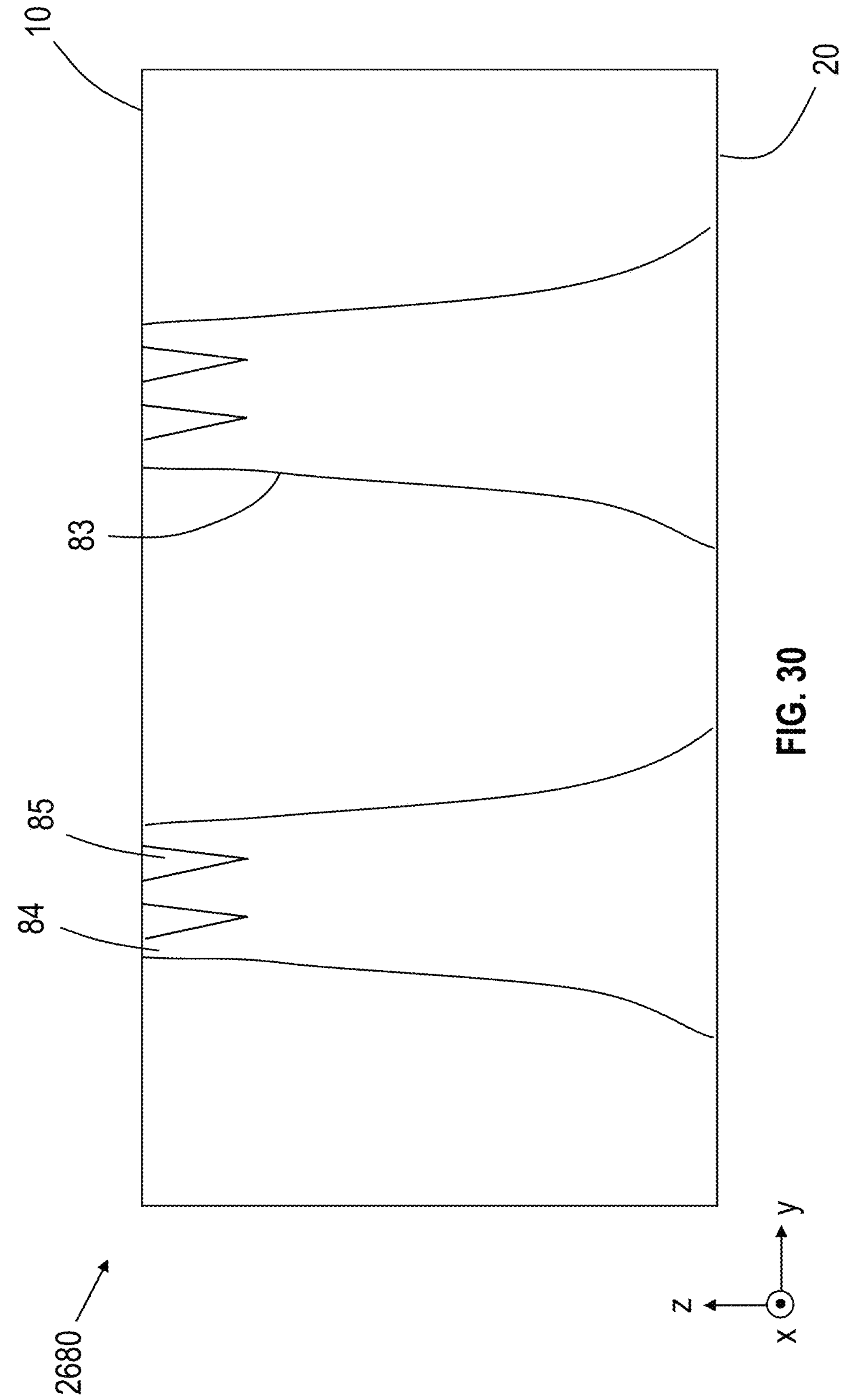

In some embodiments, a layer or film includes particles dispersed between opposing first and second major surfaces of the layer or film where the particles are agglomerated so as to form a plurality of layers of particles generally extending along orthogonal first and second directions and arranged along a third direction, where each layer of particles extends from the first to the second major surface. The layers have a thickness along a fourth direction (e.g., y-direction) orthogonal to the first and second directions. FIG. 29 is a schematic cross-sectional view of a layer or film 2580 including layers 73 of particles (schematically indicated by solid lines indicating approximate boundaries of the layers) that have a smaller thickness near the first major surface 10 and a larger thickness near the second major surface 20. FIG. 30 is a schematic cross-sectional view of a layer or film 2680 including layers 83 of particles (schematically indicated by solid lines indicating approximate boundaries of the layers) that have a smaller thickness near the first major surface 10 and a larger thickness near the second major surface 20. Near the first major surface 10, but not the second major surface 20, the particles agglomerate with the layer 83 so as to form alternating higher (84) and lower (85) density regions. Layers such as those depicted in FIGS. 29-30 can result from flow due to gravity between the time that the layers of particles are formed and the time that the polymeric binder is cured, for example.

Figure 31:
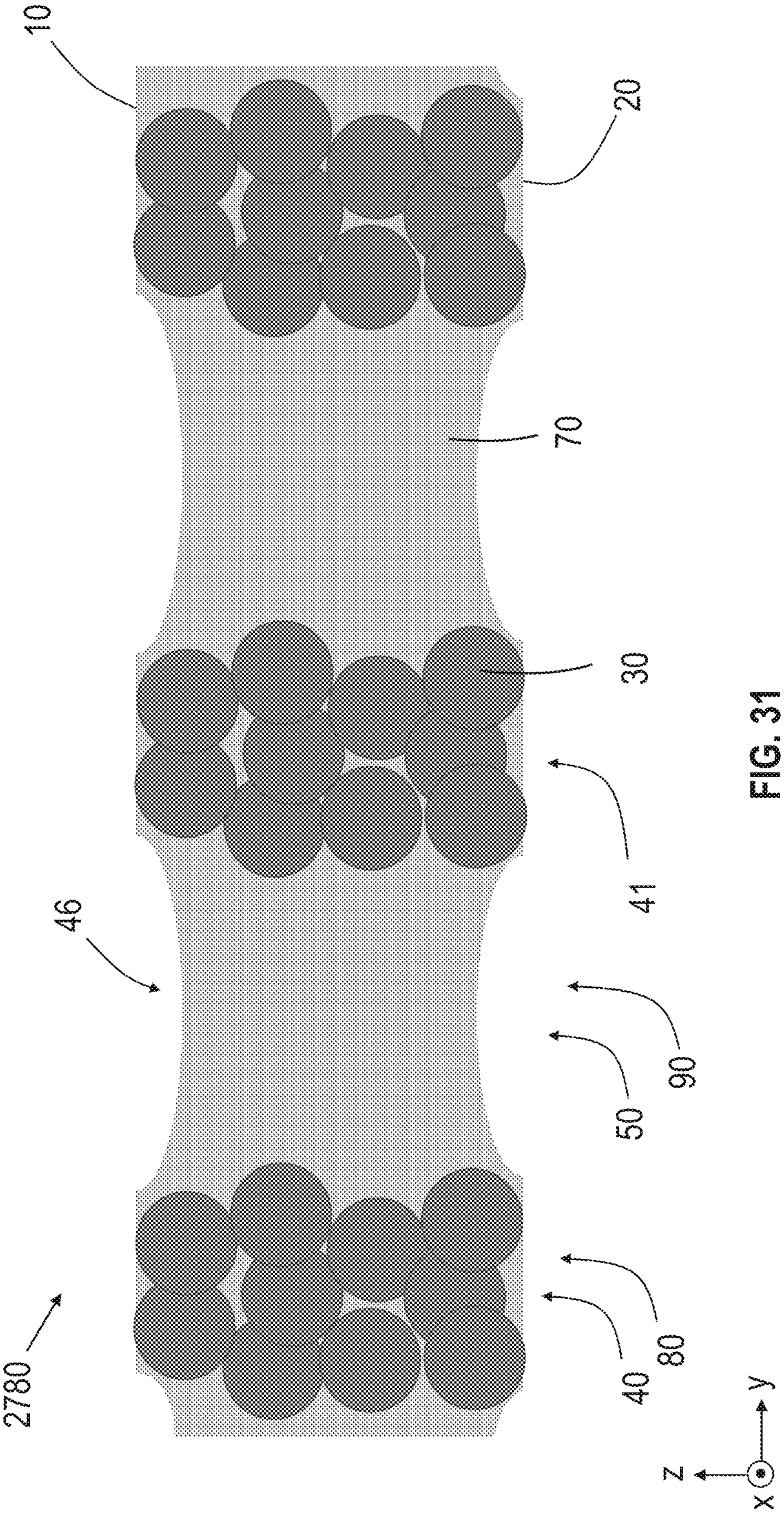
FIG. 31 is a schematic side view of a layer or film including layers of particles dispersed in a binder according to some embodiments of the present disclosure.

FIG. 31 is a schematic side view of a layer or film 2780 including layers 41 of particles 30 dispersed in a binder 70 (e.g., a polymeric matrix and/or an adhesive) between first and second major surfaces 10 and 20. The particles 30 have alternating higher (40) and lower (50) densities. The layer or film 2780 has alternating thicker (80) and thinner (90) regions corresponding to the alternating higher (40) and lower (50) densities. The first and second major surfaces 10 and 20 are structured due to the alternating higher (40) and lower (50) densities. In some embodiments, each pair of adjacent substantially continuous layers 41 of particles 30 defines a space 46 therebetween, where the particles having a lower density in the space between, than in each of, the layers of particles. The particles 30 can optionally include first and second particles as described further elsewhere herein. In some embodiments, the layer of film 2780 has alternating thicker (80) and thinner (90) regions where the thicker regions 80 are defined by the substantially continuous layers 41 of particles and the thinner regions 90 are defined by the spaces 46 between adjacent substantially continuous layers 41 of particles. The alternating thicker (80) and thinner (90) regions can result from shrinkage of the binder 70 when it is cured. For example, the binder 70 can be an ultraviolet (UV) cured acrylic resin that shrinks when cured. Any embodiment described herein where particles form layers can have a similar structure. The particles 30 can be magnetic particles and/or thermally and/or electrically conductive particles. In some embodiments, the layer or film 2780 is an adhesive layer (e.g., a pressure sensitive adhesive layer). In some such embodiments, the thinner, lower density regions provide good bonding while the thicker, higher density regions provide a "spring like effect" as the adhesive holds the particles to the surface in compression allowing for improved performance (e.g., improved electrical or thermal contact).

Figure 32:
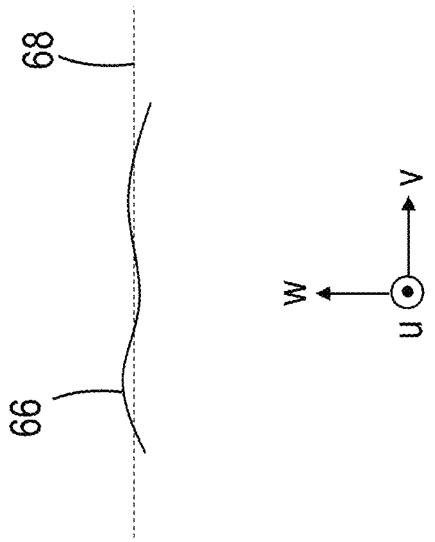
FIG. 32 is a schematic cross-sectional view of a flake.

In some embodiments, the first and/or second particles include flakes. Flakes generally extend in orthogonal first and second direction and have a thickness substantially smaller than dimensions along the first and second directions. FIG. 32 is a schematic cross-sectional view of a flake 66 extending generally along orthogonal first (u) and second (v) directions defining a plane 68 of the flake 66. An orthogonal direction w is also illustrated. The plane 68 is parallel to the u-v plane and can be taken to pass through a centroid of the flake 66. In some embodiments, a ratio of a maximum dimension of the flake in the plane of the flake to a thickness of the flake is at least about 3, 5, 8 or 10.

Figure 33:
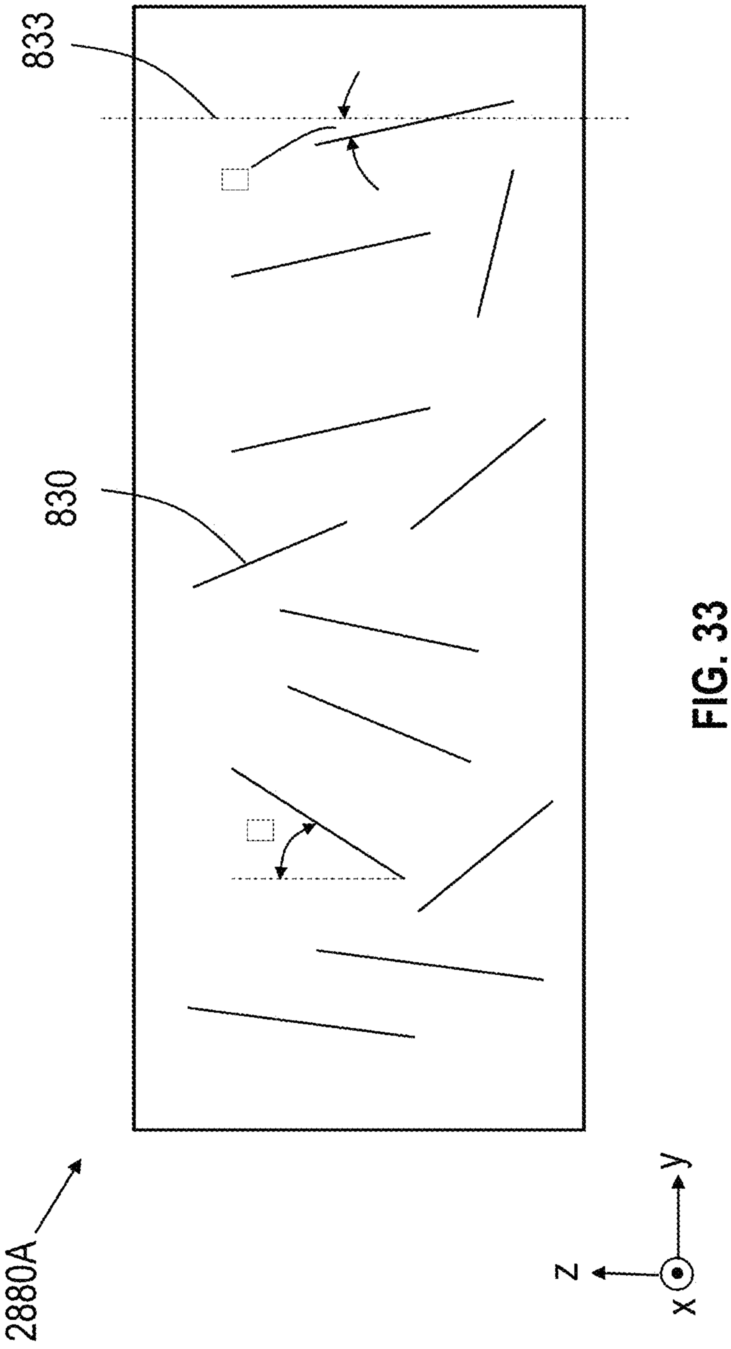
FIG. 33 is a schematic cross-sectional view of a layer or film including a plurality of flakes according to some embodiments of the present disclosure.
Figure 33A:
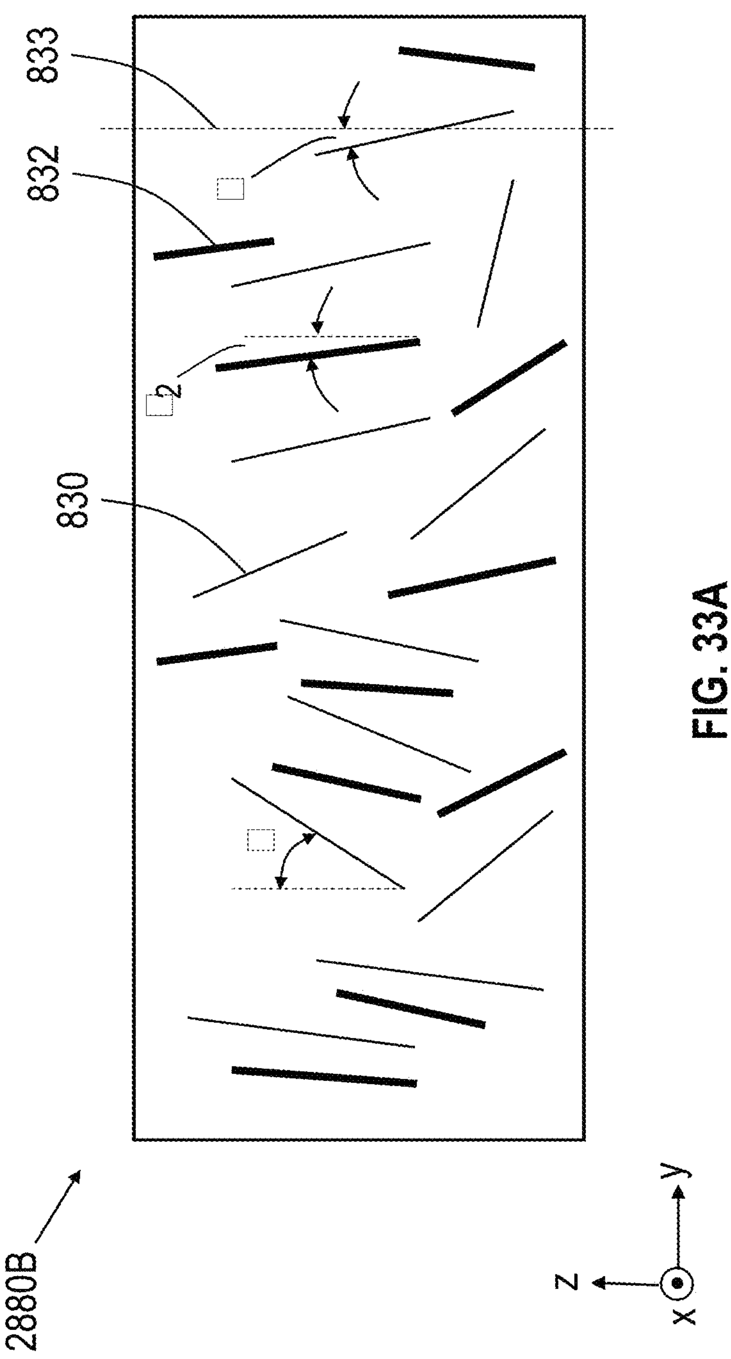
FIG. 33A is a schematic cross-sectional view of a layer or film including pluralities of first and second flakes according to some embodiments of the present disclosure.

FIG. 33 is a schematic cross-sectional view of a layer or film 2880 including a plurality of first flakes 830. The layer or film 2880 can further include a plurality of second particles which can include a plurality of second flakes and/or a plurality of substantially spherical or irregular shaped particles, for example. FIG. 33A is a schematic cross-sectional view of a layer or film 2880A corresponding to layer or film 2880 but also including a plurality of second flakes 832. Each first flake 830 extends generally along orthogonal first (e.g., u) and second (e.g., v) directions defining a plane (e.g., plane 68 of FIG. 32) of the first flake 830. In some embodiments, each first flake 830 in at least a majority of the first flakes is oriented such that the plane of the first flake makes an angle θ of less than 40 degrees, or less than 30 degrees, or less than 20 degrees, or less than 10 degrees with the thickness direction of the layer or film. In some embodiments, each first flake 830 in at least 70 percent of the first flakes is oriented such that the plane of the first flake makes an angle θ of less than 30 degrees with the thickness direction of the layer or film. The same plane 833 and the thickness direction (z-direction) can make an angle less than 30 degrees, or less than 20 degrees, or less than 10 degrees therebetween. Similarly, in some embodiments including second flake 832, each second flake 832 extends generally along orthogonal first (e.g., u) and second (e.g., v) directions defining a plane (e.g., plane 68 of FIG. 32) of the second flake 832. In some embodiments, each second flake 832 in at least a majority of the second flakes is oriented such that the plane of the second flake makes an angle θ2 of less than 40 degrees, or less than 30 degrees, or less than 20 degrees, or less than 10 degrees with the thickness direction of the layer or film. In some embodiments, the first and/or second flakes are approximately parallel to one another and to a common plane. In some embodiments, each first flake 830 in at least a majority of the first flakes is oriented such that the plane of the first flake makes an angle α of less than 40 degrees, or less than 30 degrees, or less than 20 degrees, or less than 10 degrees with a same plane 833. In some embodiments, each second flake 832 in at least a majority of the second flakes is oriented such that the plane of the second flake makes an angle of less than 40 degrees, or less than 30 degrees, or less than 20 degrees, or less than 10 degrees with the same plane 833.

In some cases, a partial alignment and/or ordering and/or positioning of the flakes 830, and a partial alignment and/or ordering and/or positioning of the second particles caused by the flakes 830, is sufficient to provide enhanced properties (e.g., increased thermal conductivity in the thickness direction). In other embodiments, a higher degree of alignment and/or ordering and/or positioning of the flakes and second particles is preferred.

Figure 34:
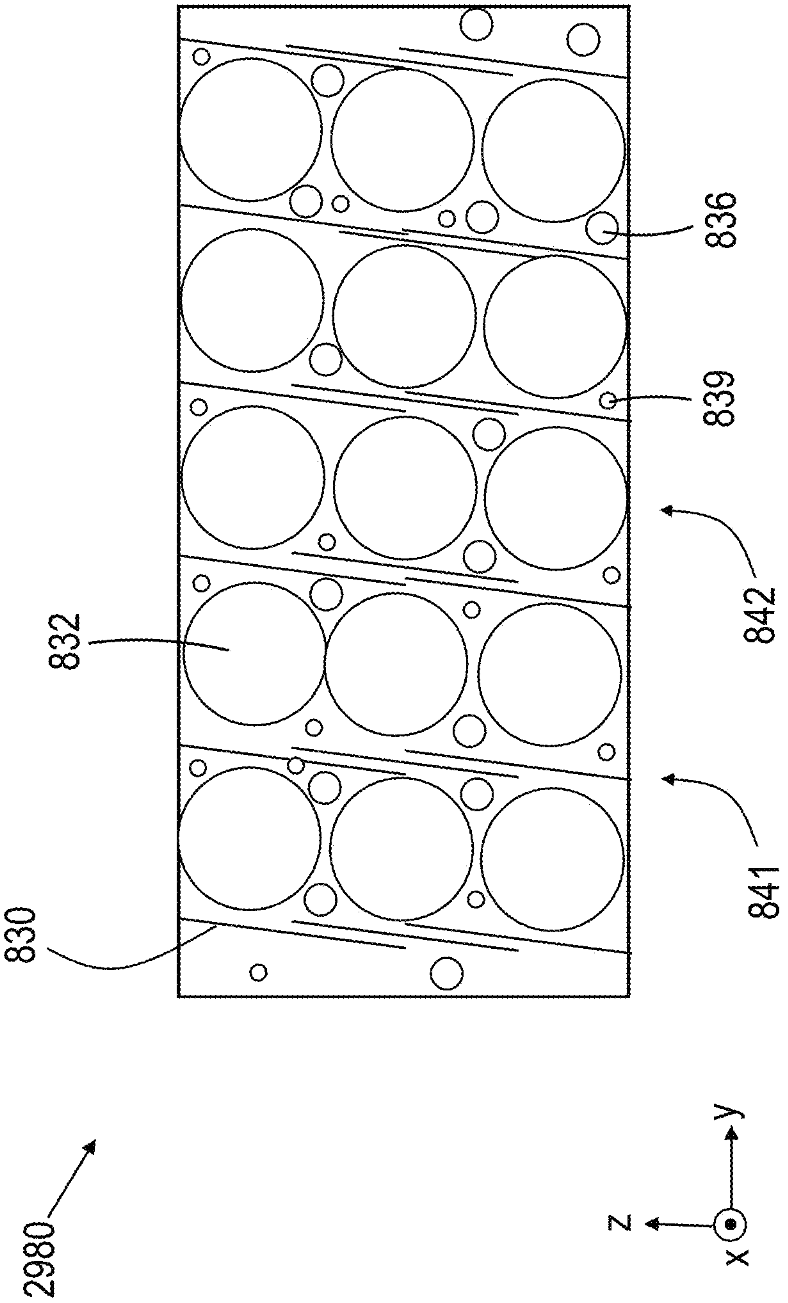
FIG. 34 is schematic cross-sectional view of a layer or film pluralities of particles according to some embodiments of the present disclosure.

FIG. 34 is schematic cross-sectional view of a layer or film 2980 including a plurality of first flakes 830, a plurality of second particles 832 (which are schematically illustrated as spherical particles, but which could alternatively be second flakes), and a plurality of optional third particles 836, and a plurality of optional fourth particles 839. The particles are agglomerated into alternating first (841) and second (842) layers, which can each be substantially continuous layers of particles. The first layers 841 are formed primarily from the first flakes 830 and the second layers 842 are formed primarily from the second particles 832 and the third particles 836. The third particles 836 may be conductive particles (e.g., thermally and/or electrically conductive) included to increase the conductivity of the layer. In some embodiments, the third particles 836 are substantially smaller than the second particles 832 (e.g., the third particles 836 can have a D50 less than 0.5, or 0.3, or 0.2 times a D50 of the second particles 832). In some embodiments, the fourth particles 839 are substantially smaller than the third particles 836 (e.g., the third particles 836 can have a D50 less than 0.5, or 0.3, or 0.2 times a D50 of the second particles 832). The layer of film 2980 can alternatively be described (e.g., when the optional particles 836 and 839 are included and have a same composition as particles 832) as including first particles 830 and second particles where the second particles include particles 832, 836, and 839. In this case, the second particles have a multimodal particle size distribution. In some embodiments, only one of the pluralities of particles 836 and 839 are included so that the second particles have a bimodal size distribution. In some embodiments, three or more, or four or more different size particles are included. Second particles (e.g., alumina or boron nitride) having a multimodal size distribution has been found, for example, to improve the thermal conductivity in a thermal interface layer, for example. The first particles (e.g., the magnetic particles) can also optionally have a multimodal particle size distribution.

The particles 832, 836, and 839 may be substantially spherical, or the particles may be flakes, or some particles may be spherical and other particles may be flakes, or other particle shapes (e.g., substantially spheroidal or substantially ellipsoidal) may be used. In some embodiments, the second particles include flakes (e.g., corresponding to particles 832 and optionally 836) and particles 839, which may be substantially spherical, substantially spheroidal, or substantially ellipsoidal, for example, are used as bridging particles to increase the thermal or electrical conduction between the flakes, for example.

Figure 34A:
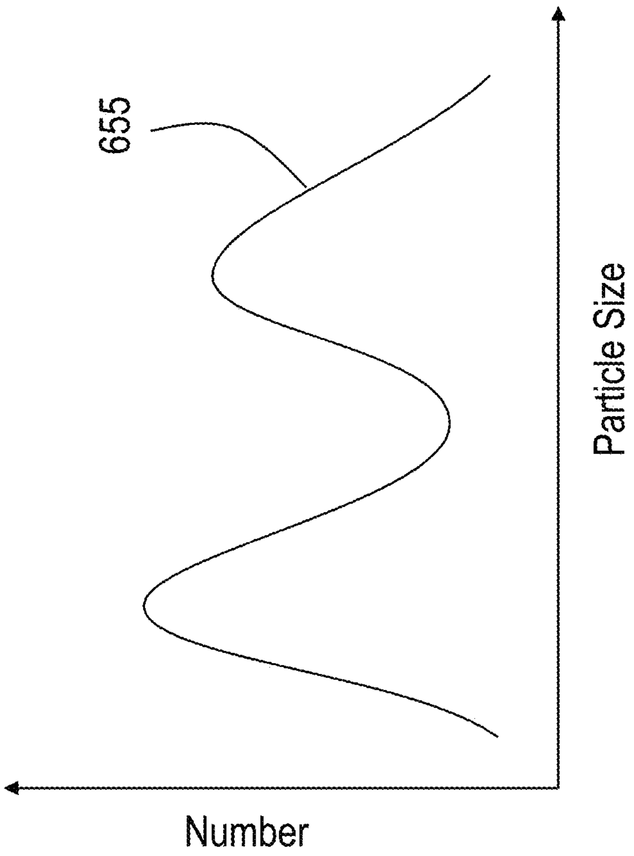
FIGS. 34A-34B are schematic illustration of multimodal size distributions of particles according to some embodiments of the present disclosure.
Figure 34B:
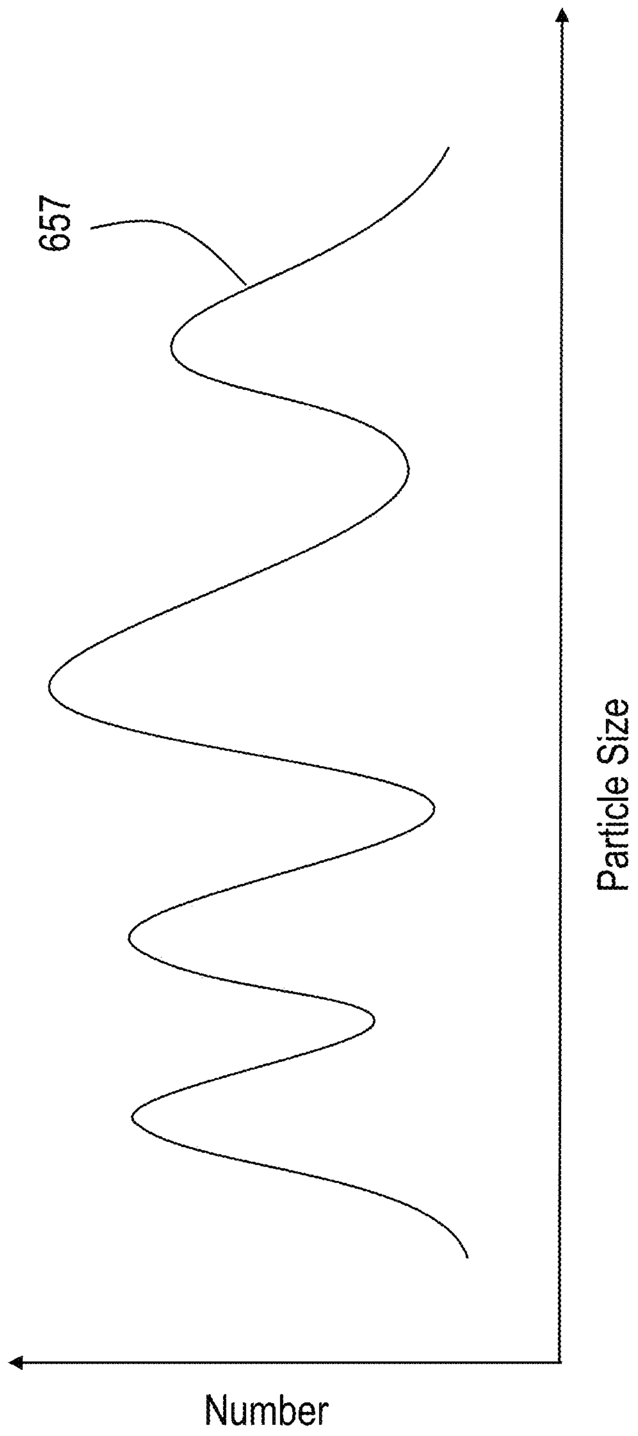

FIGS. 34A-34B are schematic illustration of multimodal particle size distributions (e.g., distribution of diameter approximately spherical particles or distribution of diameter or largest lateral dimensions of flakes). A multimodal particle size distribution can have 2 (bimodal), 3, 4, or more peaks. FIG. 34A schematically illustrates a bimodal particle size distribution 655 while FIG. 34B schematically illustrates a particle size distribution 657 having 4 peaks.

Figure 35:
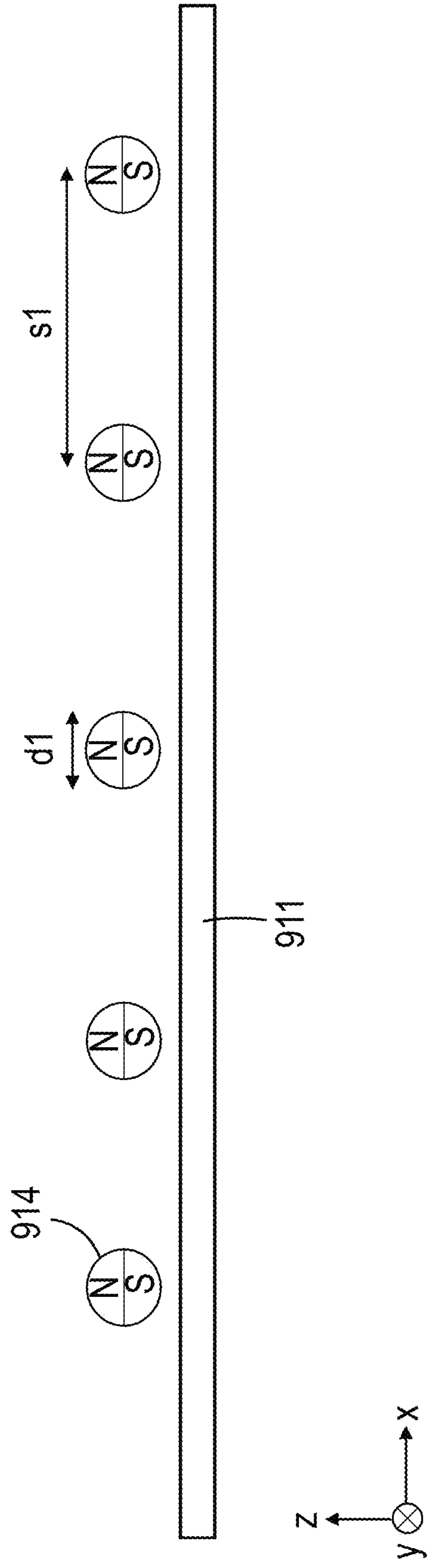
FIGS. 35 and 35A are schematic cross-sectional views of a plurality of magnets positioned proximate a web according to some embodiments of the present disclosure.
Figure 35A:
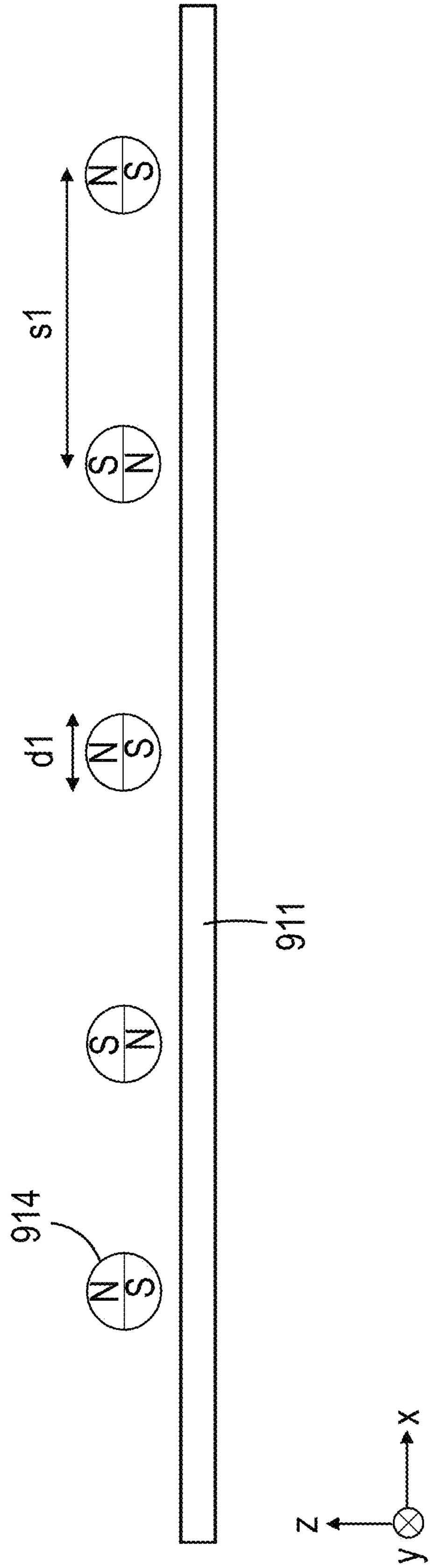

FIGS. 35 and 35A are schematic cross-sectional views of a plurality of magnets 914 positioned proximate a web 911. In FIG. 35, each magnet has a same north pole orientation (the north pole faces the +z direction and the south pole faces the −z direction). In FIG. 35A, the plurality of magnets has alternating first (e.g., +z) and second (e.g., −z) north pole orientations. In the illustrated embodiment, the first north pole orientation (oriented in +z direction) is opposite the second north pole orientation (oriented in −z direction). In some embodiments, the magnets 914 are substantially cylindrical magnets having an average diameter d1. In some embodiments, the magnets 914 are spaced apart with an average center to center distance s1. In some embodiments, s1/d1 is at least about 3, 5, 8 or 10. In some embodiments, the plurality of magnets 914 is or includes a regular array of cylindrical magnetics.

Arrangements of (e.g., static) magnets as schematically illustrated in FIGS. 35 and 35A are useful in producing layers or films having partially ordered and/or aligned and/or positioned particles as illustrated for layer or film 2880, for example. As described further elsewhere herein, rotating magnetics are useful producing layers or films having particles with improved order and/or alignment and/or positioning, as schematically illustrated for layer of film 2980, for example. In some embodiments, a plurality of substantially parallel, spaced apart rotating magnets is used (e.g., to further improve alignment/orientation/positioning of the particles in the layer compared to using a single rotating magnet, or to increase line speed while maintaining alignment/orientation/positioning of the particles). For example, the magnets 914 schematically illustrated in FIGS. 35 and 35A instead of having a fixed north pole/south pole alignment can alternatively be rotated about their axis as the web 911 passes by the magnets.

In some embodiments, a method of making a film includes positioning a plurality of magnets 914 relative to a web 911 containing a mixture of a plurality of magnetic particles dispersed in a resin. The web 911 extends generally along a first direction (x-direction) and has a width along an orthogonal second direction (y-direction). Each magnet is elongated along an axis (e.g., x-axis) not parallel to the first direction. For example, in some embodiments, the axis of each magnet is substantially orthogonal to the first direction. The plurality of magnets 914 are spaced apart along the first direction. The method includes passing the web 911 adjacent the plurality of magnets 914 (e.g., by moving the web 911 along the first direction when the web is adjacent the magnets 914) such that the magnetic particles are influenced by a magnetic field of the plurality of magnets 914 and form a desired structure as affected by the magnetic field. The method further includes vitrifying the resin to capture the plurality of magnetic particles in the desired structure.

As described further elsewhere, in some embodiments, a method of making a film include positioning a magnet relative to a web containing at least a mixture of a plurality of magnetic particles dispersed in a resin. The web extends generally along a first direction and having a width along an orthogonal second direction. The magnet is elongated along an axis not parallel to the first direction. The method includes rotating the magnet about the axis such that a north pole and a south pole of the magnet alternatively pass in proximity of the web. The method includes passing the web adjacent the magnet such that the magnetic particles are influenced by a magnetic field of the magnet and form a desired structure as affected by the magnetic field. The method further includes vitrifying the resin to capture the plurality of magnetic particles in the desired structure.

The web 911 can move in the x direction in a roll-to-roll process, for example.

Figure 36:
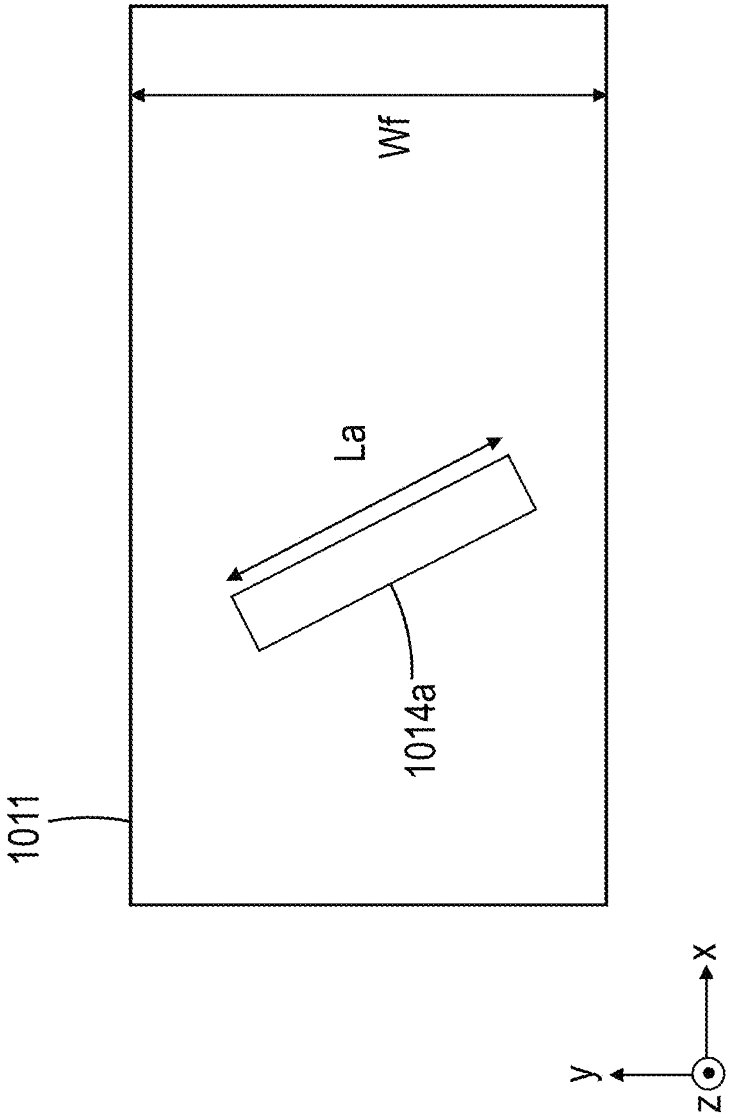
FIGS. 36 and 36A are schematic top views of magnets positioned proximate a web according to some embodiments of the present disclosure.
Figure 36A:
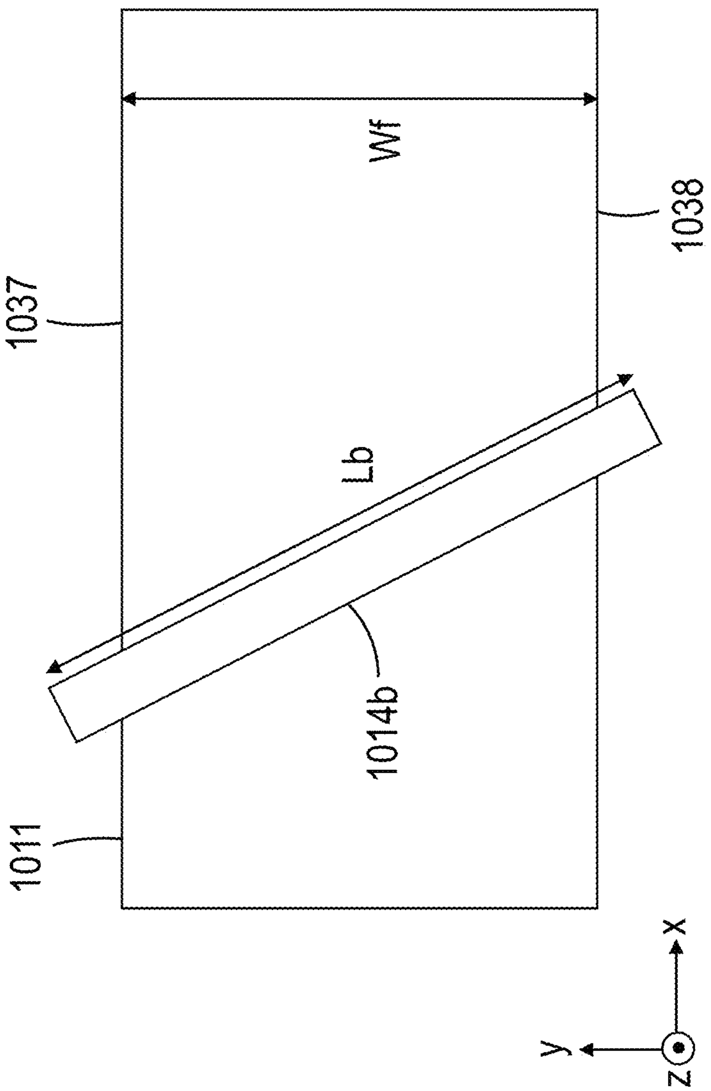

FIGS. 36 and 36A are schematic top views of magnets 1014*a* and 1014*b*, respectively positioned adjacent a web 1011. The magnet 1014*a* has a length La along its axis and the magnet 1014*b* has a length Lb along its axis. A plurality of magnets can be included and/or the magnet(s) can rotate as described further elsewhere herein. In some embodiments, each magnet has a length along the axis that is at least ½ the width Wf of the web, or at least the width Wf of the web. In some embodiments, the web 101 has opposite first (1037) and second (1038) edges separated from one another along the second direction (y-direction) and each magnet 1014*b* extends at least from the first edge 1037 to the second edge 1038 as schematically illustrated in FIG. 36A.

Figure 37:
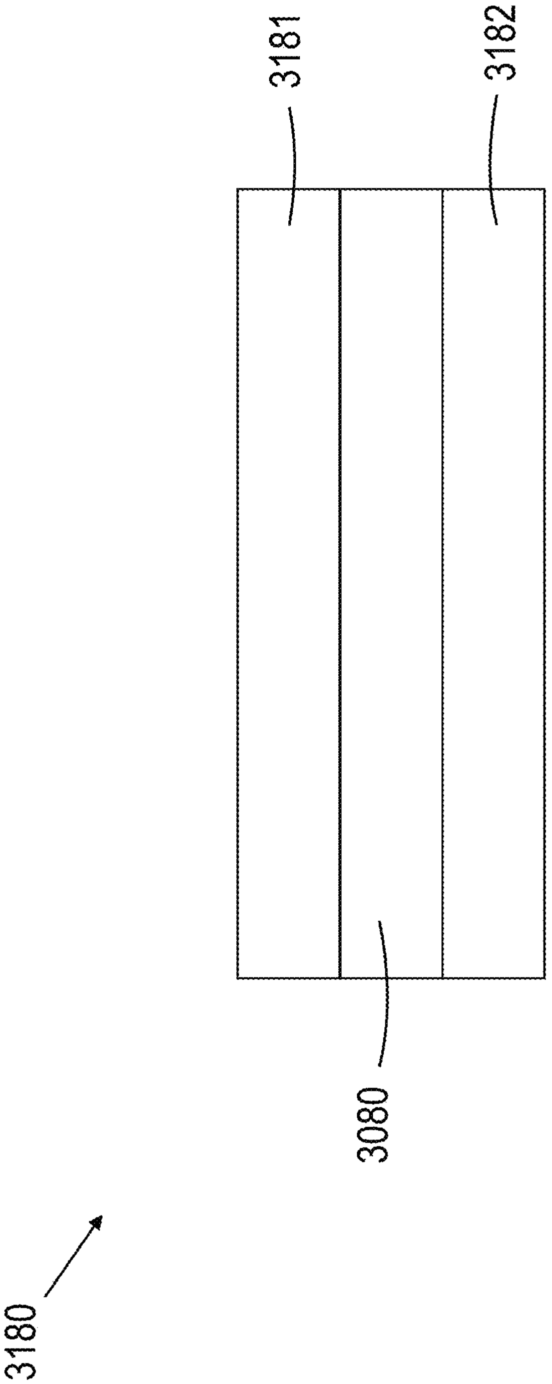
FIGS. 37 and 37A are schematic cross-sectional view of films according to some embodiments of the present disclosure.

The layers or films described herein can be a single layer, a single layer film or a multilayer film. FIG. 37 is a schematic cross-sectional view of a film 3180 including layer 3080 which includes a plurality of particles (not shown in FIG. 37) and additional layers 3181 and 3182. Additional layers 3181 and 3182 can be carrier layers or release layers, for example. In some embodiments, film 3180 is one or more of a magnetic film, an electrically conductive tape, or a thermal interface film (a film including a thermal interface layer). In some embodiments, film 3180 is an electrically conductive tape, layer 3182 is a tape backing layer, layer 3181 is release layer, and layer 3080 is an electrically conductive adhesive layer.

Figure 37A:
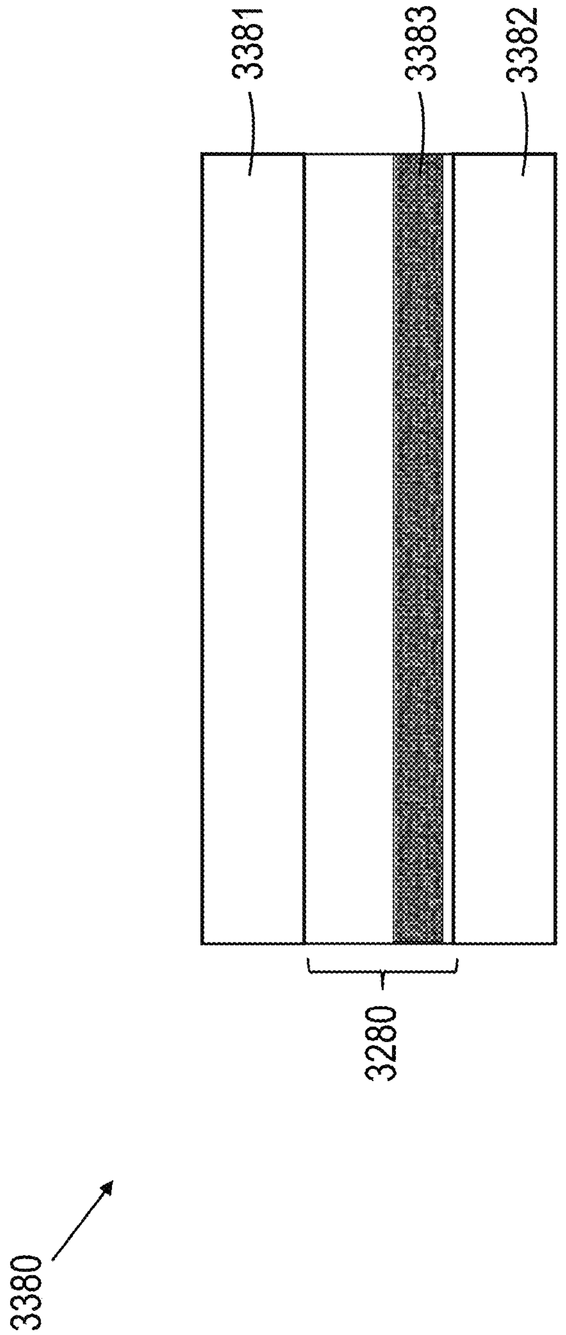

FIG. 37A is a schematic cross-sectional view of a film 3380 including layer 3280, which includes a plurality of particles (not shown in FIG. 37A) and a fabric 3383. The film 3380 further includes additional layers 3381 and 3382, which can be carrier layers or release layers, for example. In some embodiments, film 3380 is one or more of a magnetic film, an electrically conductive tape, or a thermal interface film. The fabric 3383 can be included to provide mechanical strength to the layer 3280. In some embodiments, the fabric 3383 is at least one of electrically or thermally conductive. In some embodiments, film 3380 is an electrically conductive tape, layer 3382 is a tape backing layer, layer 3381 is release layer, and layer 3280 is an electrically conductive adhesive layer. Electrically conductive tapes are described in US 2016/0333232 (Choi et al.), for example, which is hereby incorporated herein by reference to the extent that it does not contradict the present disclosure. Suitable adhesive materials (e.g., PSAs) for use in an adhesive layer are described in US 2016/0333232 (Choi et al.), for example.

Figure 38:
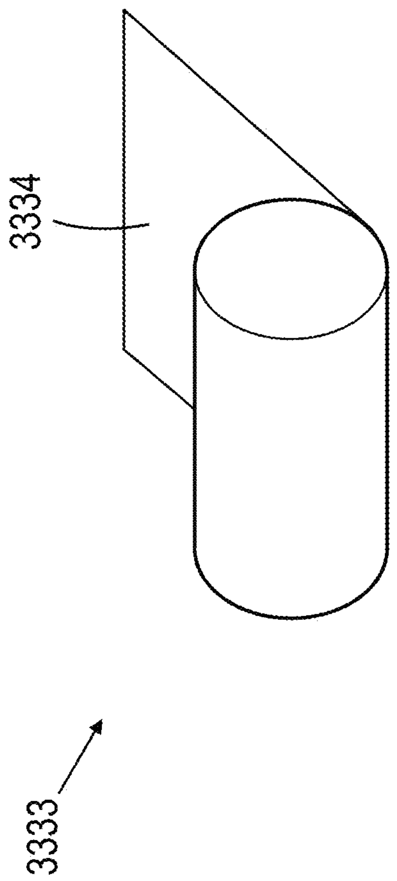
FIG. 38 is a schematic perspective view or a roll of a layer or film according to some embodiments of the present disclosure.

FIG. 38 is a schematic perspective view of a roll 3333 of layer or film 3334. The layer or film 3334 can be a magnetic film, can include an electrically conductive adhesive layer, and/or can be or include a thermal interface layer. In some embodiments, a layer or film 3334 is rolled along a length of the layer or film 3334 to form a roll 3333. In some embodiments, as described further elsewhere herein, the film, or a layer of the film, includes a plurality of substantially continuous layers of particles extending along the length and a thickness of the film or the layer and arranged along a width of the film or the layer. In some embodiments, the film 3334 has a substantially higher (e.g., higher by at least 5 percent, or at least 8 percent) magnetic permeability along each of the thickness and the length of the film than the width of the film. The magnetic permeability can be a real part of a complex magnetic permeability for at least one frequency less than about 1 GHz. In some embodiments, the layer or film 3334 is or includes an electrically conductive adhesive layer having a substantially higher electrical conductivity along each of the thickness and the length of the layer than the width of the layer. For example, the electrical conductivity can be at least a factor of 1.4, or 1.7, or 2, or 2.5 times higher along each of the thickness and the length of the layer than the width of the layer. In some embodiments, the layer or film 3334 is or includes a thermal interface layer having a substantially higher thermal conductivity along each of the thickness and the length of the layer than the width of the layer. For example, the thermal conductivity can be at least a factor of 1.4, or 1.7, or 2, or 2.5 times higher along each of the thickness and the length of the layer than the width of the layer.

In some embodiments, a layer includes first (10) and second (20) major surfaces spaced apart a distance D in a thickness direction of the layer and has a lateral length L along a length direction of the layer orthogonal to the thickness direction (see, e.g., FIG. 24). In some such embodiments, $L/D \geq 100$. The layer can include a plurality of particles 30 dispersed and asymmetrically distributed between the first and second major surfaces so that in each of at least a first layer cross-section (e.g., y-z cross-section) of the layer orthogonal to the length direction and a second layer cross-section (e.g., x-y cross-section) of the layer orthogonal to the thickness direction, an ellipse fitted to a cross-section of a two dimensional autocovariance of an image of the layer cross-section at 10% of a central peak of the autocovariance has a major axis length L1 and a minor axis length L2. As is known in the art, an autocovariance is an average of a product of a variable multiplied by the same variable evaluated at a different point. The autocovariance of a quantity can be determined as the real part of the Fourier transform of the power spectral density of the quantity. As is known in the art, a power spectral density of a quantity is the magnitude squared of the Fourier transform of the quantity. Autocovariance of an image can be determined using standard processing techniques (e.g., using functions available in MATLAB). In some such embodiments, $L1/L2 \geq 1.2$. The plurality of particles 30 can be asymmetrically distributed between the first and second major surfaces in any manner which results in autocovariances as described above. In some embodiments, the plurality of particles 30 are asymmetrically distributed by being agglomerated into substantially continuous layers of particles, for example, so that the distribution of particles is different along different directions. For example, the particles 30 can have a different distribution along the y-direction (see, e.g., FIG. 24A) than along the x-direction (see, e.g., FIG. 24).

Figure 39:
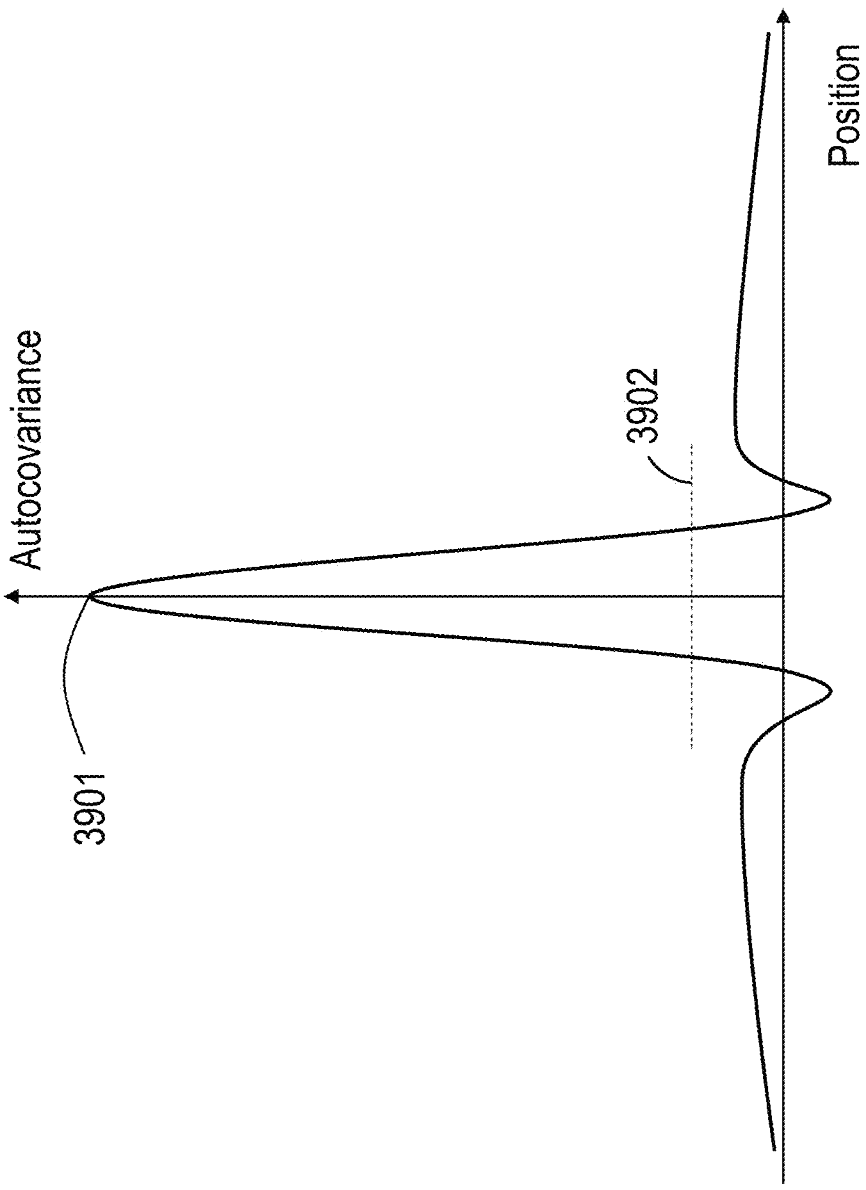
FIG. 39 is a schematic plot of an autocovariance of an image of a layer cross-section according to some embodiments of the present disclosure.
Figure 39A:
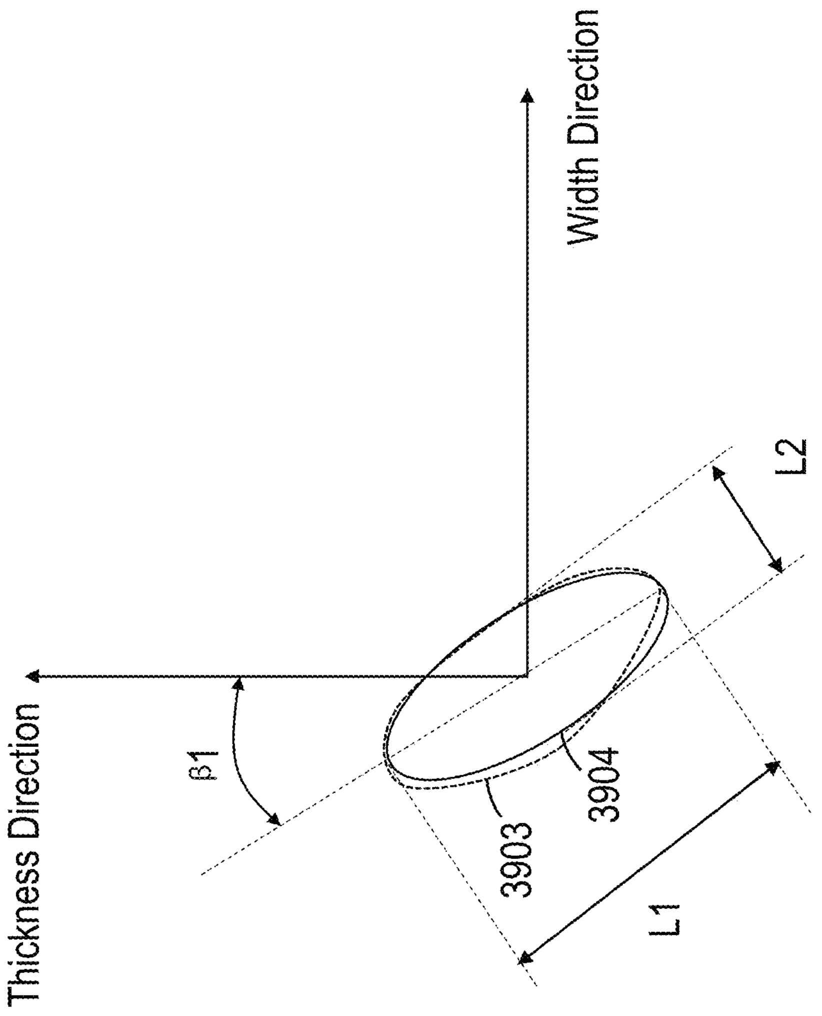
FIGS. 39A-39B are schematic cross-sections of two dimensional autocovariances of images of layer cross-sections according to some embodiments of the present disclosure.
Figure 39B:
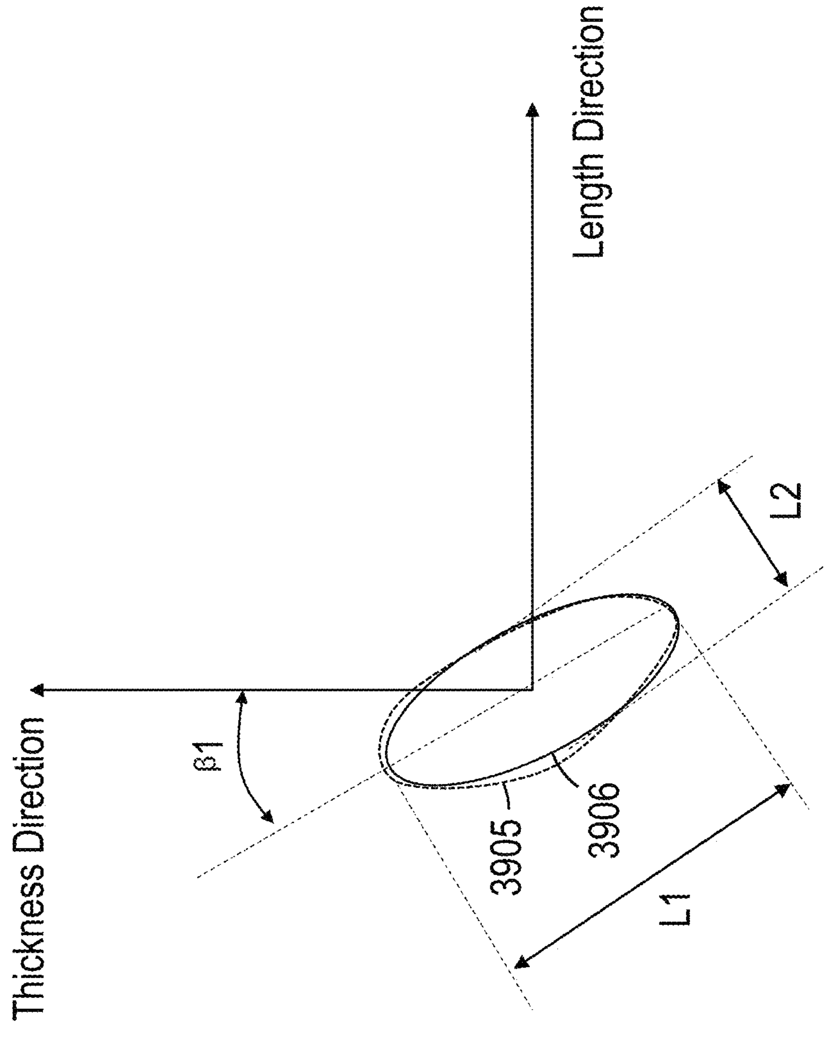

FIG. 39 is a schematic plot of an autocovariance of an image of a layer cross-section. 10% of a central peak 3901 is indicated by line 3902. FIG. 39A is a schematic cross-section of a two dimensional autocovariance 3903 of an image of the first layer cross-section at 10% of the central peak 3901 of the autocovariance. FIG. 39B is a schematic cross-section of a two dimensional autocovariance 3905 of an image of the second layer cross-section at 10% of the central peak 3901 of the autocovariance. In some embodiments, an ellipse 3904 and/or 3906 fitted to the first and/or second cross-section, respectively has a major axis length L1 and a minor axis length L2, where $L1/L2 \geq 1.2$. In some embodiments, the major axis of the ellipse corresponding to the first layer cross-section (see FIG. 39A) makes an angle $\beta 1$ between about 10 degrees to about 50 degrees with the thickness direction. In some embodiments, the major axis of the ellipse corresponding to the second layer cross-section (see FIG. 39B) makes an angle $\beta 2$ between about 10 degrees to about 50 degrees with the thickness direction.

In some embodiments, $L1/L2 \geq 1.5$, or $L1/L2 \geq 2$, or $L1/L2 \geq 2.5$.

In some embodiments, a layer includes first (10) and second (20) major surfaces spaced apart a distance D in a thickness direction of the layer and has a lateral length L along a length direction of the layer orthogonal to the thickness direction (see, e.g., FIG. 24). In some such embodiments, $L/D \geq 100$. The layer can include plurality of particles (e.g., 30) dispersed between the first and second major surfaces and regularly arranged so that in each of at least a first layer cross-section (e.g., y-z cross-section) of the layer orthogonal to the length direction and a second layer cross-section (e.g., x-y cross-section) of the layer orthogonal to the thickness direction, a power spectral density of a positive portion of a two dimensional autocovariance of an image of the layer cross-section has a peak corresponding to a pitch of less than about 100 micrometers and corresponding to the regular arrangement of the particles. The particles can be regularly arranged by being agglomerated into substantially continuous layers of particles, for example, where the layers of particles are regularly arranged along the width direction (see, e.g., the y-direction of FIG. 24A), for example.

Figure 39C:
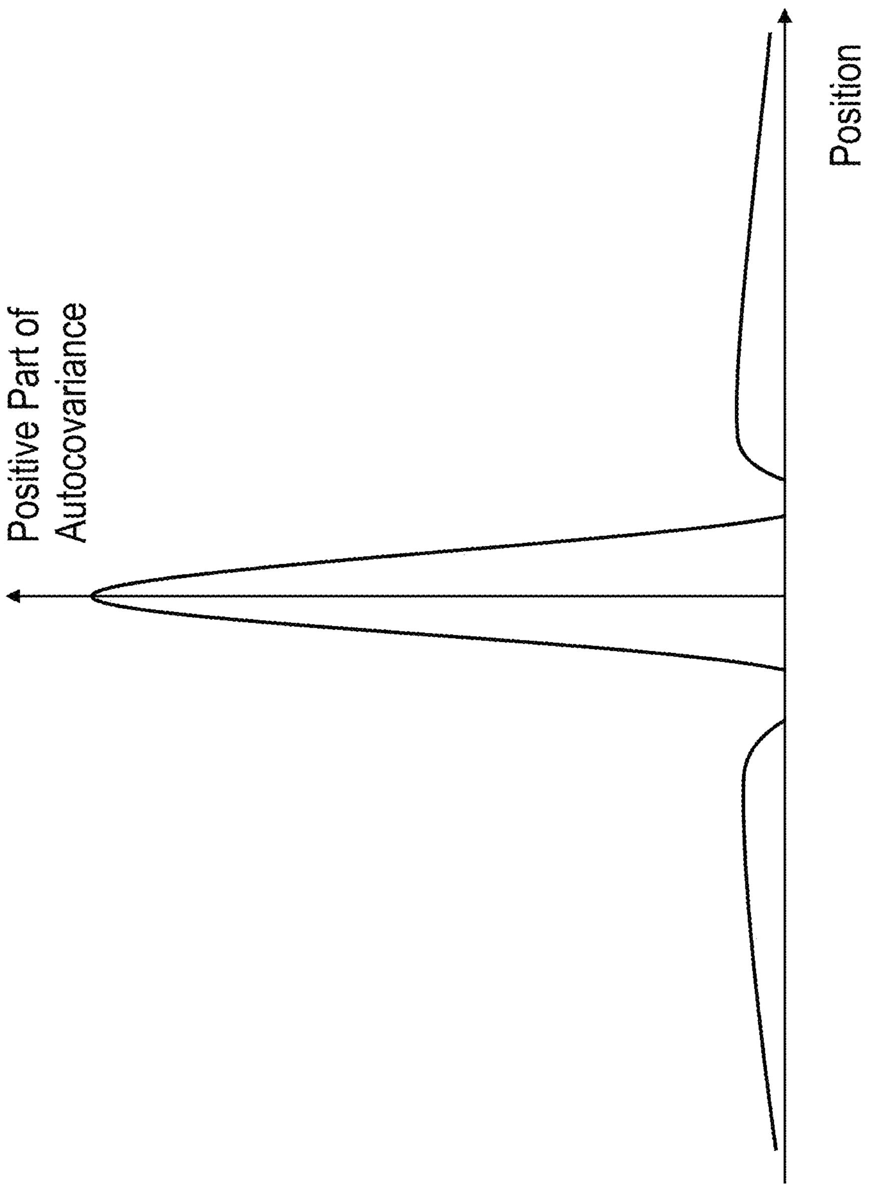
FIG. 39C is a schematic plot of a positive portion of a two dimensional autocovariance of an image of a layer cross-section according to some embodiments of the present disclosure.
Figure 39D:
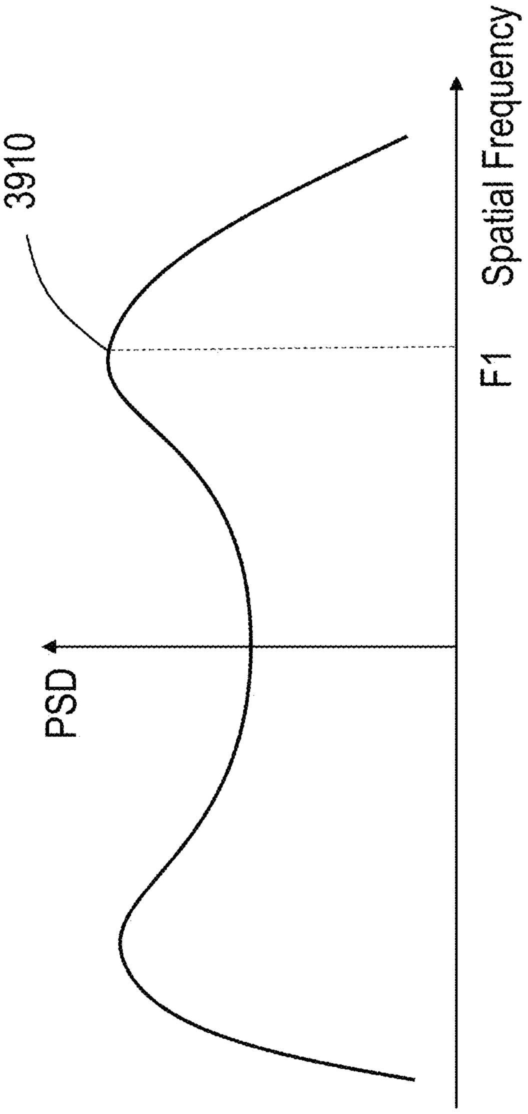
FIG. 39D is schematic plot of a power spectral density (PSD) of a positive portion of a two dimensional autocovariance of an image of a layer cross-section according to some embodiments of the present disclosure.

FIG. 39C is a schematic plot of a positive portion of a two dimensional autocovariance of an image of a layer cross-section. FIG. 39D is schematic plot of a power spectral density (PSD) of a positive portion of a two dimensional autocovariance of an image of the layer cross-section having a peak 3910 at a spatial frequency F1. The spatial frequency F1 can correspond to a pitch $P=1/F1$ where the pitch P can be less than about 100 micrometers (e.g., in a range of 1 to 100 micrometers or 1 to 80 micrometers, or 2 to 50 micrometers, or 4 to 40 micrometers).

Figure 39F:
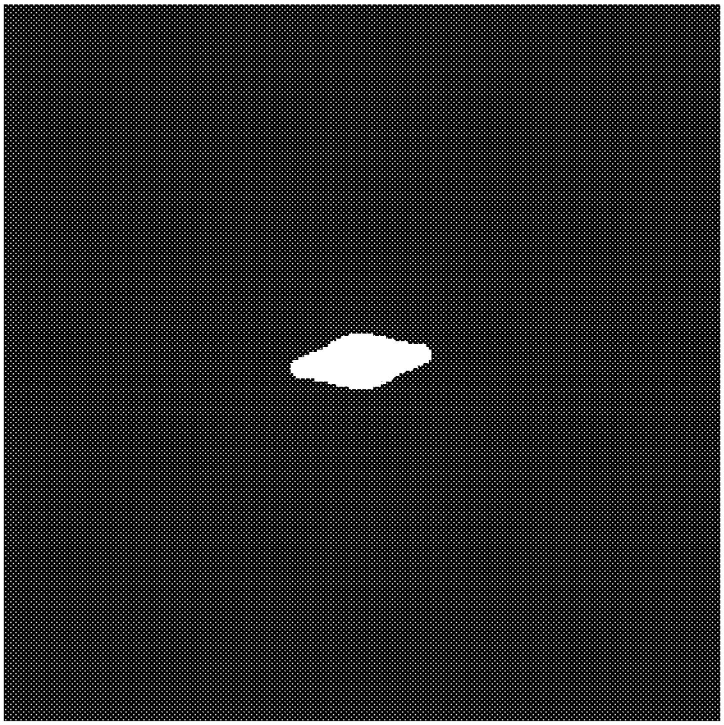
FIG. 39F is a two dimensional autocovariance of the image of the layer cross-section of FIG. 39E.
Figure 39E:
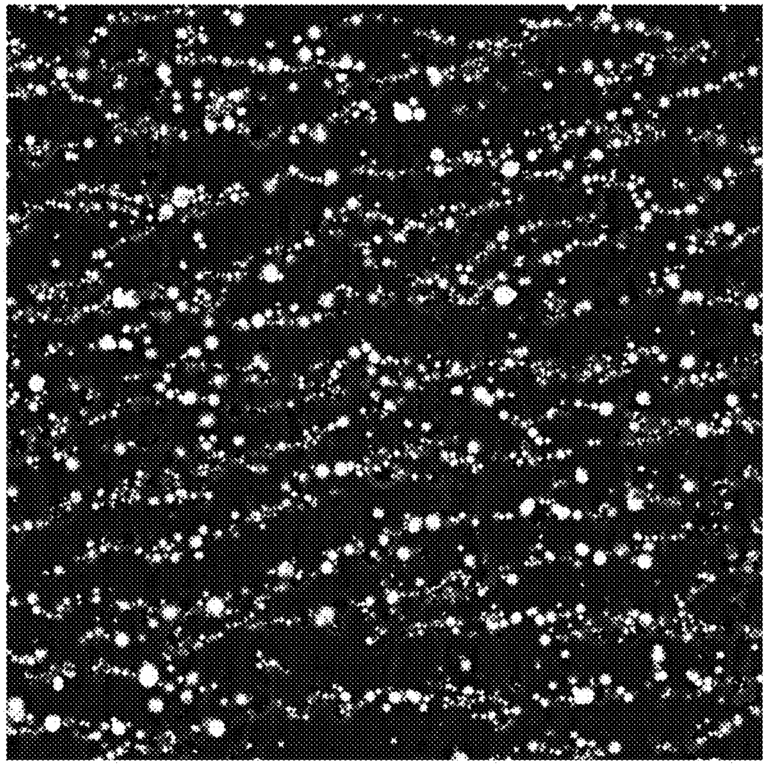
FIG. 39E is an image of a layer cross-section of a layer orthogonal to the thickness direction according to some embodiments of the present disclosure.

FIG. 39E is an image of a layer cross-section of a layer orthogonal to the thickness direction. The layer of FIG. 39E includes iron particles in resin that has been subjected to a rotating magnetic field. FIG. 39F is a two dimensional autocovariance of the image of the layer cross-section of FIG. 39E at 10% of a central peak of the autocovariance.

Figure 39G:
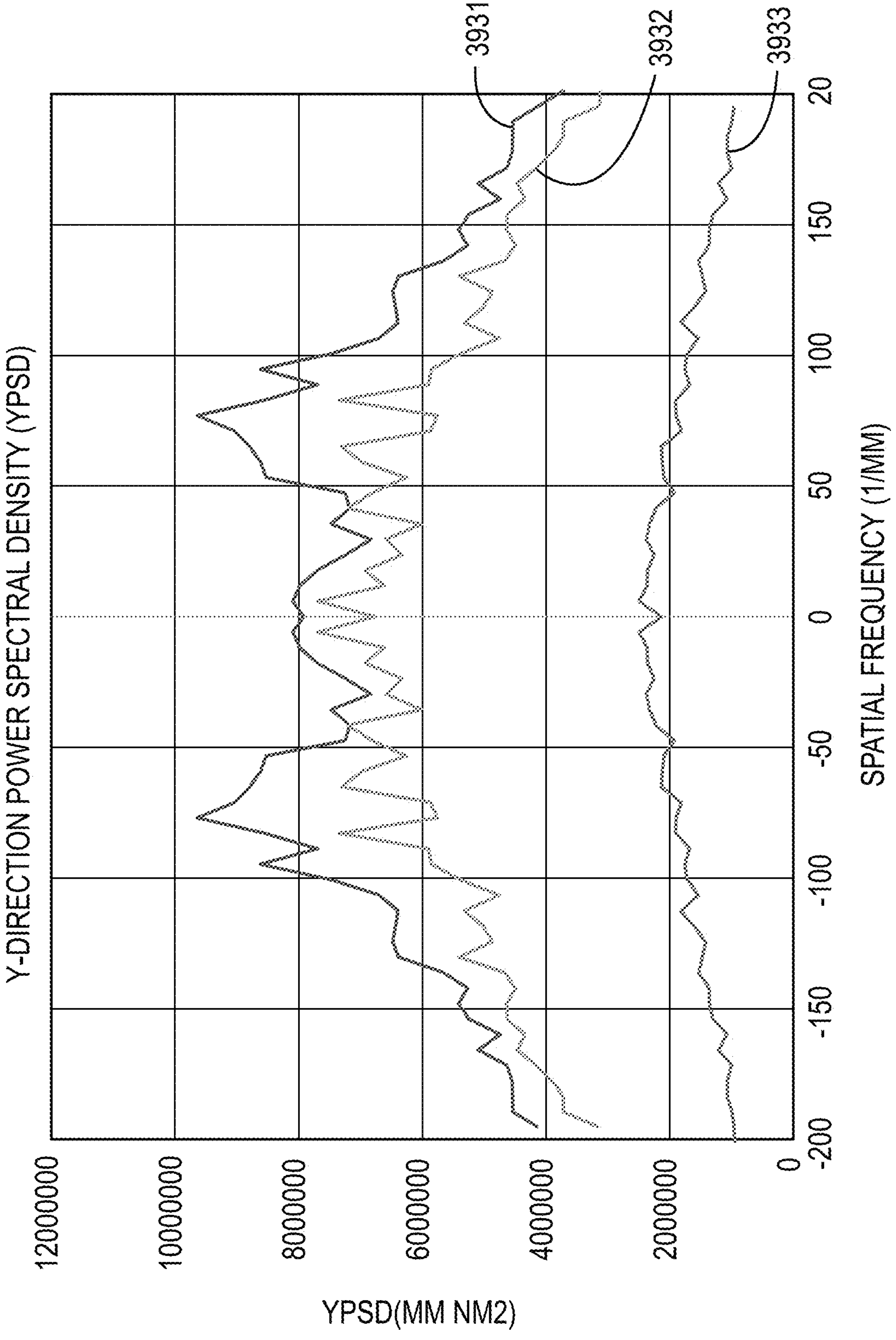
FIG. 39G is a plot showing PSDs of positive portions of a two dimensional autocovariances integrated over a length direction according to some embodiments of the present disclosure.

FIG. 39G is a plot showing a yPSD (the PSD of a positive portion of a two dimensional autocovariance integrated over the full range in the x-direction (length direction) and averaged over four PSD curves; the yPSD is a function of the spatial frequency in the x direction (width direction)) for the layer cross-section of FIG. 39E (curve 3931), for a layer cross-section of a layer including iron particles in resin that has been subjected to a static magnetic field (curve 3932), and for a layer cross-section of a layer including iron particles in resin that has not been subjected to a magnetic field (curve 3933).

The layer (e.g., the layer referred to in any of FIGS. 39-39F or other layer described herein) can be a magnetic layer, an electrically conductive adhesive layer, and/or a thermal interface layer, for example. In some embodiments, at least some of the particles are magnetically permeable. In some embodiments, at least some of the particles are electrically conductive. In some embodiments, at least some of the particles have a thermal conductivity of at least 10 W/mK. For example, at least some of the particles have a thermal conductivity of at least 10 W/mK along at least one direction, or along each of two orthogonal directions, or along each of three mutually orthogonal directions.

Figure 40:
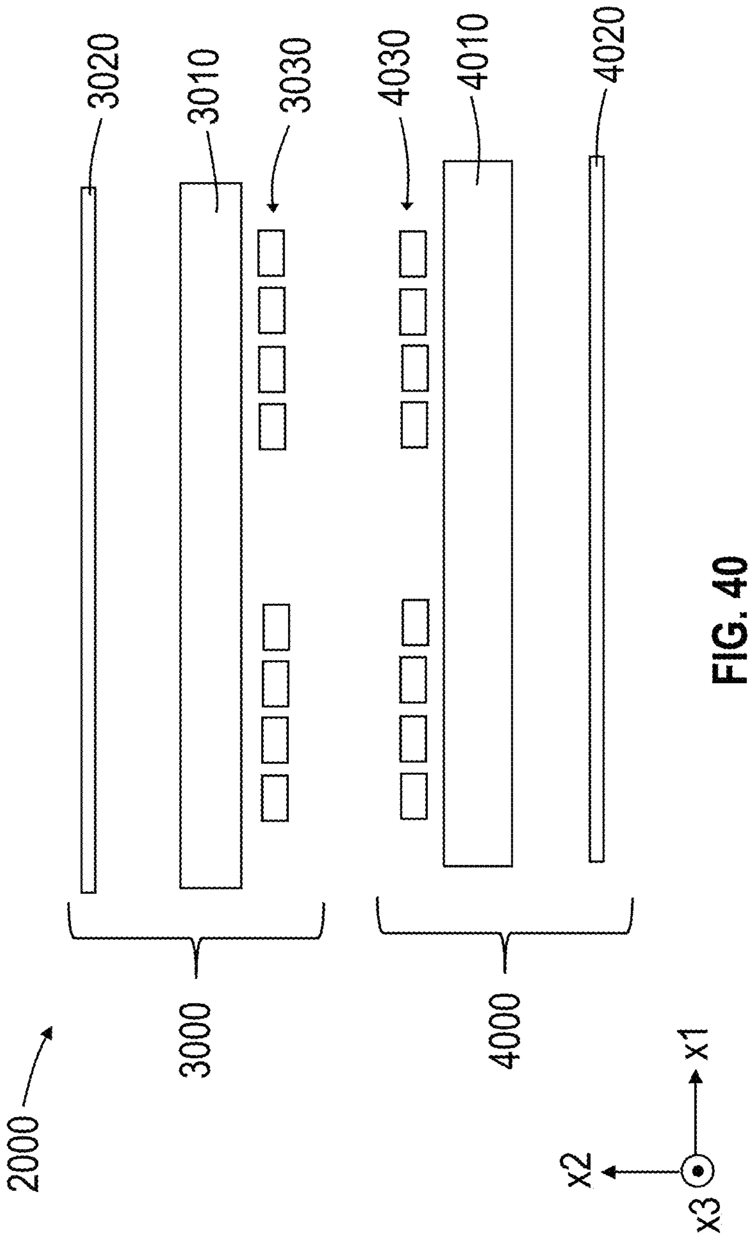
FIG. 40 is a schematic cross-sectional view of a system for wireless power transmission according to some embodiments of the present disclosure.

FIG. 40 is a schematic cross-sectional view of a system 2000 for wireless power transmission. The system includes a power receiving assembly 3000 including a first magnetic film 3010 disposed between a first metal plate 3020 and a power receiving antenna 3030; and a power transmitting assembly 4000 facing the power receiving assembly 3000 and including a second magnetic film 4010 disposed between a second metal plate 4020 and a power transmitting antenna 4030. The power receiving and transmitting antennas face, and are substantially aligned with, one another (e.g., the antennas may extend in respective planes which are within 30 degrees, or within 20 degrees, or within 10 degrees of being parallel to one another), such that when energized, the power transmitting antenna 4030 wirelessly transmits power to the power receiving antenna 3030. At least one of the first and second magnetic films is a magnetic film of the present disclosure (e.g., including magnetic particles agglomerated into layers). In some embodiments, the system 2000 is configured to operate at an operating frequency, whereat the operating frequency, a real relative magnetic permeability of the magnetic film has a first value $\mu'_1$ along a separation direction (x2-direction) between the power receiving and transmitting assemblies and a second value $\mu'_2$ along a second direction (e.g., one of x1-direction and x3-direction) orthogonal to the separation direction, where $\mu'_1$ is greater than $\mu'_2$ by at least 5%.

Materials

| Material | Description | Supplier |
|---|---|---|
| Sendust HS80 | ~80 μm × 1 μm magnetically responsive flake, thermal conductivity of ~80 W/mK | Mate Co., Ltd., Okayama, JP |
| 500-15 BN Flake | Boron nitride (BN) flake available under the trade designation Flakes CFF 500-15, D50 of 160-400 μm, thermal conductivity of 3-5 W/mK (through-plane) and 100-400 W/mK (in-plane) | 3M Company, St. Paul, MN |
| 500-3 BN Flake | Boron nitride (BN) flake available under the trade designation Flakes CFF 500-3, D50 of 300-530 μm, D10 of 140-260 μm | 3M Company, St. Paul, MN |
| 200-15 BN Flake | BN flake available under the trade designation Flakes CFF 200-15, D50 of 65-210 μm, thermal conductivity of 3-5 W/mK (through-plane) and 100-400 W/mK (in-plane) | 3M Company, St. Paul, MN |
| AA-18 | Polyhedral alumina, D50 of 18 μm, thermal conductivity of ~40 W/mK | Sumitomo Chemical, Tokyo, JP |
| TM1250 | Alpha alumina powder, D50 of 1.6 μm, thermal conductivity of ~40 W/mK | Huber Engineered Materials, Atlanta, GA |
| Platelets 012P | Spray dried BN platelets available under the trade designation Platelets CFP 012P, D10 of 65-120 μm, D50 of 125-190 μm, D90 of 200-300 μm, thermal conductivity of 3-5 W/mK (through-plane) and 100-400 W/mK (in-plane) | 3M Company, St. Paul, MN |
| Asbury 3268 | Graphite flake, D50 of ~180 μm | Asbury Carbons |
| BAK70 | Spherical alumina, D50 of 70 μm, thermal conductivity of ~30-40 W/mK | Bestry |
| BAK10 | Spherical alumina, D50 of 10 μm, ~30-40 W/mK | Bestry |
| NGR-80 | Nickel coated graphite (60 wt % Nickel), avg. size of 115 μm | Potters Industries LLC, Valley Forge, PA |
| DP460 | Epoxy adhesive | 3M Company, St. Paul, MN |
| DER332 | Epoxide resin | OLIN EPOXY |
| TEPA | Tetraethylenepentamine | Tokyo Chemical Industry |
| IRGACURE 819 | phenylbis(2,4,6-Trimethylbenzoyl)-phosphine oxide, CAS#: 162881-26-7 | BASF Corporation, Evans City, PA |
| iso-octyl acrylate | iso-octyl acrylate, CAS#29590-42-9 | 3M Company, St. Paul, MN |
| 1,6 hexanediol diacrylate | 1,6 hexanediol diacrylate | TCI America |

-continued

| Materials | | |
|---|---|---|
| Material | Description | Supplier |
| N-dimethylacrylamide | N-dimethylacrylamide | TCI America |
| DISPERBYK 145 | Dispersing additive | BYK, Wesel, Germany |
| CIP-EW | Carbonyl iron powder, D50 of 3-4 μm | BASF Corporation, Evans City, PA |
| CIP-ER | Carbonyl iron powder, D50 of 4.5 μm | BASF Corporation, Evans City, PA |
| PNW-5-PCN(ii) | 15 micrometer thick nonwoven scrim coated with thin layers of nickel/copper/nickel | Ajin-Electron Co., Ltd. Busan, ration, Rock Hill, SC |
| SN40S15 | Silver coated nickel particles, 15 wt % silver, avg. size of 42 μm | Potters Industries LLC, Valley Forge, PA |
| NG15F50 | Nickel coated glass flakes, 49.4 wt % Ni, D90 of 51.7 μm, D50 of 29.5 μm, D10 of 14.4 μm, mean size of 31.5 μm | Potters Industries LLC, Valley Forge, PA |
| E-Fill 2806 | Nickel coated graphite flake, D10 of 16 μm, D50 of 30 μm, D90 of 55 μm | Oerlikon Metco, Pfäffikon, Switzerland |

Assembly of Magnetic Apparatus I

Three diametrically magnetized cylinder magnets (obtained as RY04YODIA from K&J Magnetic Inc., Pipersville, PA), each having an outer diameter of 50.8 mm, an inner diameter of 6.35 mm, and a length of 50.8 mm, were affixed to a 6.22 mm 304 stainless steel shaft with Epoxy Adhesive DP460 with all north poles facing the same direction. This resulted in effectively a single diametrically magnetized cylinder magnet with a diameter of 50.8 mm and a length of 152.4 mm. This resultant cylinder magnet was connected to an electric DC motor (obtained as Part no: 3482-MAC5115 Rev.1 with maximum speed 3450 rpm from AMETEK Pittman) to spin it about its axis. At the sample preparation position, the maximum magnetic field was about 2.2 kG.

Assembly of Magnetic Apparatus II

Magnetic Apparatus II was prepared as described for Magnetic Apparatus I except that 6 of the diametrically magnetized cylinder magnets were affixed to the stainless steel shaft with all north poles facing the same direction to form effectively a single diametrically magnetized cylinder magnet with a diameter of 50.8 mm and a length of 304.8 mm. The measured field strength was 4.34 kG directly above the rotating shaft. The rotating shaft could be driven up to 2200 rpm.

Comparative Example C1—Carbonyl Iron Powder (CIP) in Silicon Elastomer (SYLGARD 184)

In a plastic cup, SYLGARD 184 Part A (available from Dow) was degassed under vacuum for 10-15 minutes. SYLGARD 184 Part B, the curing agent, was then added to the degassed Part A. The amounts of Parts A and B were chosen so that the Part A:Part B ratio was 10:1 by weight. To this mixture was added CIP-EW in an amount to result in a loading of about 50% CIP-EW powder by weight. The plastic cup was covered with a cap configured to allow speed mixing under vacuum (100 mbar) for 2 minutes and 15 seconds. The mixture was then poured onto an Aluminum plate. A second Aluminum plate was placed on top of the mixture and appropriate silicon spacers (min 1.5 mm) were used between the two plates to separate them to a desired thickness. The plates containing the mixture were pressed together with 5 kg of weight on top. The Aluminum plates were heated to 150° C. using heating strip and monitoring temperature using thermal couple. The plates were kept at 150° C. for 10 mins. The plates were them allowed to cool for 30-45 minutes before the cured composite sheet was removed. The sheet had dimensions of about 10 cm by 6 cm.

Example 1—Carbonyl Iron Powder (CIP) in Silicon Elastomer (SYLGARD 184)

A sample was made as in Comparative Example C1, except that after placing the sample between two aluminum plates with a 5 kg of weight on top, the sample with the plates and with top weight was placed on the Magnetic Apparatus I. The diametrically magnetized cylinder magnet was set to rotate at 40% of maximum speed. After 10 seconds, the Aluminum plates were heated to 150° C. using heating strip and temperature was monitored using a thermal couple. The plates were kept at 150° C. for 10 mins. The plates were then allowed to cool for 30-45 minutes before the cured composite sheet was removed.

Comparative Example C2—Carbonyl Iron Powder (CIP) in Polyurethane 92.5 parts of 3M SCOTCH-WELD PUR Adhesive 2710p (available from 3M Company, St. Paul, MN), 7.4 parts of Hydroxyethylmethacrylate (from San Ester), and 0.1 part of 2,4,6-trimethylbenzoylphenyl phosphinate (IRGACURE TPO-L) was added to a black cup and heated up to 110° C. for two hours. Then the mixture was mixed using speed mixer for 3 mins. CIP-ER was added to the mixture in an amount to result in a loading of 53.2% by weight of CIP-ER powder in the whole slurry which was then mixed again under vacuum (100 mbar).

The mixture was then poured onto an ultraviolet (UV) light transparent glass. An ultraviolet (UV) light transparent glass was placed on top of the mixture and appropriate silicon spacers (min 1.5 mm) were used between the two plates to separate them to a desired thickness. The glasses containing the mixture were pressed together with 5 kg of weight on top. The 5 kg weight was removed and the sample with glass plates was put on a DYMAX BLUEWAVE LED FLOOD curing system (Dymax Corporation, Torrington, CT) with 100% intensity to cure the mixture with ultraviolet (UV) light irradiation (365 nm) for 25 seconds. The sample with the glasses plates was flipped over and the UV curing step was repeated.

Example 2—Carbonyl Iron Powder (CIP) in Polyurethane

A sample was made as in Comparative Example C2, except that after the glass plates containing the mixture were pressed together with 5 kg of weight on top, the whole assembly (sample, plates and top weight) was placed on the Magnetic Apparatus I. The diametrically magnetized cylinder magnet was set to rotate at 40% of maximum speed. After 10 seconds, the top weight was removed, and the sample was cured using the DYMAX BLUEWAVE LED FLOOD as described for Comparative Example C2.

Examples 3-4

Figure 41:
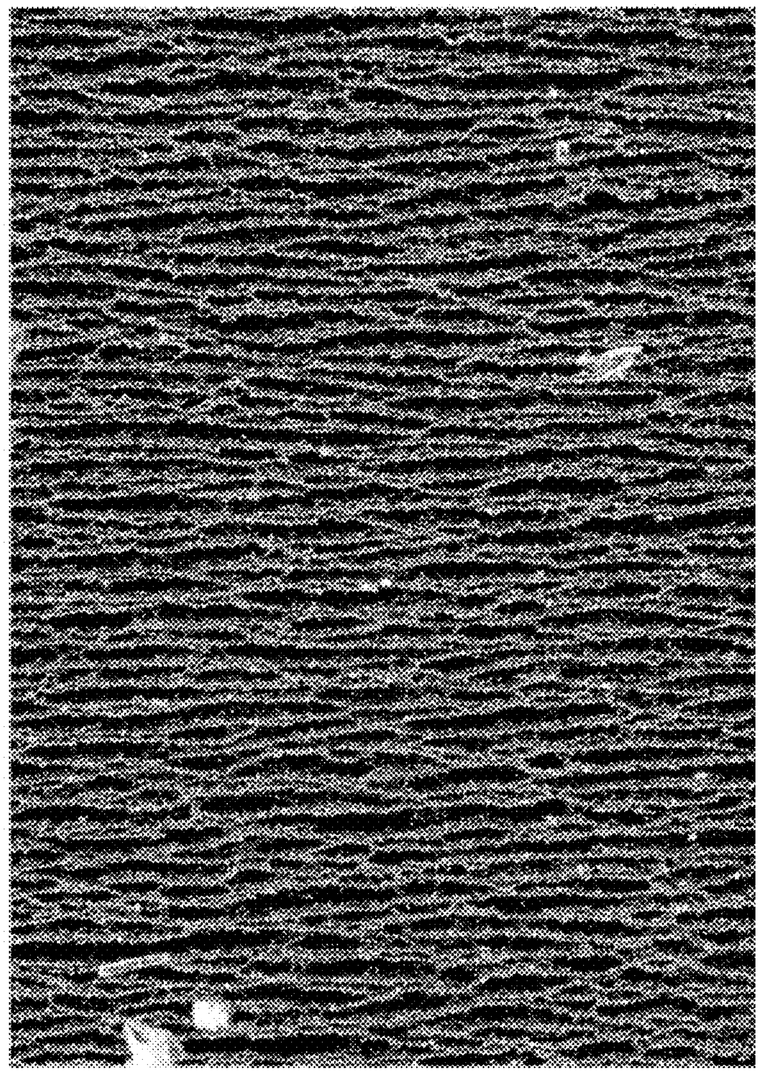
FIGS. 41-42 are images showing top and cross-sectional views of a magnetic film.
Figure 42:
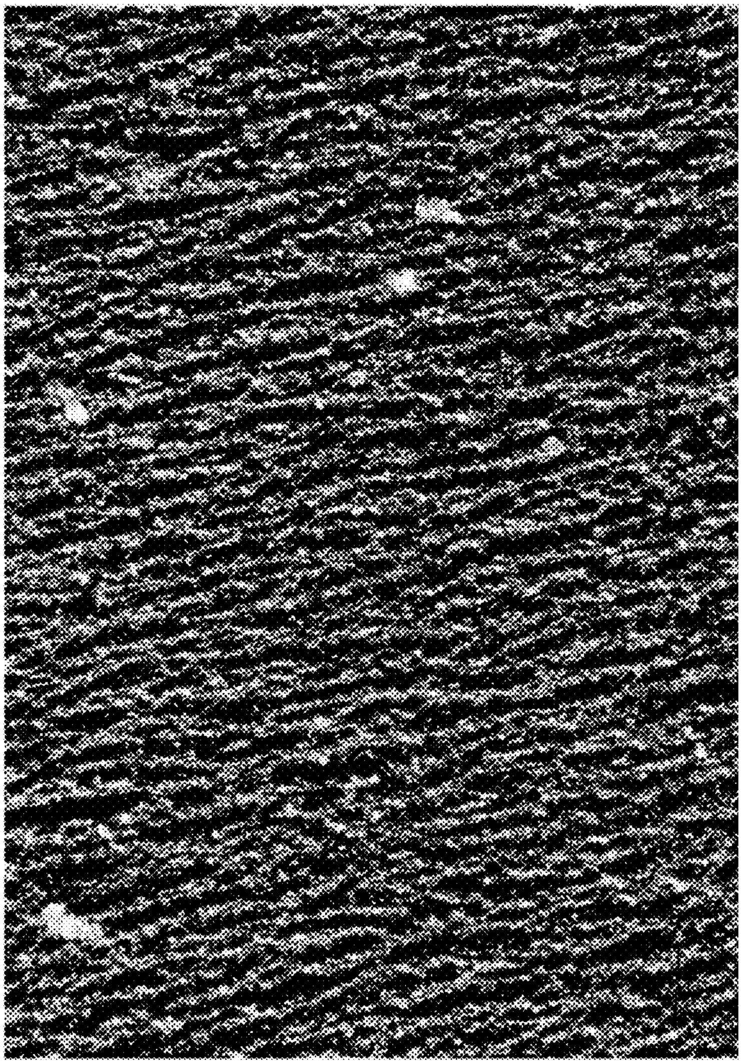
Figure 43:
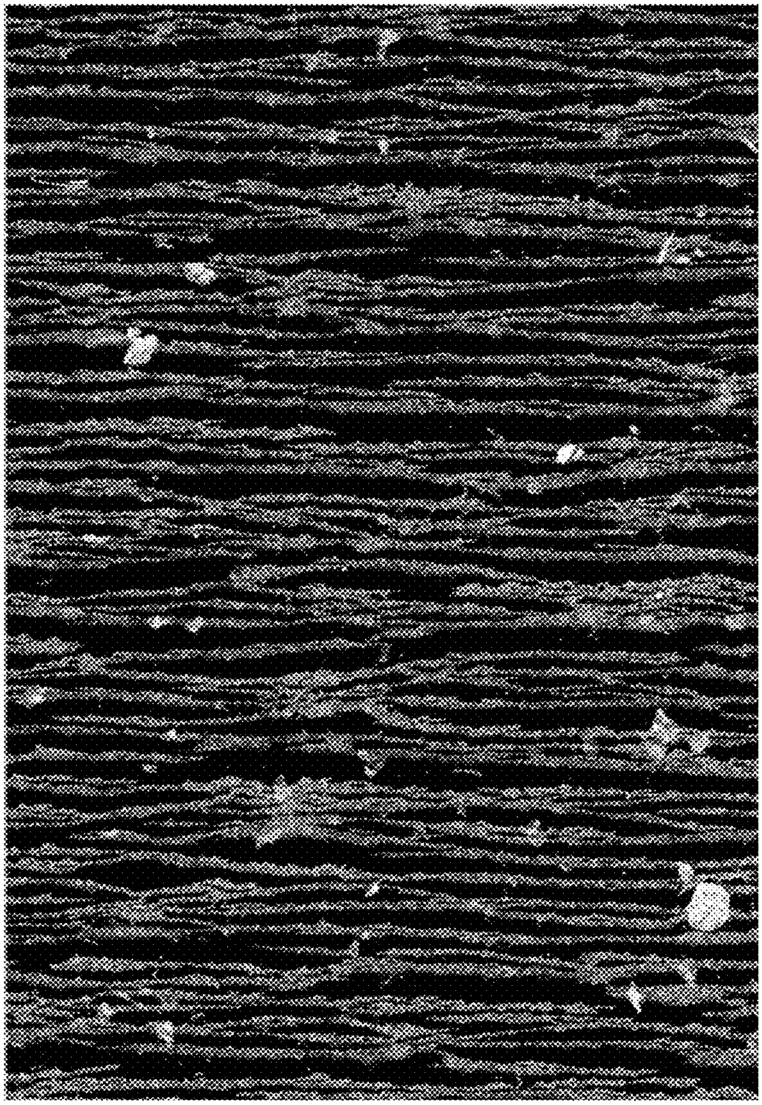
FIGS. 43 and 43A are images showing top views of a magnetic film at different magnifications.
Figure 43A:
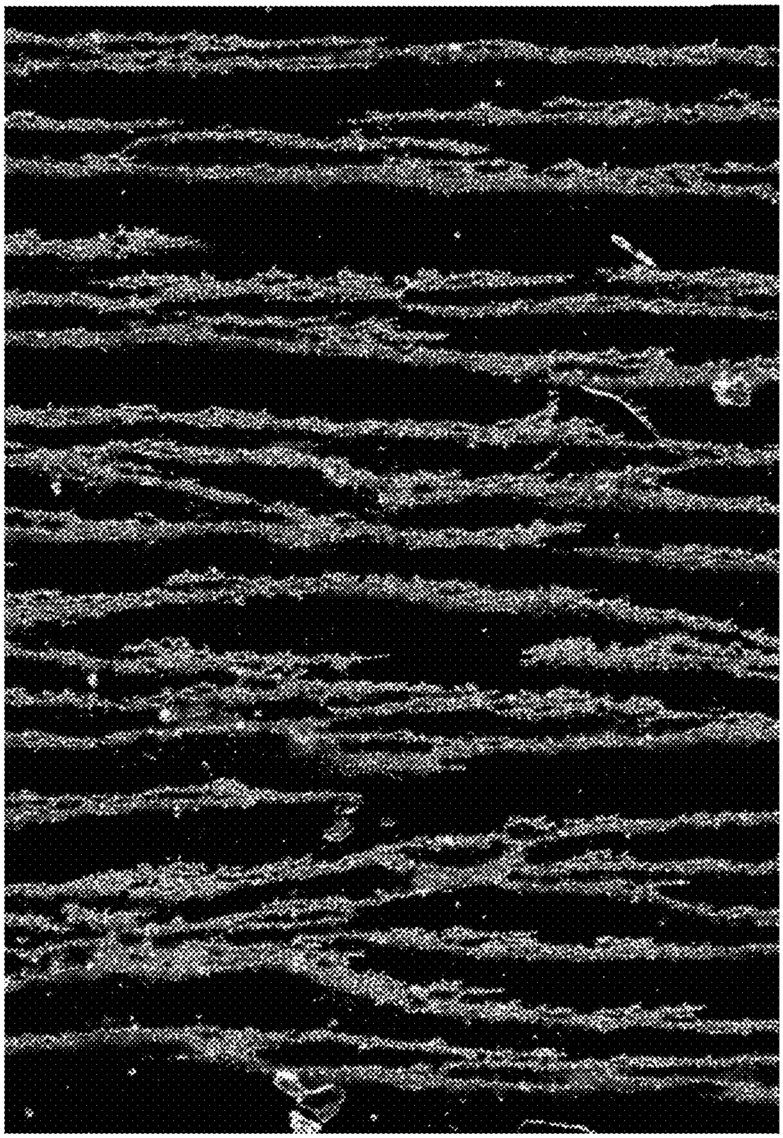
Figure 44:
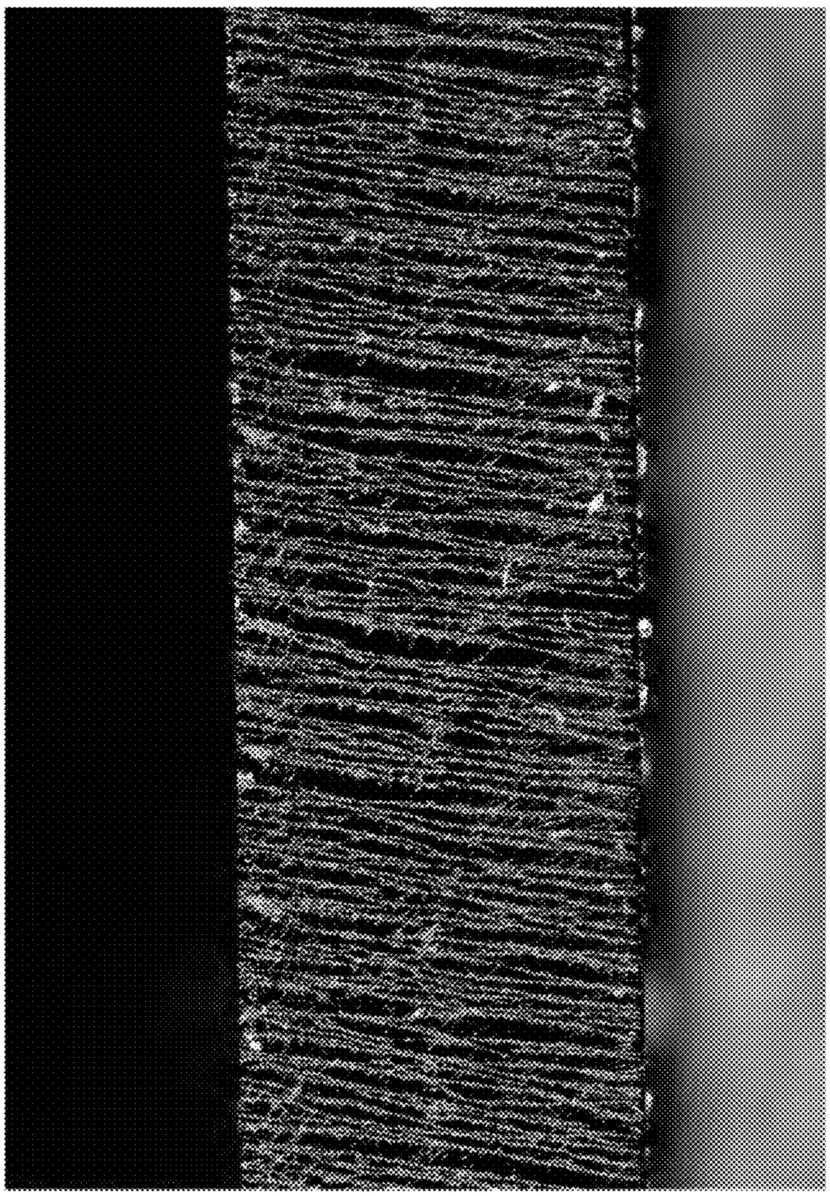
FIGS. 44 and 44A are images showing cross-sectional views of the magnetic film of FIG. 43 at different magnifications.
Figure 44A:
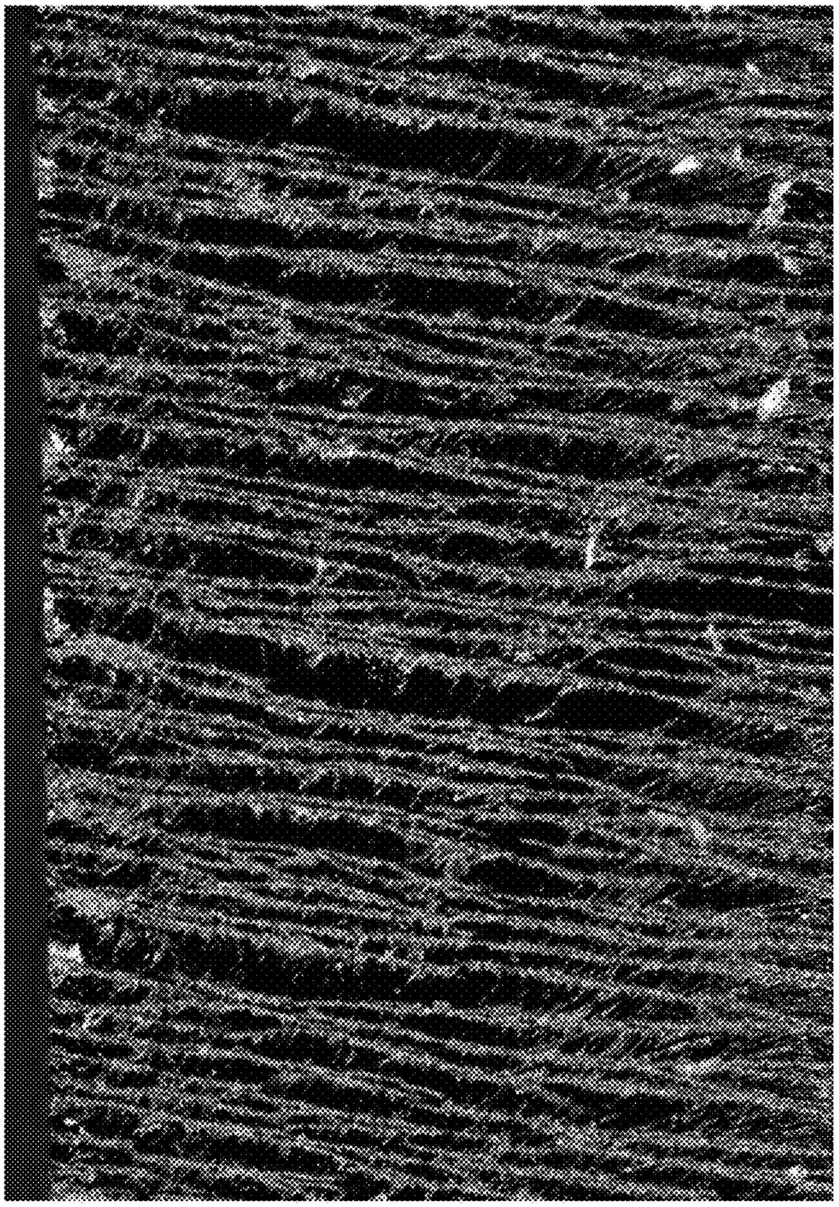

Examples 3-4 were prepared as Example 1 except that the CIP-EW was included in the layer at 60 wt % (17 volume percent) and 40 wt % (8.4 volume percent), respectively. FIGS. 41-42 are images showing top and cross-sectional views of Example 3, respectively. FIGS. 43 and 43A are images showing top views of Example 4 at different magnifications. FIGS. 44 and 44A are images showing cross-sectional views of Example 4 at different magnifications.

Comparative Example C3

Comparative Example C3 was prepared as Example 1 except that the CIP-EW was included in the layer at 80 wt % (35.6 volume percent). Images showed that the particles were randomly distributed in the layer and did not agglomerate into sheets.

Power Loss and Shielding Effectiveness Measurements

Samples were tested using a test fixture that included an about 3 mm wide micro-strip-line (schematically illustrated in FIGS. 45 and 45A) with 50Ω impedance that was hooked to a ZNB20-Vector Network Analyzer (VNA) (from ROHDE&SCHWARZ) using coaxial radio frequency (RF) cables. The full 4-port calibration was performed on the VNA with cables. A sample was cut to 50 mm×50 mm and then aligned to the strip-line and placed on top of the micro-strip line. Styrofoam (dimension: Length×Width×Height=129×96×50 mm) and Teflon blocks (dimension: Length×Width×Height=130×100×25 mm) were put on top of the tested samples to press samples towards microstrip line. The Styrofoam block was between the sample and the Teflon block. The full 4 port S-parameters were measured for each sample and for the test fixture without a sample (empty). The test frequencies range was set to 300 kHz to 20 GHz. Shielding effectiveness was calculated as a difference in S21 (measured in dB by VNA) parameters for test fixture loaded with samples and without (empty). Preliminary Power loss were calculated as $PL=1-|S11|^2-|S21|^2$ for all samples and the empty test fixture. The final reported PL is a difference between PL for the test fixture with samples and without (empty).

Figure 45B:
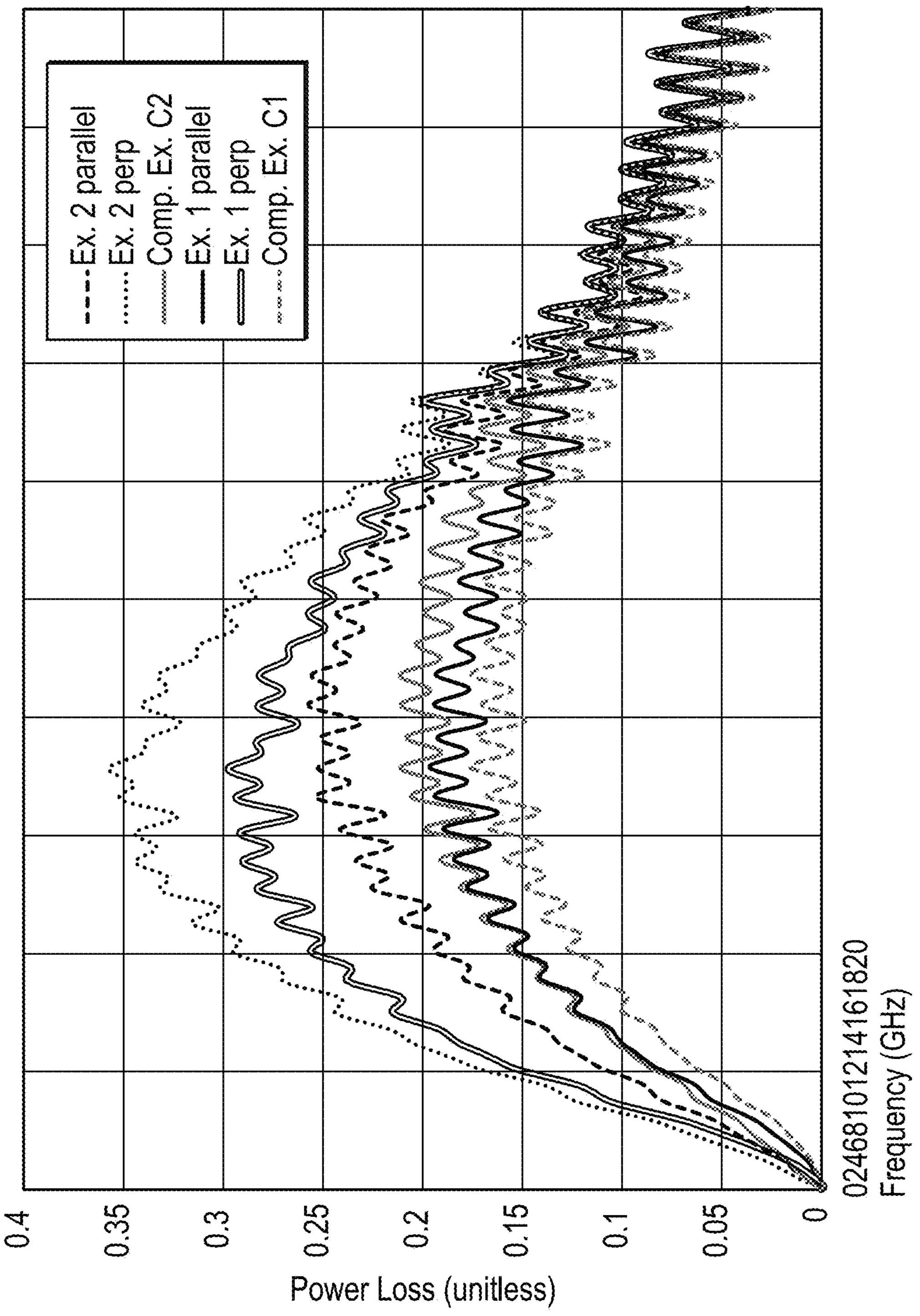
FIG. 45B is a plot of a power loss versus frequency for magnetic films.
Figure 45C:
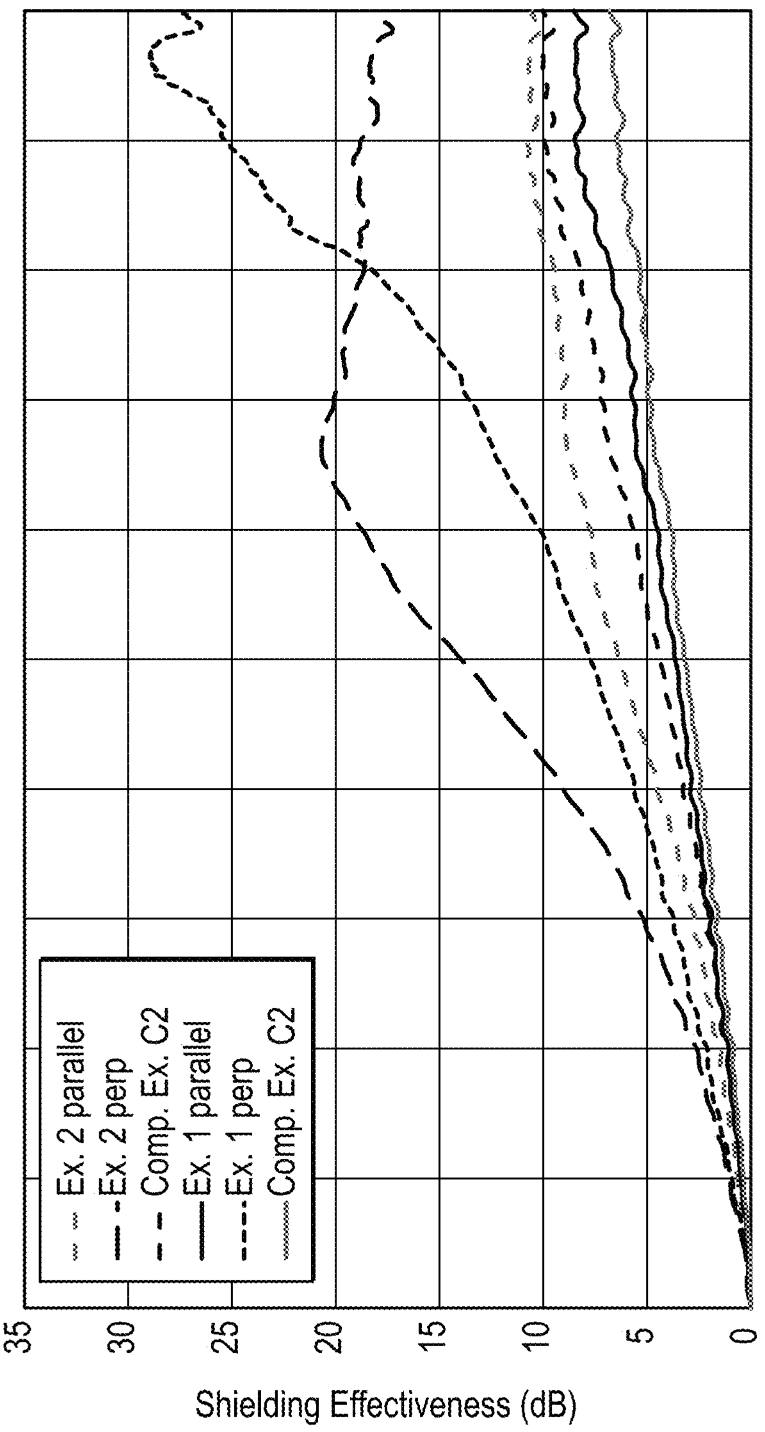
FIG. 45C is a plot of shielding effectiveness versus frequency for magnetic films.
Figure 45D:
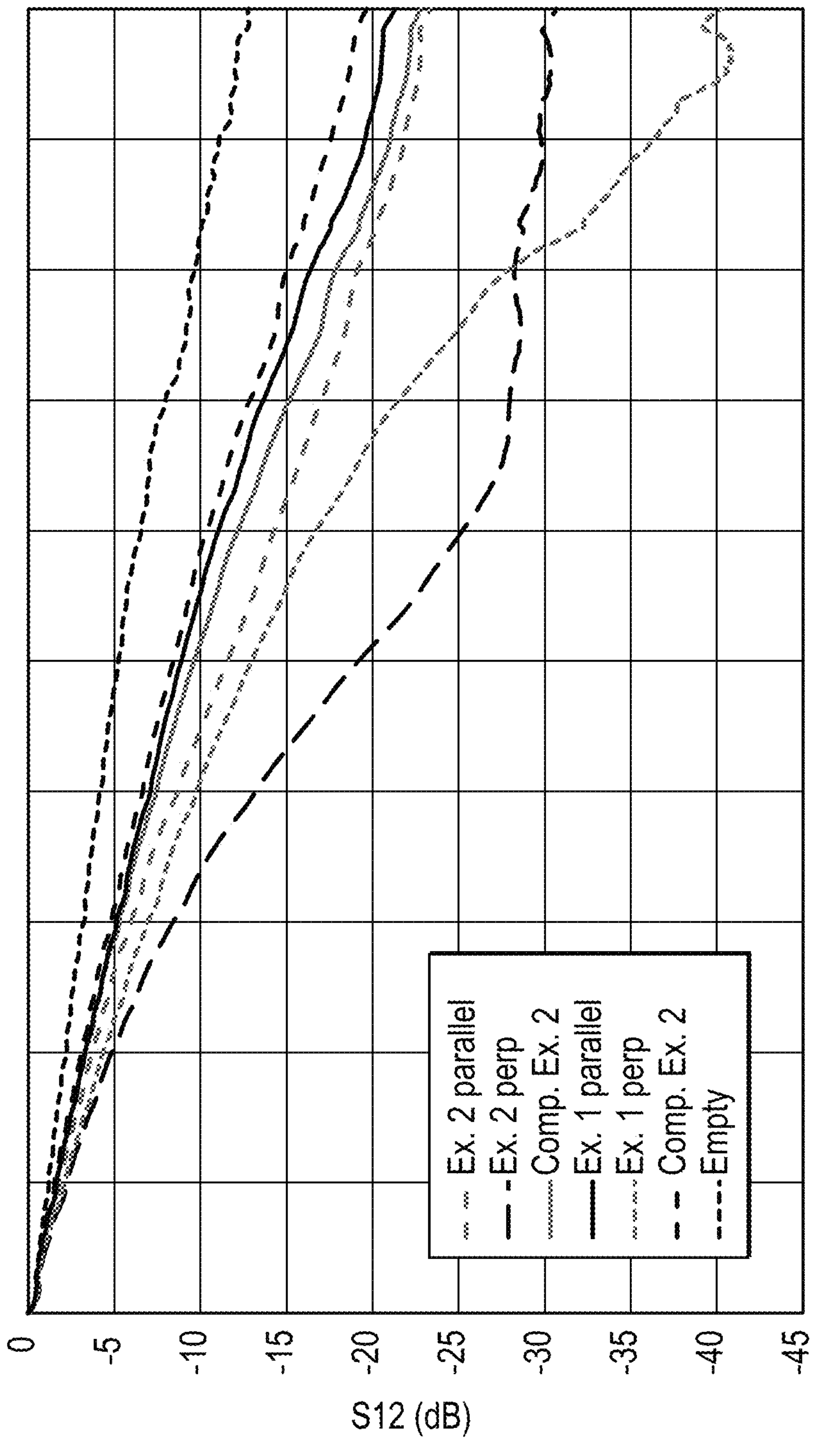
FIG. 45D is a plot of the transmission coefficient versus frequency for magnetic films.

FIG. 45B is a plot of a power loss versus frequency for various samples. FIG. 45C is a plot of shielding effectiveness versus frequency for various samples. FIG. 45D is a plot of the magnitude of the transmission coefficient (S12) versus frequency for various samples. "Parallel" indicates that the in-plane direction of the layers of particles in the magnetic film is parallel to the transmission line (as schematically illustrated in FIG. 45) while "perp" indicates that the in-plane direction of the layers of particles in the magnetic film is perpendicular to the transmission line (as schematically illustrated in FIG. 45A). "Empty" indicates that the sample was not present.

Comparative Example C4

An acrylate slurry was prepared as follows. 299.88 grams of iso-octyl acrylate was mixed with 0.12 grams of IRGACURE 819 as photo initiator and were introduced into a 1 L glass reactor. Then, the mixture was partially polymerized by ultraviolet (UV) light irradiation (365 nm) to obtain syrup having a viscosity of about 900 cps. 87.58 gram of the prepared syrup was transferred into an 800 mL plastic cup, and 0.136 grams of 1,6 hexanediol diacrylate, 37.43 gram of N-dimethylacrylamide, 0.18 gram of IRGACURE 819 and 125.40 gram of NGR-80 was added to the cup. Then, the cup was put into a speed mixer to mix all the materials uniformly under vacuum, resulting in a smooth slurry for coating. The resulting slurry contained about 50 wt % NGR-80.

An adhesive film was made on a small lab coater with a two roll coater set-up. A release liner RFO2N (SKC Hitech & Marketing Co., Ltd, Korea; 3 mil thick) was on the bottom roll. Another release liner RF12N (SKC Hitech & Marketing Co., Ltd, Korea; 3 mil thick) was on the top roll. These two liners were fed through the coating head and the coating gap between two liners was adjusted to 150 micrometers. A layer of PNW-5-PCN(ii), a 15 micrometer thick electrically conductive nonwoven scrim coated with multiple, thin layers of metal, was placed onto the bottom liner and the beginning edge of the conductive nonwoven sheet was fixed using polyimide tape to prevent from sliding relative to the bottom liner. Some of the Acrylate Slurry was poured onto the conductive nonwoven sheet and then the two release liners were pulled through the coating header gap to provide the adhesive film.

An approximately 12 cm×12 cm piece of the coated adhesive layer was cut out and cured with ultraviolet (UV) light irradiation (365 nm) by using the device DYMAX bluewave LED FLOOD with 25% intensity for 25 seconds (total energy: 1322 mJ/cm2, power intensity: 47.5 mW/cm2). The coated adhesive layer was then flipped over and cured once more under the same conditions.

Comparative Example C5

Comparative Example C5 was made as Comparative Example C4 except that the coated adhesive layer was placed on top of the Magnetic Apparatus I for 10 seconds while the diametrically magnetized cylinder magnet was kept still. Then, the coated adhesive layer was cured in a similar manner as Comparative Example C4.

Example 5

Figure 46:
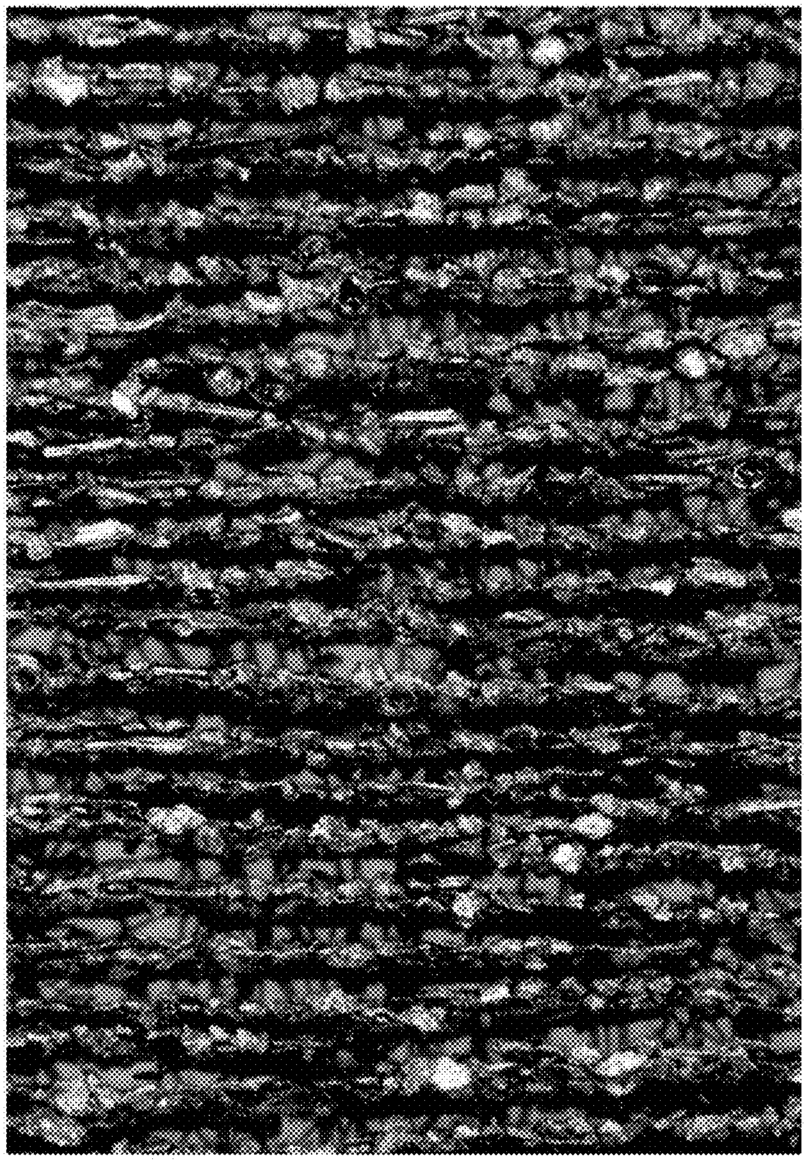
FIGS. 46 and 46A are images of a top view of an adhesive layer at different magnifications.
Figure 46A:
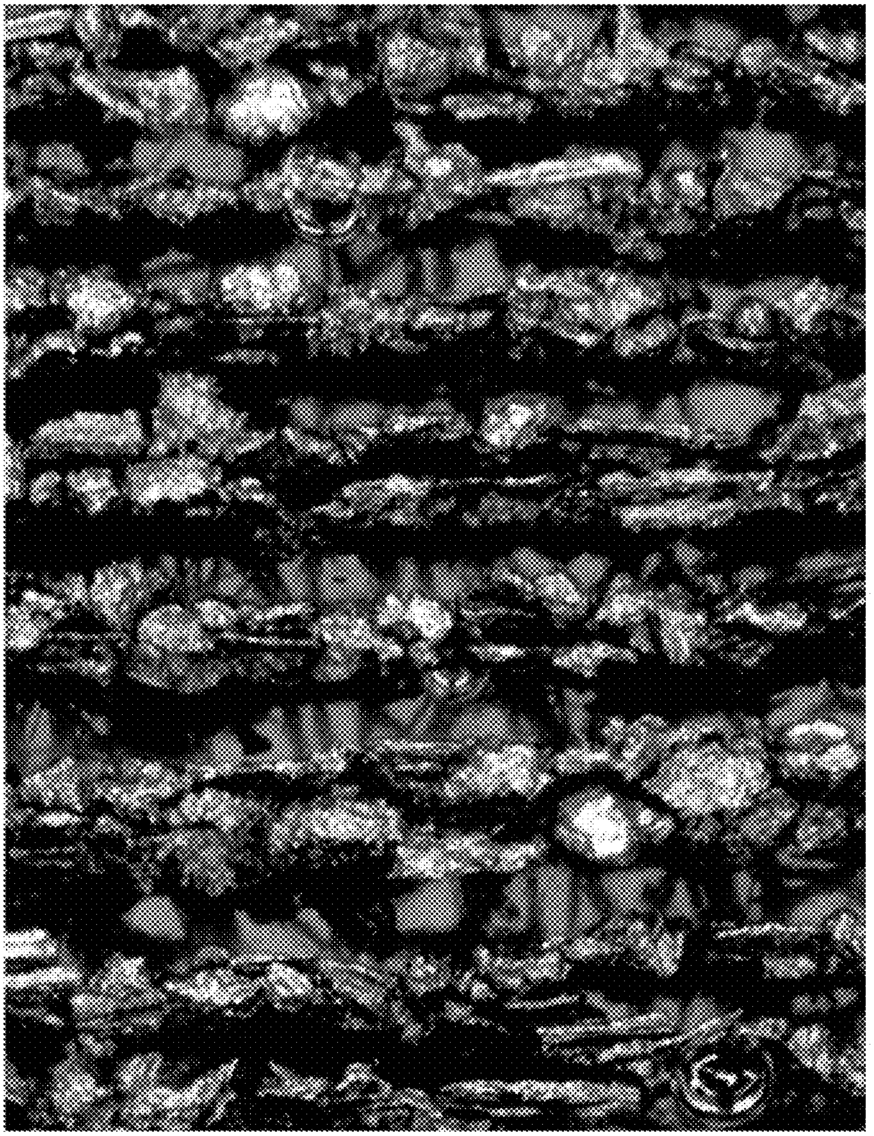
Figure 46B:
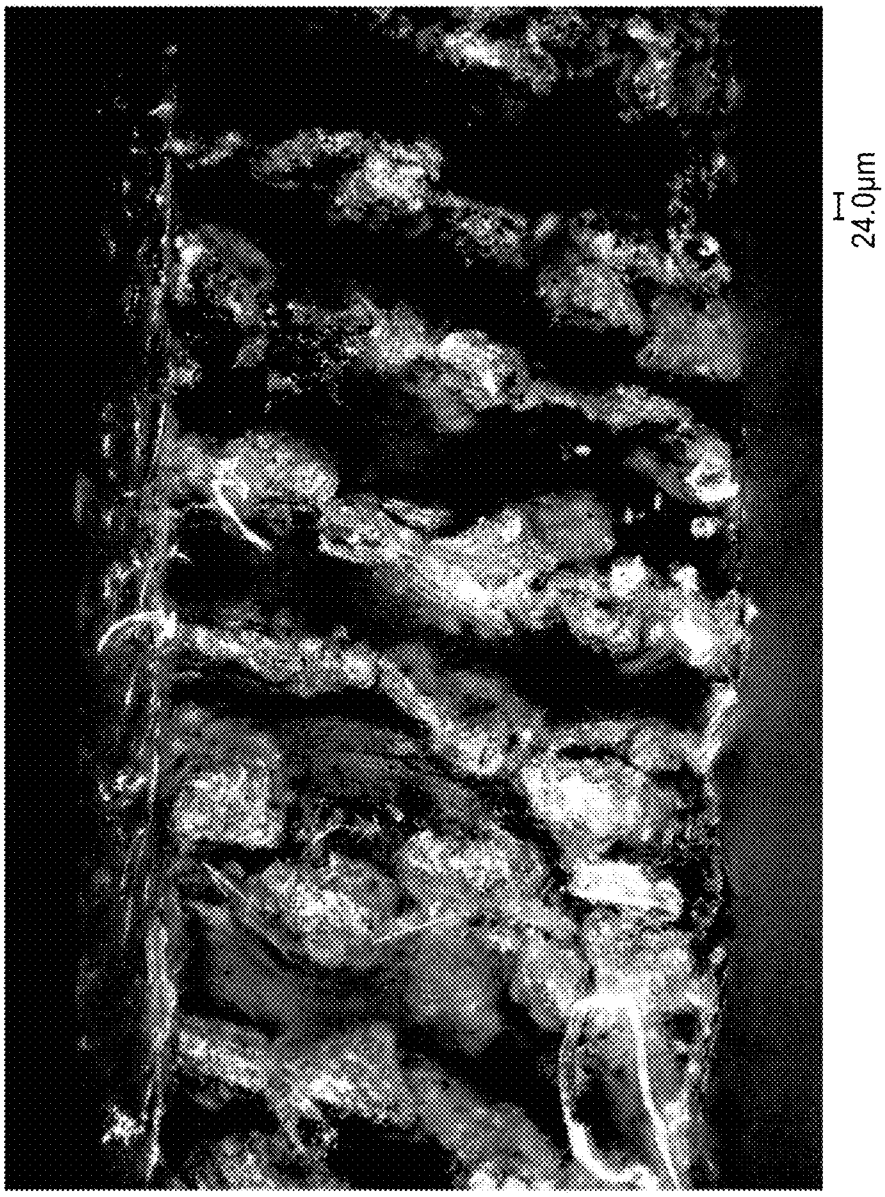
FIG. 46B is an image of a cross-section of the adhesive layer of FIG. 46.

Example 5 was made as Comparative Example A1 except that the coated adhesive layer was placed on top of the Magnetic Apparatus I for 10 seconds while the diametrically magnetized cylinder magnet was rotating at 20% of maximum speed. Then, the coated adhesive layer was cured in a similar manner as Comparative Example C4. The adhesive layer was roughly 500 micrometers thick. FIGS. 46 and 46A are images of top views of the adhesive layer at different magnifications. FIG. 46B is an image of a cross-section image of the adhesive layer.

Impedance Measurements

A measurement board which included a 3 mm wide micro-strip-line with 10 mm gap was hooked to a ZNB20-Vector Network Analyzer (VNA) (from ROHDE&SCHWARZ) or to an Impedance Analyzer E4990A (20 Hz-120 MHz) (from Agilent Technologies). Two pieces of tape were cut to 3 mm×15 mm and one was adhered to each end of a 3 mm×40 mm×1 mm stainless steel bar after removing one side liner. Then the stainless steel bar with tape was aligned to the strip-line and gently adhered after removing another side liner. A 1 kg of weight was applied to the top of the stainless steel bar for 10 seconds. After resting for 20 minutes, the sample was measured on the VNA or Impedance Analyzer.

Figure 47:
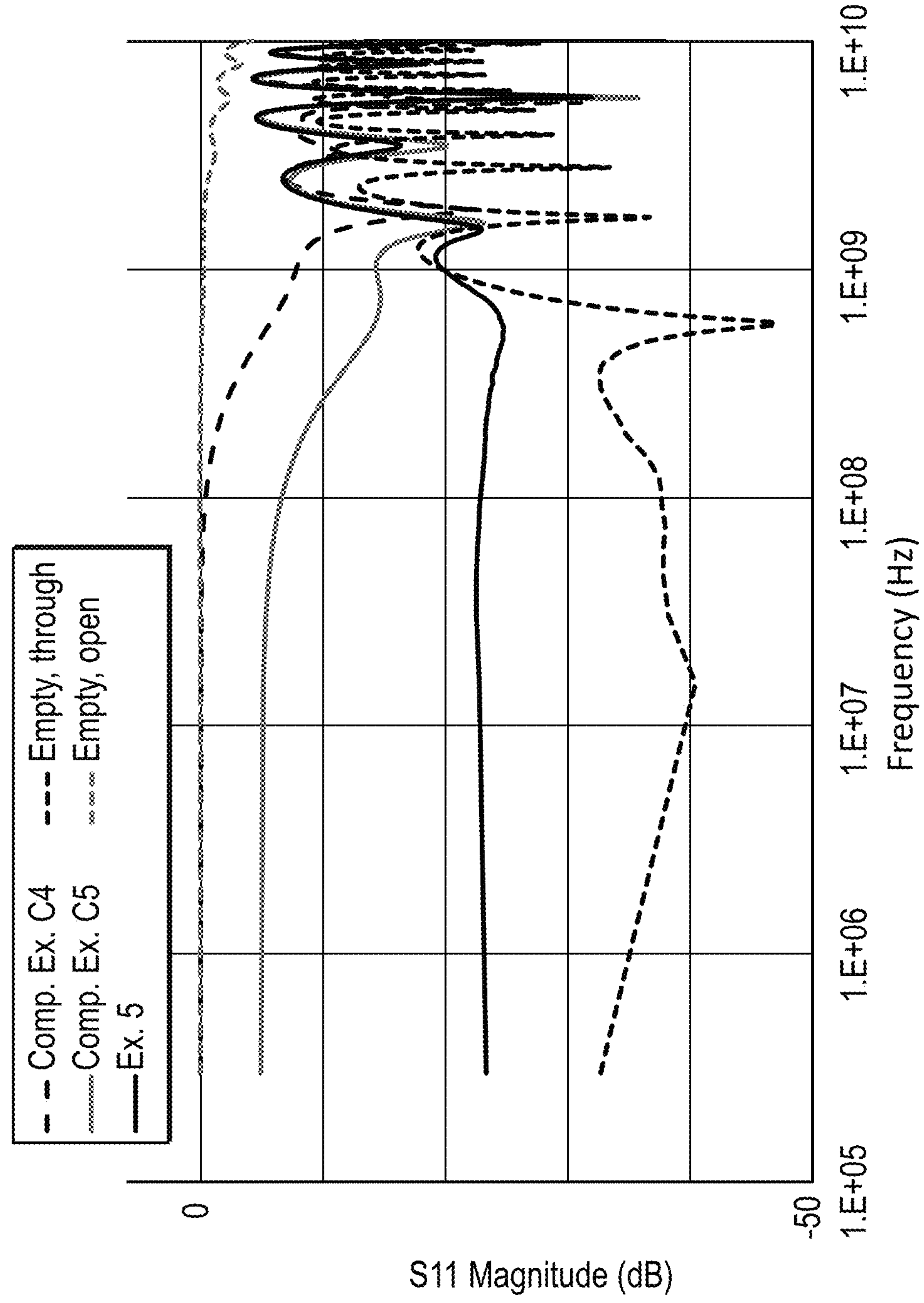
FIGS. 47 and 47A are plots of signal magnitudes S11 and S21, respectively, versus frequency.
Figure 47A:
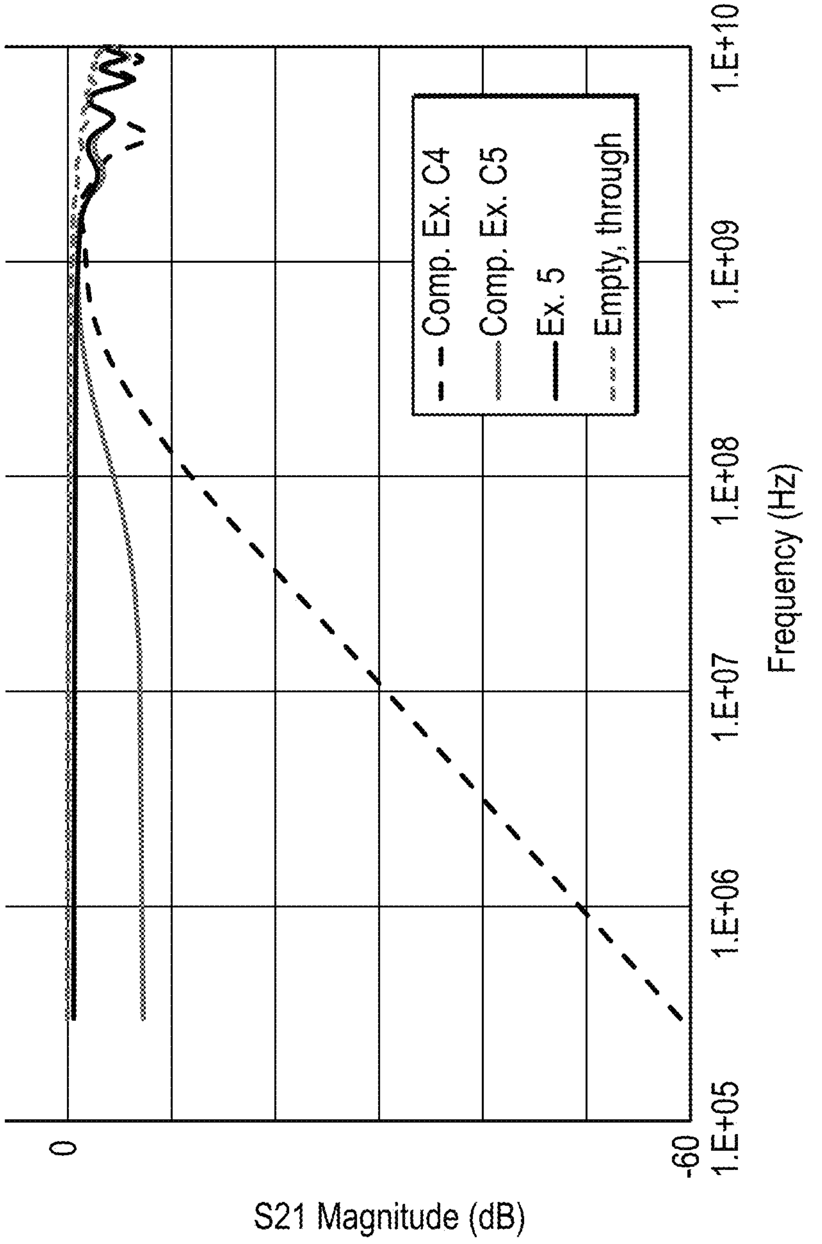

FIGS. 47 and 47A are plots of the signal magnitude S11 (reflection by conductive adhesive layers) and S21 (transferred through z-direction of conductive adhesive layers from port 1 to port 2), respectively, versus frequency. The label "through" indicates that a metallic copper strip with the same dimensions as the strip-line of the test fixture was used in place of the sample. This was considered an "ideal" sample (very highly conductive) to compare the tape measurements to. The label "open" indicates that no sample was in the test fixture and that no tape or bridging stainless steel bar was included. This was considered a reference for a worst case (no conduction).

Figure 47B:
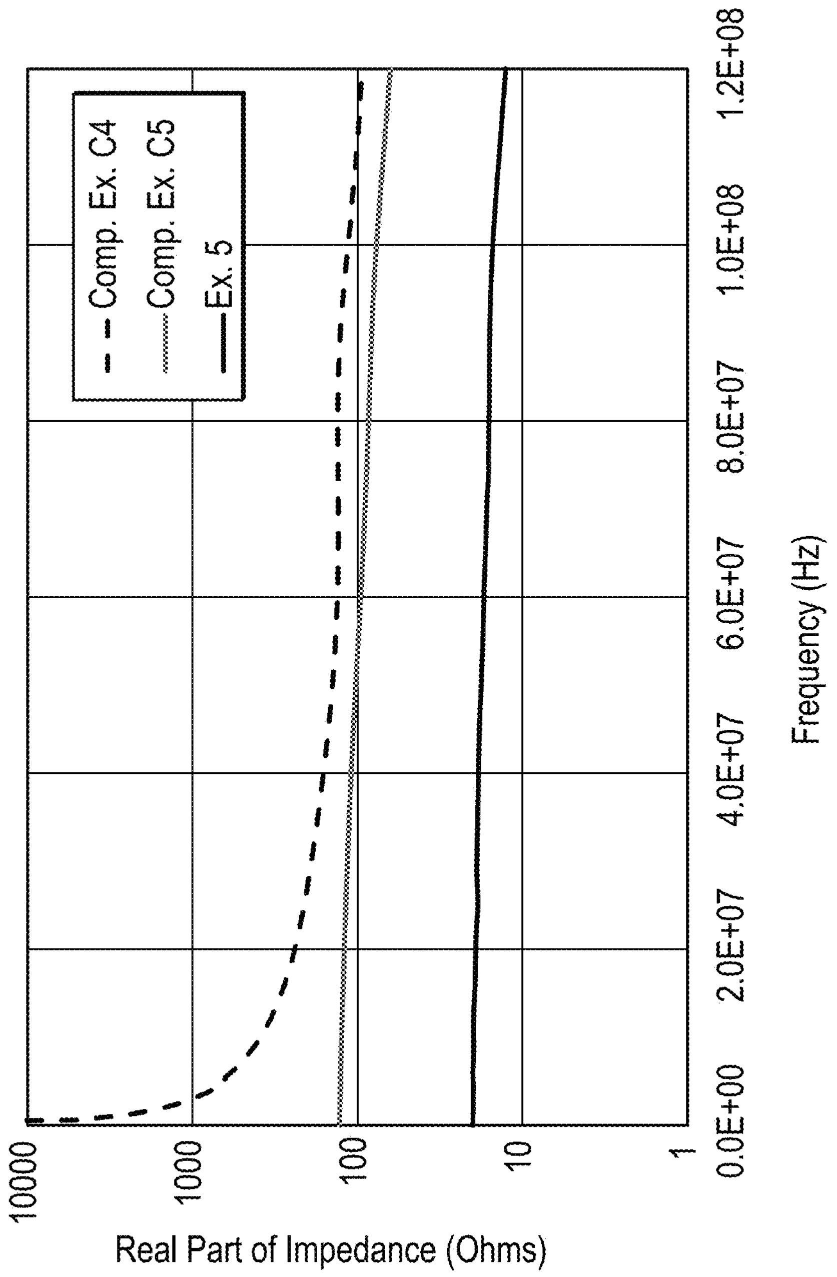
FIGS. 47B and 47C are plots of the real and imaginary parts of the impedance, respectively, versus frequency.
Figure 47C:
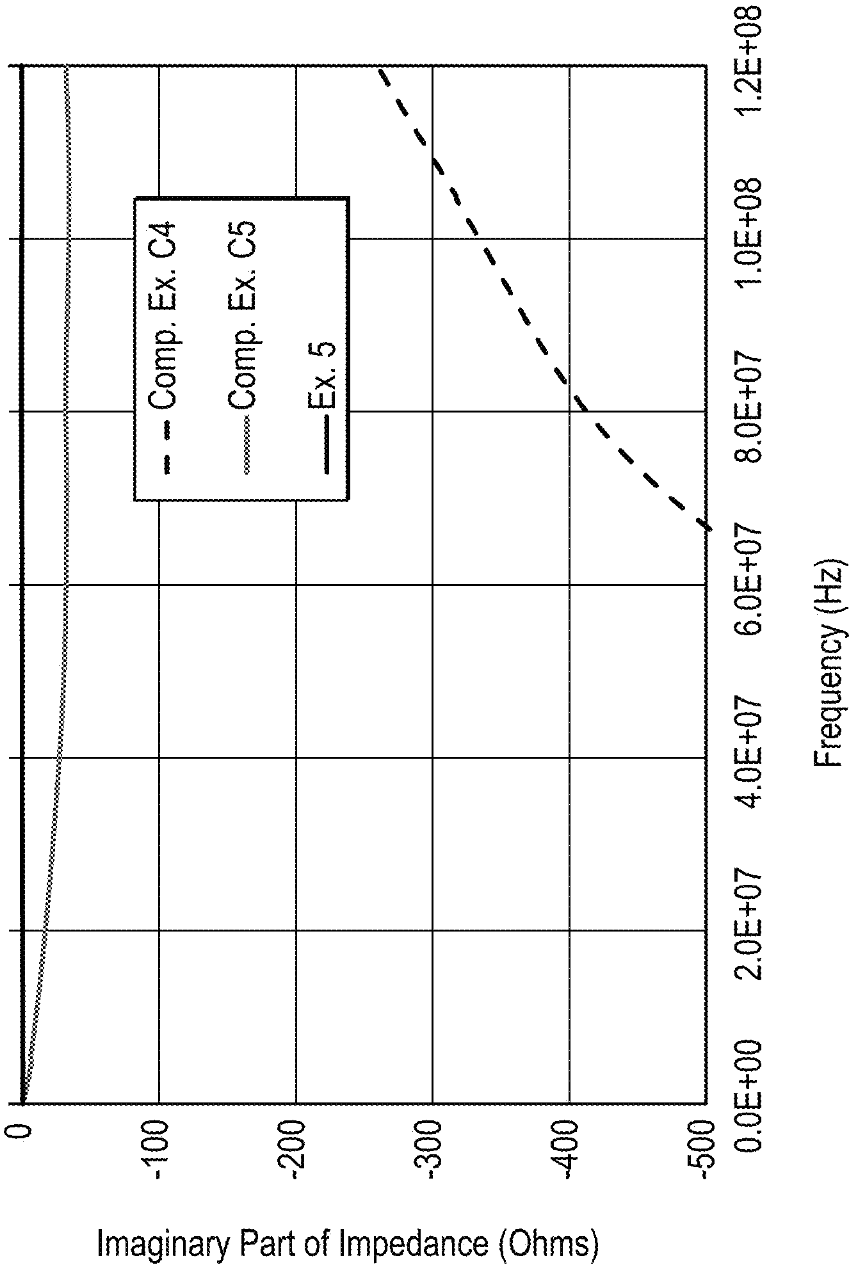

FIGS. 47B and 47C are plots of the real and imaginary parts, respectively, of the impedance of the conductive adhesive layers versus frequency.

Example 6

Figure 48:
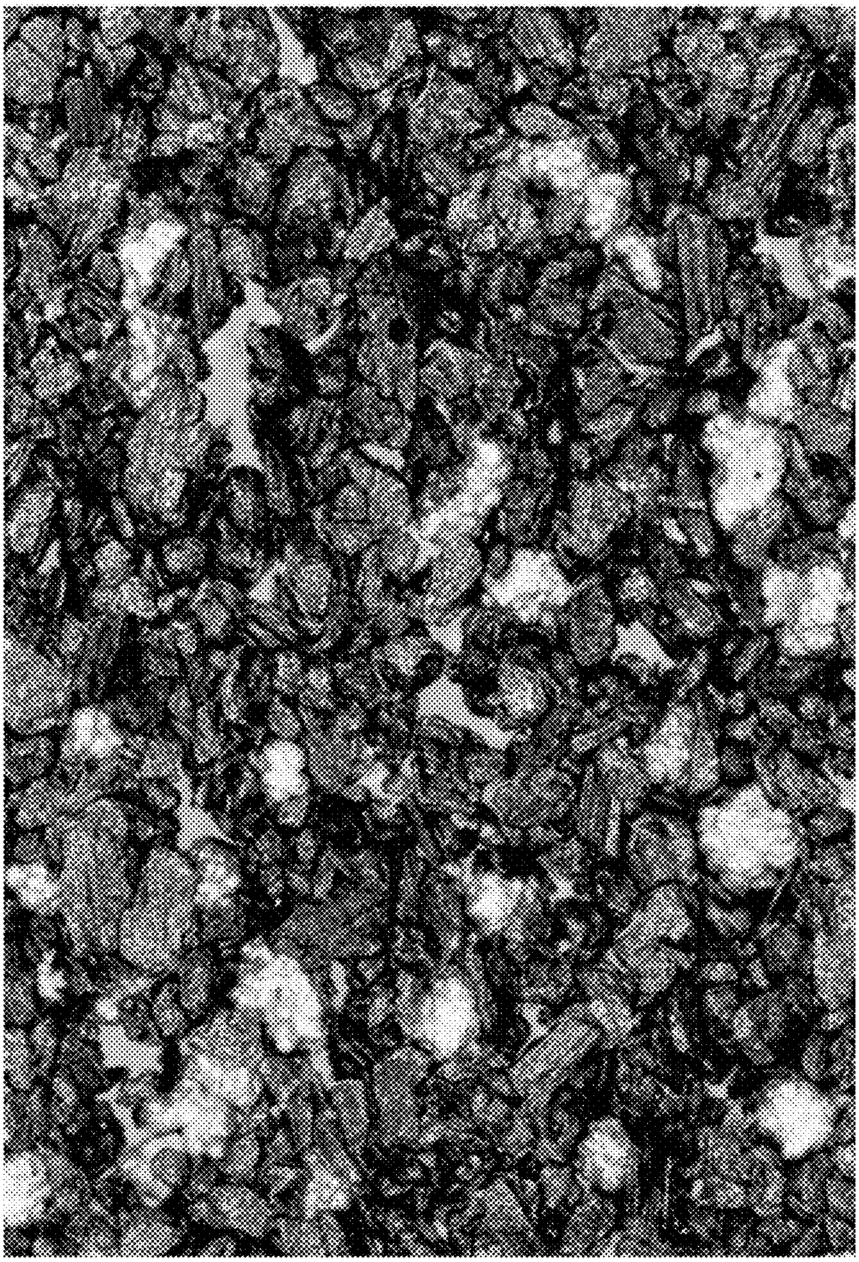
FIGS. 48, 48A, 48B, 49, 49A, 49B, 50, and 50A are images of top views of adhesive layers.
Figure 48A:
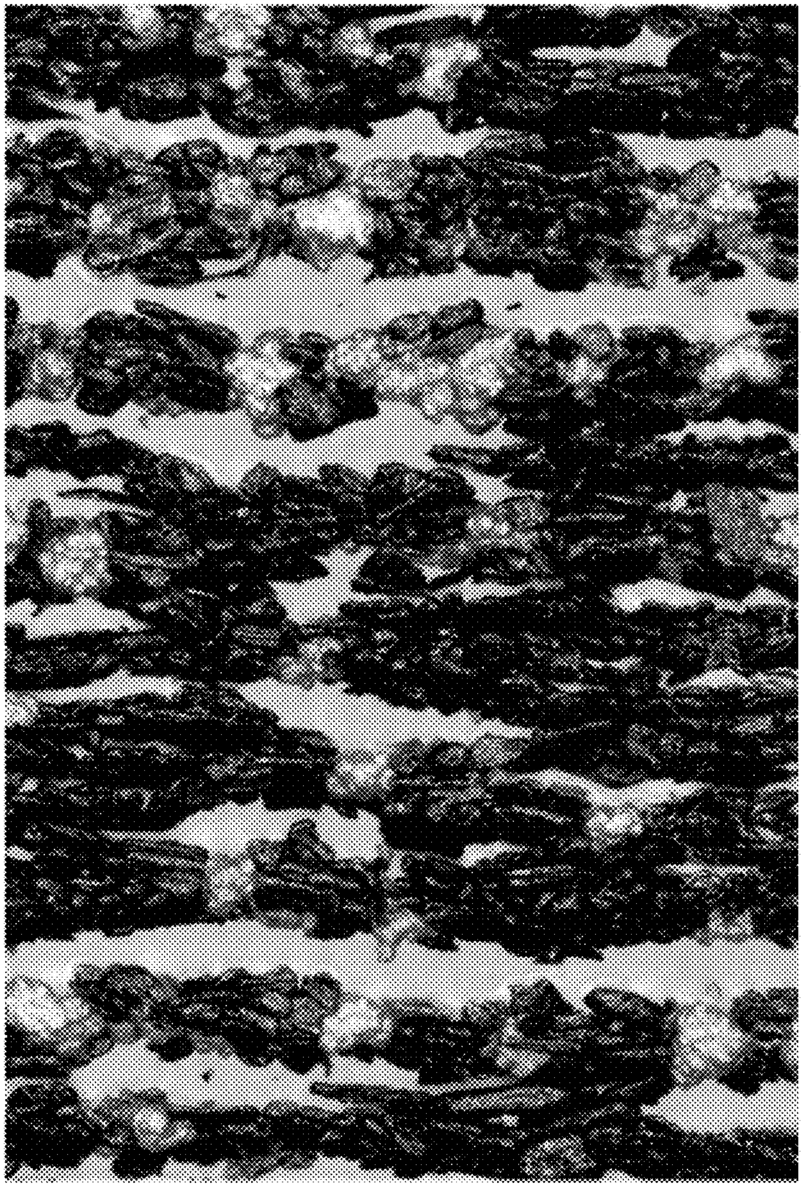
Figure 48B:
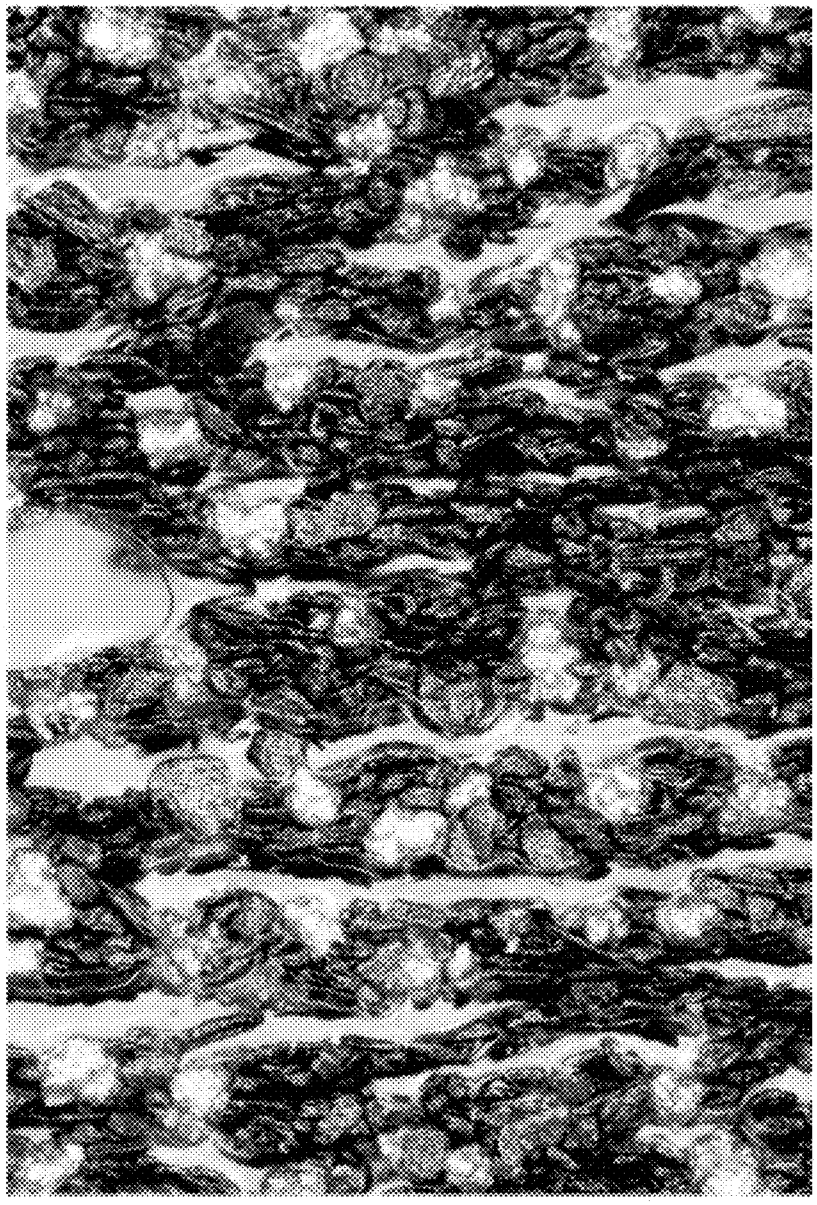

Example 6 was prepared as in Example 5 except that nickel coated graphite (E-Fill 2806) and silver coated nickel (SN40S15) were used in place of NGR-80, and the nonwoven scrim was not included. The loading of E-Fill 2806 was about 45.7 wt. % or 20 vol. % and the loading of SN40S15 was about 20 wt. % or 5 vol. %. Samples were made with the diametrically magnetized cylinder magnet rotating at 20% of maximum speed and at 40% of maximum speed. FIG. 48 is a top view image of a comparative sample that was not subjected to a magnetic field, FIG. 48A is a top view image of a sample made with a magnet rotation speed of 20% of maximum, and FIG. 48B is a top view image of a sample made with a magnet rotation speed of 40% of maximum.

Example 7

Figure 49:
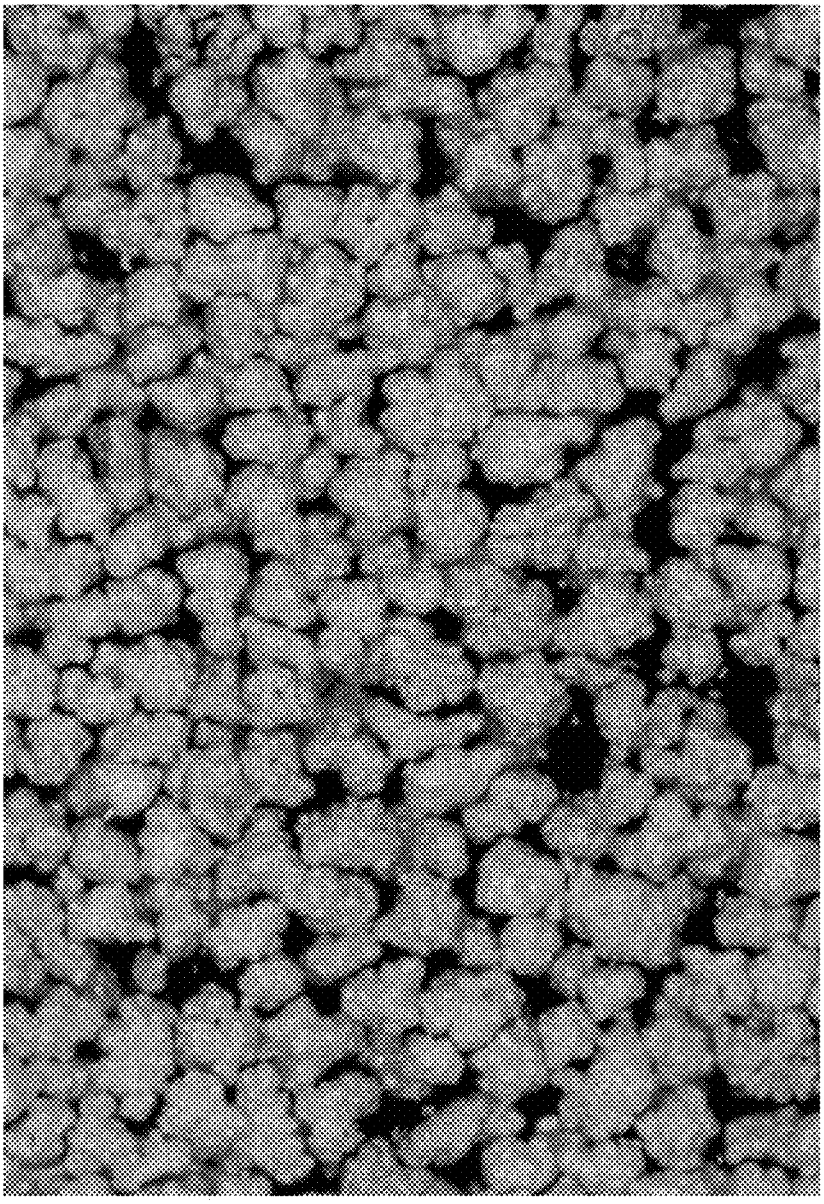
Figure 49A:
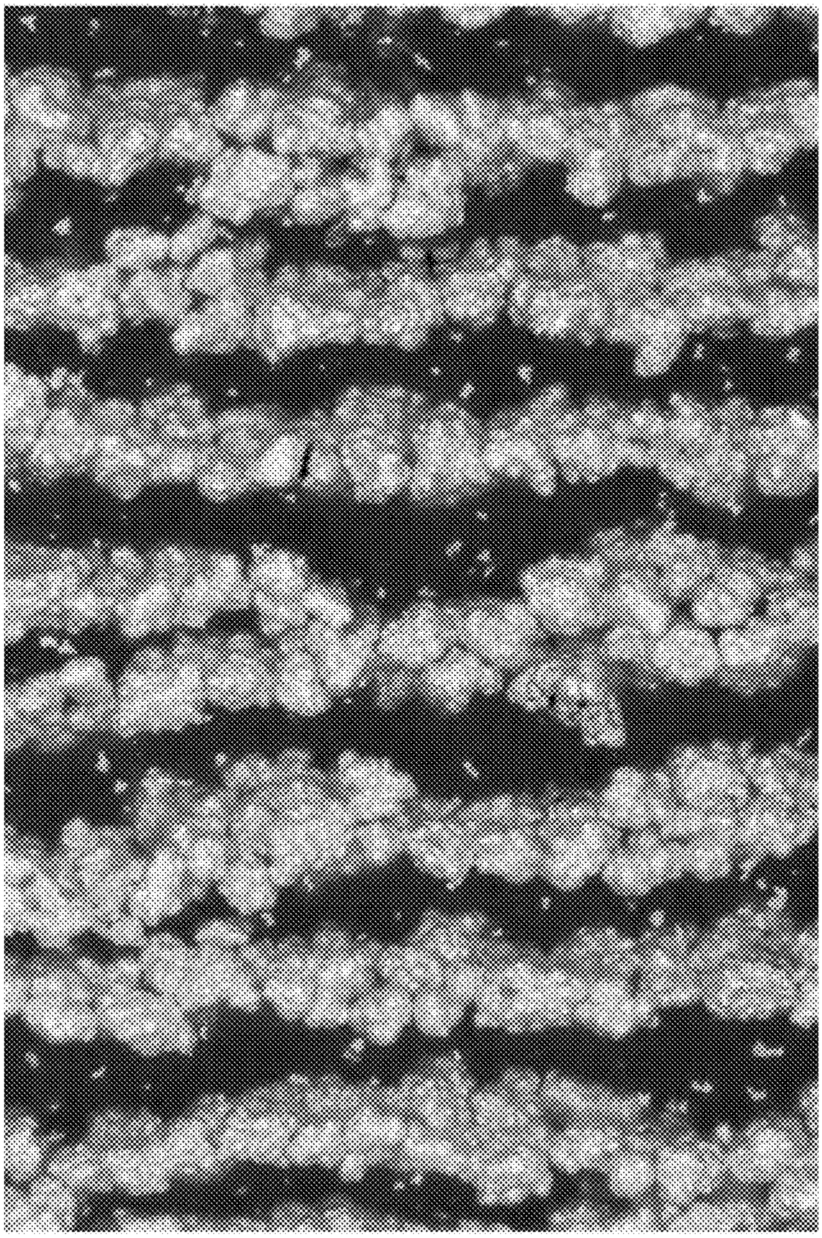
Figure 49B:
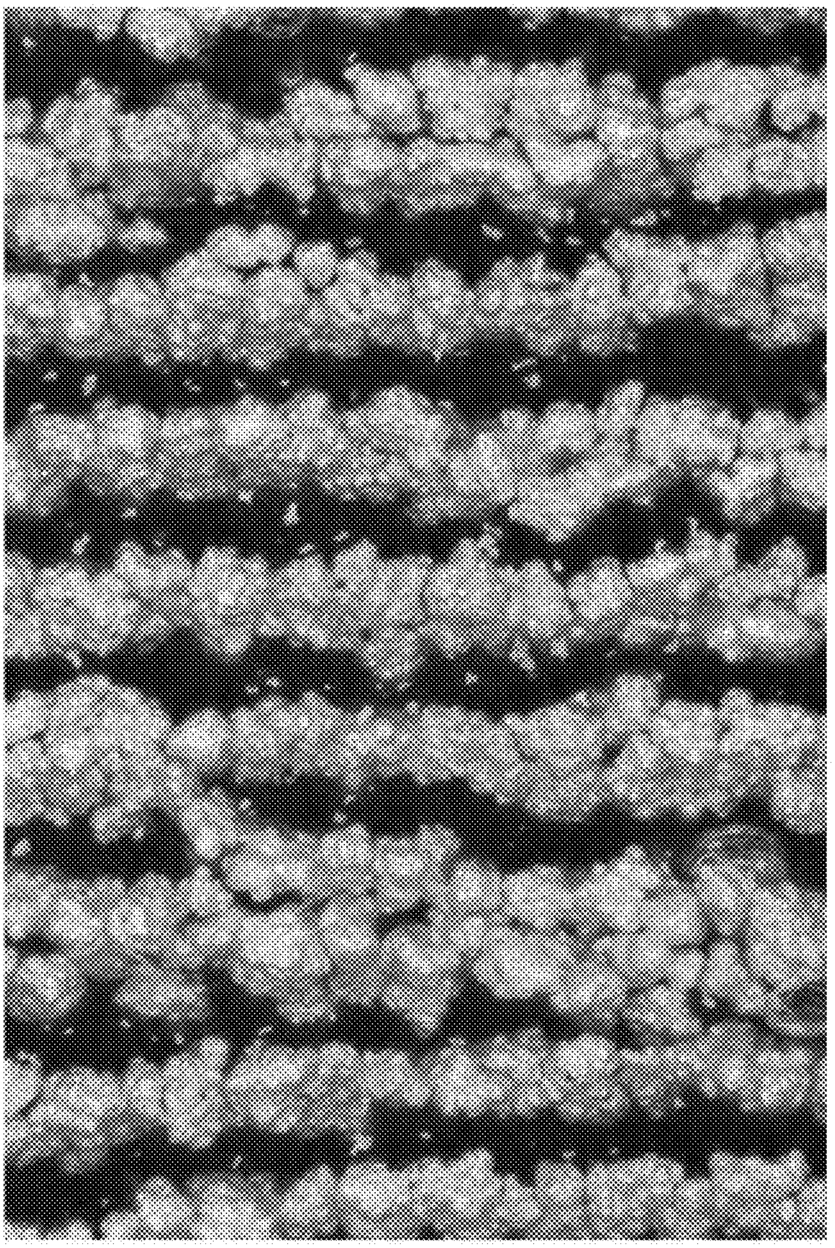

Example 7 was prepared as in Example 5 except that silver coated nickel (SN40S15) was used in place of NGR-80, and the nonwoven scrim was not included. The loading of SN40S15 was about 74.2 wt. % or about 25 vol. %. Samples were made with the diametrically magnetized cylinder magnet rotating at 20% of maximum speed and at 40% of maximum speed. FIG. 49 is a top view image of a comparative sample that was not subjected to a magnetic field, FIG. 49A is a top view image of a sample made with a magnet rotation speed of 20% of maximum, and FIG. 49B is a top view image of a sample made with a magnet rotation speed of 40% of maximum.

Example 8

Figure 50:
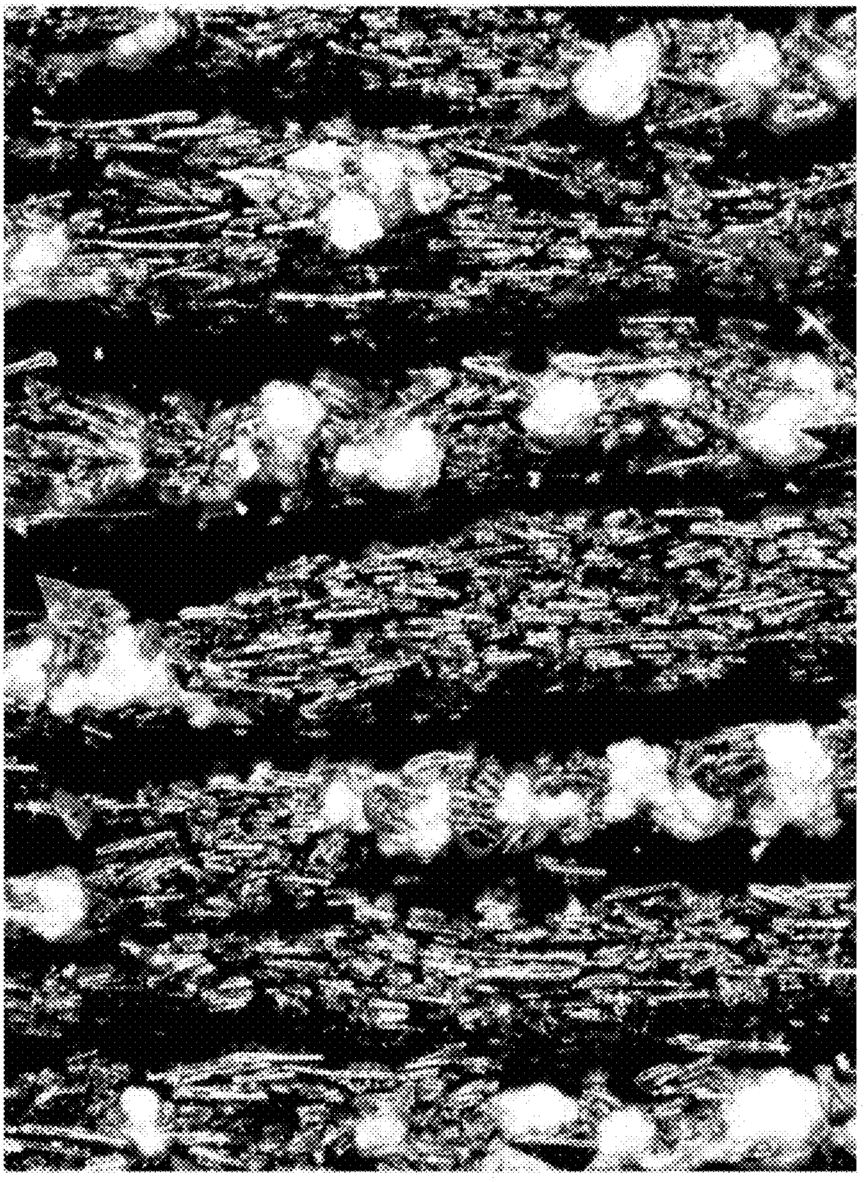
Figure 50A:
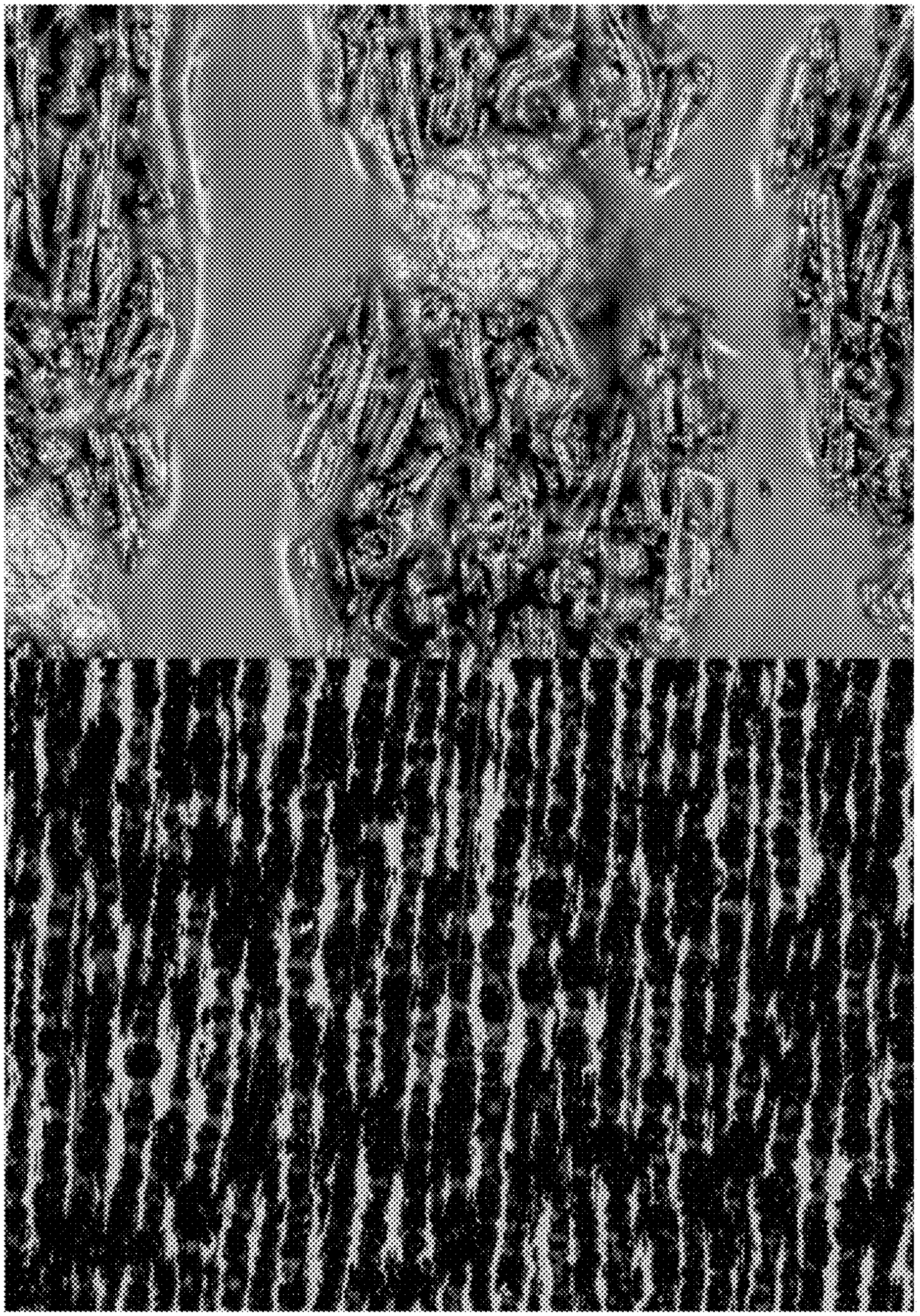

Example 8 was prepared as in Example 5 except that nickel coated glass (NG15F50) and silver coated nickel (SN40S15) were used in place of NGR-80. Samples were made with and without the nonwoven scrim was not included. The loading of NG15F50 was about 36.6 wt. % or 19 vol. % and the loading of SN40S15 was about 26 wt. % or 6 vol. %. Samples were made with the diametrically magnetized cylinder magnet rotating at 20% of maximum speed. FIG. 50 is atop view image of a sample without the nonwoven scrim. FIG. 50A shows top view images of the sample at a lower magnification on the left and a higher magnification on the right. The sample made with the nonwoven scrim had a thickness of 94 micrometers, a resistance in the thickness direction of 0.05 ohms, a resistance in an in-plane direction along the layers of particles of 0.635 ohms, and a resistance in an in-plane direction perpendicular to the layers of particles of 1.70 ohms. The sample made without the nonwoven scrim had a thickness of 103 micrometers and a resistance in the thickness direction of 0.06 ohms.

Example 9

The organic components indicated in the following table were added to a 200-gram capacity speed mixer cup along with fillers and, for some samples, DISPERBYK 145 as a dispersing agent (indicated under "Disp.?" in the table). The whole system was then mixed with the following protocol on a DAC 1100.2 VAC-P Speed Mixer (FlackTek) under the following conditions:

1. 1200 RPM 20 sec, 300 mbar
2. 1400 RPM 20 sec, 300 mbar

The fillers for each sample included Sendust as Filler 1 and the filler listed under "Filler 2" in the table.

| Sample No. | Filler 2 | TEPA qty (g) | DER332 qty (g) | Filler 1 qty (g) | Filler 2 qty (g) | Disp.? | Vol. Fraction Filler | Vol. Fraction Sendust |
|---|---|---|---|---|---|---|---|---|
| 1 | 500-15 BN Flake | 2.3 | 15.04 | 17.23 | 15.28 | Y | 0.40 | 0.10 |
| 2 | 500-15 BN Flake | 2.53 | 16.56 | 12.3 | 18.45 | Y | 0.40 | 0.07 |
| 3 | 500-15 BN Flake | 2.7 | 17.65 | 7.97 | 21.54 | Y | 0.40 | 0.04 |
| 4 | 500-15 BN Flake | 2.83 | 18.52 | 5.13 | 23.37 | Y | 0.40 | 0.03 |
| 5 | 500-15 BN Flake | 2.01 | 13.16 | 18.36 | 16.29 | Y | 0.45 | 0.12 |

-continued

| Sample No. | Filler 2 | TEPA qty (g) | DER332 qty (g) | Filler 1 qty (g) | Filler 2 qty (g) | Disp.? | Vol. Fraction Filler | Vol. Fraction Sendust |
|---|---|---|---|---|---|---|---|---|
| 6 | 500-15 BN Flake | 2.39 | 15.6 | 8.6 | 23.25 | Y | 0.45 | 0.05 |
| 7 | 500-15 BN Flake | 2.89 | 18.86 | 11.3 | 16.95 | Y | 0.35 | 0.06 |
| 8 | 500-15 BN Flake | 2.89 | 18.86 | 11.3 | 16.95 | N | 0.35 | 0.06 |
| 9 | 200-15 BN Flake | 2.39 | 15.6 | 8.6 | 23.25 | Y | 0.45 | 0.05 |
| 10 | 500-3 BN Flake | 2.39 | 15.6 | 8.6 | 23.25 | Y | 0.45 | 0.05 |
| 11 | 500-3 BN Flake | 2.5 | 16.36 | 11.73 | 10.41 | N | 0.30 | 0.08 |
| 12 | 500-15 BN Flake | 2.53 | 16.56 | 12.3 | 18.45 | N | 0.40 | 0.07 |
| 13 | 500-15 BN Flake | 2.29 | 14.96 | 11.79 | 20.96 | N | 0.45 | 0.07 |
| 14 | Asbury 3268 | 3.35 | 21.90 | 12.38 | 12.38 | N | 0.28 | 0.05 |
| 15 | Asbury 3268 | 3.35 | 21.90 | 12.38 | 12.38 | N | 0.28 | 0.05 |
| 16 | Asbury 3268 | 2.83 | 18.49 | 10.43 | 9.25 | N | 0.25 | 0.06 |

Additional samples were made according to the following table. No DISPERBYK 145 was included in these samples.

| Sample No. | Filler 1 | Filler 2 | TEPA qty (g) | DER332 qty (g) | Filler 1 qty (g) | Filler 2 qty (g) | Vol. Fraction Filler | Vol. Fraction Magnetic Filler | Vol. Fraction non-flake Filler (eg., bridging particles) |
|---|---|---|---|---|---|---|---|---|---|
| 17 | Sendust HS80 | 500-15 BN Flake | 1.66 | 10.84 | 10.5 | 15.75 | 0.53 | 0.07 | 0.13 |
| | | TM1250 | | | | 5.62 | | | |
| | | AA18 | | | | 5.62 | | | |
| 18 | Sendust HS80 | 500-15 BN Flake | 1.99 | 13.01 | 11.2 | 16.8 | 0.48 | 0.07 | 0.08 |
| | | TM1250 | | | | 3.5 | | | |
| | | AA18 | | | | 3.5 | | | |
| 19 | Sendust HS80 | 500-15 BN Flake | 2.45 | 16.05 | 10.08 | 15.12 | 0.40 | 0.06 | 0.06 |
| | | TM1250 | | | | 3.15 | | | |
| | | AA18 | | | | 3.15 | | | |
| 20 | Sendust HS80 | 500-15 BN Flake | 2.26 | 14.74 | 11.88 | 17.82 | 0.45 | 0.07 | 0 |
| | | 500-3 BN Flake | | | | 3.3 | | | |
| 21 | Sendust HS80 | 500-15 BN Flake | | | 11.36 | 17.4 | 0.52 | 0.07 | 0 |
| | Platelets 012P | 200-15 BN Flake | | | 2.25 | 2.25 | | | |
| | | 500-3 BN Flake | | | | 2.25 | | | |

-continued

| Sample No. | Filler 1 | Filler 2 | TEPA qty (g) | DER332 qty (g) | Filler 1 qty (g) | Filler 2 qty (g) | Vol. Fraction Filler | Vol. Fraction Magnetic Filler | Vol. Fraction non-flake Filler (eg., bridging particles) |
|---|---|---|---|---|---|---|---|---|---|
| 22 | BAK70 | BAK10 | 4.14 | 27.1 | 70.31 | 23.44 | 0.48 | 0 | 0.48 |
| 23 | BAK70 | BAK10<br>TM1250 | 1.33 | 8.67 | 69 | 23<br>23 | 0.78 | 0 | 0.78 |

After mixing, the coating solutions were cast into a sheet using a 12" (30.5 cm) wide notch bar with a 30 mil (0.76 mm) gap between two silicone release liners (32N-3 mil and 32N-3 mil from SKC). A magnetic field was then applied to the coated uncured composite samples using either a static magnet with a linear back and forth motion of the sample (denoted "Linear" in the table below) relative to the magnet, or using a rotating magnet (denoted "Rotating" in the table below).

For the static magnet system, two aligned rare earth magnets were separated by 9.2 mm and the coated uncured composite was passed back and forth in the gap between the two magnets 30-60 times. It was found that simply holding the composite between the magnets was not enough to force alignment/orientation in these systems. The measured field strength was 4.37 kG between the two magnets. The magnets were of T550 type and of rectangular dimensions (25 mm×30 mm×17 mm). They were obtained from Electron Energy Corporation, Landisville, PA.

The rotating magnetic is described under "Assembly of Magnetic Apparatus II". The coated uncured composite was passed back and forth for 20-30 passes over the magnet over a period of ~1 min.

Coatings were then taped to a plastic board. The boards were placed in an oven at 70° C. for half an hour to cure the epoxy at which point they were removed, and the liners were stripped off.

Thermal conductivities of the cured samples were measured using a Laser Flash Analysis (LFA) diffusivity method with an LFA 467 Hyper Flash (Netzsch). The test was run with a laser cut 12.7 mm disc that had been spray coated in graphite to control emissivity. Data was collected with a sample temperature of 50° C., and three replicates were tested and averaged for each coating. The LFA method provided a sample diffusivity. Several additional quantities were measured to determine the thermal conductivity: thickness was measured using a drop gauge, sample density was measured using an Archimedes' method (Mettler Toledo XSE204 w/density kit), and heat capacity was measured using a pyroceram reference material run at the same time as the samples.

Figure 51:
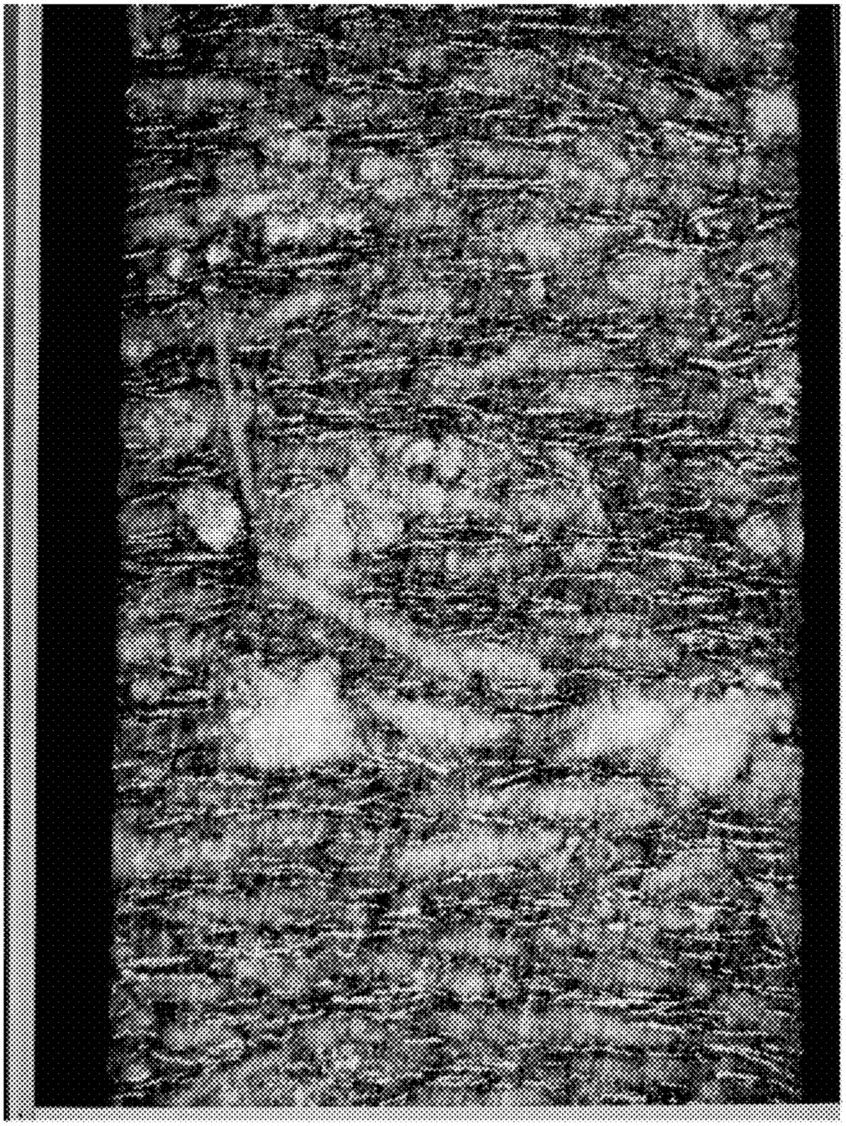
FIG. 51 is an image of a cross-section of a thermal interface layer.
Figure 52:
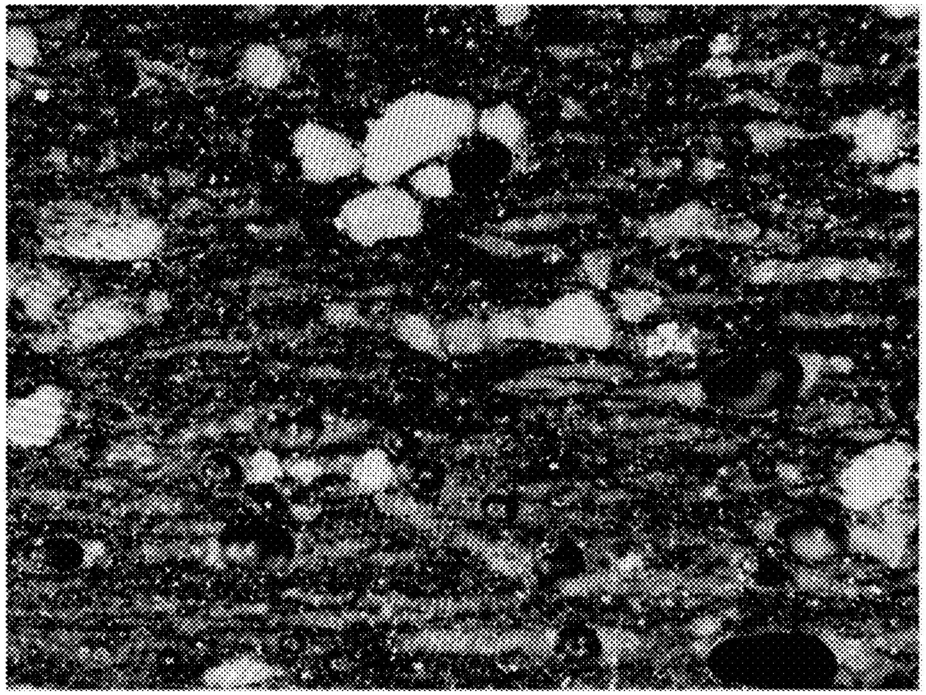
FIGS. 52 and 52A are images of top and cross-sectional views, respectively, of another thermal interface layer.
Figure 52A:
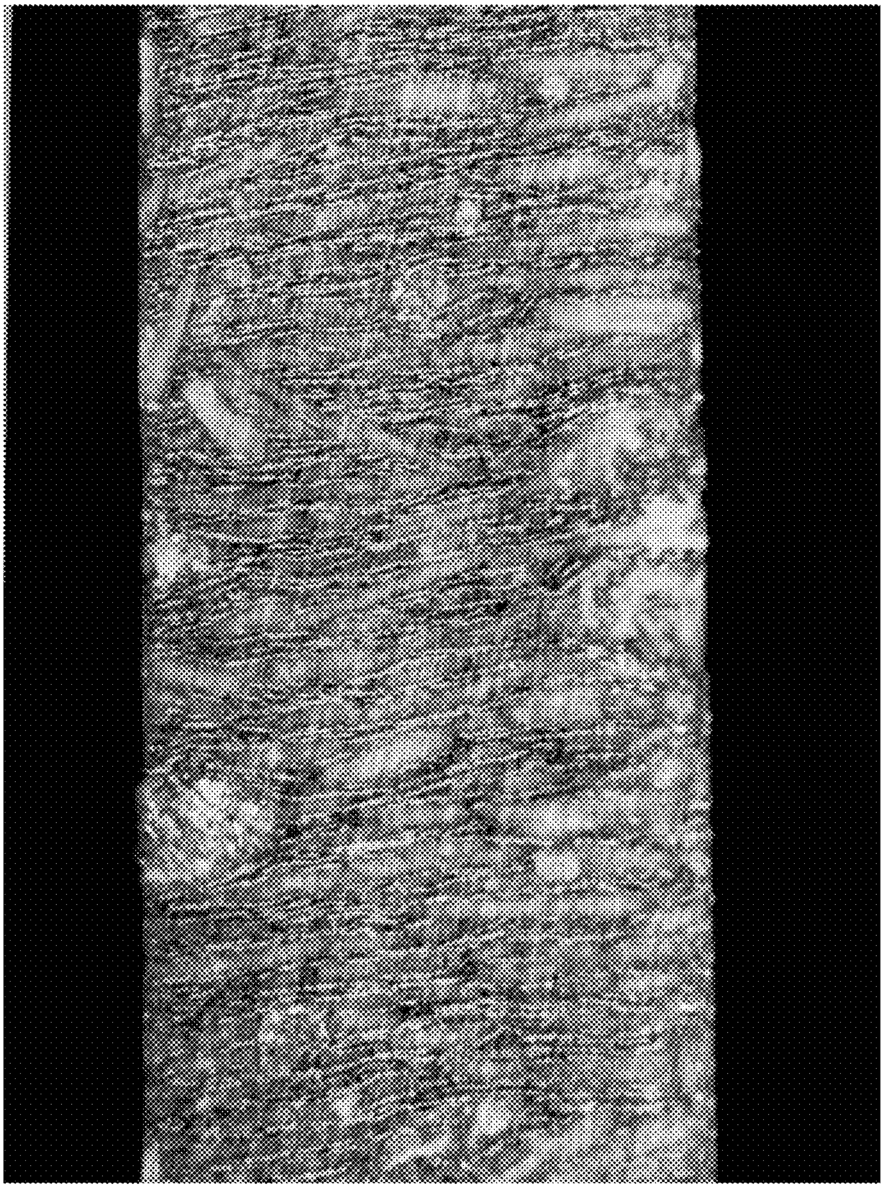
Figure 53:
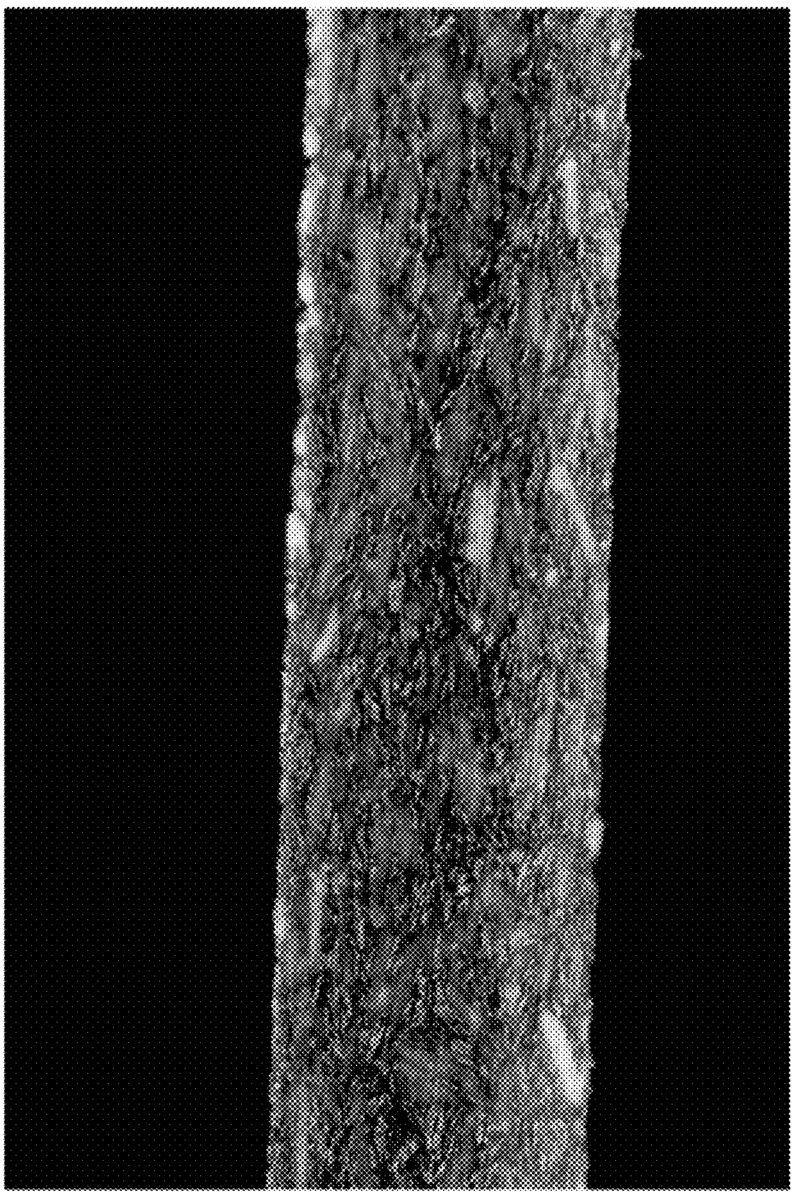
FIG. 53 is an image of a cross-section of a thermal interface layer that was not subjected to an applied rotating magnetic field.
Figure 53A:
FIG. 53A is an image of a cross-section of a thermal interface layer that was subjected to an applied rotating magnetic field.

Results are provided in the table below. "Aligned" samples are samples that were subjected to an applied magnetic field, while "unaligned" samples were not. The samples subjected to the rotating magnetic files showed that the Sendust particles tended to agglomerate into layers. The samples subjected to linear relative magnetic field motion showed at least some degree of orientation of the Sendust particles in the thickness direction, but the particles were not agglomerated into layers. FIG. 51 is an image of a cross-section of Sample 2. FIGS. 52 and 52A are images of top and cross-sectional views, respectively, of Sample 12. FIG. 53 is an image of a cross-section of a comparative version of Sample 21 which was unaligned. FIG. 53A is an image of a cross-section of Sample 21 which was aligned with the rotating magnet. The Sendust flakes appear as thin line segments in these images.

| Sample No. | Relative Field Motion | Thermal Conductivity (Aligned/Unaligned) |
|---|---|---|
| 1 | Linear | 3.2 W/mK Aligned<br>1.0 W/mK Unaligned |
| 2 | Linear | 4 W/mK Aligned<br>1.0 W/mK Unaligned |
| 3 | Linear | 3.2 W/mK Aligned<br>1.0 W/mK Unaligned |
| 4 | Linear | 3.3 W/mK Aligned<br>1.1 W/mK Unaligned |
| 5 | Linear | 1.6 W/mK Aligned |
| 6 | Linear | 4.3 W/mK Aligned<br>1.2 W/mK unaligned |
| 7 | Linear | 2.8 W/mK Aligned<br>0.8 W/mK unaligned |
| 8 | Linear | 3.4 W/mK Aligned |
| 9 | Linear | 3.2 W/mK Aligned<br>1.2 W/mK unaligned |
| 10 | Linear | Would not form into cohesive paste to coat |
| 11 | Rotating | 3.2 W/mK Aligned |
| 12 | Rotating | 4.3 W/mK Aligned<br>1.1 W/mK Unaligned |
| 13 | Rotating | 4.5 W/mK Aligned |
| 14 | Linear | 1.4 W/mK Aligned |
| 15 | Rotating | 2.4 W/mK Aligned |
| 16 | Rotating | 3.3 W/mK Aligned |
| 17 | Rotating | 4.2 Aligned |
| 18 | Rotating | 4.4 Aligned |
| 19 | Rotating | 3.5 Aligned |
| 20 | Rotating | 4.9 Aligned |
| 21 | Rotating | 5.2 Aligned<br>1.7 Unaligned |
| 22 | None | 1.1 |
| 23 | None | 4.6 |

Example 10

Samples were made and tested as described for Example 9 except that the materials in the following table were used in the coating solution. In the table, "aligned" samples are samples that were subjected to an applied rotating magnetic field, while "unaligned" samples were not subjected to an applied magnetic field. FIG. 54 is an image of a cross-section of a comparative version of Sample 1 that was not subjected an applied magnetic field, and FIG. 54A is an image of a cross-section of Sample 1 which was subjected a rotating magnetic field. The Sendust flakes appear as thin line segments in these images while the boron nitride particles appear approximately circular.

| Sample No. | Filler 1 | Filler 2 | TEPA qty (g) | DER332 qty (g) | Filler 1 (g) | Filler 2 (g) | Disp.? | Total Filler Volume % | Thermal Conductivity (Align/Unalign) W/mK |
|---|---|---|---|---|---|---|---|---|---|
| 1 | Sendust HS80 | BAK90 | 1 | 6.5 | 2.98 | 23.8 | N | 63% | 2.7 Aligned |
| | BAK10 | TM1250 | | | 7.87 | 7.87 | | | |
| 2 | Sendust HS80 | BAK90 | 0.8 | 5.2 | 3.96 | 29.4 | Y | 69% | 3.1 Aligned |
| | BAK10 | TM1250 | | | 5.5 | 5.5 | | | |
| 3 | Sendust HS80 | BAK90 | 0.9 | 5.85 | 3.46 | 27.68 | N | 66% | 2.8 Aligned<br>2.3 Unaligned |
| | BAK10 | TM1250 | | | 6.05 | 6.05 | | | |
| 4 | Sendust HS80 | BAK90 | 1.99 | 13.01 | 5.95 | 55.25 | N | 63% | 2.6 Aligned<br>2.2 Unaligned |
| | BAK10 | TM1250 | | | 17 | 6.8 | | | |
| 5 | Sendust HS80 | BAK90 | 1 | 6.5 | 3.83 | 27.63 | N | 63% | 2.7 Aligned |
| | BAK10 | TM1250 | | | 7.9 | 3.5 | | | |
| 6 | Sendust HS80 | BAK90 | 0.8 | 5.2 | 3.96 | 29.04 | Y | 69% | 3.2 Aligned<br>2.3 Unaligned |
| | BAK10 | TM1250 | | | 5.5 | 5.5 | | | |
| 7 | Sendust HS80 | BAK90 | 1.33 | 8.67 | 3.15 | 54.41 | Y | 73% | 4.3 Aligned<br>3.8 Unaligned |
| | BAK10 | TM1250 | | | 20.93 | 8.37 | | | |
| 8 | Sendust HS80 | BAK90 | 1.06 | 6.94 | 3.22 | 55.61 | Y | 78% | 4.7 Aligned<br>4.5 Unaligned |
| | BAK10 | TM1250 | | | 21.39 | 8.56 | | | |
| 9 | Sendust HS80 | BAK90 | 1.93 | 12.59 | 3.62 | 62.52 | N | 63.6% | 2.4 Aligned<br>2.2 Unaligned |
| | BAK10 | TM1250 | | | 11.52 | 4.61 | | | |
| 10 | Sendust HS80 | BAK90 | 1.28 | 8.39 | 5.23 | 67.07 | Y | 73.3% | 3.4 Aligned<br>3.2 Unaligned |
| | BAK10 | TM1250 | | | 10.58 | 4.23 | | | |
| 11 | Sendust HS80 | BAK90 | 1.28 | 8.39 | 3.4 | 68.81 | Y | 73.3% | 3.8 Aligned<br>3.6 Unaligned |
| | BAK10 | TM1250 | | | 10.64 | 4.26 | | | |
| 12 | Sendust HS80 | BAK90 | 1.54 | 10.07 | 3.58 | 66.43 | Y | 69.3% | 3.0 Aligned<br>2.9 Unaligned |
| | BAK10 | TM1250 | | | 10.83 | 4.33 | | | |
| 13 | Sendust HS80 | BAK90 | 2.18 | 14.27 | 3.78 | 62.66 | N | 60.0% | 2.2 Aligned<br>1.9 Unaligned |
| | BAK10 | TM1250 | | | 9.93 | 3.97 | | | |
| 14 | Sendust HS80 | BAK90 | 2.65 | 17.35 | 8 | 62.4 | N | 54.6% | 1.9 Aligned<br>1.4 Unaligned |
| | BAK10 | TM1250 | | | 6.86 | 2.74 | | | |
| 15 | Sendust HS80 | BAK90 | 1.28 | 8.39 | 6.1 | 53.13 | Y | 73.3% | 3.8 Aligned<br>3.2 Unaligned |
| | BAK10 | TM1250 | | | 13.94 | 13.94 | | | |
| 16 | Sendust HS80 | BAK90 | 1.28 | 8.39 | 6.1 | 46.16 | Y | 73.3% | 3.9 Aligned<br>3.3 Unaligned |
| | BAK10 | TM1250 | | | 17.42 | 17.42 | | | |
| 17 | Sendust HS80 | BAK90 | 1.28 | 8.39 | 6.1 | 34.84 | Y | 73.3% | 3.6 Aligned<br>3.2 Unaligned |
| | BAK10 | TM1250 | | | 23.08 | 23.08 | | | |
| 18 | Sendust HS80 | BAK90 | 1.47 | 9.46 | 10.91 | 43.79 | Y | 69.1% | 3.2 Aligned<br>2.8 Unaligned |
| | BAK10 | TM1250 | | | 14.6 | 14.6 | | | |
| 19 | Sendust HS80 | BAK90 | 1.24 | 8.07 | 8.57 | 46.27 | Y | 73.4% | 3.9 Aligned<br>3.6 Unaligned |
| | BAK10 | TM1250 | | | 15.42 | 15.42 | | | |
| 20 | Sendust HS80 | BAK90 | 2.45 | 15.98 | 11.49 | 39.05 | Y | 54.9% | 2.3 Aligned<br>1.7 Unaligned |
| | BAK10 | TM1250 | | | 13.02 | 13.02 | | | |
| 21 | Sendust HS80 | BAK90 | 3.05 | 19.95 | 9.24 | 40.66 | N | 50% | 2.3 Aligned<br>1.6 Unaligned |
| | BAK10 | TM1250 | | | 13.55 | 13.55 | | | |
| 22 | Sendust HS80 | BAK90 | 4.11 | 26.89 | 8.28 | 36.43 | N | 40% | 1.5 Aligned<br>1.1 Unaligned |
| | BAK10 | TM1250 | | | 12.14 | 12.14 | | | |

For comparison, additional samples were made and tested as described for Example 9 except that the materials in the following table were used in the coating solution, and no magnetic field was applied to the samples. No DISPERBYK 145 was included in these samples.

| Sample No. | Filler 1 | Filler 2 | TEPA qty (g) | DER332 qty (g) | Filler 1 qty (g) | Filler 2 qty (g) | Total Filler Volume % | Thermal Conductivity (W/mK) |
|---|---|---|---|---|---|---|---|---|
| 23 | BAK70 | BAK10 | 2.49 | 16.26 | 79.69 | 26.56 | 64% | 2.0 |
| 24 | BAK70 | BAK10 | 1.66 | 10.84 | 84.38 | 28.13 | 74% | 2.9 |
| 25 | BAK70 | BAK10 | 2.07 | 13.55 | 82.03 | 27.34 | 69% | 2.5 |
| 26 | BAK70 | BAK10 | 4.14 | 27.1 | 70.31 | 23.44 | 49% | 1.1 |
| 27 | BAK70 | BAK10 | 1.33 | 8.67 | 69 | 23 | 79% | 4.6 |
| | TM1250 | | | | 23 | | | |
| 28 | | | 10.34 | 65.06 | | | 0% | 0.2 |

Figure 56:
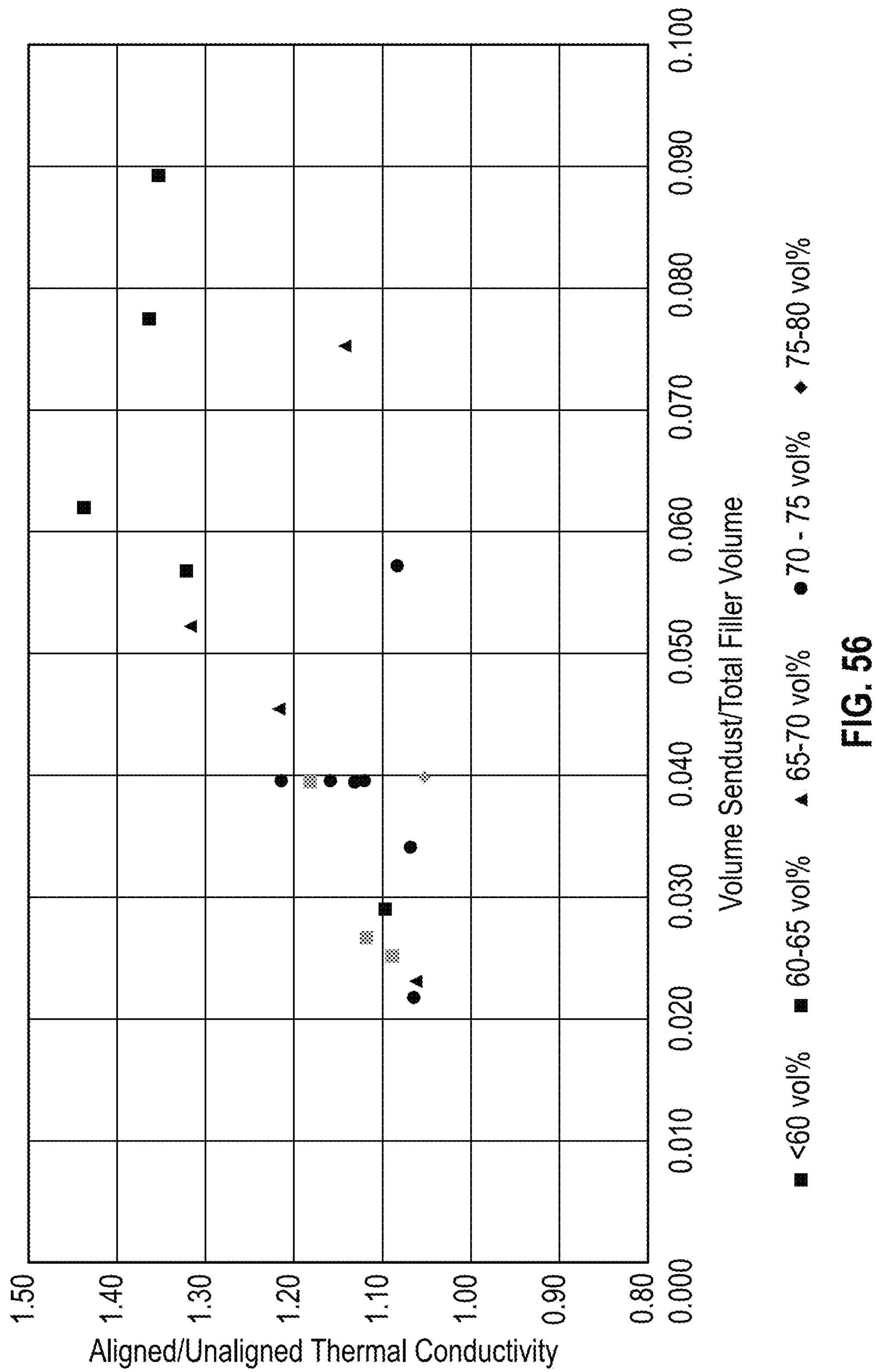
FIG. 56 is a plot of the ratio of the thermal conductivity of samples subjected to an applied rotating magnetic field to the thermal conductivity of corresponding samples that were not subjected to an applied rotating magnetic field as a function of the ratio of volume of magnetic filler to total filler volume.

FIG. 55 is a plot of thermal conductivity versus total filler volume loading for various samples. FIG. 56 is a plot of the ratio of the thermal conductivity of aligned samples to the thermal conductivity of corresponding unaligned samples as a function of the ratio of volume of magnetic filler (Sendust) to total filler volume for various samples.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 5 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.95 and 1.05, and that the value could be 1.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations, or variations, or combinations of the specific embodiments discussed herein. Therefore, it is intended that this disclosure be limited only by the claims and the equivalents thereof.

What is claimed is:

1. A thermal interface layer having opposing first and second major surfaces and comprising a plurality of alternating substantially continuous layers of magnetically responsive first and thermally conductive second particles, the alternating layers generally extending along orthogonal first and second directions and arranged along a third direction, the first and second particles having different compositions, the second particles having a thermal conductivity of at least 10 W/mK, wherein the second particles are agglomerated into the substantially continuous layers of the second particles due to an agglomeration of the first particles into the substantially continuous layers of the first particles without the first particles being attached to the second particles, wherein for at least one layer of the plurality of alternating substantially continuous layers, the layer has a thickness along the third direction that is smaller near the first major surface and larger near the second major surface, such that near the first major surface, but not near the second major surface, the particles of the layer are agglomerated within the layer so as to form alternating higher and lower density regions within the layer that are arranged along the third direction.

2. The thermal interface layer of claim 1, wherein the first and second particles have respective real parts of relative permeability $m'_1$ and $m'_2$ such that for at least one frequency less than about 1 GHZ, $m'_1/m'_2 \geq 5$.

3. The thermal interface layer of claim 1, wherein the opposing first and second major surfaces are spaced apart by a distance D along a thickness direction of the thermal interface layer, wherein each layer has a length L along the first direction from a first to an opposing second edge of the thermal interface layer, $L/D \geq 100$.

4. The thermal interface layer of claim 3, wherein the thickness direction is substantially parallel to the second direction.

5. The thermal interface layer of claim 3, wherein the first particles comprise a plurality of first flakes, each first flake extending generally along a plane of the first flake, each first flake in at least a majority of the first flakes being oriented such that the plane of the first flake makes an angle of less than 40 degrees with the thickness direction of the thermal interface layer, the first particles causing the second particles to at least partially align.

6. The thermal interface layer of claim 1, wherein the first and second particles are dispersed in a polymeric matrix, the polymeric matrix comprising at least 50 percent by volume of the thermal interface layer.

7. The thermal interface layer of claim 1, wherein a total volume loading of the first and second particles in the thermal interface layer is in a range of about 20 percent to about 55 percent.

8. The thermal interface layer of claim 1, wherein a total volume percent of the first and second particles is V, and wherein a thermal conductivity of the thermal interface layer in a thickness direction of the thermal interface layer in units of W/mK is at least $K=5.1-0.17\ V+0.002\ V^2$, the second particles comprising one or more of aluminum, magnesium, silicon, copper, or zinc.

* * * * *